(12) United States Patent
Cho et al.

(10) Patent No.: US 10,050,212 B2
(45) Date of Patent: Aug. 14, 2018

(54) ORGANIC OPTOELECTRIC DEVICE AND DISPLAY DEVICE

(71) Applicants: Pyeong-Seok Cho, Uiwang-si (KR); Gi-Wook Kang, Uiwang-si (KR); Eui-Su Kang, Uiwang-si (KR); Youn-Hwan Kim, Uiwang-si (KR); Hun Kim, Uiwang-si (KR); Yong-Tak Yang, Uiwang-si (KR); Jae-Jin Oh, Uiwang-si (KR); Eun-Sun Yu, Uiwang-si (KR); Nam-Heon Lee, Uiwang-si (KR); Sang-Shin Lee, Uiwang-si (KR); Han-Ill Lee, Uiwang-si (KR)

(72) Inventors: Pyeong-Seok Cho, Uiwang-si (KR); Gi-Wook Kang, Uiwang-si (KR); Eui-Su Kang, Uiwang-si (KR); Youn-Hwan Kim, Uiwang-si (KR); Hun Kim, Uiwang-si (KR); Yong-Tak Yang, Uiwang-si (KR); Jae-Jin Oh, Uiwang-si (KR); Eun-Sun Yu, Uiwang-si (KR); Nam-Heon Lee, Uiwang-si (KR); Sang-Shin Lee, Uiwang-si (KR); Han-Ill Lee, Uiwang-si (KR)

(73) Assignee: Cheil Industries, Inc., Gumi-Si, Gyeongsangbuk-do (KR)

( * ) Notice: Subject to any disclaimer, the term of this patent is extended or adjusted under 35 U.S.C. 154(b) by 958 days.

(21) Appl. No.: 14/302,464

(22) Filed: Jun. 12, 2014

(65) Prior Publication Data

US 2015/0102301 A1    Apr. 16, 2015

(30) Foreign Application Priority Data

Oct. 11, 2013    (KR) ......................... 10-2013-0121466

(51) Int. Cl.
*H01L 51/00* (2006.01)
*C09B 57/00* (2006.01)
*H01L 51/50* (2006.01)

(52) U.S. Cl.
CPC .......... *H01L 51/0067* (2013.01); *C09B 57/00* (2013.01); *H01L 51/0054* (2013.01);
(Continued)

(58) Field of Classification Search
CPC ............. H01L 51/0067; H01L 51/0054; H01L 51/0072; H01L 51/0073; H01L 51/0074;
(Continued)

(56) References Cited

U.S. PATENT DOCUMENTS

| 2013/0048964 | A1 | 2/2013 | Takeda et al. | |
| 2013/0256644 | A1 | 10/2013 | Kim et al. | |
| 2014/0336392 | A1* | 11/2014 | Kim | C09K 11/06 |
| | | | | 548/440 |

FOREIGN PATENT DOCUMENTS

| JP | 3139321 B2 | 2/2001 |
| JP | 4388590 B2 | 12/2009 |

(Continued)

OTHER PUBLICATIONS

Machine Translation of WO 2011/081423 (2011).*

(Continued)

*Primary Examiner* — Alexander R Pagano
(74) *Attorney, Agent, or Firm* — Lee & Morse, P.C.

(57) ABSTRACT

Disclosed is an organic optoelectric device, including an anode and a cathode facing each other, an emission layer interposed between the anode and the cathode, a hole transport layer interposed between the anode and the emission layer, and a hole transport auxiliary layer interposed between the hole transport layer and the emission layer. The emission layer includes at least one first compound represented by Chemical Formula 1:

[Chemical Formula 1]

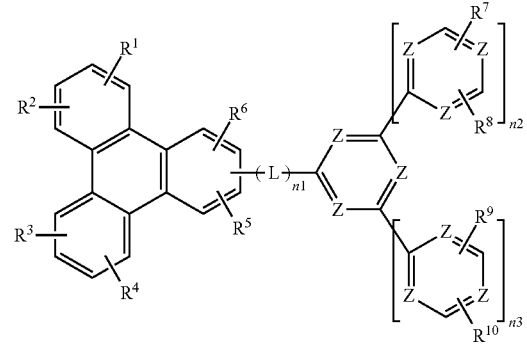

The emission layer further includes at least one second compound represented by Chemical Formula 2:

[Chemcial Formula 2]

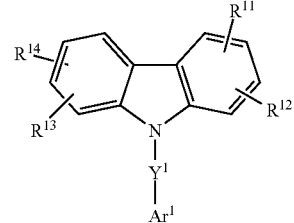

The hole transport auxiliary layer includes a third compound represented by Chemical Formula 2, the third compound being the same as or different from the second compound.

15 Claims, 1 Drawing Sheet

(52) U.S. Cl.
CPC ...... *H01L 51/0072* (2013.01); *H01L 51/0073* (2013.01); *H01L 51/0074* (2013.01); *H01L 51/5012* (2013.01); *H01L 51/5016* (2013.01); *H01L 51/5056* (2013.01)

(58) Field of Classification Search
CPC ............. H01L 51/5012; H01L 51/5016; H01L 51/5056; C09B 57/00
See application file for complete search history.

(56) References Cited

FOREIGN PATENT DOCUMENTS

| | | | |
|---|---|---|---|
| KR | 10-2005-0123409 A | 12/2005 | |
| KR | 10-2006-0055767 A | 5/2006 | |
| KR | 10-2006-0097313 A | 9/2006 | |
| KR | 10-2010-0028471 A | 6/2010 | |
| KR | 10-2010-0131745 A | 12/2010 | |
| KR | 10-2011-0048838 A | 5/2011 | |
| KR | 10-2012-0034648 A | 4/2012 | |
| KR | 10-2012-0046778 A | 5/2012 | |
| KR | 10-2012-0116282 A | 10/2012 | |
| KR | 10-2012-0130074 A | 11/2012 | |
| KR | 10-2012-0130102 A | 11/2012 | |
| KR | 10-2012-0140140 A | 12/2012 | |
| WO | WO 2009/136596 A1 | 11/2009 | |
| WO | WO 2010/098246 A1 | 9/2010 | |
| WO | WO 2011/021689 A1 | 2/2011 | |
| WO | WO 2011/081451 A2 | 7/2011 | |
| WO | WO 2011081423 A2 * | 7/2011 | ............. C09K 11/06 |
| WO | WO-2011081451 A2 * | 7/2011 | ........... C07D 327/08 |
| WO | WO 2011/105373 A1 | 9/2011 | |
| WO | WO 2011/132684 A1 | 10/2011 | |
| WO | WO 2012/114745 A1 | 8/2012 | |
| WO | WO-2013085243 A1 * | 6/2013 | ............. C09K 11/06 |

OTHER PUBLICATIONS

Extended European Search Report dated Feb. 18, 2015 for EP 14172018.5., Cho, et al.
Provisional double patenting rejection over claims of the above-identified application; USPTO Office action dated Oct. 6, 2017, in U.S. Appl. No. 14/902,225.

* cited by examiner

【FIG. 1】
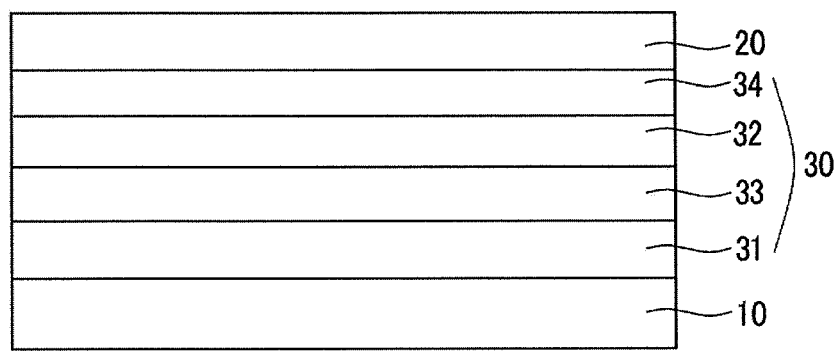

ORGANIC OPTOELECTRIC DEVICE AND DISPLAY DEVICE

CROSS-REFERENCE TO RELATED APPLICATION

Korean Patent Application No. 10-2013-0121466, filed on Oct. 11, 2013, in the Korean Intellectual Property Office, and entitled: "Organic Optoelectric Device and Display Device," is incorporated by reference herein in its entirety.

BACKGROUND

1. Field

An organic optoelectric device and a display device are disclosed.

2. Description of the Related Art

An organic optoelectric device is a device that converts electrical energy into photoenergy, and vice versa.

SUMMARY

Embodiments may be realized by providing an organic optoelectric device, including an anode and a cathode facing each other, an emission layer interposed between the anode and the cathode, a hole transport layer interposed between the anode and the emission layer, and a hole transport auxiliary layer interposed between the hole transport layer and the emission layer. The emission layer includes at least one first compound represented by Chemical Formula 1:

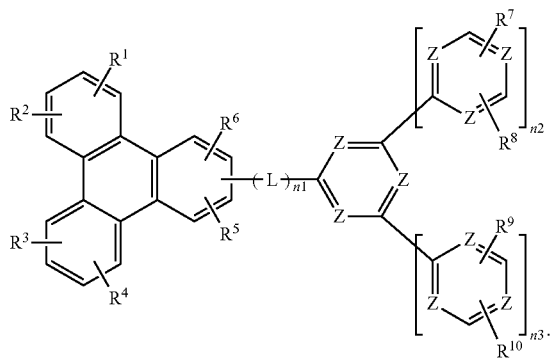

[Chemical Formula 1]

In Chemical Formula 1,

Z is independently N or $CR^a$, at least one of Z is N, $R^1$ to $R^{10}$ and $R^a$ are independently hydrogen, deuterium, a substituted or unsubstituted C1 to C10 alkyl group, a substituted or unsubstituted C6 to C12 aryl group, or a combination thereof, the total number of 6-membered rings substituted on the triphenylenyl group is less than or equal to 6, L is a substituted or unsubstituted phenylenyl group, a substituted or unsubstituted biphenylenyl group or a substituted or unsubstituted terphenylenyl group, n1 to n3 are independently 0 or 1, and n1+n2+n3≥1.

The emission layer further includes at least one second compound represented by Chemical Formula 2:

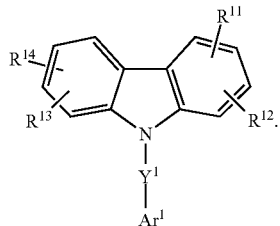

[Chemical Formula 2]

In Chemical Formula 2, $Y^1$ is a single bond, a substituted or unsubstituted C1 to C20 alkylenyl group, a substituted or unsubstituted C2 to C20 alkenylenyl group, a substituted or unsubstituted C6 to C30 arylenyl group, a substituted or unsubstituted C2 to C30 heterocyclic group, or a combination thereof, $Ar^1$ is a substituted or unsubstituted C6 to C30 aryl group, a substituted or unsubstituted C2 to C30 heterocyclic group, or a combination thereof, $R^{11}$ to $R^{14}$ are independently hydrogen, deuterium, a substituted or unsubstituted C1 to C20 alkyl group, a substituted or unsubstituted C6 to C50 aryl group, a substituted or unsubstituted C2 to C50 heterocyclic group, or a combination thereof, and at least one of $R^{11}$ to $R^{14}$ and $Ar^1$ includes a substituted or unsubstituted triphenylenyl group or a substituted or unsubstituted carbazolyl group.

The hole transport auxiliary layer includes a third compound represented by Chemical Formula 2, the third compound being the same as or different from the second compound.

According to another embodiment, a display device including the organic optoelectric device is provided.

BRIEF DESCRIPTION OF THE DRAWINGS

Features will become apparent to those of skill in the art by describing in detail exemplary embodiments with reference to the attached drawings in which:

FIG. 1 illustrates a cross-sectional view of an organic optoelectric device according to one embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer is referred to as being "between" two layers, it can be the only layer between the two layers, or one or more intervening layers may also be present.

Hereinafter, embodiments are described in detail. However, these embodiments are merely exemplary.

As used herein, when a definition is not otherwise provided, the term "substituted" refers to one substituted with a deuterium, a halogen, a hydroxy group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C3 to C30 cycloalkyl group, a C2 to C30 heterocycloalkyl group, a C6 to C30 aryl group, a C2 to C30 heterocyclic group, a C1 to C20 alkoxy group, a fluoro group, a C1 to C10 trifluoroalkyl group such as a trifluoromethyl group, and the like, or a cyano group, instead of at least one hydrogen of a substituent or a compound.

In addition, two adjacent substituents of the substituted halogen, hydroxy group, amino group, substituted or unsubstituted C1 to C20 amine group, a nitro group, substituted or unsubstituted C3 to C40 silyl group, C1 to C30 alkyl group, C1 to C10 alkylsilyl group, C3 to C30 cycloalkyl group, C2 to C30 heterocycloalkyl group, C6 to C30 aryl group, C2 to C30 heterocyclic group, C1 to C20 alkoxy group, fluoro group, C1 to C10 trifluoroalkyl group such as trifluoromethyl group and the like, or cyano group may be fused with each other to form a ring. For example, the substituted C6 to C30 aryl group may be fused with another adjacent substituted C6 to C30 aryl group to form a substituted or unsubstituted fluorene ring.

In the present specification, when specific definition is not otherwise provided, the term "hetero" refers to one including 1 to 3 hetero atoms selected from N, O, S, P, and Si, and remaining carbons in one compound or substituent.

As used herein, when a definition is not otherwise provided, the term "alkyl group" may refer to an aliphatic hydrocarbon group. The alkyl group may refer to "a saturated alkyl group" without any double bond or triple bond.

The alkyl group may be a C1 to C30 alkyl group. More specifically, the alkyl group may be a C1 to C20 alkyl group or a C1 to C10 alkyl group. For example, a C1 to C4 alkyl group includes 1 to 4 carbons in alkyl chain, and may be selected from methyl, ethyl, propyl, iso-propyl, n-butyl, iso-butyl, sec-butyl, and t-butyl.

Specific examples of the alkyl group may be a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and the like.

As used herein, the term "aryl group" refers to a substituent including all element of the cycle having p-orbitals which form conjugation, and may be monocyclic, polycyclic or fused ring polycyclic (i.e., rings sharing adjacent pairs of carbon atoms) functional group.

As used herein, the term "heterocyclic group" may refer to cyclic group including 1 to 3 hetero atoms selected from N, O, S, P, and Si and remaining carbons in one functional group. The heterocyclic group may be a fused ring where each ring may include the 1 to 3 heteroatoms.

More specifically, the substituted or unsubstituted C6 to C30 aryl group and/or the substituted or unsubstituted C2 to C30 heterocyclic group may be a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted chrysenyl group, a substituted or unsubstituted triphenylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted fluorenyl group, a substituted or unsubstituted dibenzofuranyl group, a substituted or unsubstituted dibenzothiophenyl group, a substituted or unsubstituted carbazolyl group, a combination thereof, or a fused ring of the combination thereof, but are not limited thereto.

As used herein, hole characteristics refer to an ability to donate an electron to form a hole when an electric field is applied and that a hole formed in the anode may be injected into the emission layer and transported in the emission layer due to conductive characteristics according to highest occupied molecular orbital (HOMO) level.

In addition, as used herein, electron characteristics refer to an ability to accept an electron when an electric field is applied and that an electron formed in the cathode may be injected into the emission layer and transported in the emission layer due to conductive characteristics according to lowest unoccupied molecular orbital (LUMO) level.

Hereinafter, an organic optoelectric device according to one embodiment is described.

The organic optoelectric device may be any device to convert electrical energy into photoenergy and vice versa and may be, for example, an organic photoelectric device, an organic light emitting diode, an organic solar cell, and an organic photo-conductor drum.

Herein, an organic light emitting diode as one examples of an organic optoelectric device is described.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

FIG. 1 illustrates a cross-sectional view of an organic optoelectric device according to one embodiment.

Referring to FIG. 1, an organic optoelectric device according to one embodiment includes an anode 10 and a cathode 20 facing each other and an organic layer 30 interposed between the anode 10 and cathode 20.

The anode 10 may be made of a conductor having a high work function to help hole injection, and may be, for example, metal, metal oxide, and/or a conductive polymer. The anode 10 may be, for example, a metal, such as, nickel, platinum, vanadium, chromium, copper, zinc, gold, and an alloy thereof; a metal oxide, such as, zinc oxide, indium oxide, indium tin oxide (ITO), and indium zinc oxide (IZO); a combination of metal and oxide, such as, ZnO and Al or $SnO_2$ and Sb; and/or a conductive polymer, such as, poly (3-methylthiophene), poly(3,4-(ethylene-1,2-dioxy)thiophene) (PEDOT), polypyrrole, and polyaniline.

The cathode 20 may be made of a conductor having a low work function to help electron injection, and may be, for example, metal, metal oxide and/or a conductive polymer. The cathode 20 may be, for example, a metal or an alloy thereof, such as, magnesium, calcium, sodium, potassium, titanium, indium, yttrium, lithium, gadolinium, aluminum silver, tin, lead, cesium, and barium; or a multi-layer structure material, such as, LiF/Al, $LiO_2$/Al, LiF/Ca, LiF/Al and $BaF_2$/Ca.

The organic layer 30 includes a hole transport layer (HTL) 31, an emission layer 32, and a hole transport auxiliary layer 33 interposed between the hole transport layer (HTL) 31 and the emission layer 32.

The hole transport layer (HTL) 31 promotes transfer of holes from the anode 10 to the emission layer 32, and may include, for example, an amine compound.

The amine compound may include, for example, at least one aryl group and/or heterocyclic group. The amine compound may be, for example, represented by the following Chemical Formula a or Chemical Formula b.

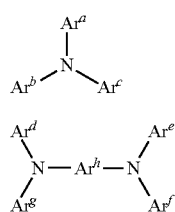

[Chemical Formula a]

[Chemical Formula b]

In the above Chemical Formula a or b, $Ar^a$ to $Ar^g$ are independently hydrogen, deuterium, a substituted or unsubstituted C1 to C20 alkyl group, a substituted or unsubstituted C6 to C30 aryl group, a substituted or unsubstituted C2 to C30 heterocyclic group, or a combination thereof, at least one of $Ar^a$ to $Ar^c$ and at least one of $Ar^d$ to $Ar^g$ are a substituted or unsubstituted C6 to C30 aryl group, a substituted or unsubstituted C2 to C30 heterocyclic group, or a combination thereof, and $Ar^h$ is a single bond, a substituted or unsubstituted C1 to C20 alkylene group, a substituted or unsubstituted C6 to C30 arylene group, a substituted or unsubstituted C2 to C30 heterocyclic group, or a combination thereof.

The emission layer 32 includes at least two hosts and a dopant, and the hosts may include a first compound having bipolar characteristics in which electron characteristics are relatively strong and a second compound that may have bipolar characteristics in which hole characteristics are relatively strong.

The hole transport auxiliary layer 33 includes a third compound that may have bipolar characteristics in which hole characteristics are relatively strong, and the third compound may be the same as or different from the second compound.

The first compound may be a compound having bipolar characteristics in which electron characteristics are relatively strong, and represented by the following Chemical Formula 1.

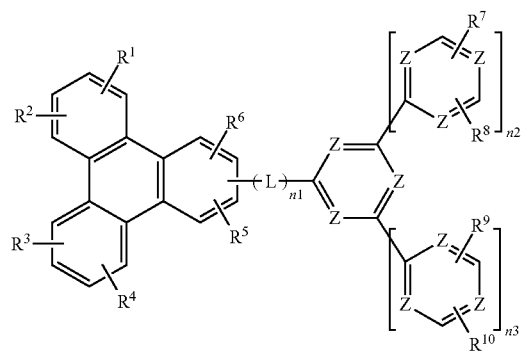

[Chemical Formula 1]

In the above Chemical Formula 1,

Z is independently N or $CR^a$, at least one of Z is N, $R^1$ to $R^{10}$ and $R^a$ are independently hydrogen, deuterium, a substituted or unsubstituted C1 to C10 alkyl group, a substituted or unsubstituted C6 to C12 aryl group, or a combination thereof, in the above Chemical Formula 1, the total number of 6-membered rings substituted on the triphenylenyl group is less than or equal to 6, L is a substituted or unsubstituted phenylenyl group, a substituted or unsubstituted biphenylenyl group or a substituted or unsubstituted terphenylenyl group, n1 to n3 are independently 0 or 1, and n1+n2+n3≥1.

The 6-membered rings substituted on the triphenylenyl group indicate all the 6-membered rings directly or indirectly linked to the triphenylenyl group and include 6-membered rings consisting of carbon atoms, nitrogen atoms, or a combination thereof.

The first compound may be represented by for example, the following Chemical Formula 1-I or 1-II, depending on the bonding position of the triphenylene group.

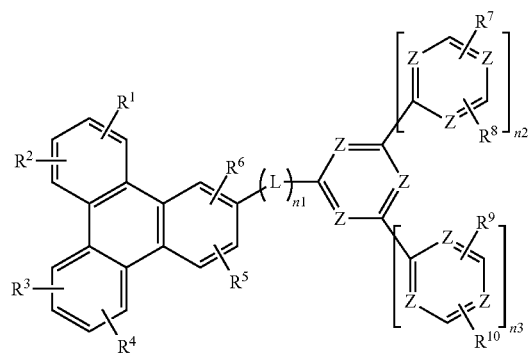

[Chemical Formula 1-I]

[Chemical Formula 1-II]

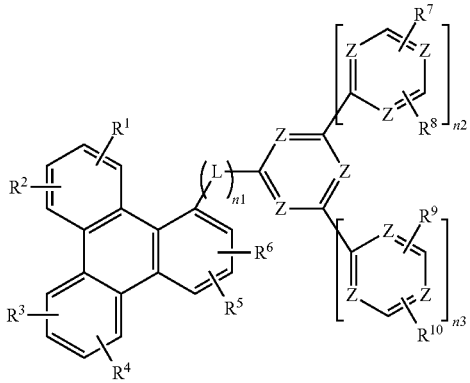

In the above Chemical Formula 1-I or 1-II, Z, $R^1$ to $R^{10}$, L and n1 to n3 are the same as described above.

The first compound may include the triphenylenyl group and at least one nitrogen-containing heterocyclic group. The first compound may include at least one nitrogen-containing ring and thereby, may have a structure of easily accepting electrons when an electric field is applied thereto and decrease a driving voltage of an organic optoelectric device including the first compound.

In addition, the first compound may have a bipolar structure by including both a triphenylene structure of easily accepting holes and a nitrogen-containing ring moiety of easily accepting electrons and may appropriately balance a flow of the holes and the electrons, and improve efficiency of an organic optoelectric device when applied thereto.

The first compound represented by the above Chemical Formula 1 may have at least one kink structure as a center of an arylenyl group and/or a heterocyclic group.

A kink structure, as used herein, is a structure in which two linking moieties of the arylenyl group and/or the heterocyclic group are not a linear structure. For example, phenylene, ortho phenylene (o-phenylene) and meta phenylene (m-phenylene) have a kink structure where linking moieties do not form a linear structure, while para phenylene (p-phenylene) does not have a kink structure because linking moieties do form a linear structure.

In the above Chemical Formula 1, a kink structure may be formed as a center of a linking group (L) and/or an arylene group/a heterocyclic group.

For example, when n1 in the above Chemical Formula 1 is 0, there is no linking group (L), and a kink structure may be formed as a center of an arylene group/a heterocyclic group, and, for example, the compound may be represented by the following Chemical Formula 1a or 1 b.

[Chemical Formula 1a]

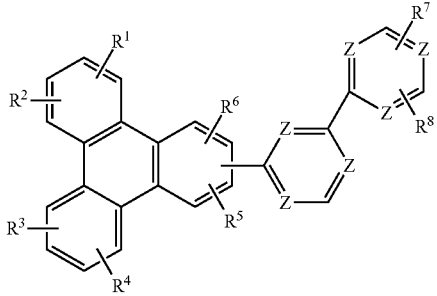

[Chemical Formula 1b]

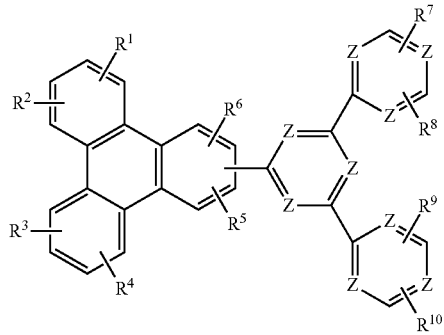

In the above Chemical Formula 1a or 1b, Z, $R^1$ to $R^{10}$ and L are the same as described above.

For example, when n1 in the above Chemical Formula 1 is 1, a kink structure is formed as a center of a linking group (L), and, for example, the L is may be a substituted or unsubstituted phenylene having a kink structure, a substituted or unsubstituted biphenylene group having a kink structure, or a substituted or unsubstituted terphenylene group having a kink structure.

The L may be selected from, for example, substituted or unsubstituted groups of the following Group 1.

[Group 1]

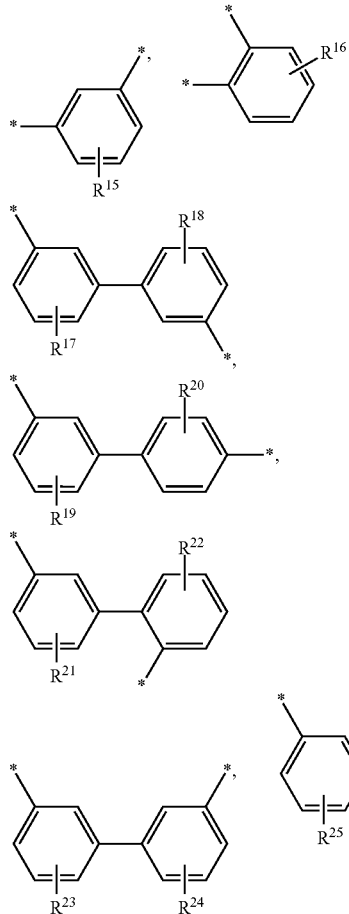

-continued

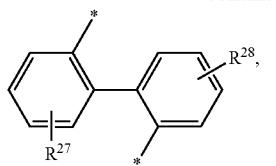

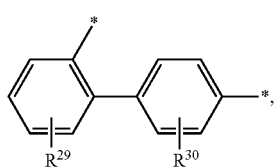

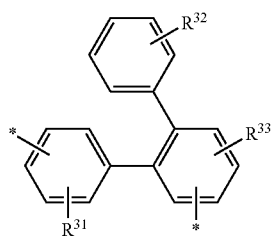

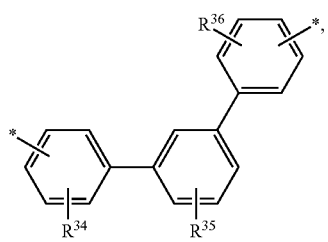

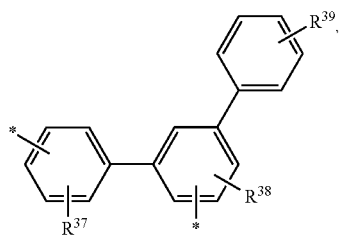

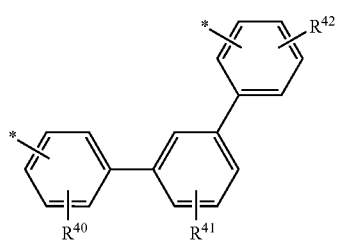

In the Group 1,
$R^{15}$ to $R^{42}$ are independently hydrogen, deuterium, a substituted or unsubstituted C1 to C10 alkyl group, a substituted or unsubstituted C3 to C30 cycloalkyl group, a substituted or unsubstituted C2 to C30 heterocycloalkyl group, a substituted or unsubstituted C6 to C30 aryl group, a substituted or unsubstituted C2 to C30 heterocyclic group, a substituted or unsubstituted amine group, a substituted or unsubstituted C6 to C30 arylamine group, a substituted or unsubstituted C6 to C30 heteroarylamine group, a substituted or unsubstituted C1 to C30 alkoxy group, a halogen, a halogen-containing group, a cyano group, a hydroxyl group, an amino group, a nitro group, a carboxyl group, a ferrocenyl group, or a combination thereof.

The first compound may have at least two kink structures and for example, two to four kink structures.

The first compound, with a kink structure, may appropriately localize charges and control a conjugation-system flow, and a life-span of an organic optoelectric device to which the composition is applied may be improved.

In addition, in Chemical Formula 1, the number of $R^1$ to $R^6$, the total number of 6-membered rings substituted on the triphenylenyl group is less than or equal to 6, and thereby thermal decomposition of the compound by a high temperature during a deposition process may be decreased.

In addition, the first compound may be effectively prevented from stacking due to the structure and improve process stability and simultaneously, decrease a deposition temperature. This stacking prevention effect may be further increased when the compound includes the linking group (L) of the above Chemical Formula 1.

The first compound may be represented by one of, for example, the following Chemical Formulae 1c to 1t.

[Chemical Formula 1c]

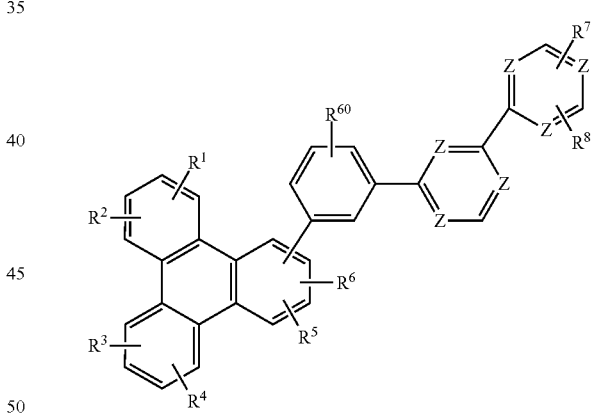

[Chemical Formula 1d]

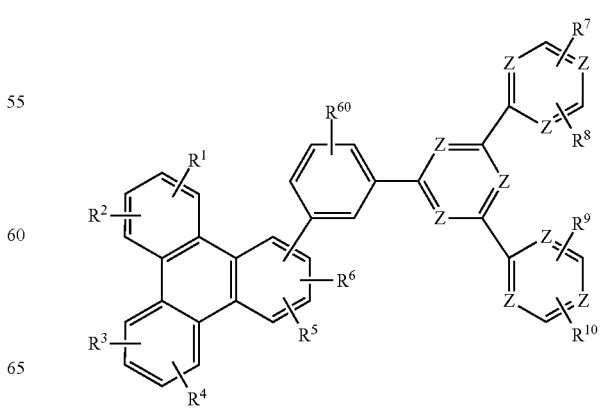

[Chemical Formula 1e]
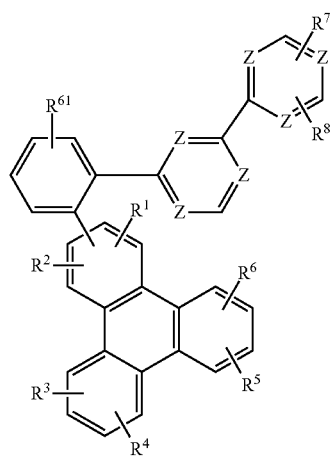
[Chemical Formula 1f]
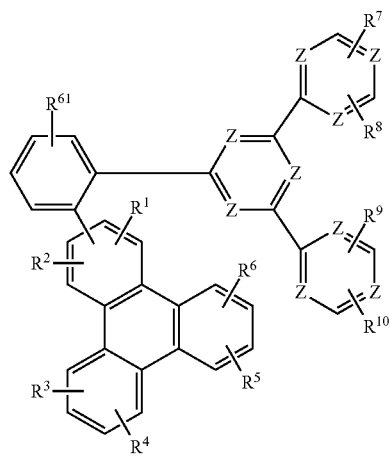
[Chemical Formula 1g]
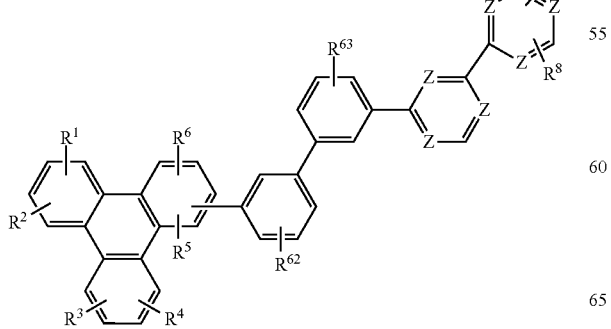
[Chemical Formula 1h]
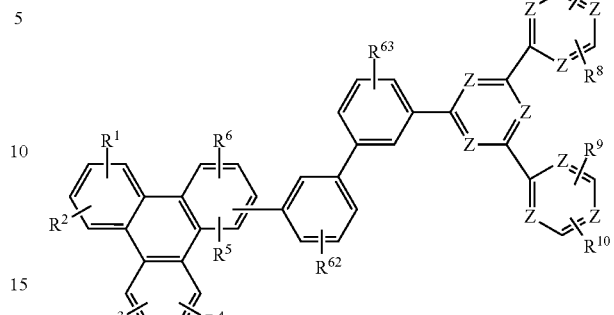
[Chemical Formula 1i]
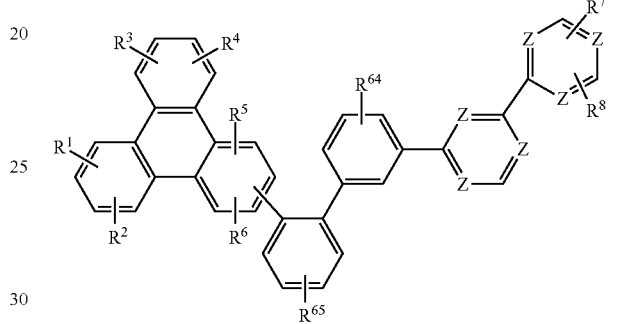
[Chemical Formula 1j]
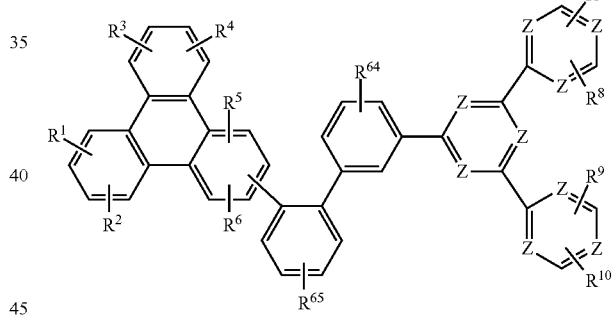
[Chemical Formula 1k]
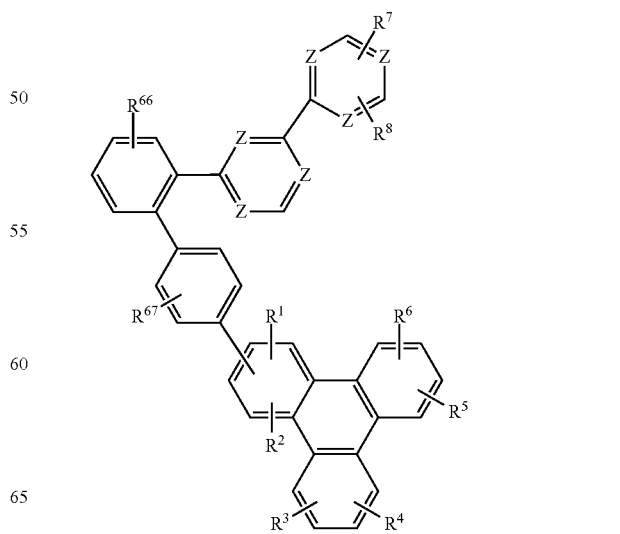

[Chemical Formula 1l]
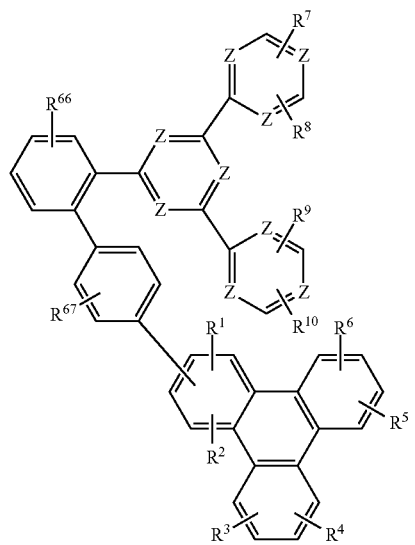
[Chemical Formula 1m]
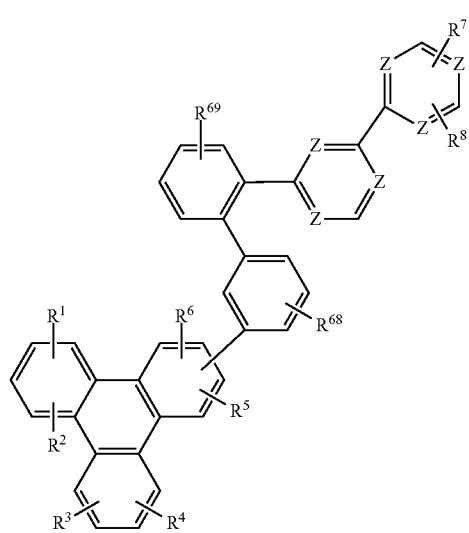
[Chemical Formula 1n]
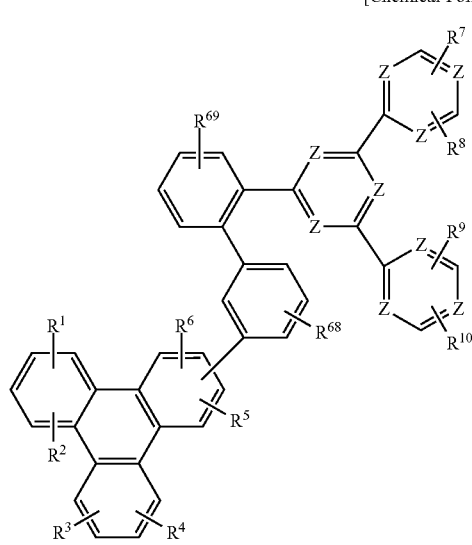
[Chemical Formula 1o]
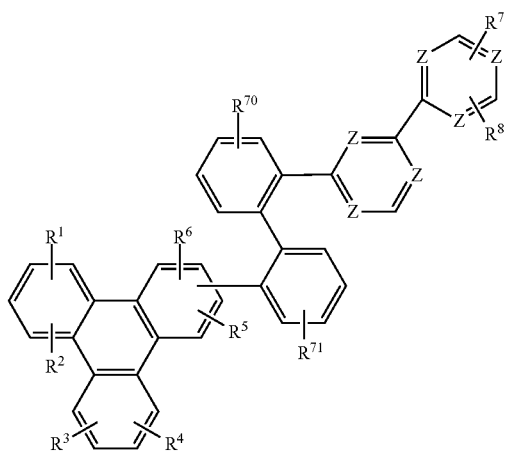
[Chemical Formula 1p]
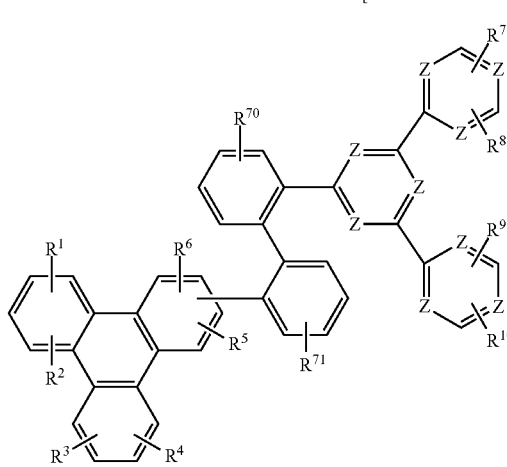
[Chemical Formula 1q]
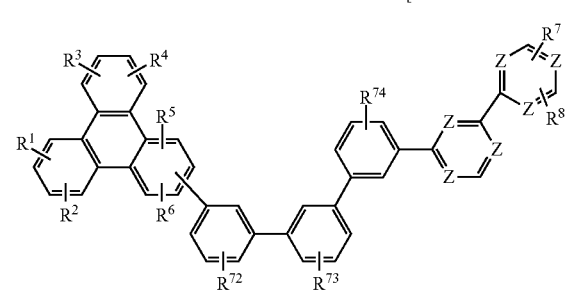
[Chemical Formula 1r]
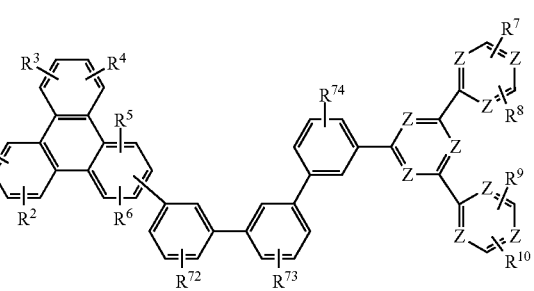

[Chemical Formula 1s]

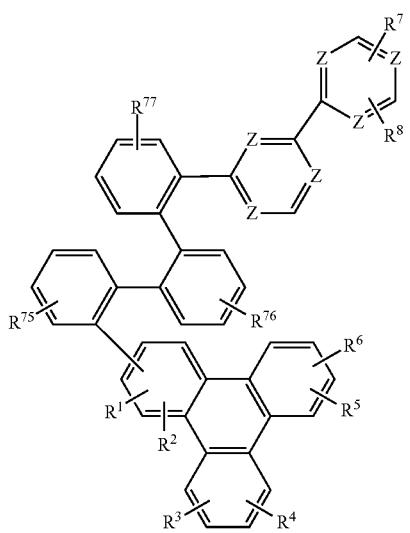

[Chemical Formula 1t]

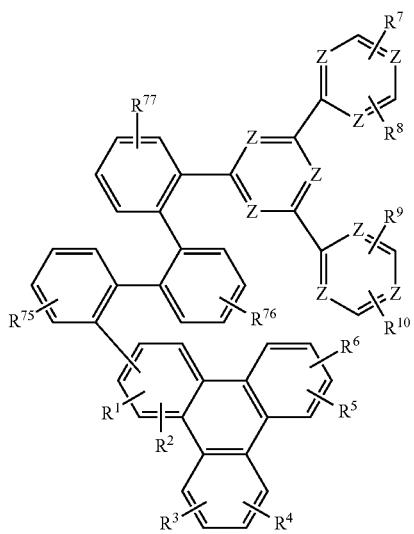

In the above Chemical Formulae 1c to 1t,

Z and $R^1$ to $R^{10}$ are the same as described above, and $R^{60}$ to $R^{77}$ are independently hydrogen, deuterium, a substituted or unsubstituted C1 to C10 alkyl group, a substituted or unsubstituted C3 to C30 cycloalkyl group, a substituted or unsubstituted C2 to C30 heterocycloalkyl group, a substituted or unsubstituted C6 to C30 aryl group, a substituted or unsubstituted C2 to C30 heterocyclic group, a substituted or unsubstituted amine group, a substituted or unsubstituted C6 to C30 arylamine group, a substituted or unsubstituted C6 to C30 heteroarylamine group, a substituted or unsubstituted C1 to C30 alkoxy group, a halogen, a halogen-containing group, a cyano group, a hydroxyl group, an amino group, a nitro group, a carboxyl group, a ferrocenyl group, or a combination thereof.

The first compound may be, for example, selected from the following Group 2.

[Group 2]

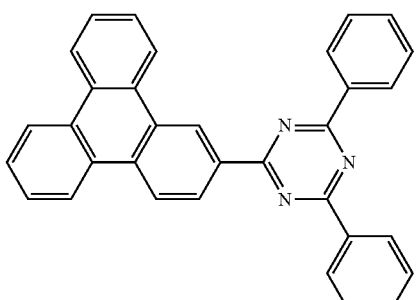

A-1

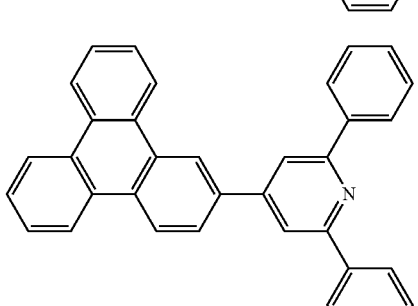

A-2

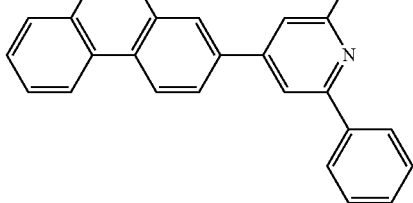

A-3

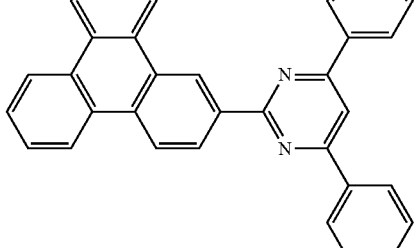

A-4

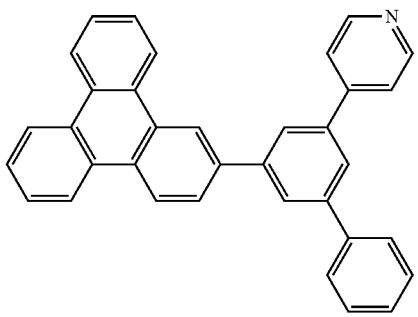

A-5

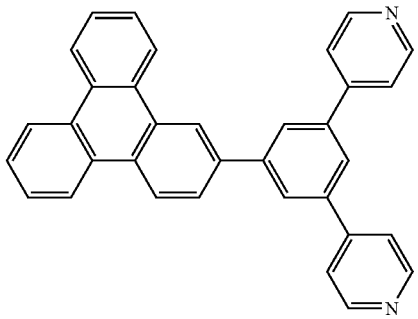

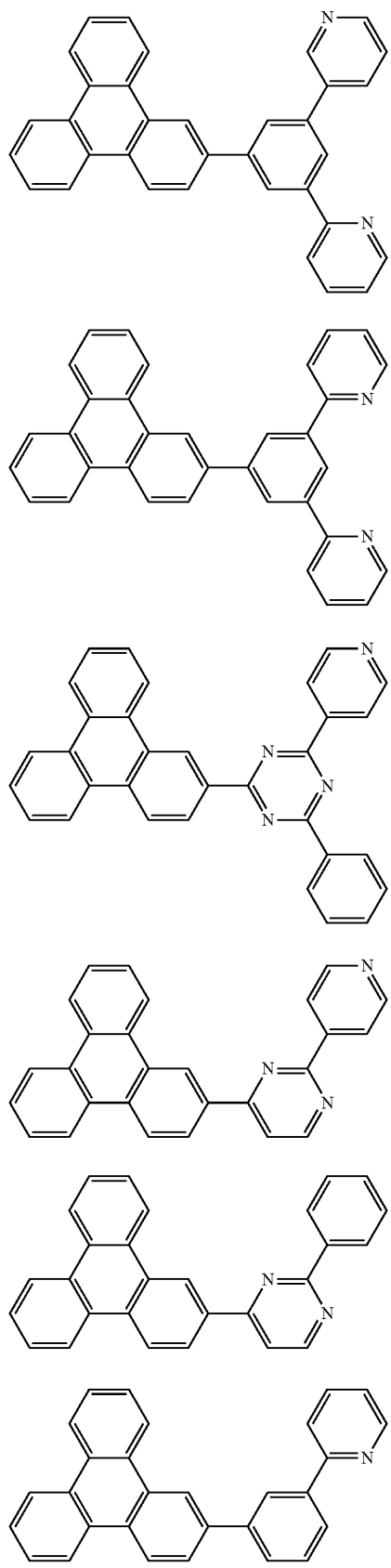
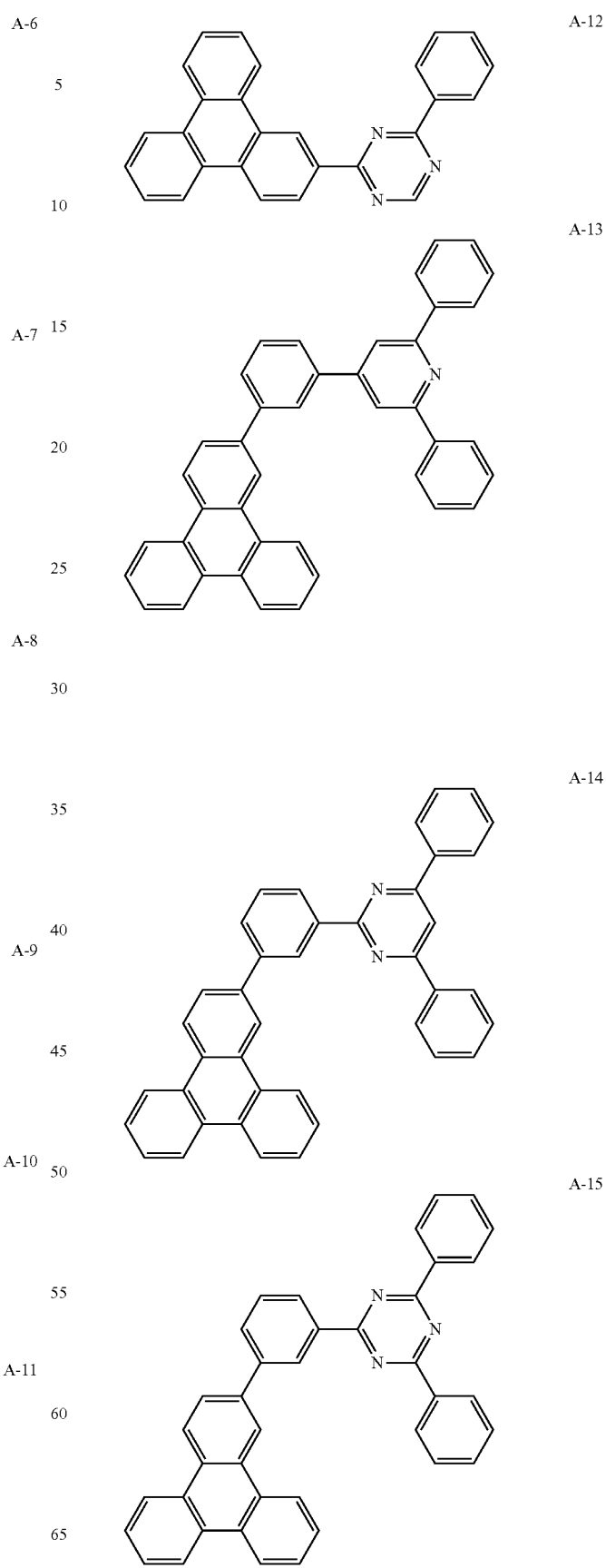

-continued
A-16
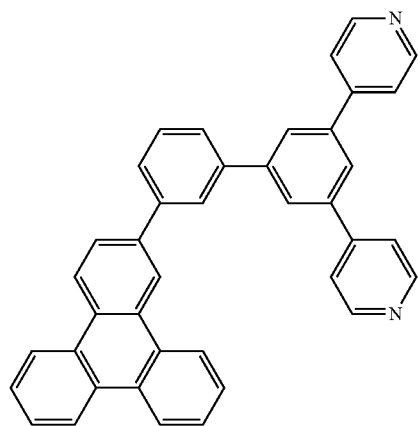
A-17
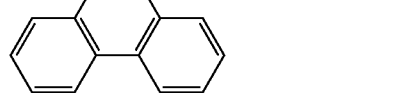
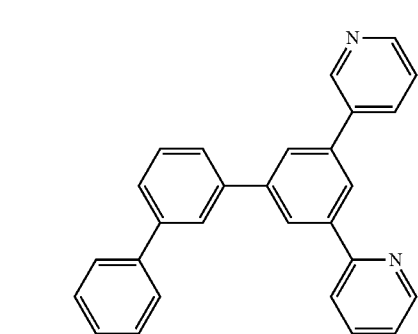
A-18
A-19
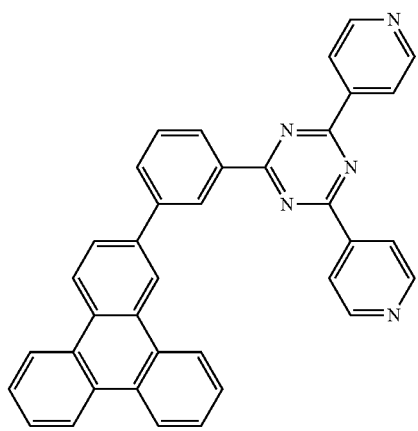
A-20
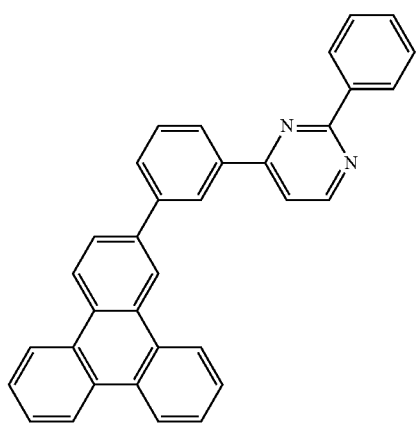
A-21
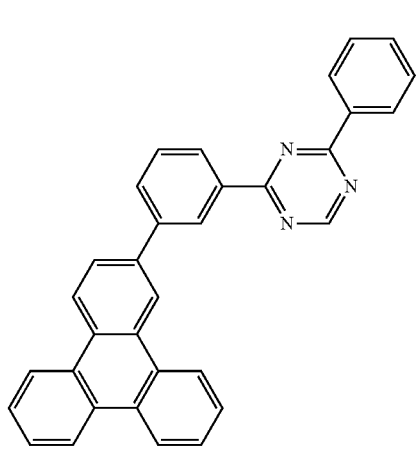

A-22 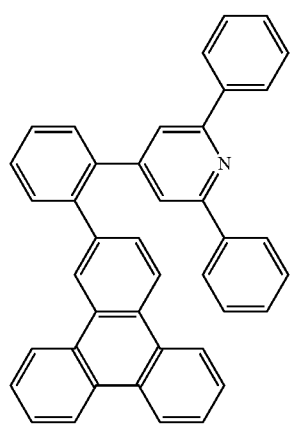
A-25 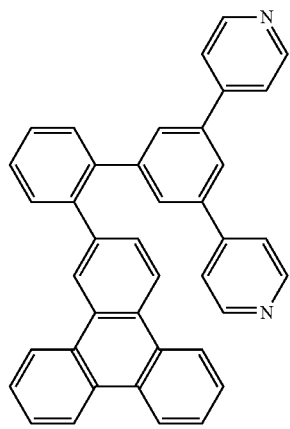
A-23 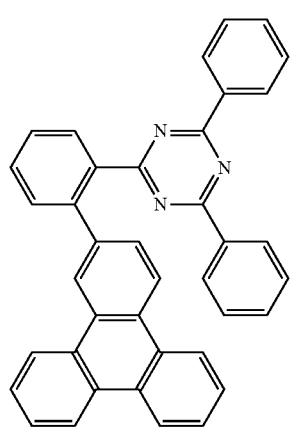
A-26 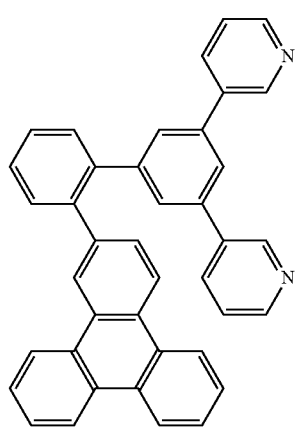
A-24 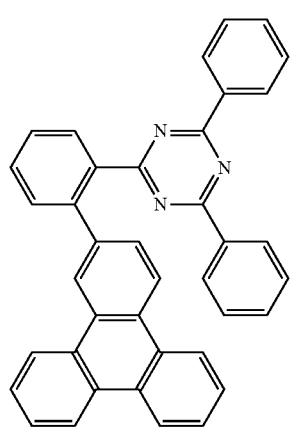
A-27 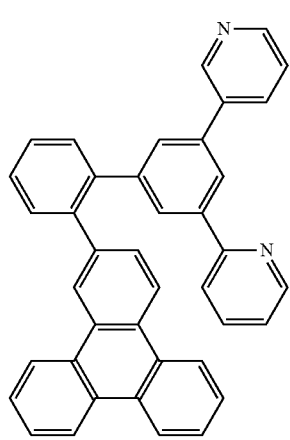

A-28
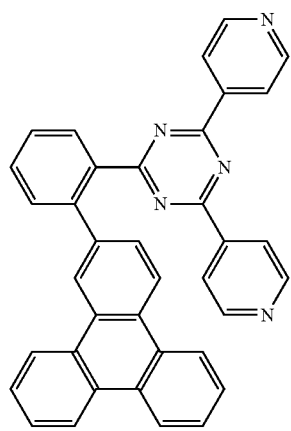
A-29
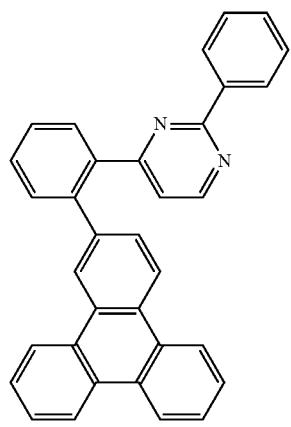
A-30
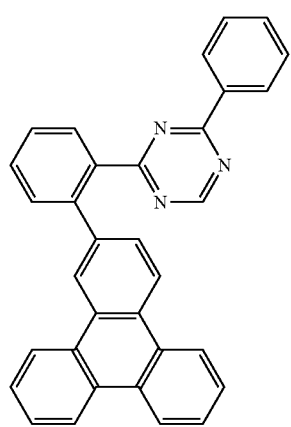
A-31
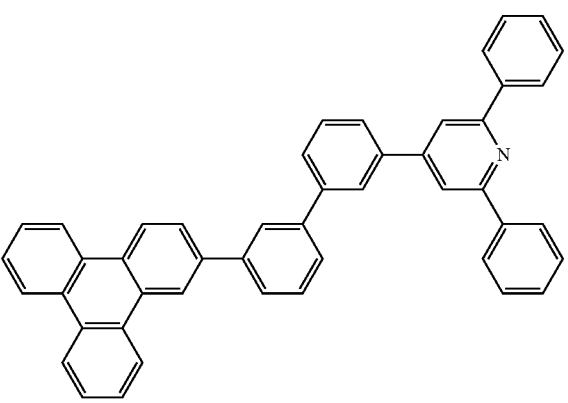
A-32
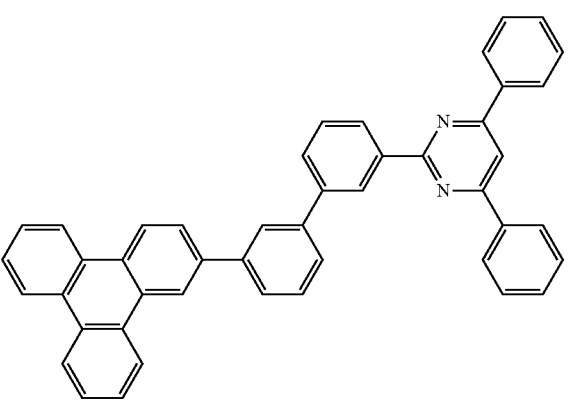
A-33
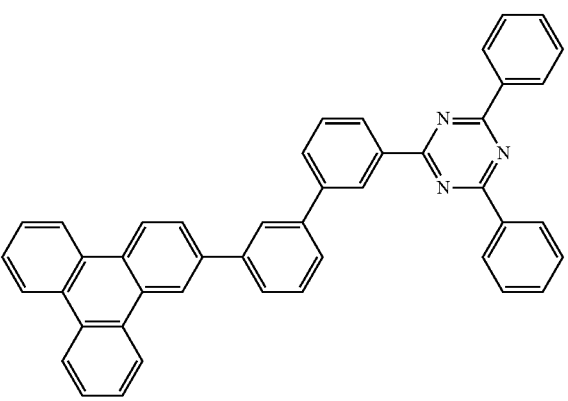

A-34
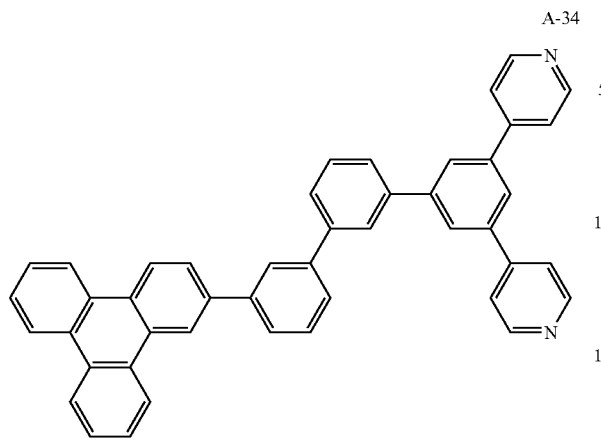
A-35
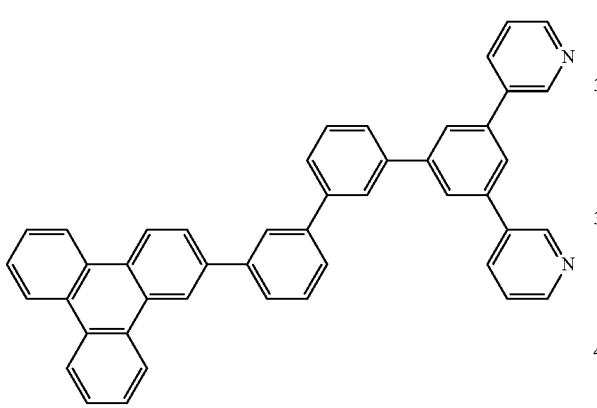
A-36
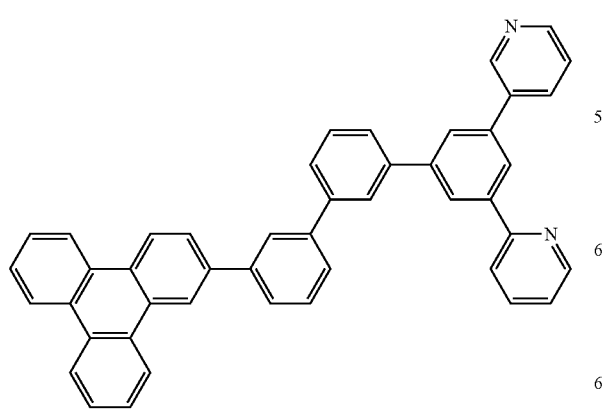
A-37
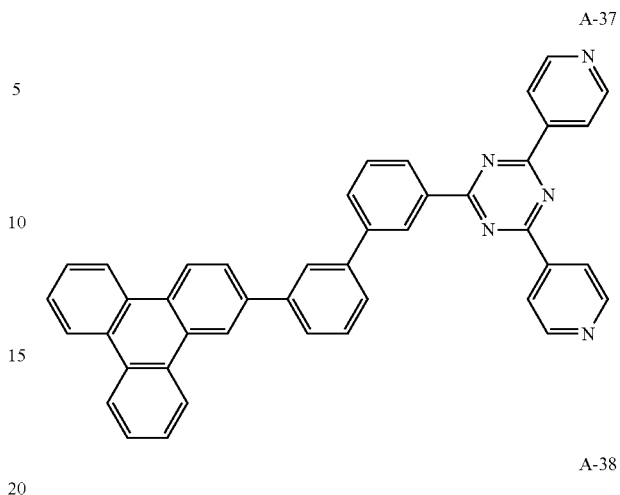
A-38
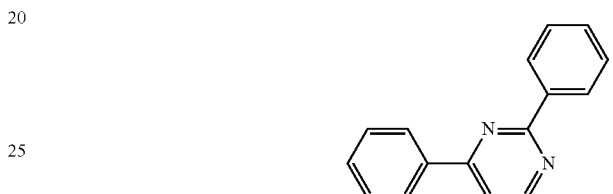
A-39
A-40
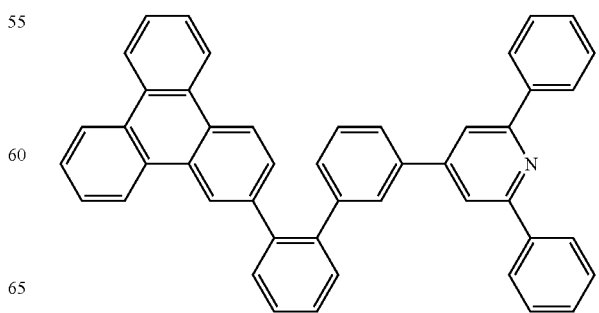

A-41
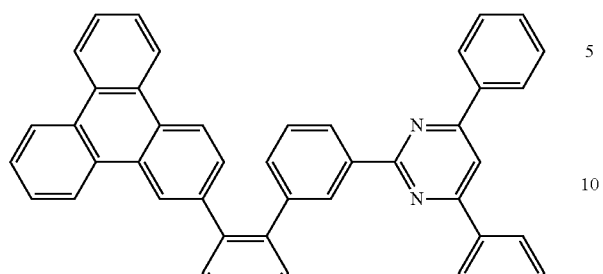
A-42
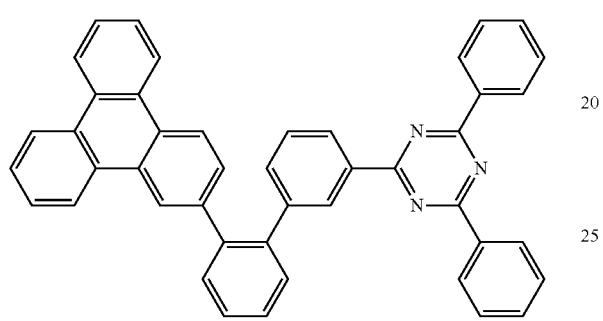
A-43
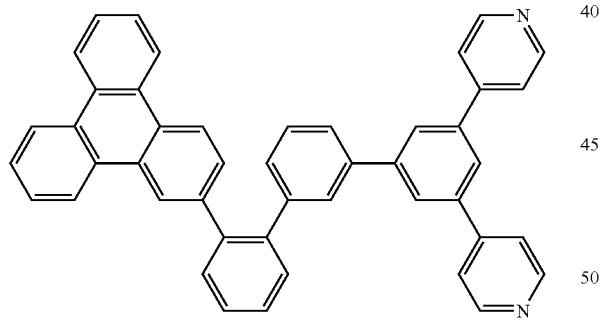
A-44
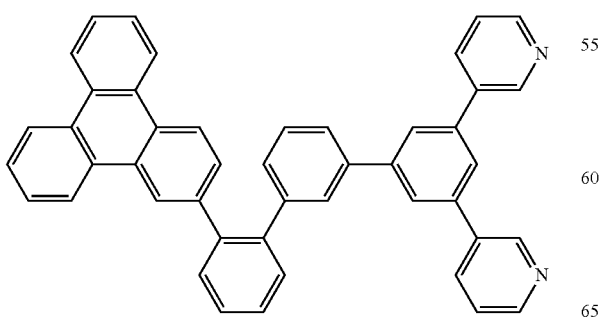
A-45
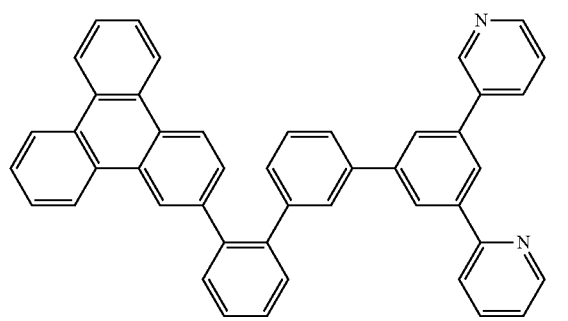
A-46
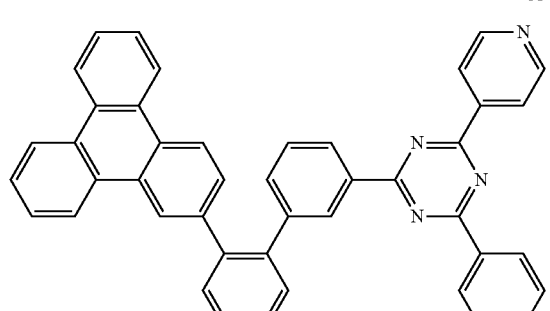
A-47
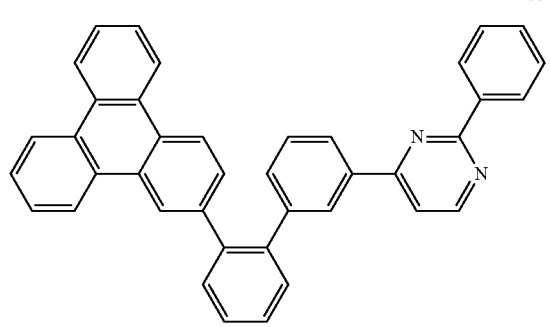
A-48
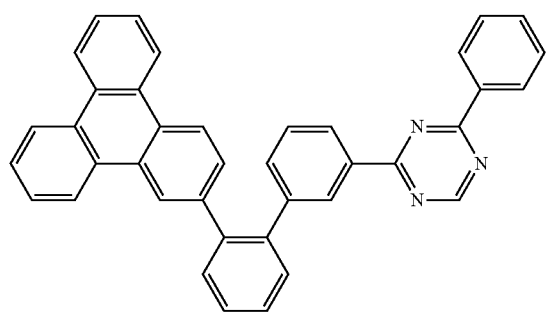

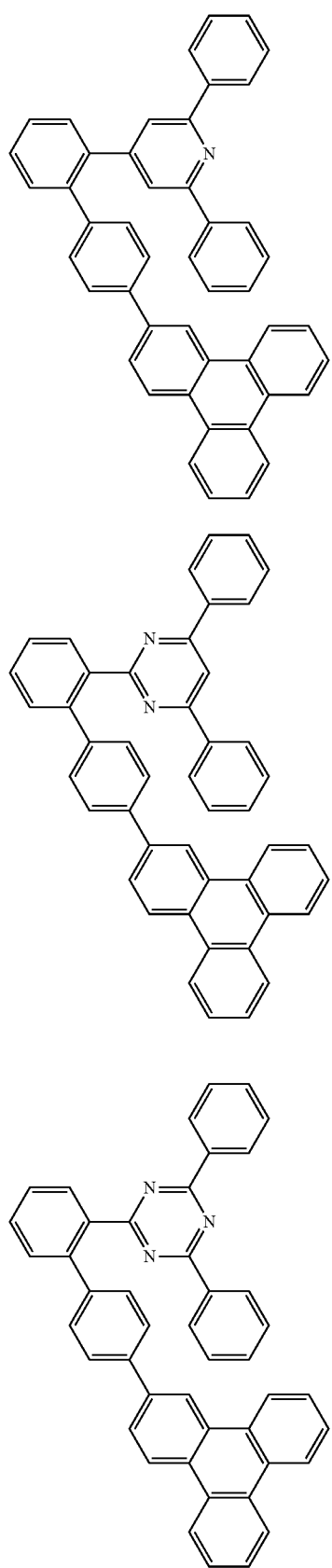
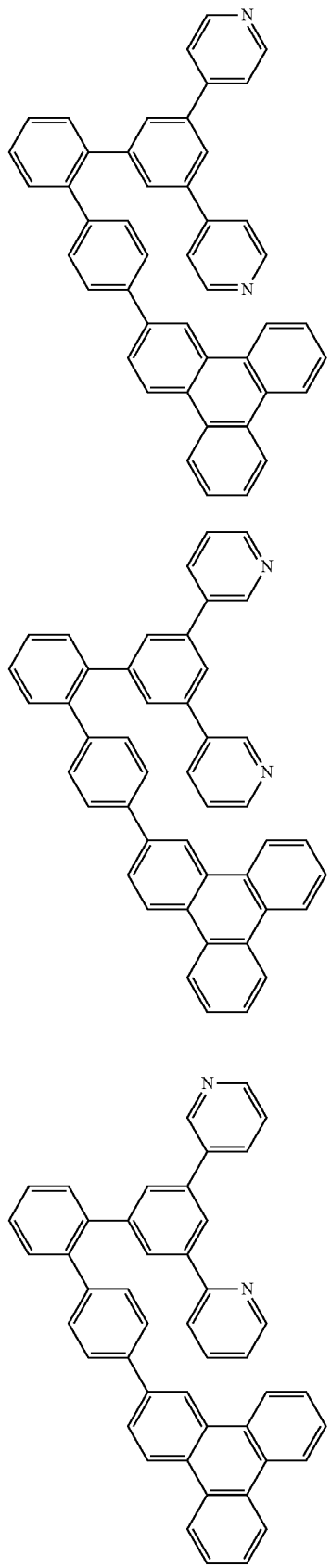

A-55
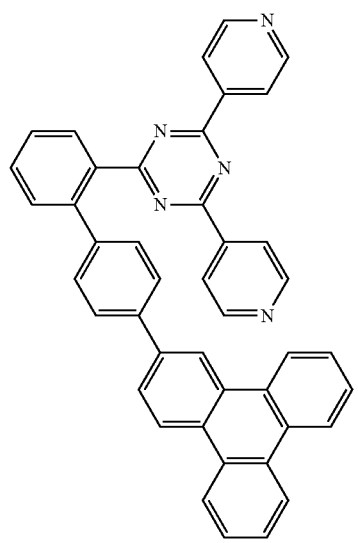
A-56
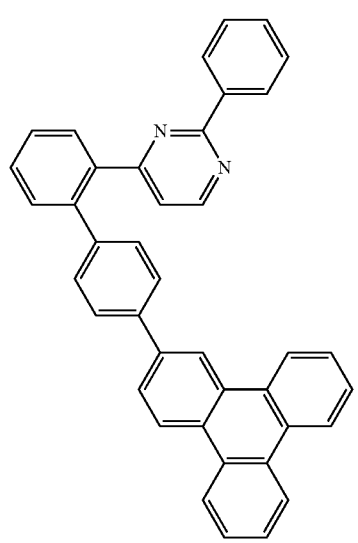
A-57
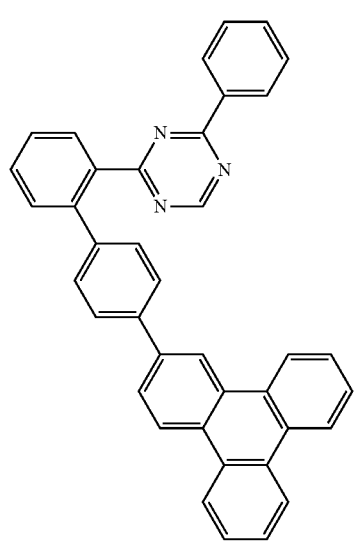
A-58
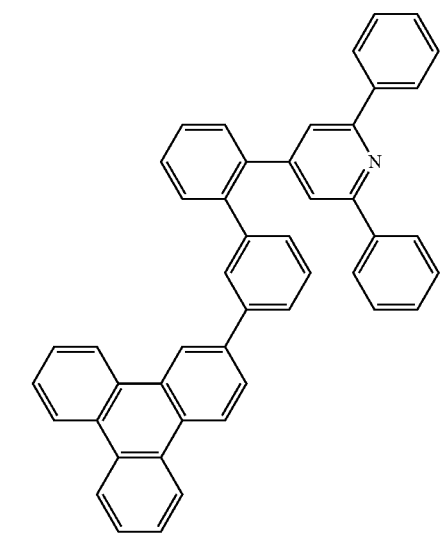
A-59
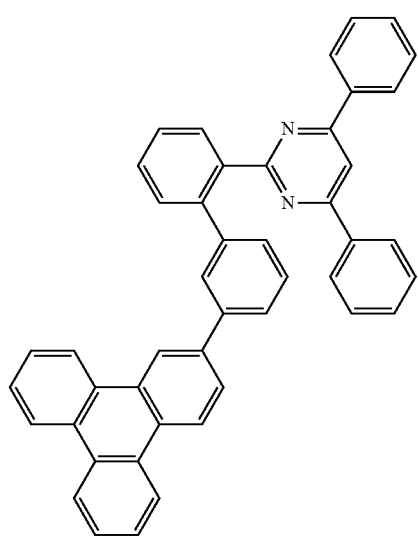
A-60
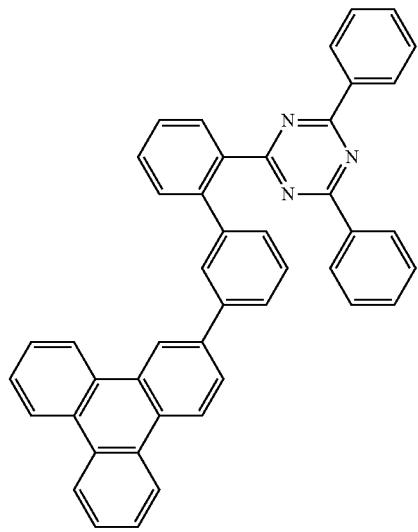

A-61 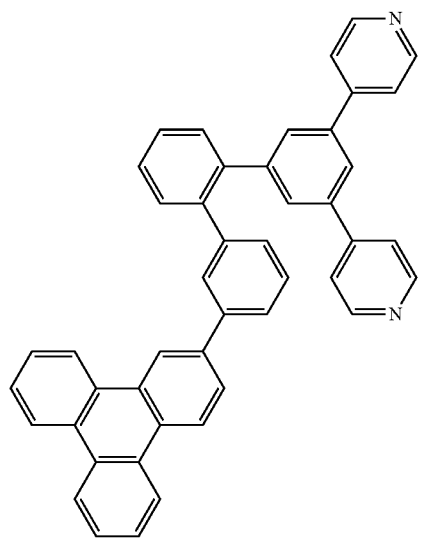
A-62 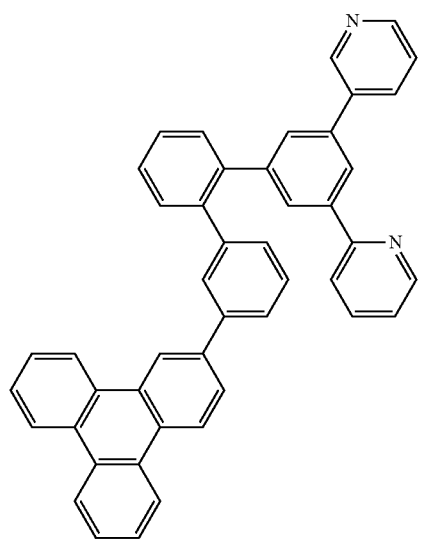
A-63 
A-64 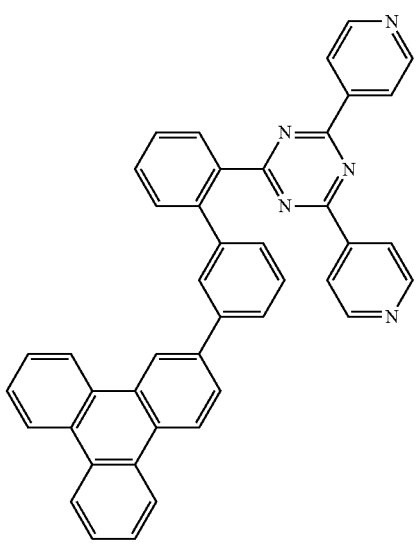
A-65 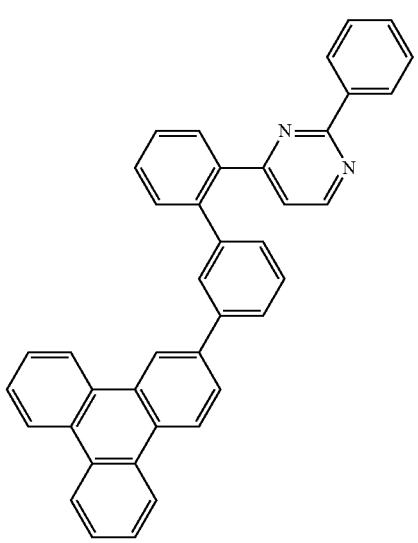
A-66 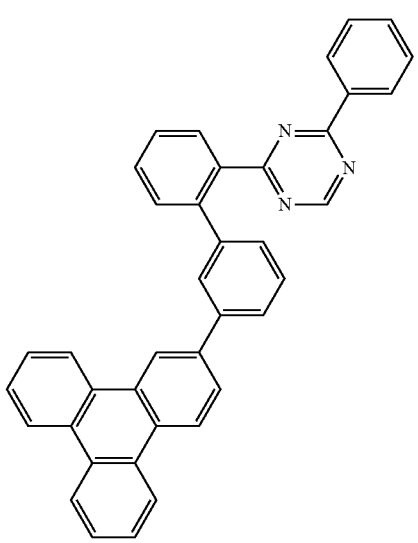

A-67
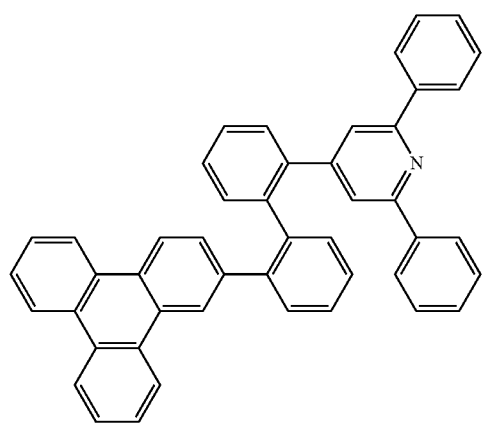
A-68
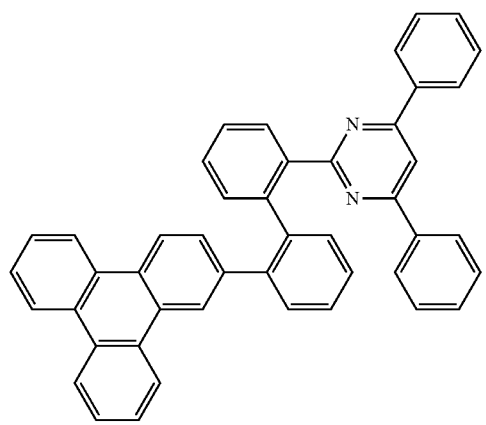
A-69
A-70
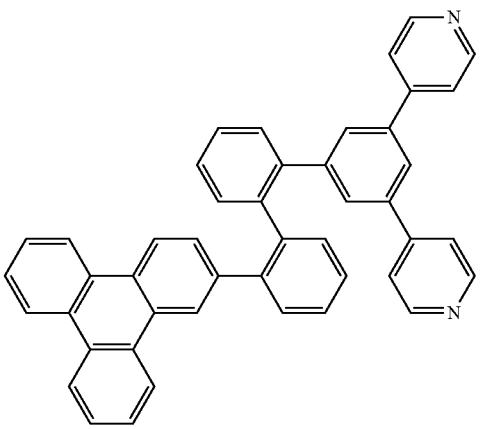
A-71
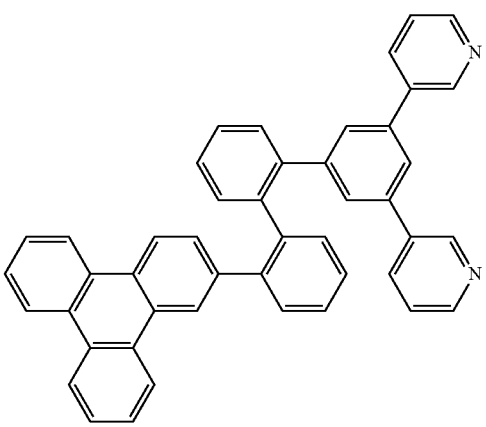
A-72
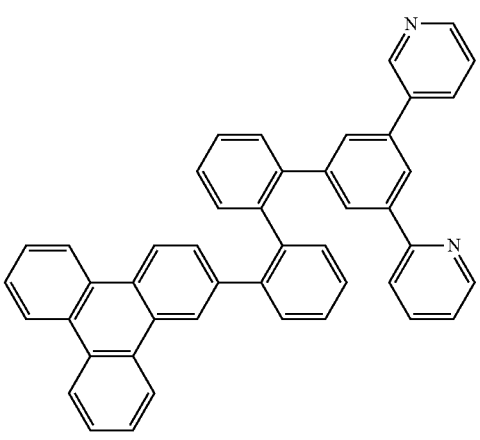

A-73
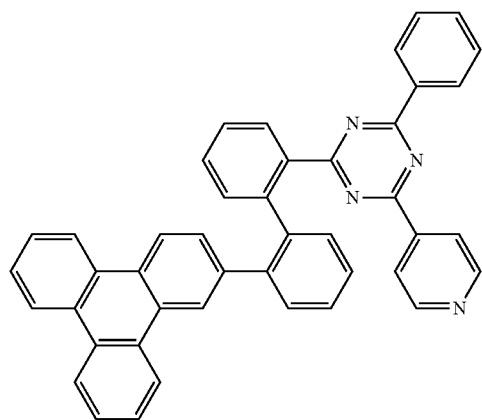
A-74
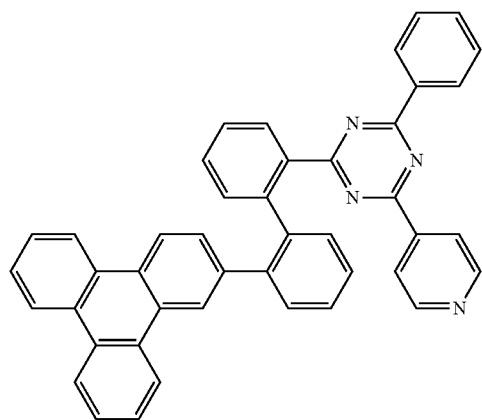
A-75
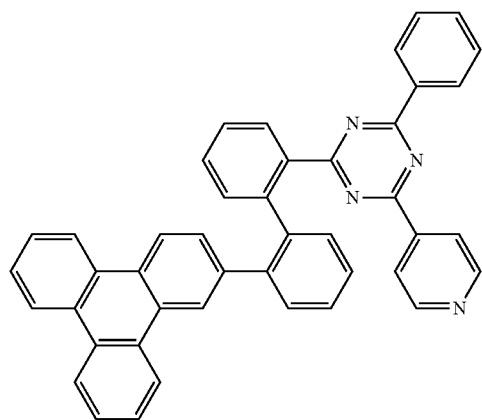
A-76
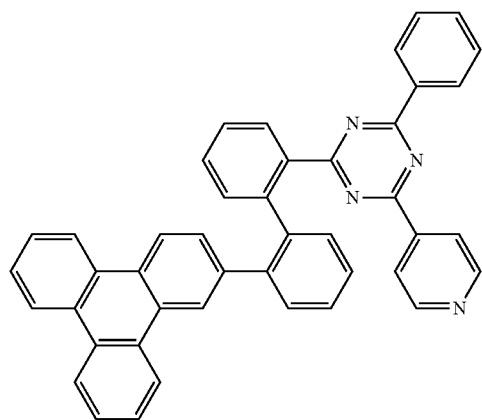
A-77
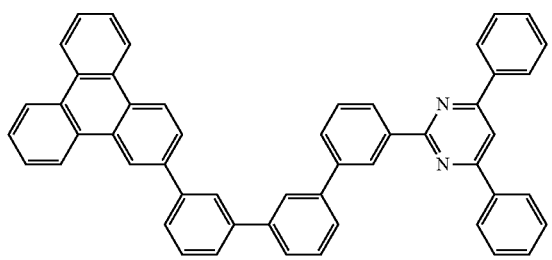
A-78
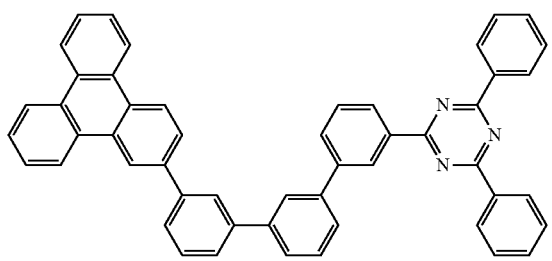
A-79
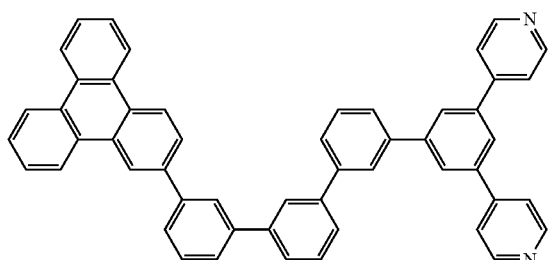
A-80
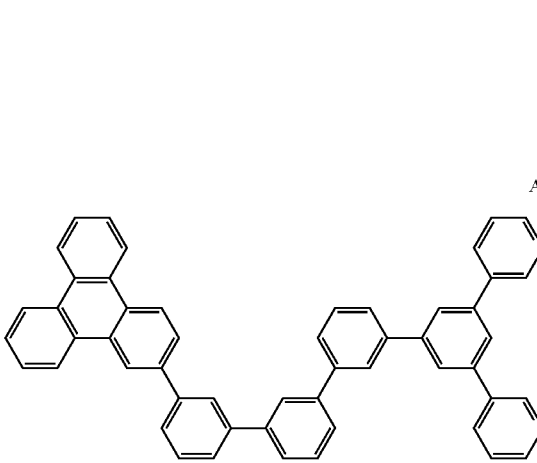
A-81
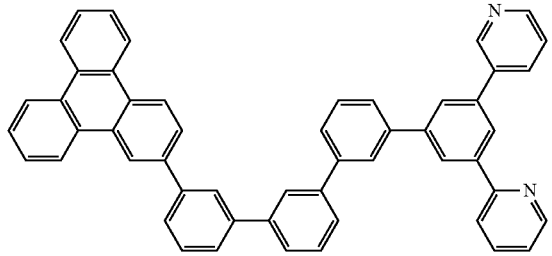

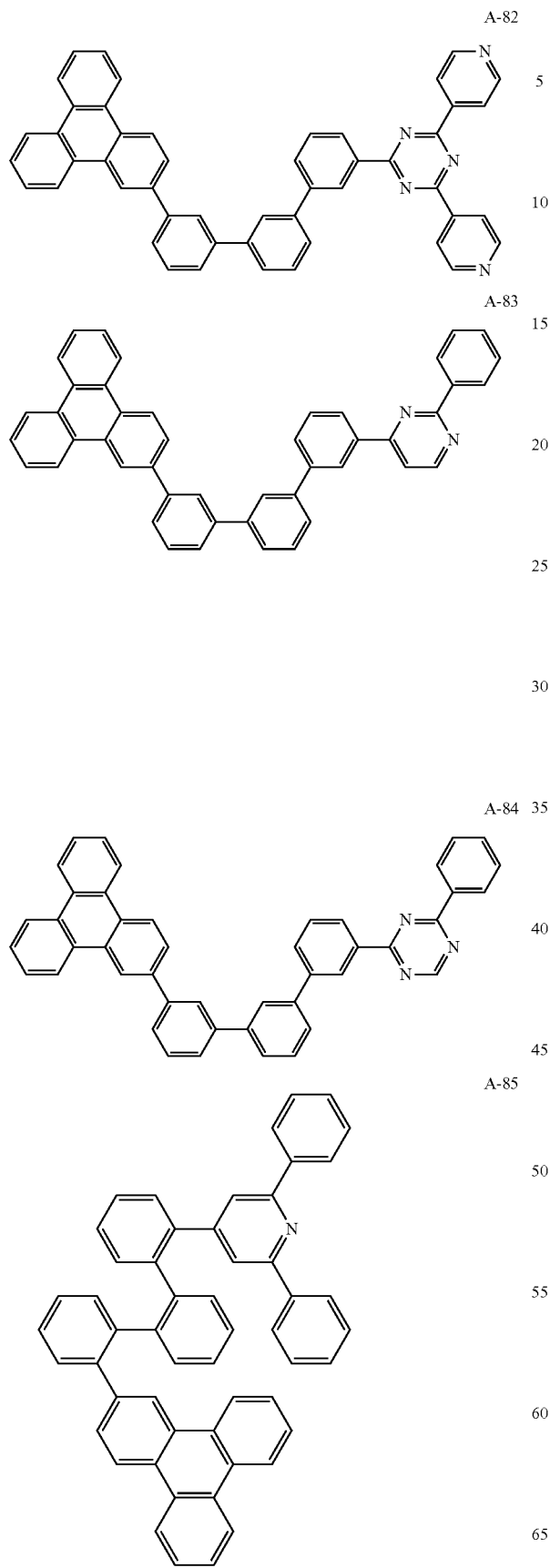
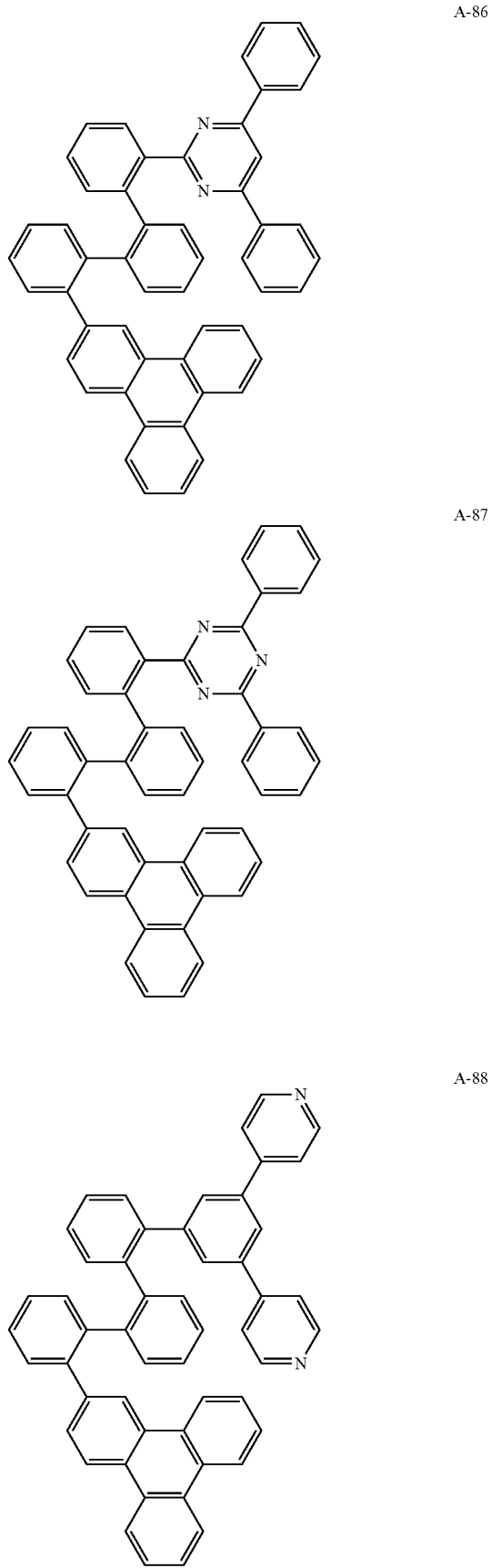

A-89
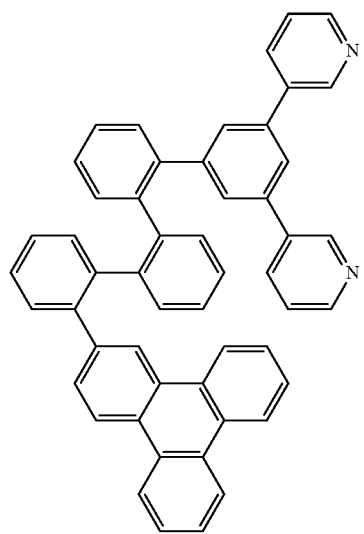
A-90
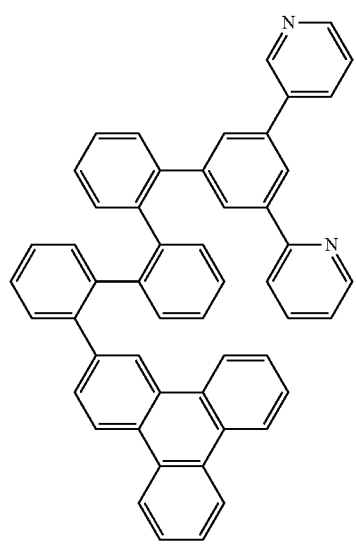
A-91
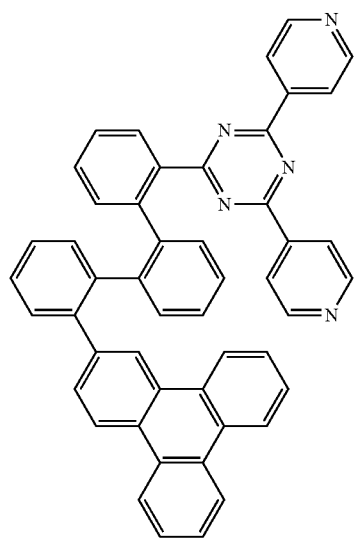
A-92
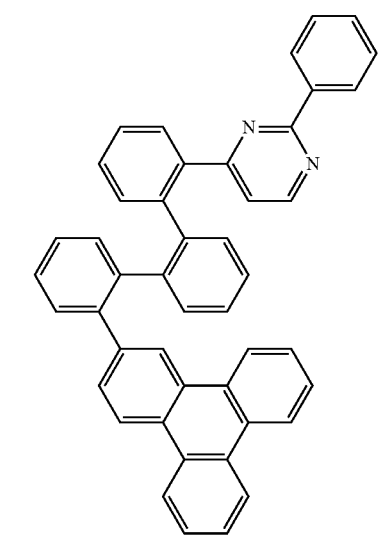
A-93
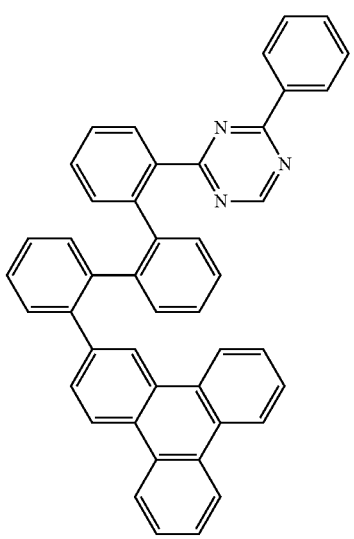
A-94
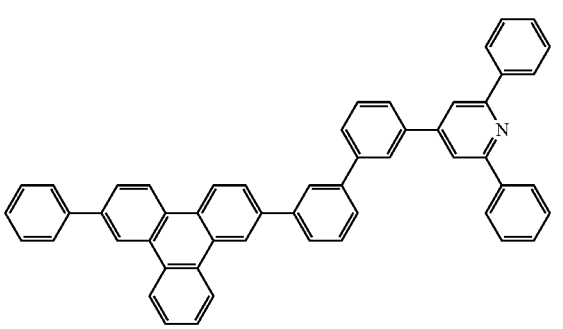

A-95
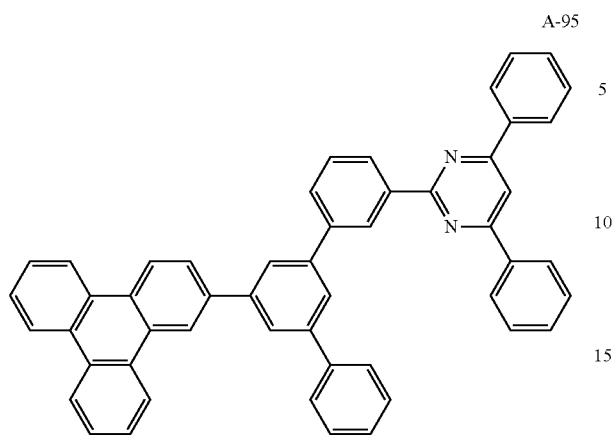
A-99
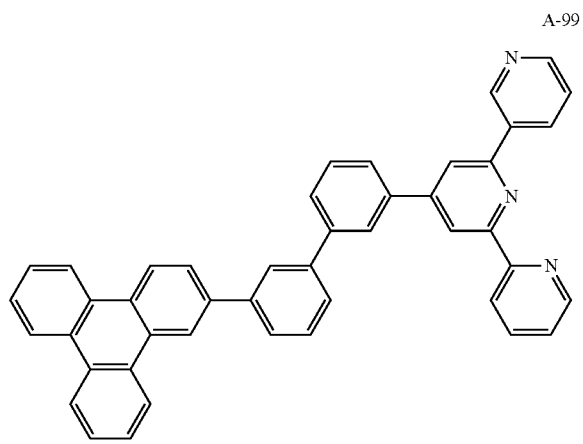
A-96
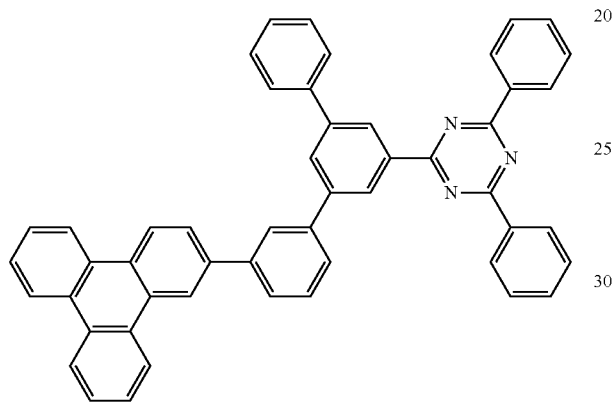
A-100
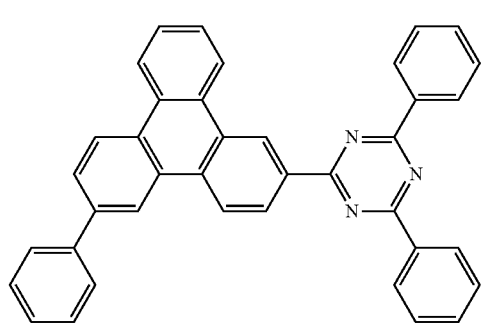
A-97
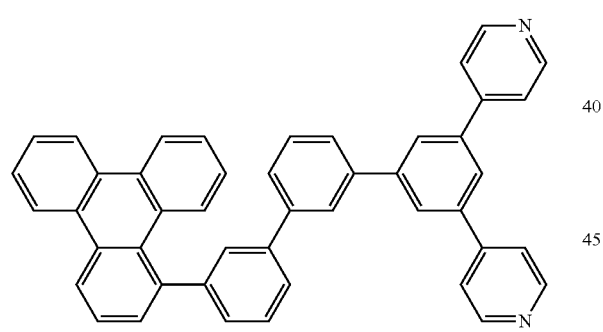
A-101
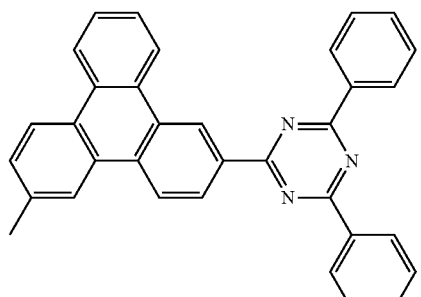
A-98
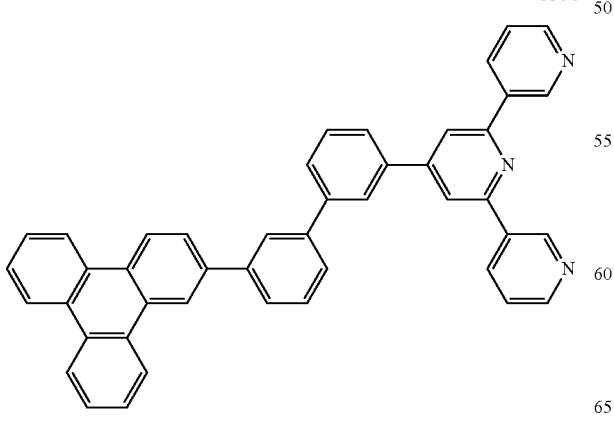
A-102
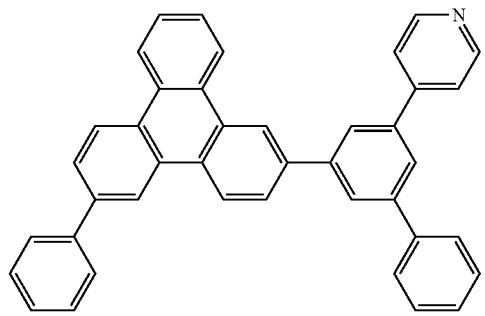

-continued
A-103
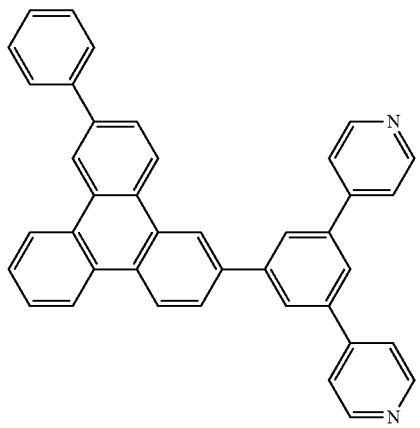
A-104
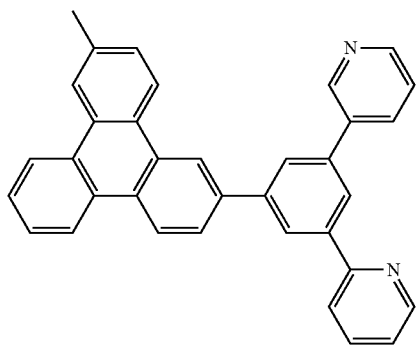
A-105
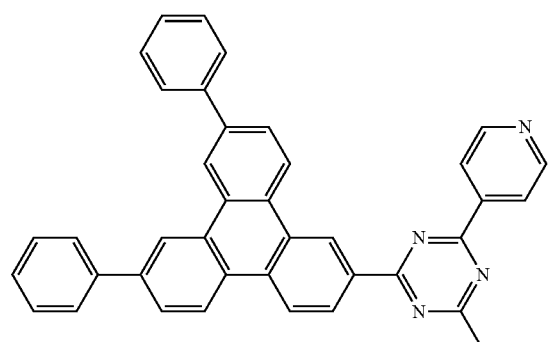
A-106
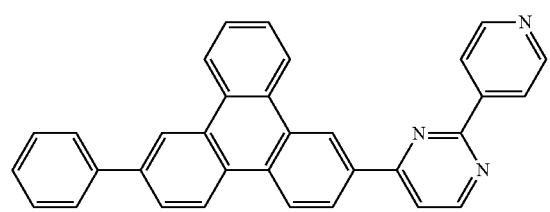
-continued
A-107
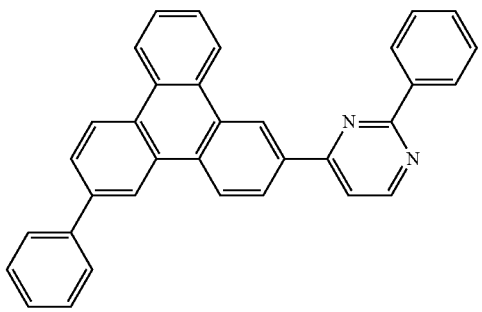
A-108
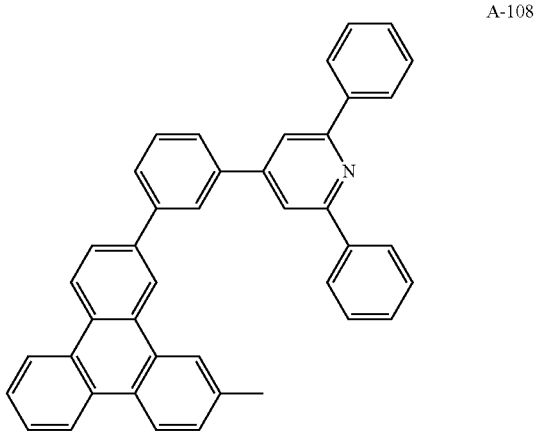
A-109
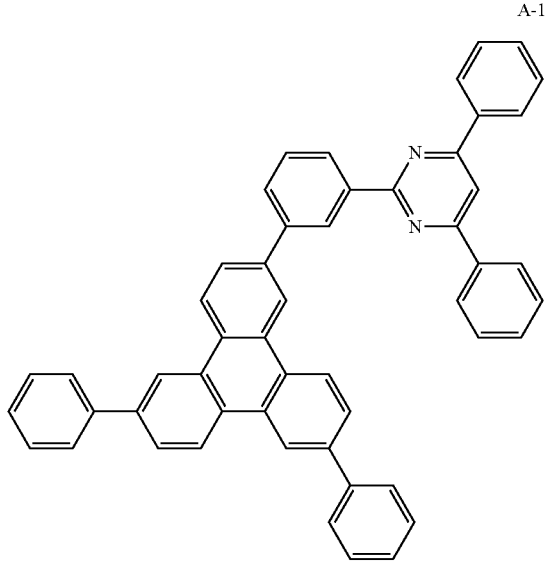

A-110
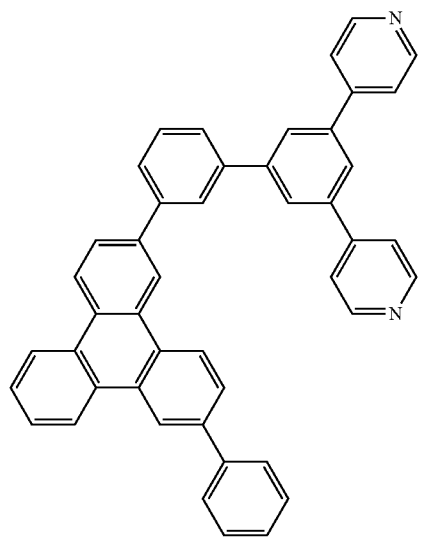
A-111
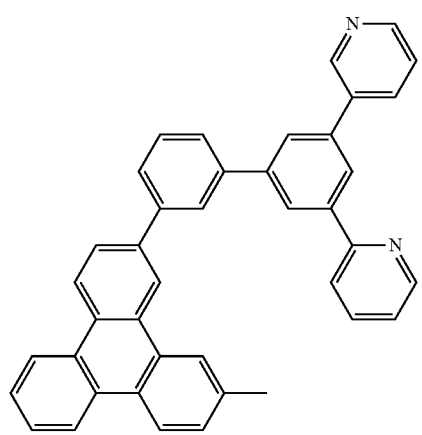
A-112
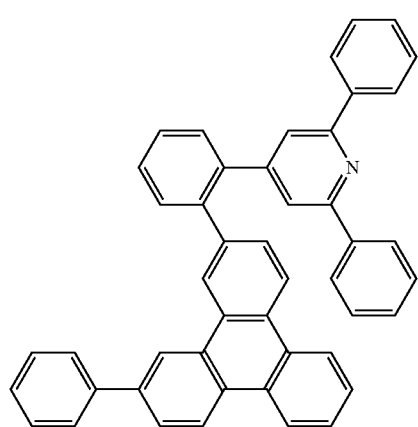
A-113
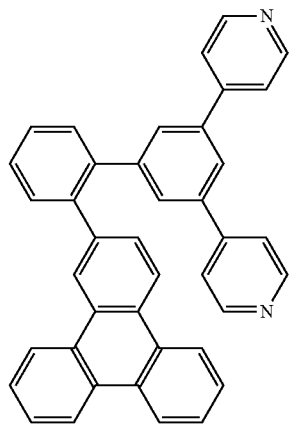
A-114
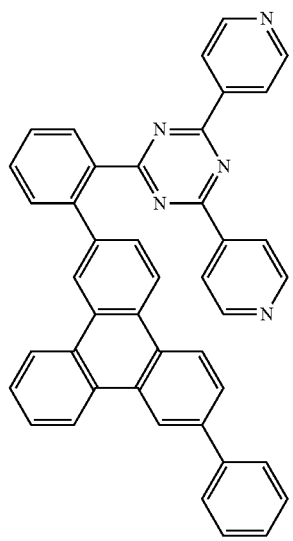
A-115
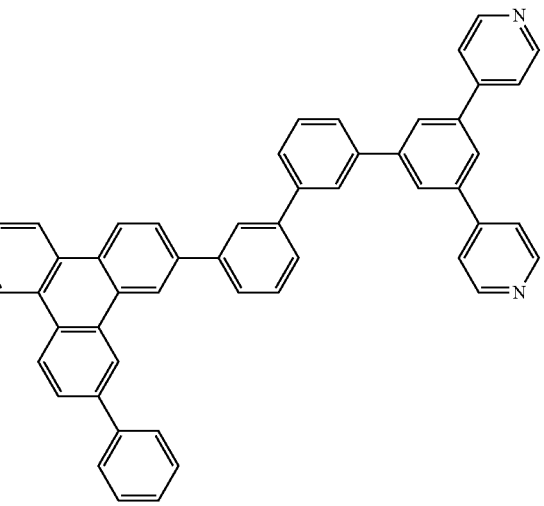

A-116
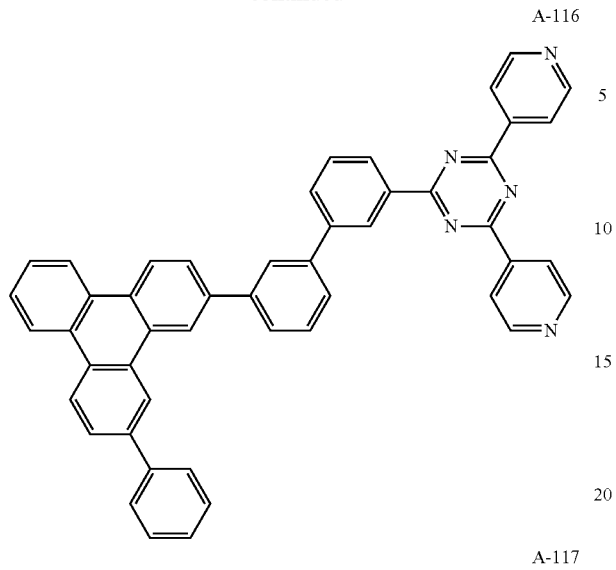
A-117
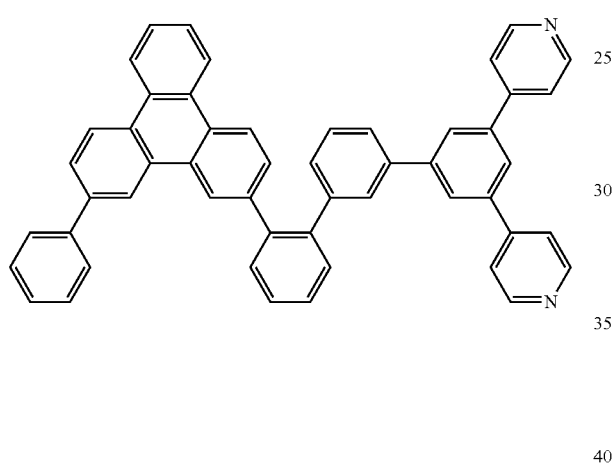
A-118
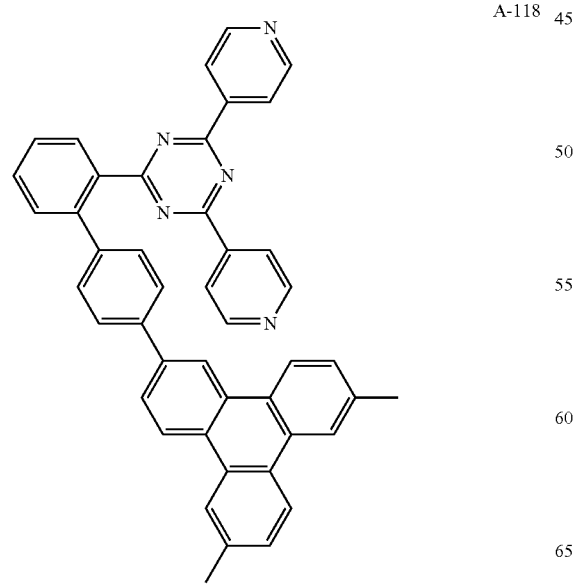
A-119
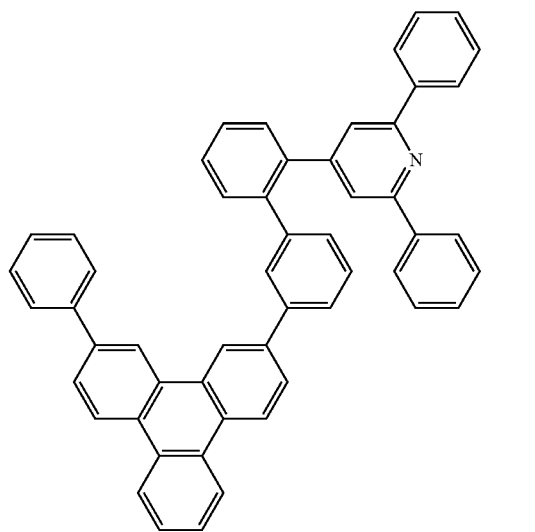
A-120
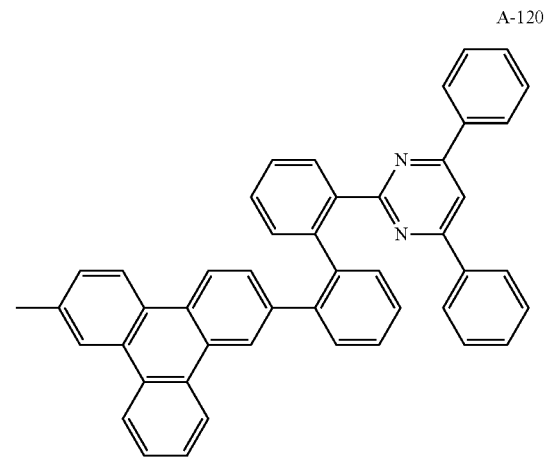
A-121
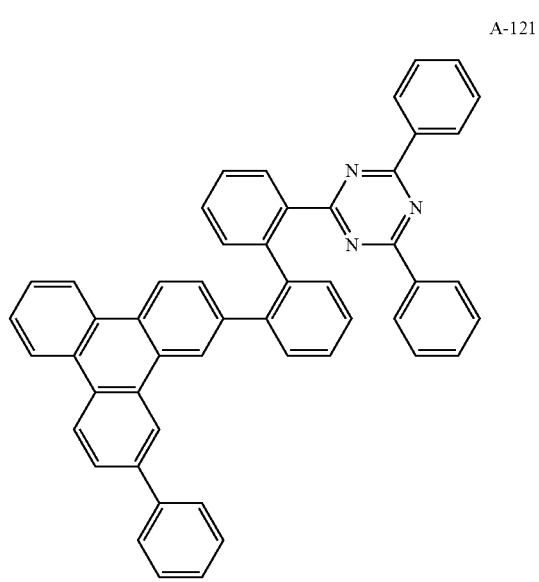

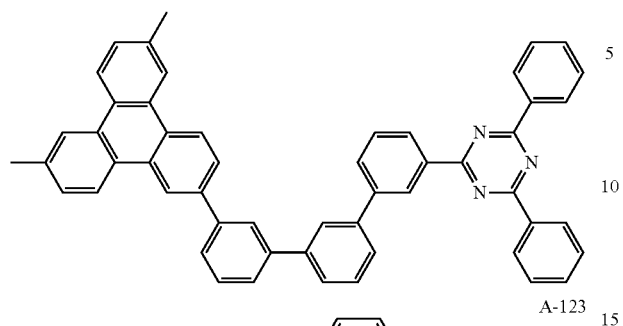

A-122

A-123

A-124

A-125

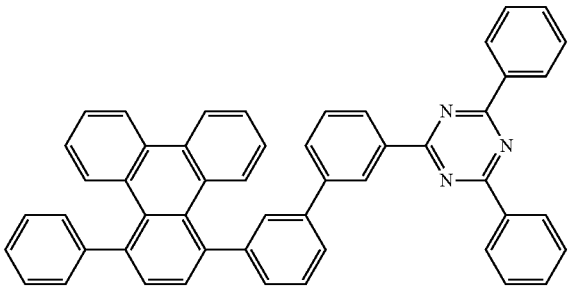

A-126

At least one or more of the first compound may be used.

The second compound and the third compound may be represented by the following Chemical Formula 2.

[Chemcial Formula 2]

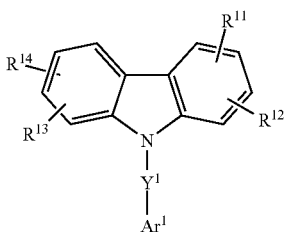

In the above Chemical Formula 2, $Y^1$ is a single bond, a substituted or unsubstituted C1 to C20 alkylenyl group, a substituted or unsubstituted C2 to C20 alkenylenyl group, a substituted or unsubstituted C6 to C30 arylenyl group, a substituted or unsubstituted C2 to C30 heterocyclic group, or a combination thereof, $Ar^1$ is a substituted or unsubstituted C6 to C30 aryl group, a substituted or unsubstituted C2 to C30 heterocyclic group, or a combination thereof, $R^{11}$ to $R^{14}$ are independently hydrogen, deuterium, a substituted or unsubstituted C1 to C20 alkyl group, a substituted or unsubstituted C6 to C50 aryl group, a substituted or unsubstituted C2 to C50 heterocyclic group, or a combination thereof, and at least one of $R^{11}$ to $R^{14}$ and $Ar^1$ includes a substituted or unsubstituted triphenylenyl group or a substituted or unsubstituted carbazolyl group.

The compound represented by the above Chemical Formula 2 is a compound that may have bipolar characteristics in which hole characteristics are relatively strong, may increase charge mobility and stability in an emission layer along with the first compound, may be used in a hole transport auxiliary layer that is adjacent to an emission layer, and may prevent accumulation of holes and/or electrons at the interface between the hole transport layer (HTL) and the emission layer and may increase charge balance. Therefore, luminous efficiency and life-span characteristics of an organic optoelectric device may be remarkably increased.

The compound represented by above Chemical Formula 2 may be, for example, represented by at least one of the following Chemical Formulae 2-I to 2-III.

[Chemical Formula 2-I]

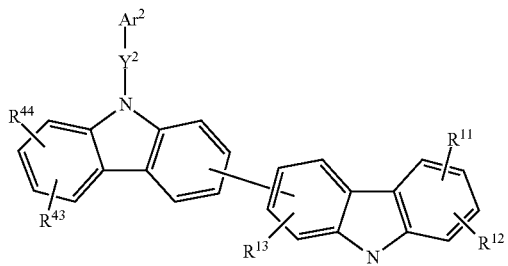

[Chemical Formula 2-II]

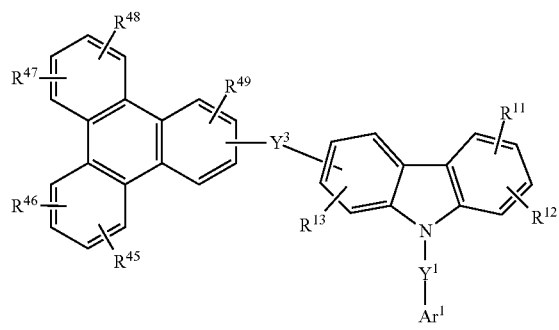

[Chemical Formula 2-III]

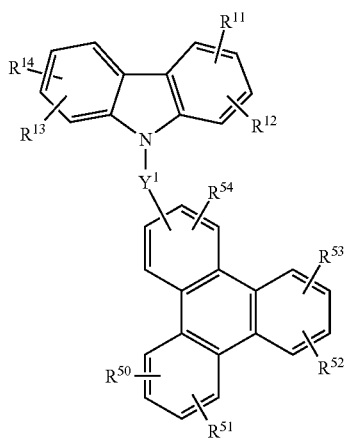

In the above Chemical Formulae 2-I to 2-III, $Y^1$ to $Y^3$ are independently a single bond, a substituted or unsubstituted C1 to C20 alkylenyl group, a substituted or unsubstituted C2 to C20 alkenylenyl group, a substituted or unsubstituted C6 to C30 arylenyl group, a substituted or unsubstituted C2 to C30 heterocyclic group, or a combination thereof, $Ar^1$ and $Ar^2$ are independently a substituted or unsubstituted C6 to C30 aryl group, a substituted or unsubstituted C2 to C30 heterocyclic group, or a combination thereof, and $R^{11}$ to $R^{14}$ and $R^{43}$ to $R^{54}$ are independently hydrogen, deuterium, a substituted or unsubstituted C1 to C20 alkyl group, a substituted or unsubstituted C6 to C50 aryl group, a substituted or unsubstituted C2 to C50 heterocyclicheterocyclic group, or a combination thereof.

The compound represented by the above Chemical Formula 2-I may have a structure where two carbazolyl groups having a substituent are linked to each other.

$Ar^1$ and $Ar^2$ of the above Chemical Formula 2-I are a substituent having electron or hole characteristics, and may be, for example, a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted carbazolyl group, a substituted or unsubstituted benzofuranyl group, a substituted or unsubstituted benzothiophenyl group, a substituted or unsubstituted fluorenyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted triphenylene group, a substituted or unsubstituted dibenzofuranyl group, a substituted or unsubstituted dibenzothiophenyl group, or a combination thereof.

At least one of $Ar^1$ and $Ar^2$ of the above Chemical Formula 2-I may be, for example, a substituent having electron characteristics, and may be, for example, a substituent represented by the following Chemical Formula A.

[Chemical Formula A]

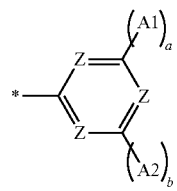

In the above Chemical Formula A,

Z is independently N or $CR^b$,

A1 and A2 are independently a substituted or unsubstituted C6 to C30 aryl group, a substituted or unsubstituted C2 to C30 heterocyclic group, or a combination thereof, at least one of the Z, A1 and A2 includes N, and a and b are independently 0 or 1.

The substituent represented by the above Chemical Formula A may be, for example, a functional group selected from the following Group 3.

[Group 3]

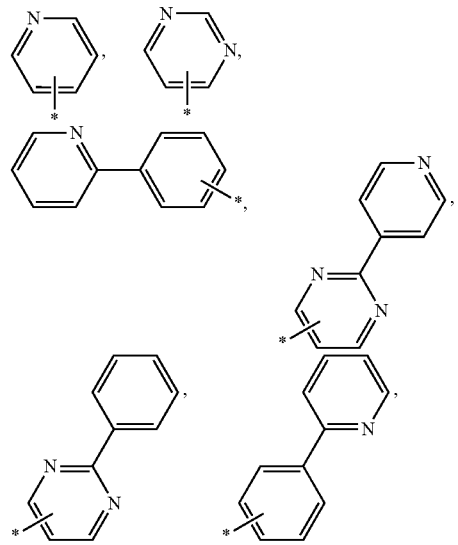

-continued
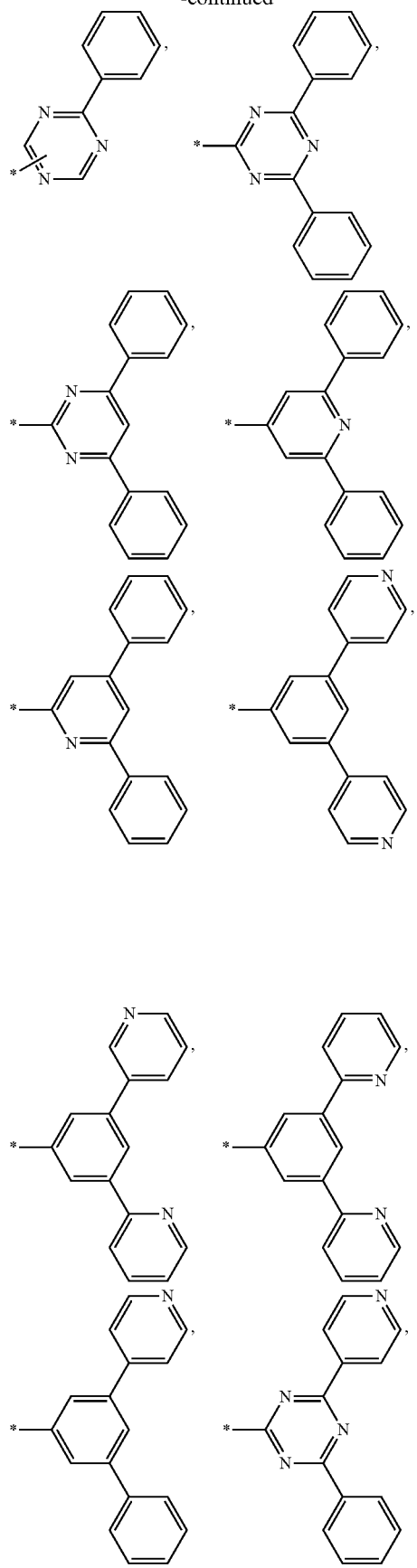
-continued
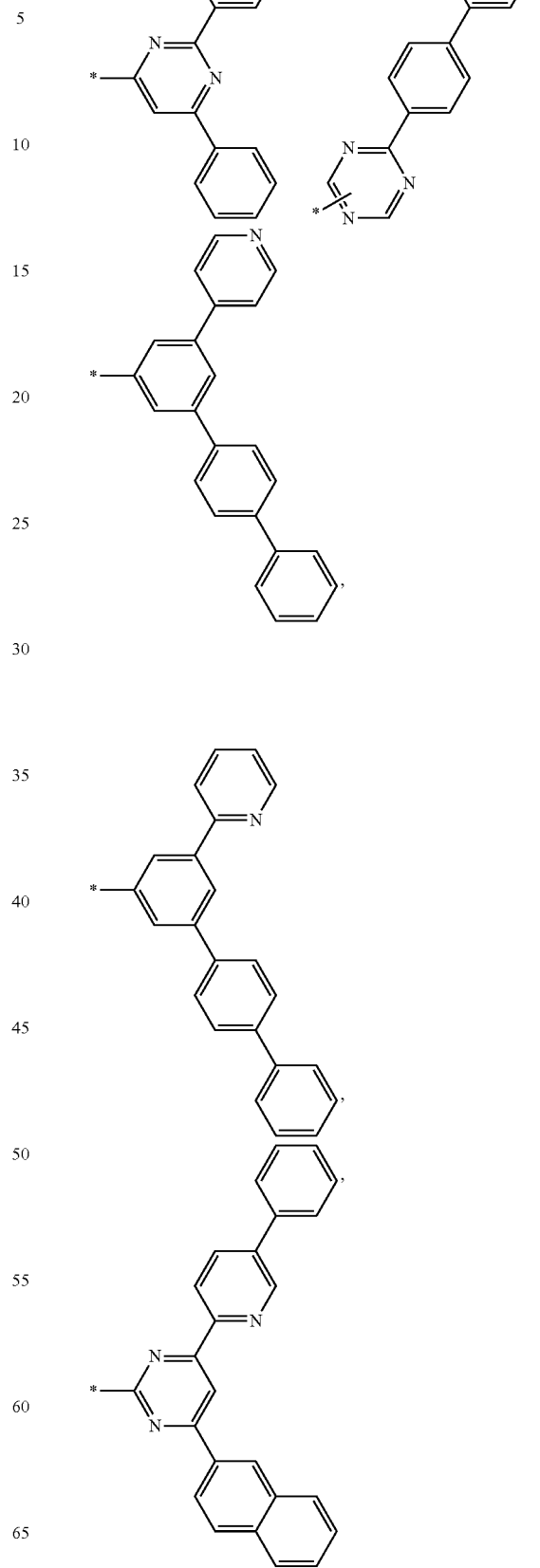

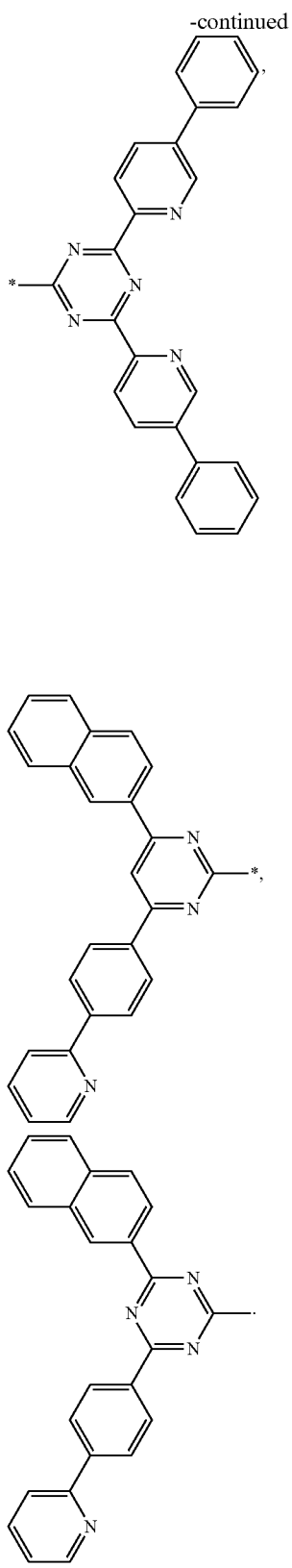
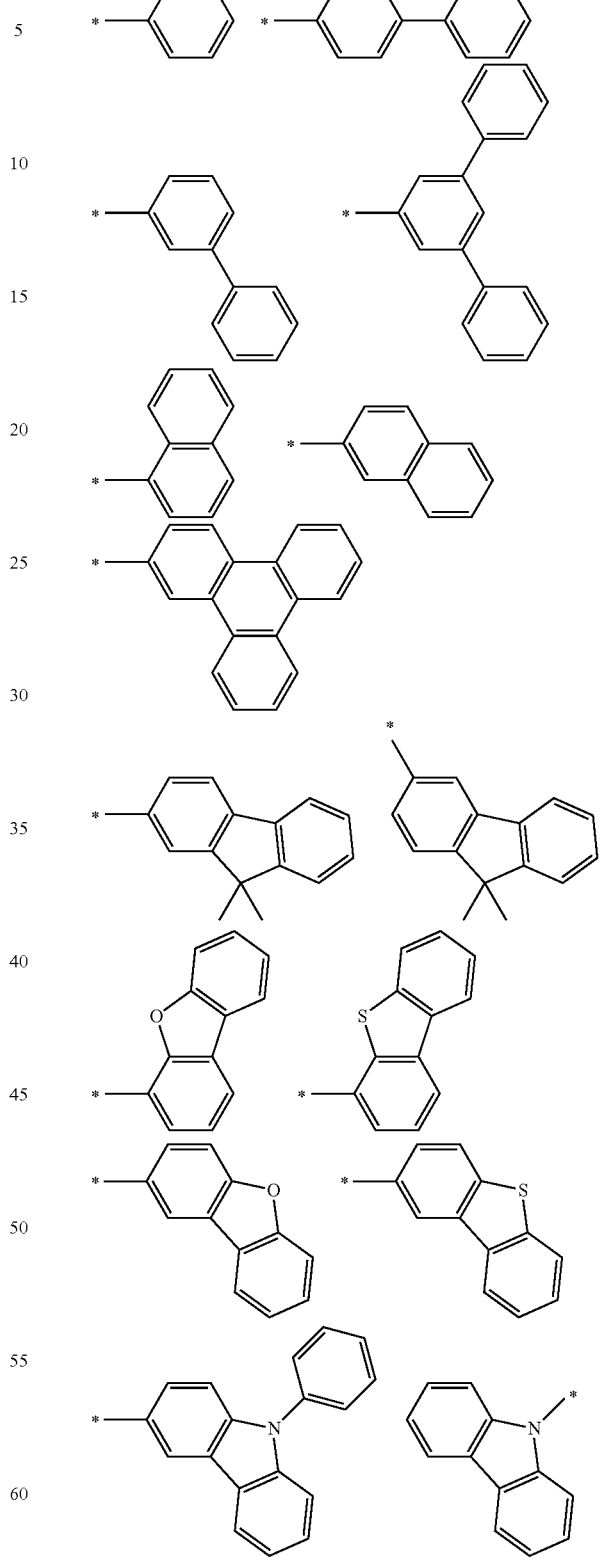
[Group 4]
In addition, at least one of Ar[1] and Ar[2] of the above Chemical Formula 2-I may be, for example, a substituent having hole characteristics, and may be, for example, a substituent selected from the following Group 4.
The compound represented by the above Chemical Formula 2-I may be, for example, a compound selected from the following Group 5.

[Group 5]
B-10
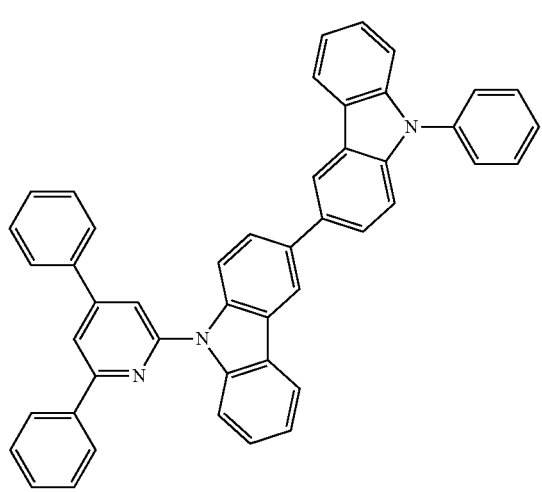
B-11
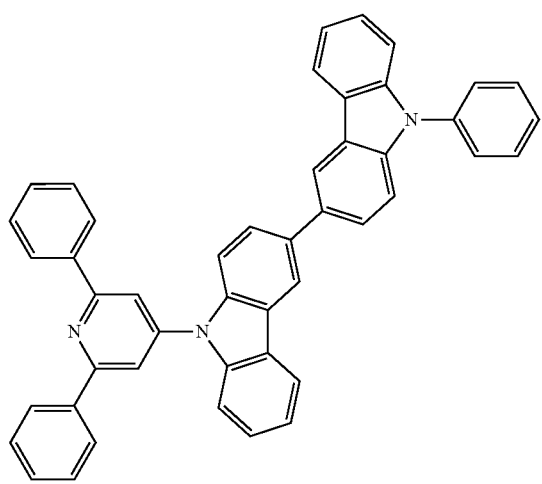
B-12
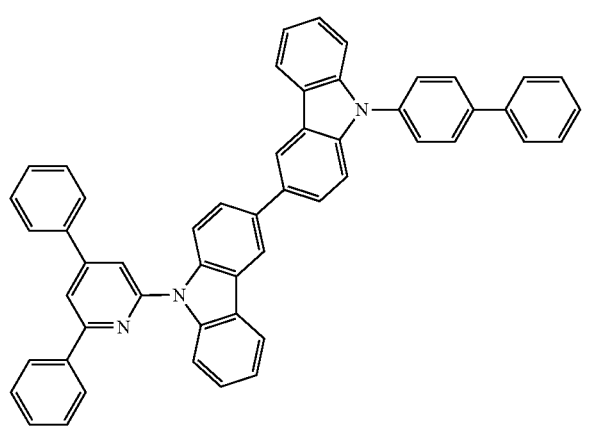
B-13
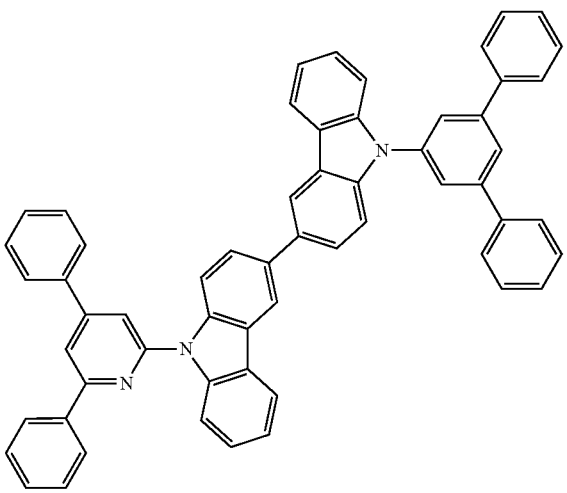
B-14
B-15
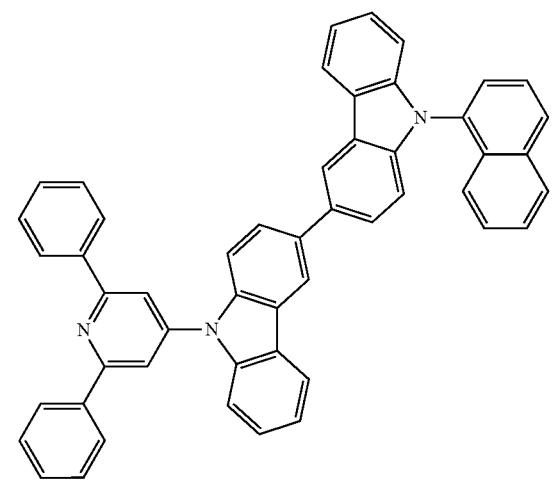

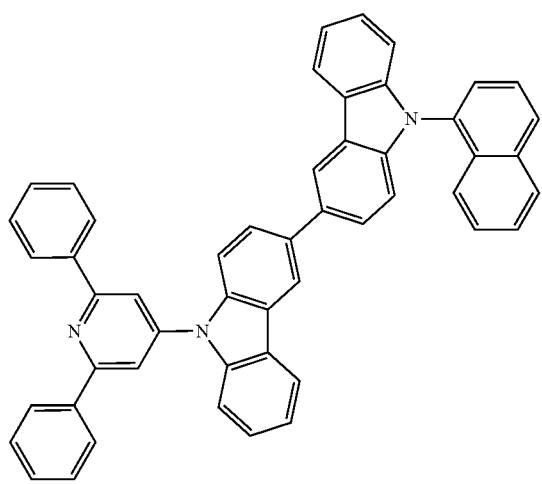
B-16
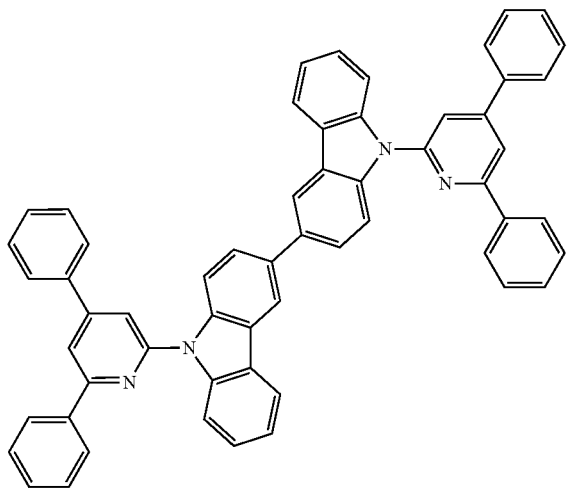
B-19
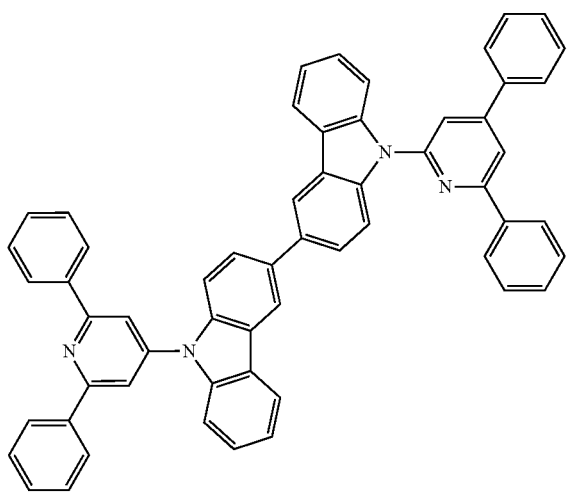
B-20
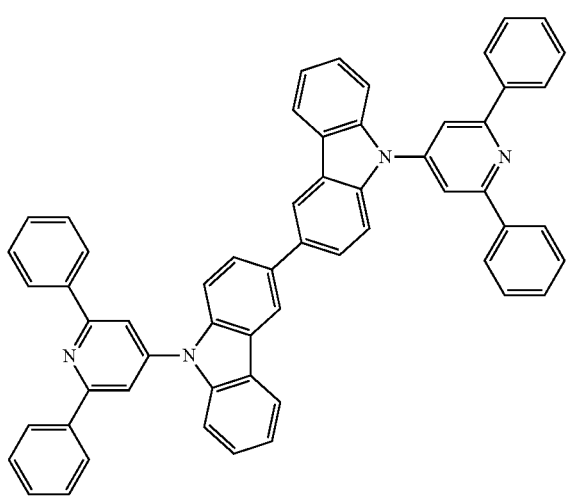
B-21

B-22
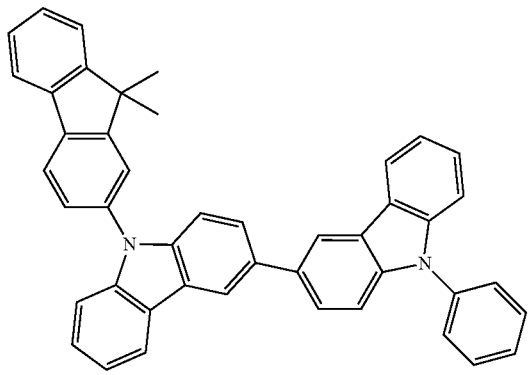
B-23
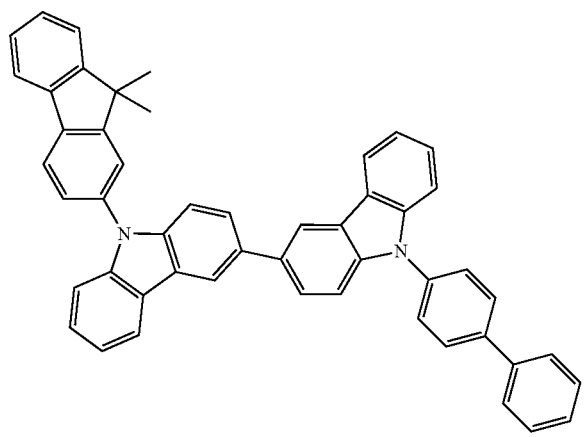
B-24
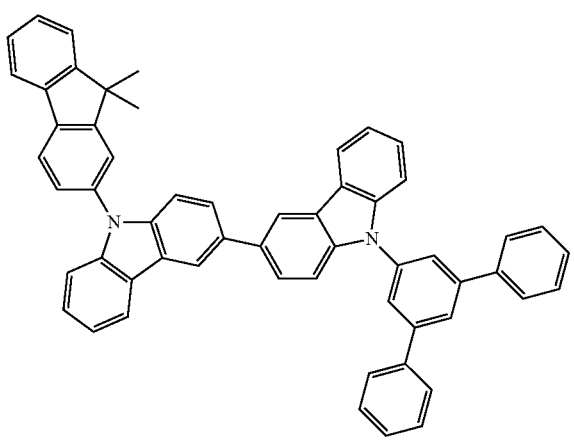
B-25
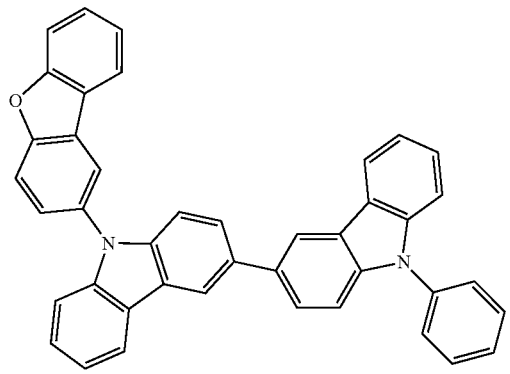
B-26
B-27
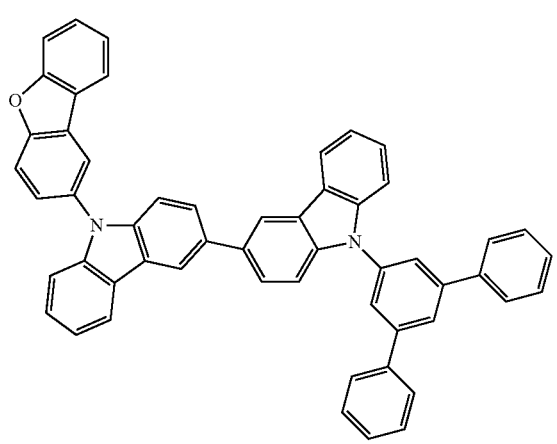

B-28
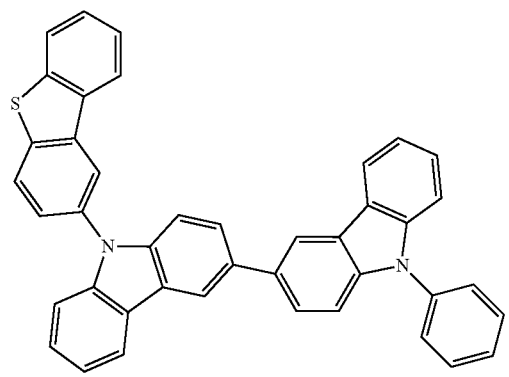
B-31
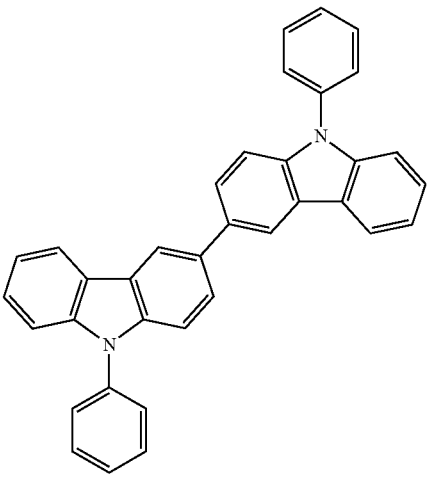
B-29
B-32
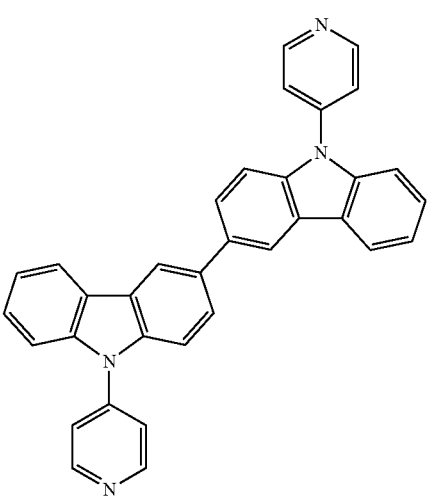
B-30
B-33
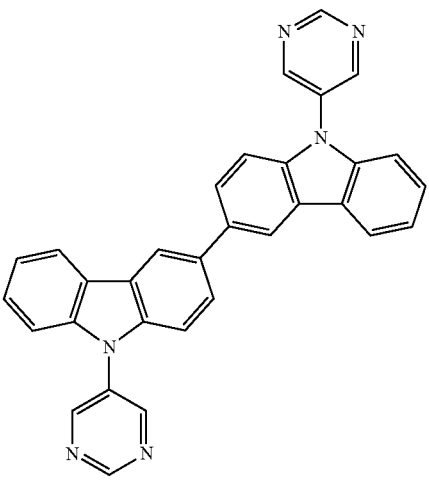

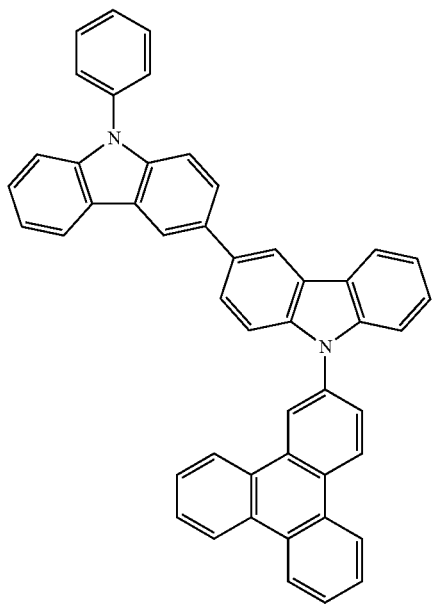
B-34
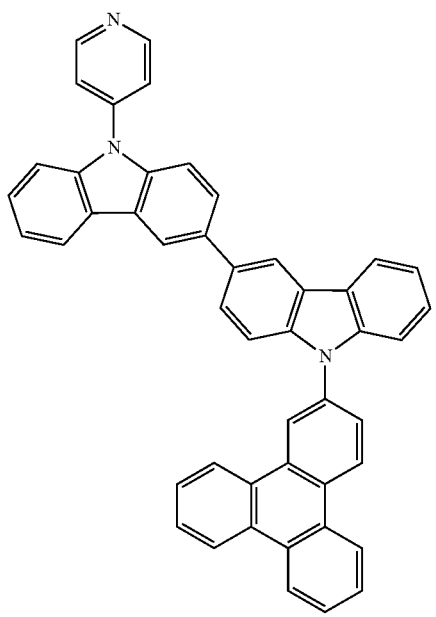
B-35
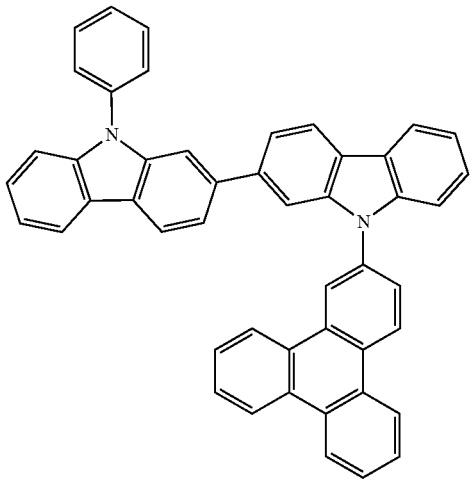
B-37
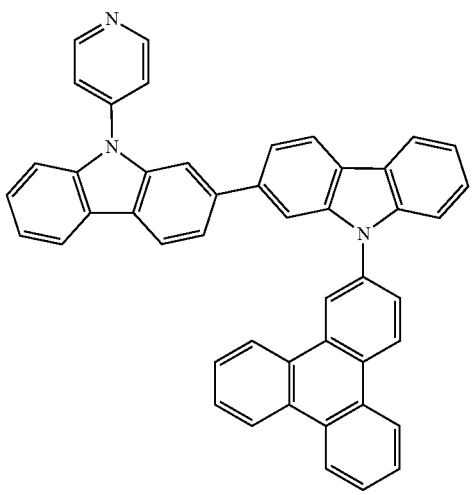
B-38
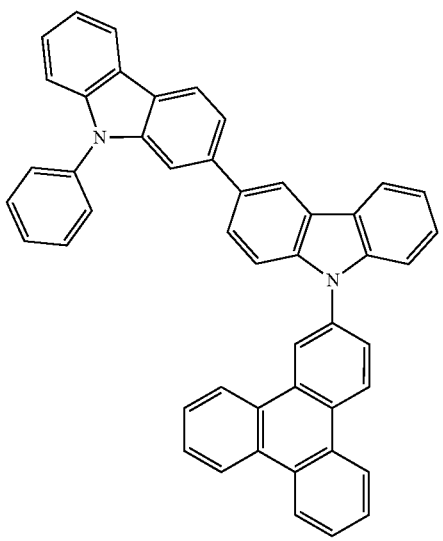
B-40

B-41
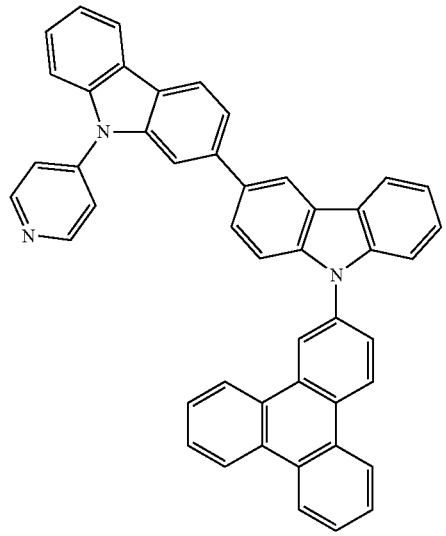
B-44
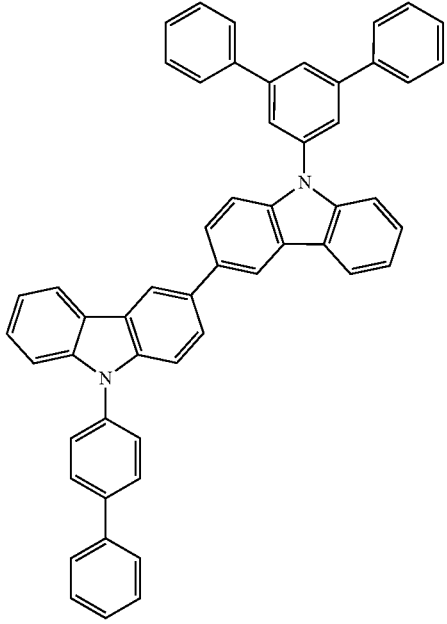
B-43
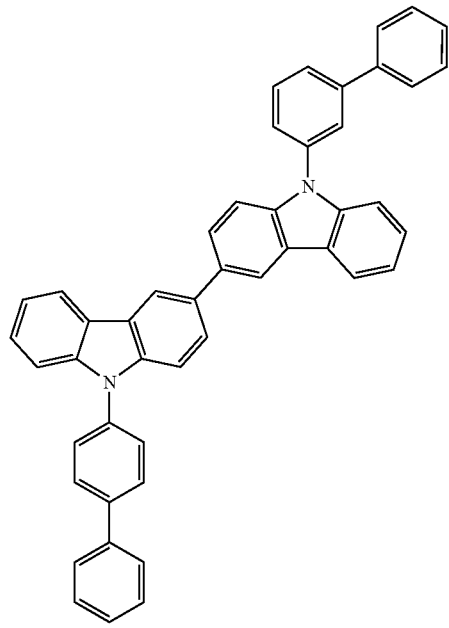
B-45
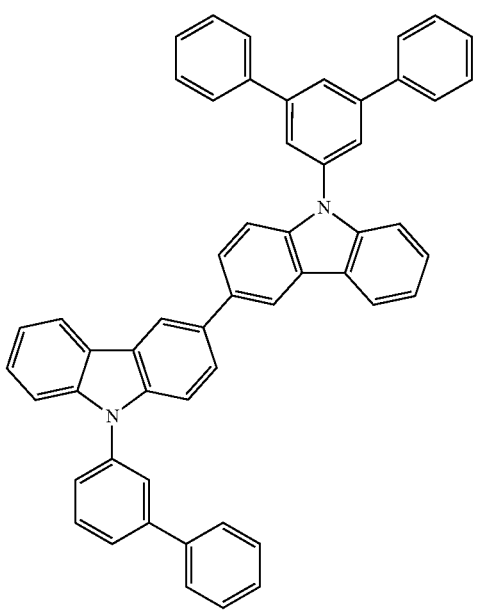

B-46
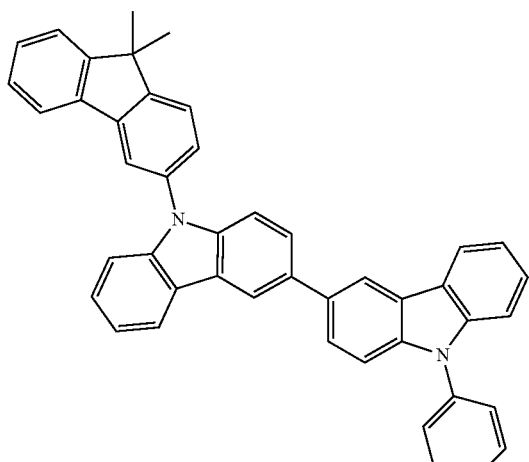
B-47
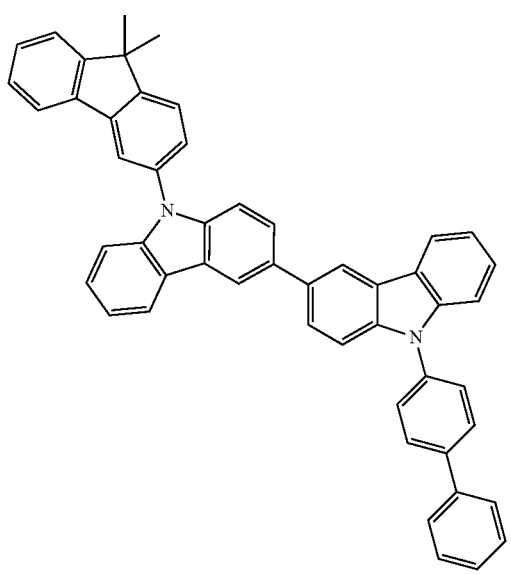
B-48
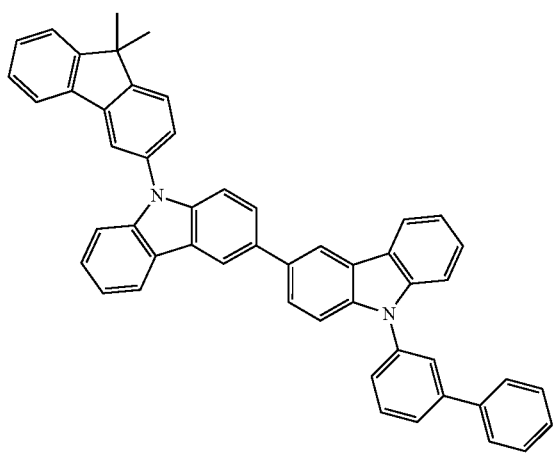
B-49
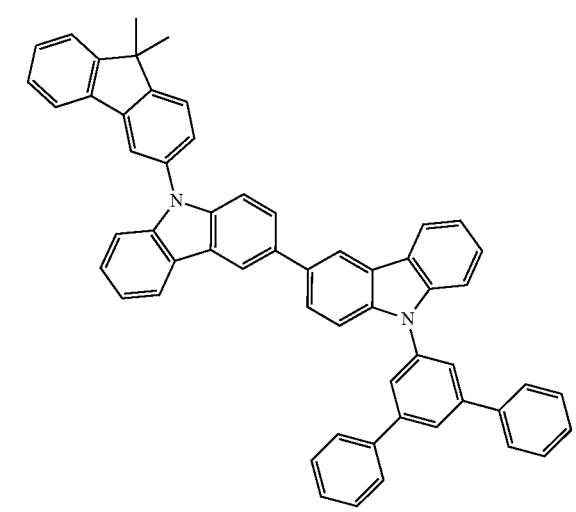
B-50
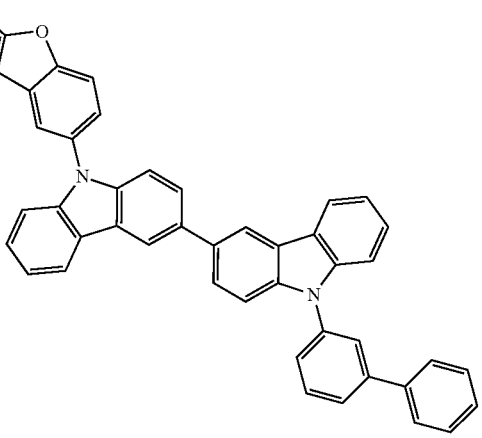
B-51
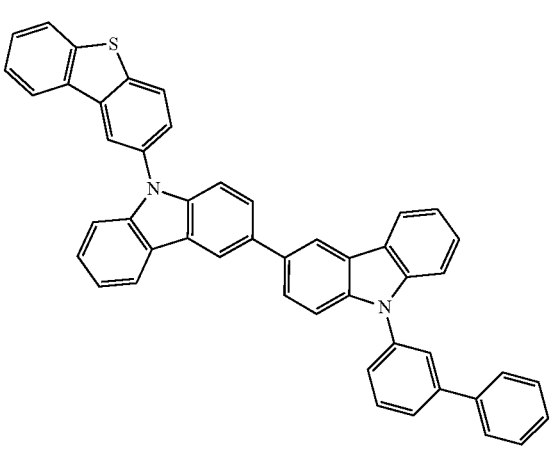

B-52
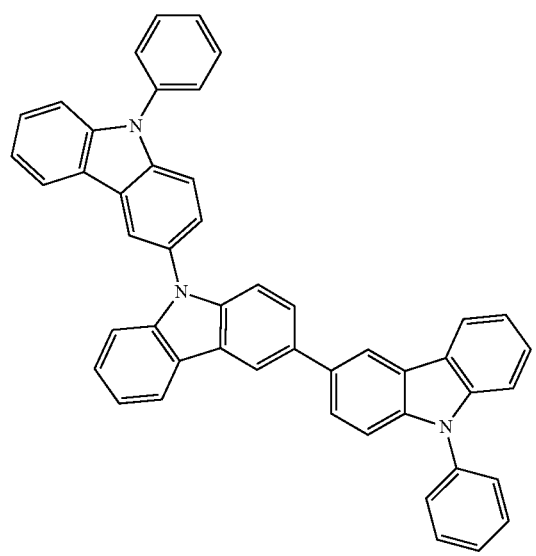
B-55
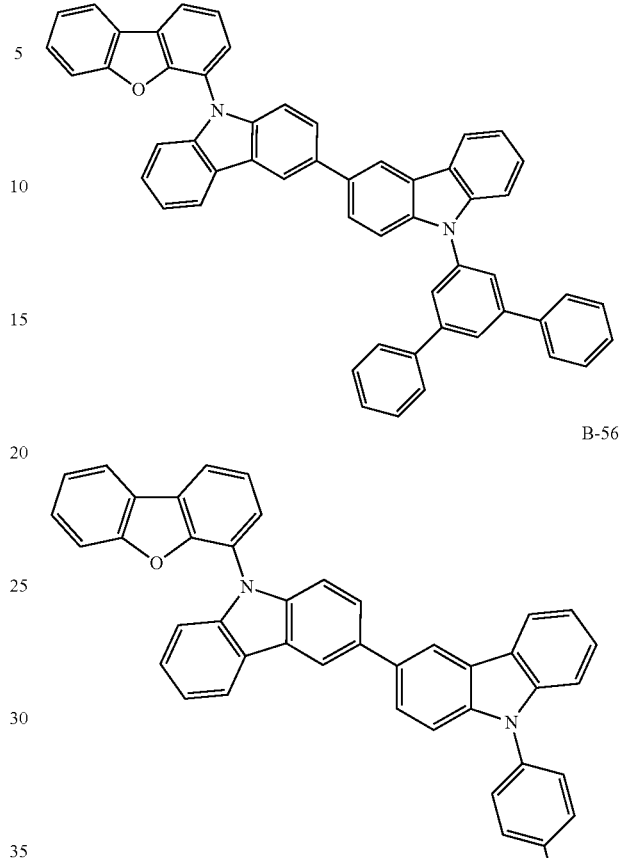
B-53
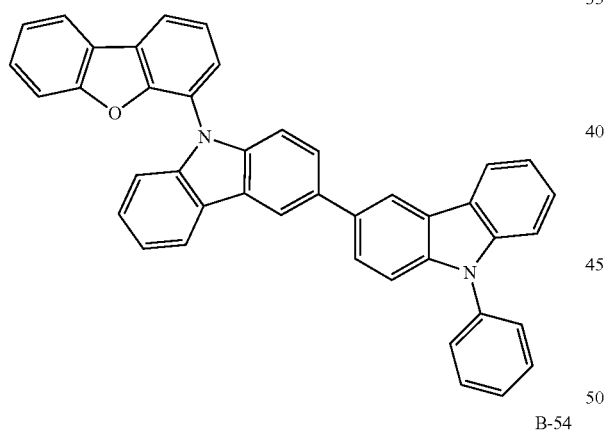
B-54
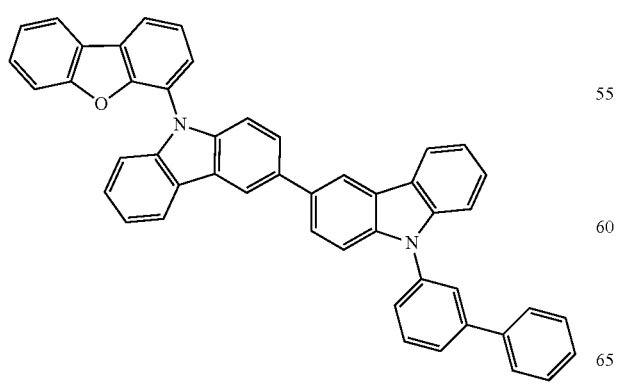
B-57
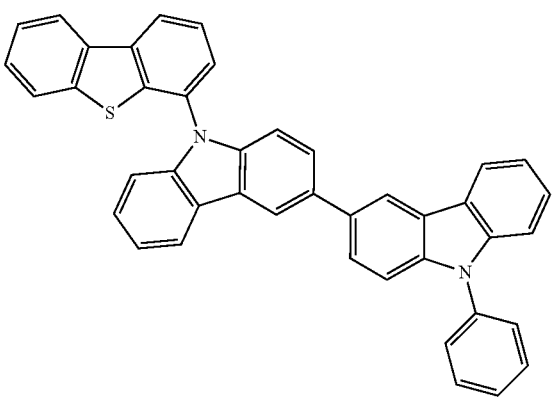

-continued
B-58
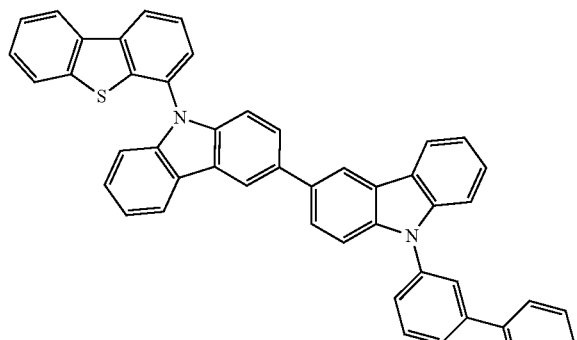
B-59
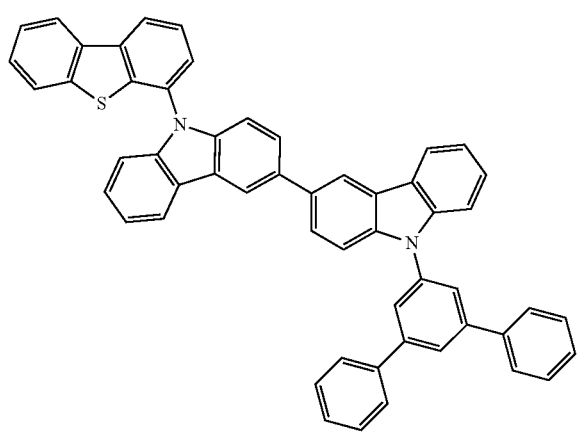
B-60
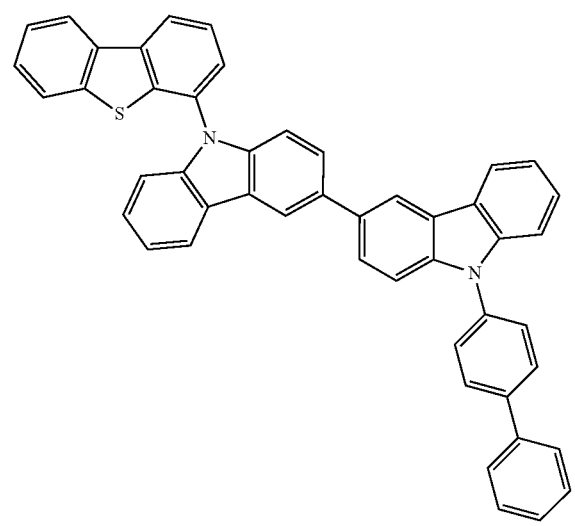
-continued
B-61
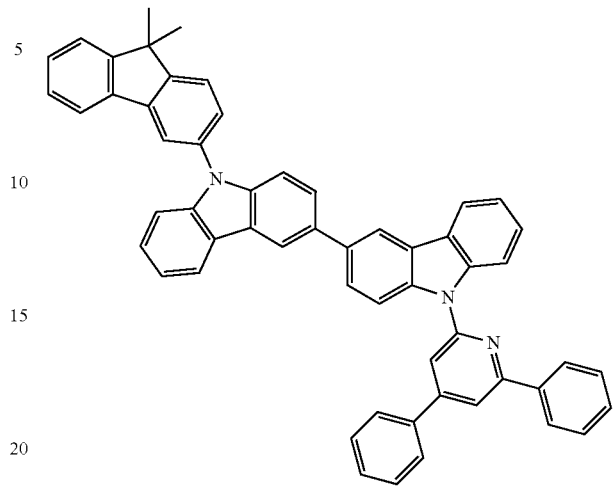
B-62
B-63

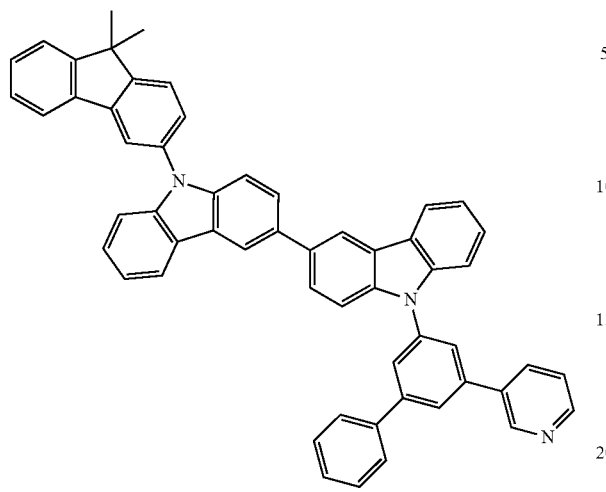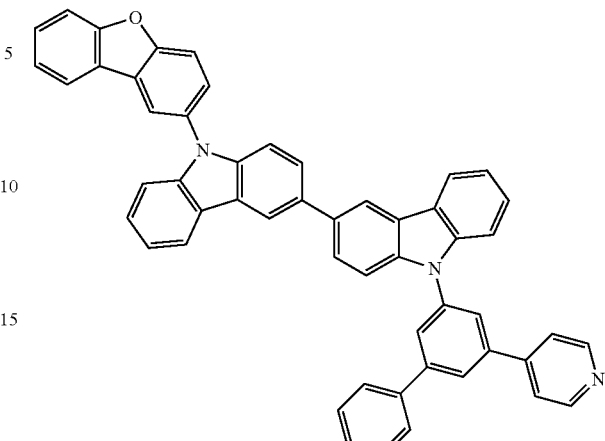

B-70
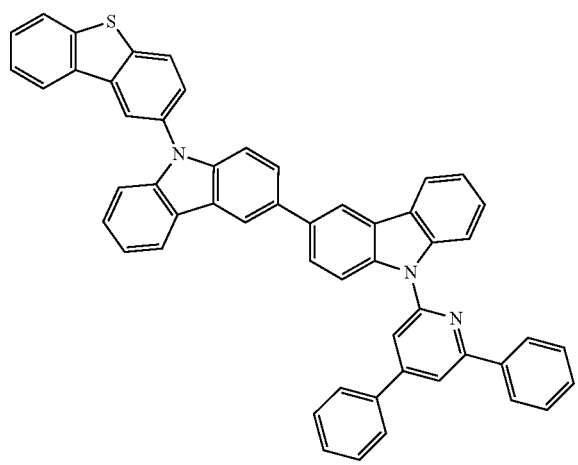
B-73
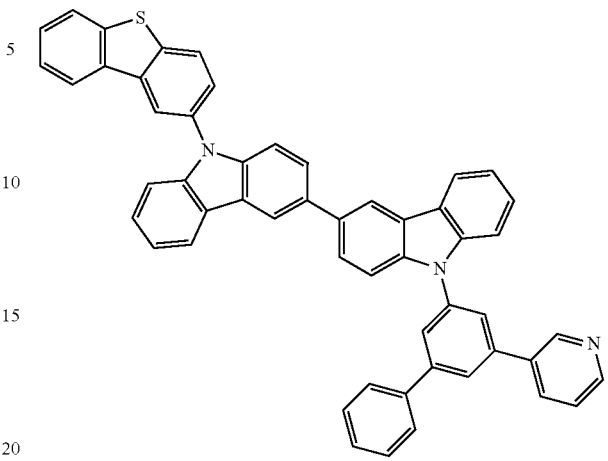
B-71
B-74
B-72
B-75
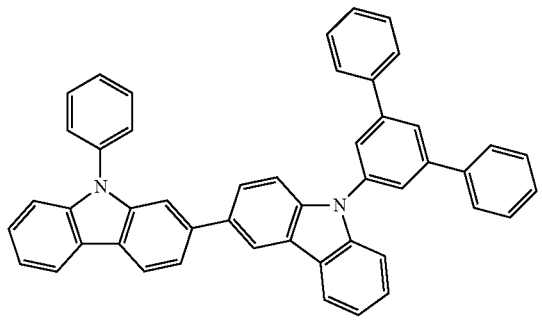
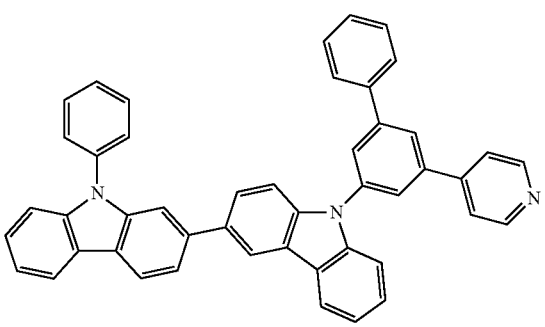
B-76
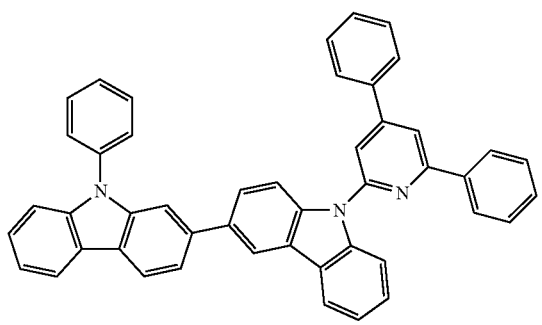

B-77
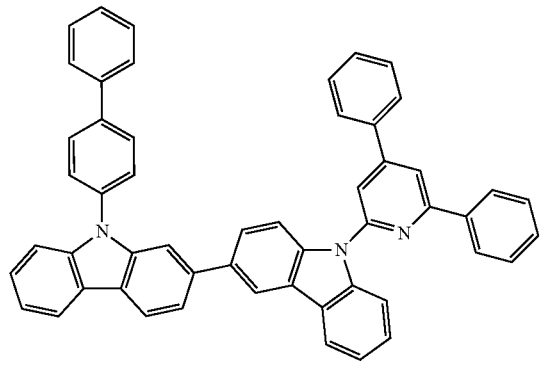
B-78
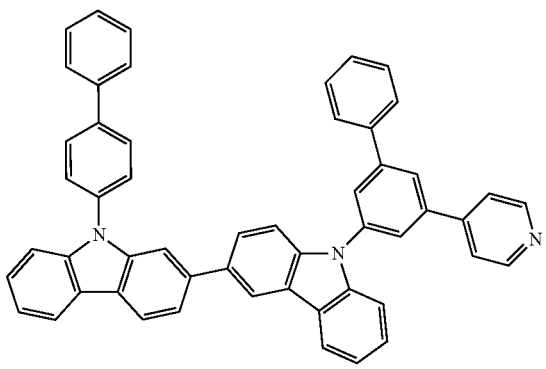
B-79
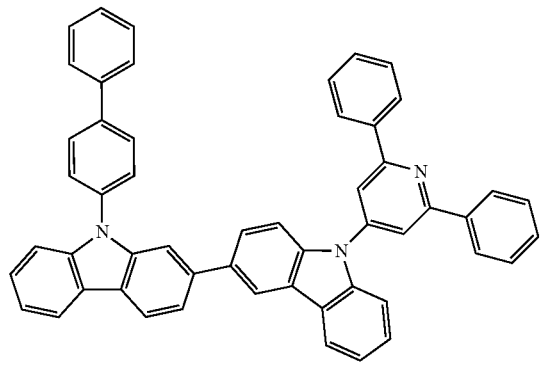
B-80
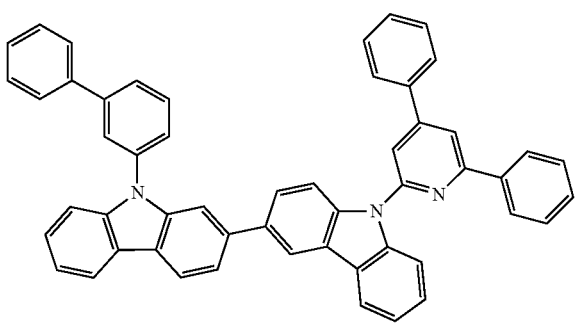
B-81
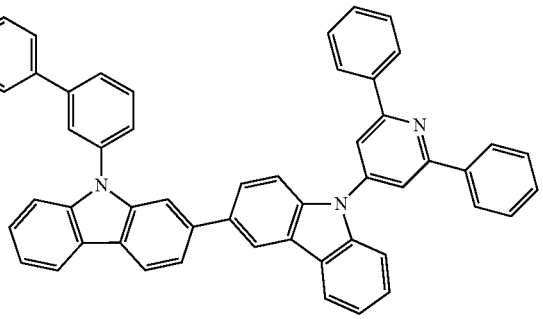
B-82
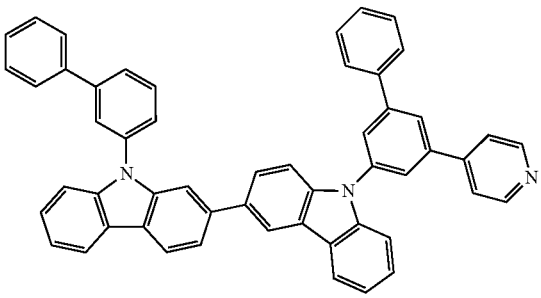
B-83
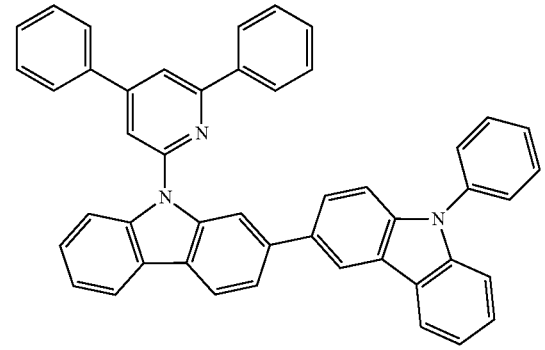
B-84
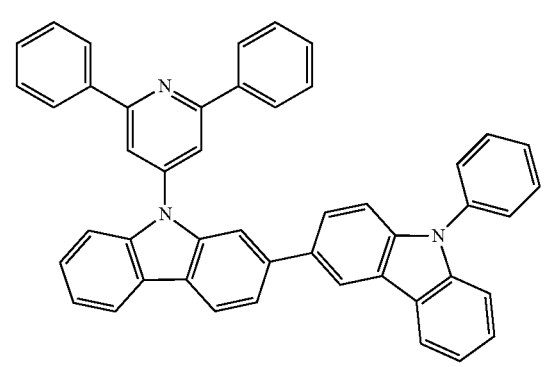

-continued
B-85
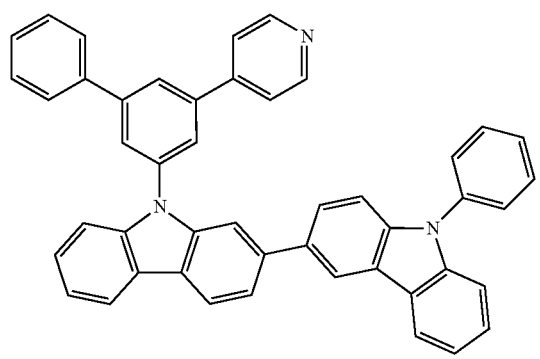
B-86
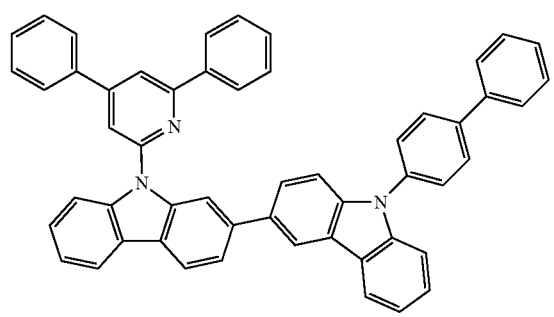
B-87
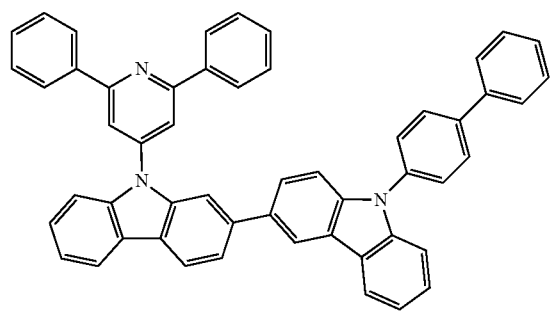
B-88
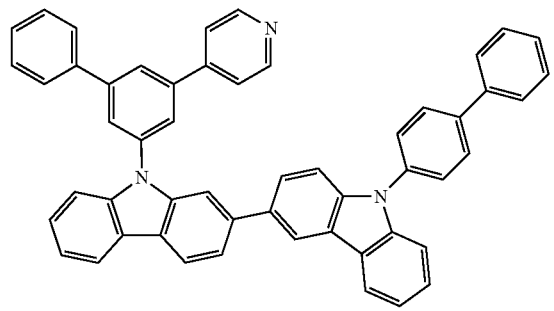
-continued
B-89
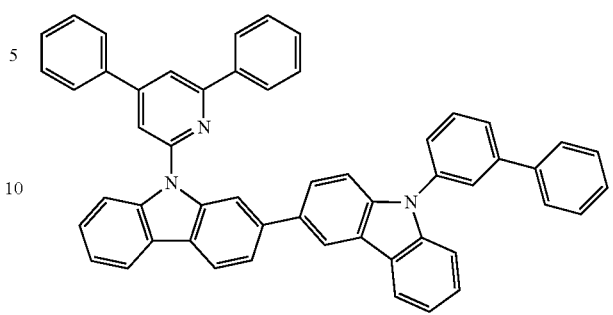
B-90
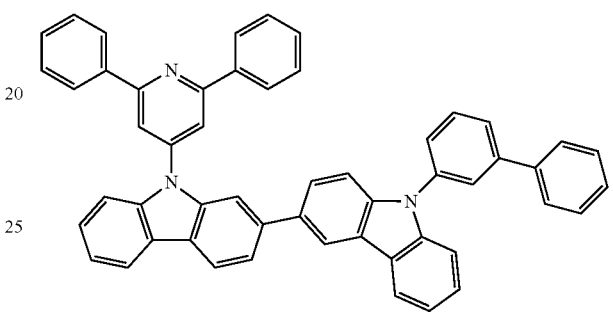
B-91
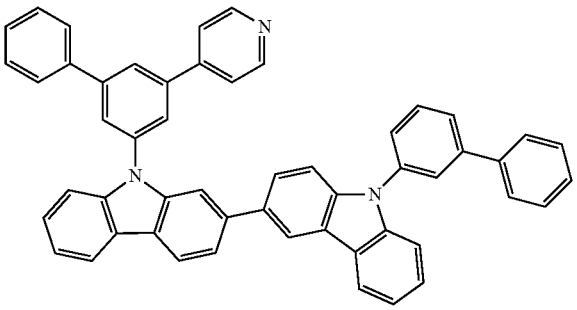
B-92
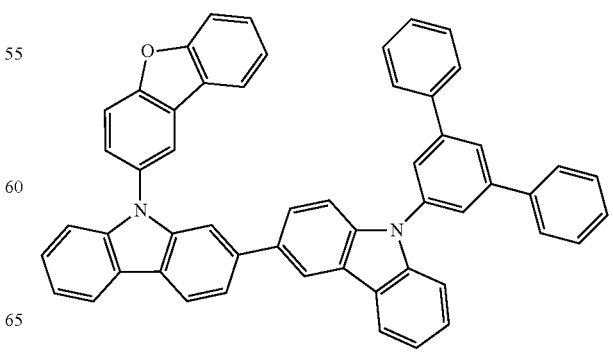

B-93
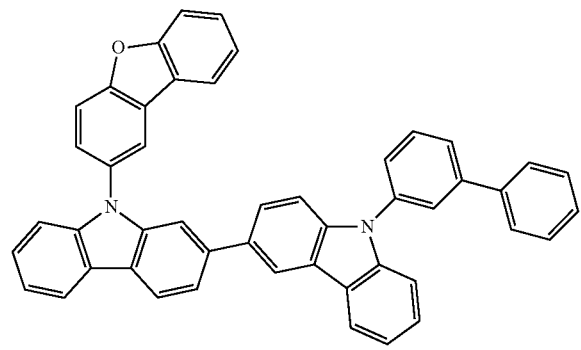
B-94
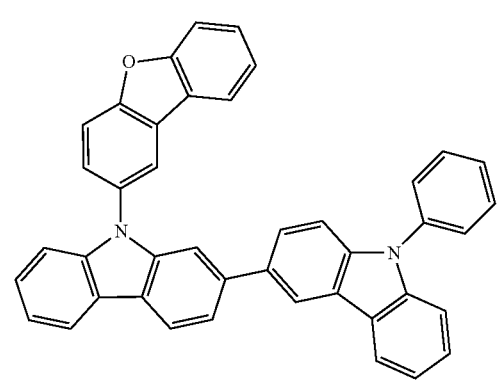
B-95
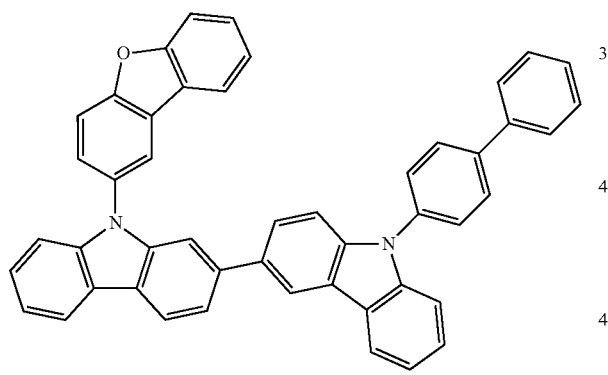
B-96
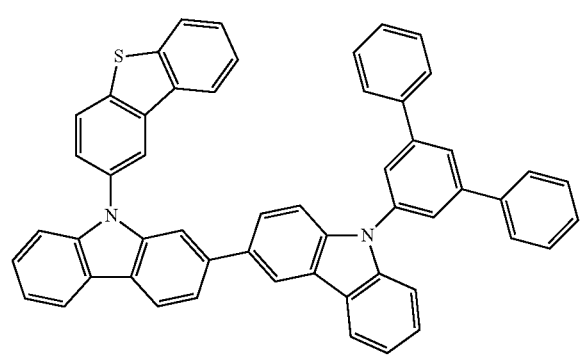
B-97
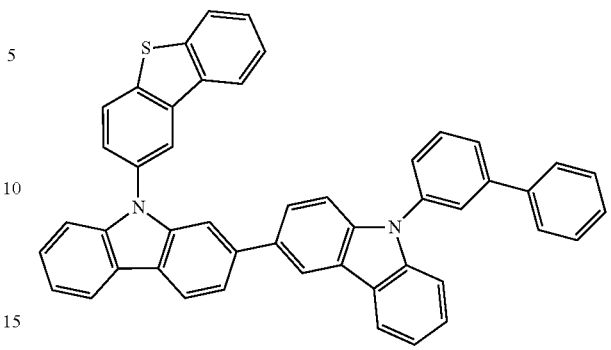
B-98
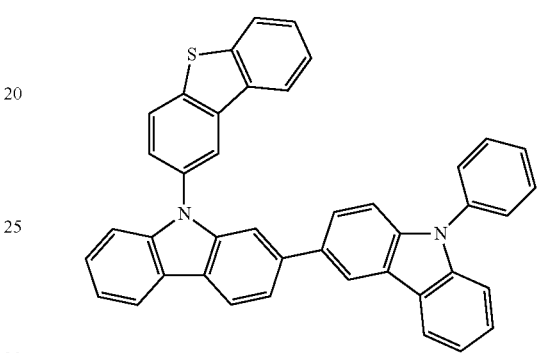
B-99
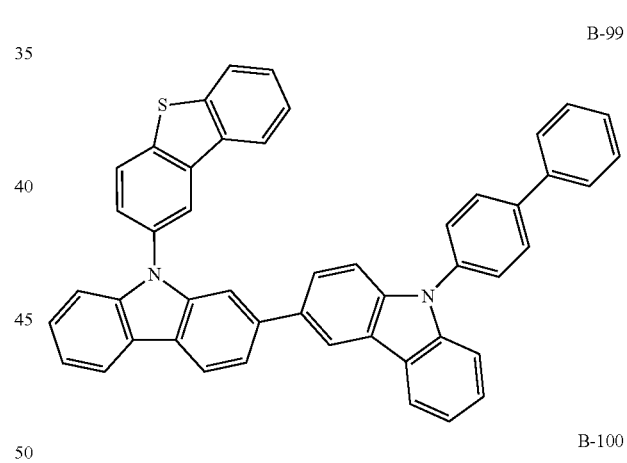
B-100
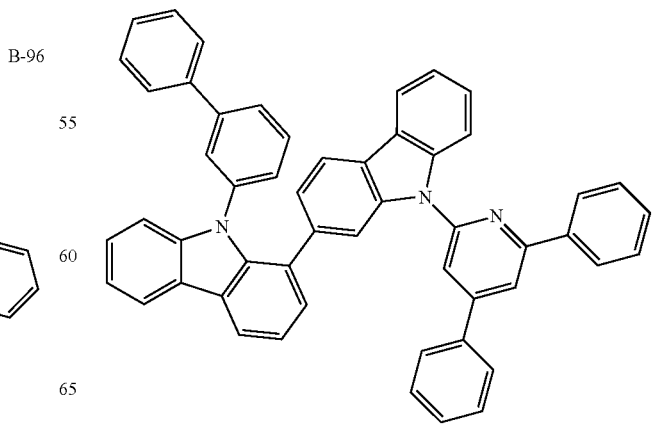

B-101
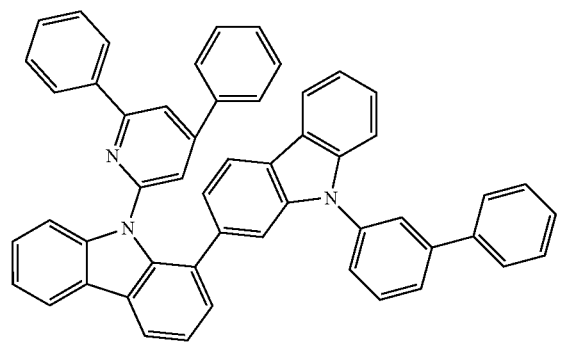
B-102
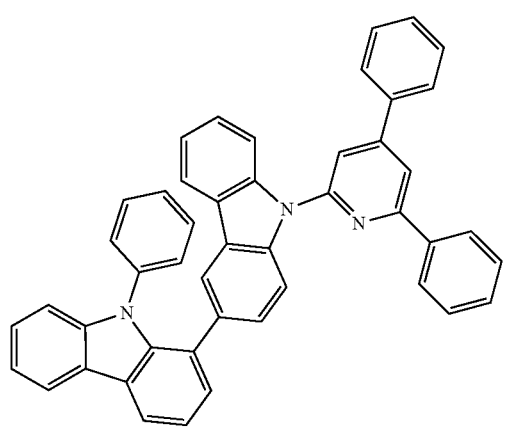
B-103
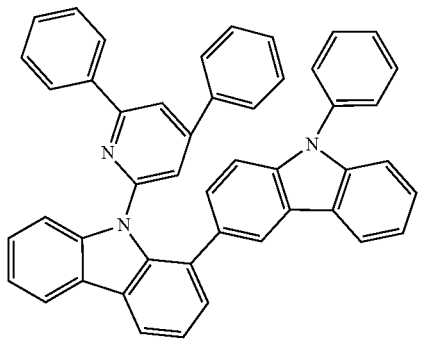
B-104
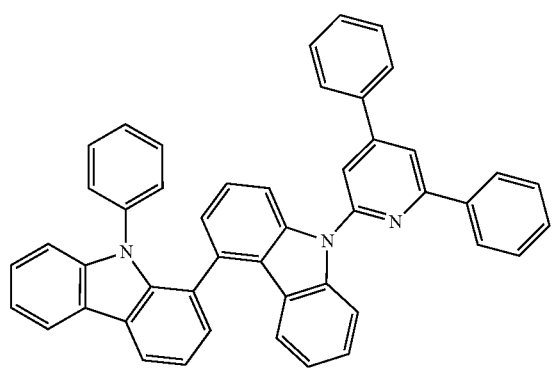
B-105
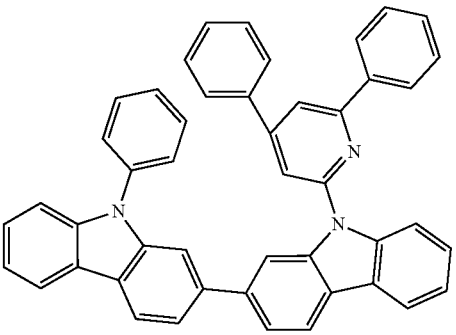
B-106
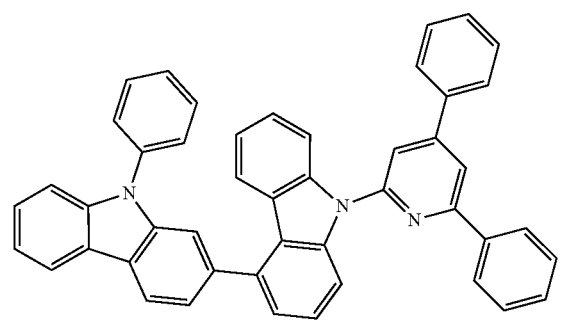
B-107
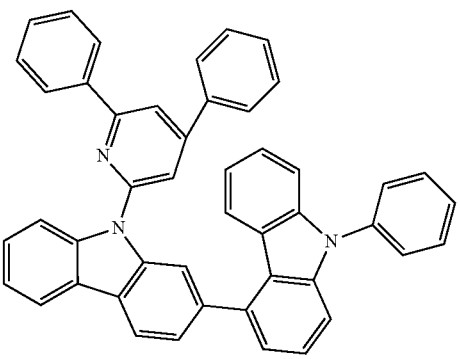
B-108
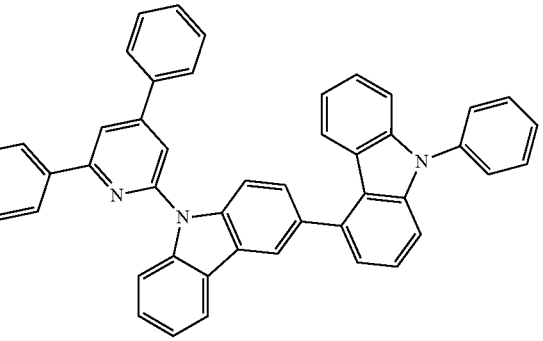

B-109

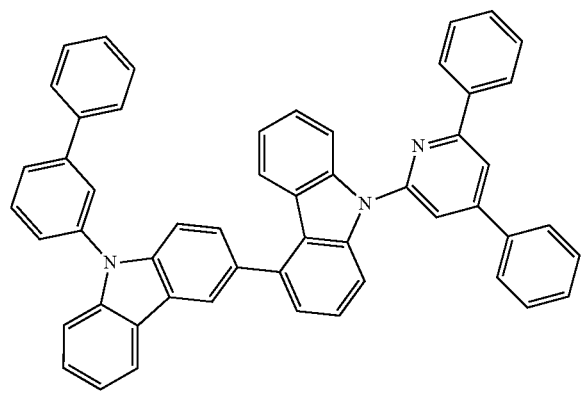

B-110

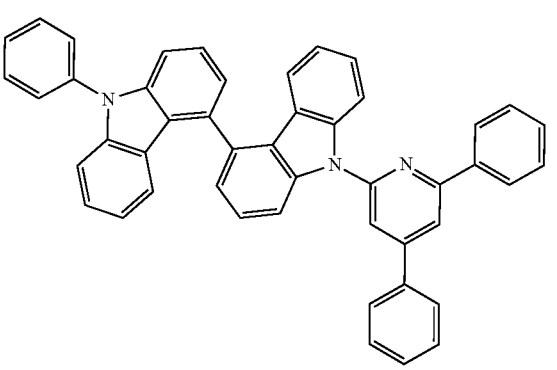

B-111

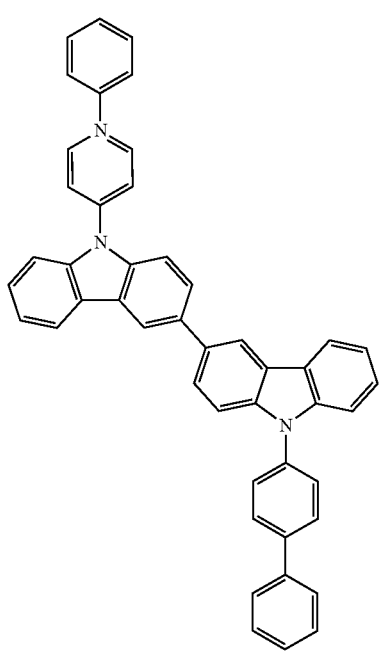

B-112

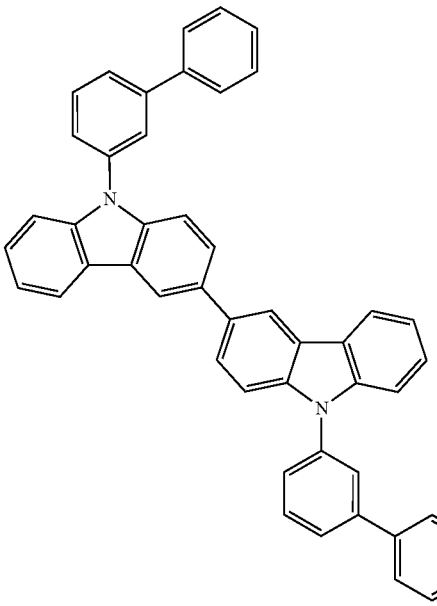

B-113

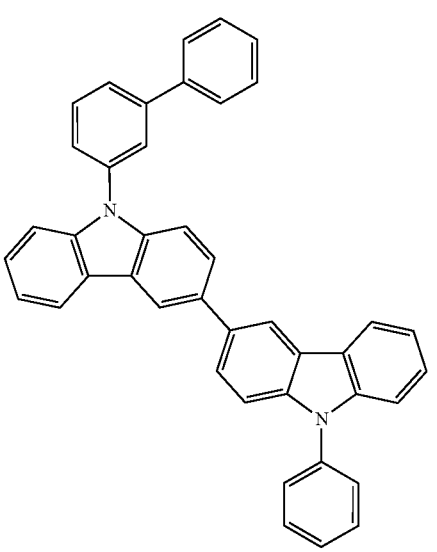

A compound represented by the above Chemical Formula 2-II or 2-III may have a structure where a substituted or unsubstituted carbazolyl group and a substituted or unsubstituted triphenylenyl group are bonded.

$Ar^1$ of the above Chemical Formula 2-II may be a substituent having hole or electron characteristics, and may be, for example, a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted carbazolyl group, a substituted or unsubstituted benzofuranyl group, a substituted or unsubstituted benzothiophenyl group, a substituted or unsubstituted fluorenyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted triphenylene group, a substituted or unsubstituted dibenzothiophenyl group, a substituted or unsubstituted dibenzofuranyl group, or a combination thereof.

The compound represented by the above Chemical Formula 2-II may be, for example, a compound selected from the following Group 6.
[Group 6]
C-10
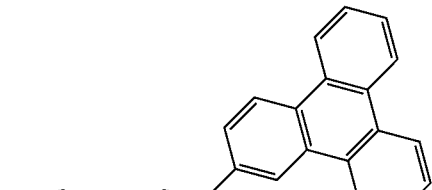
C-11
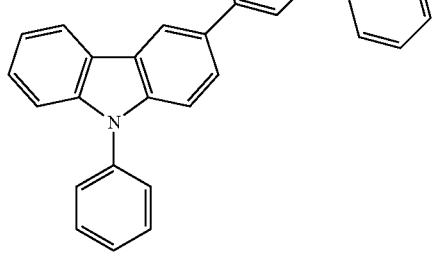
C-12
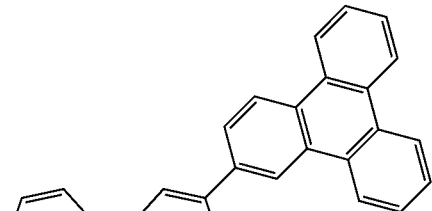
C-13
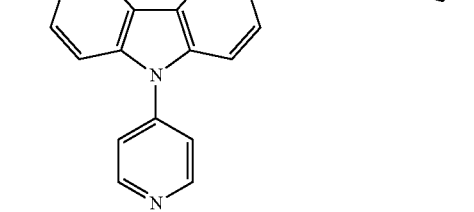
C-14
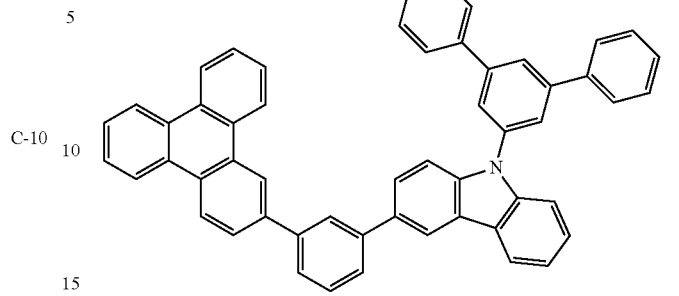
C-15
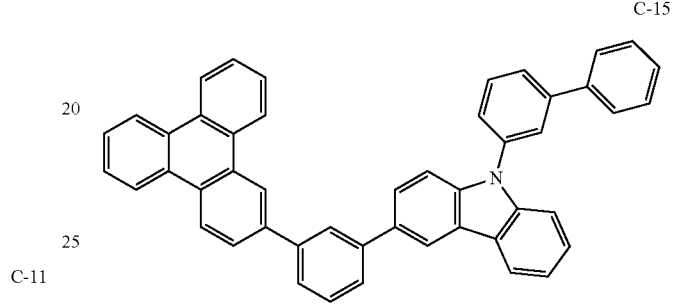
C-16
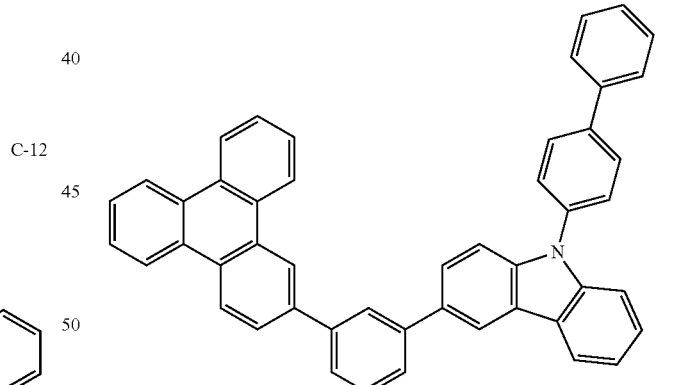
C-17
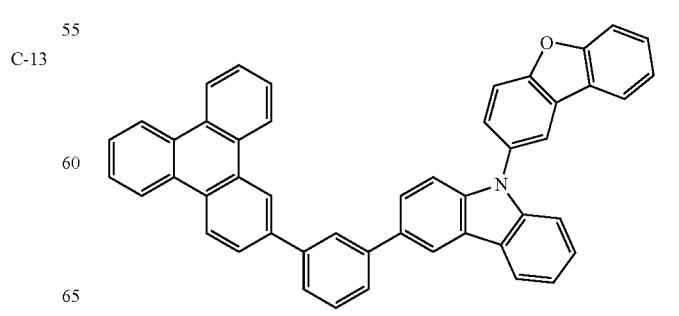

C-18
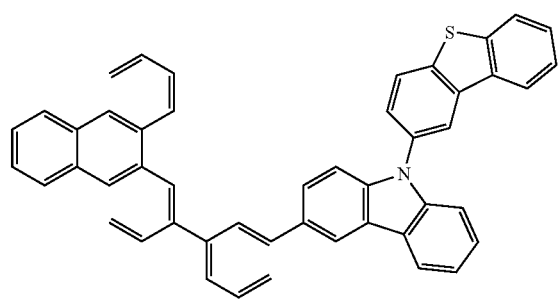
C-19
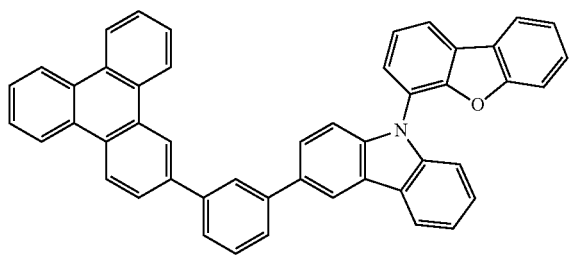
C-20
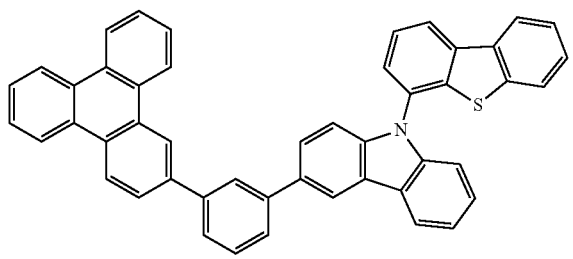
C-21
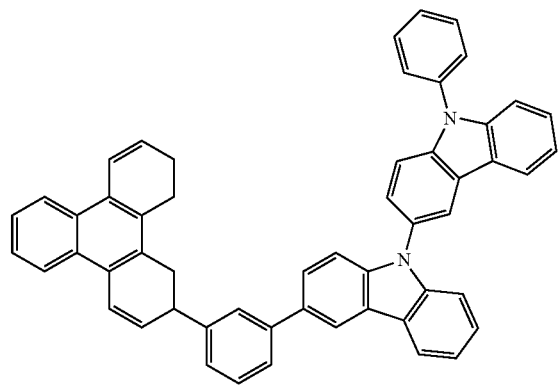
C-22
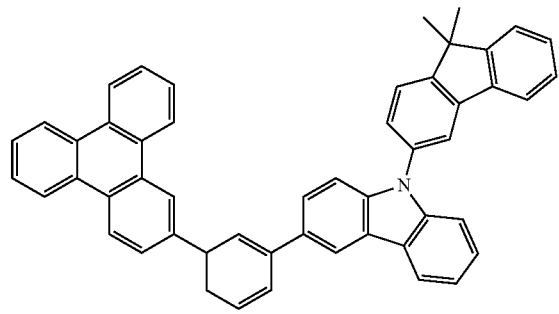
C-23
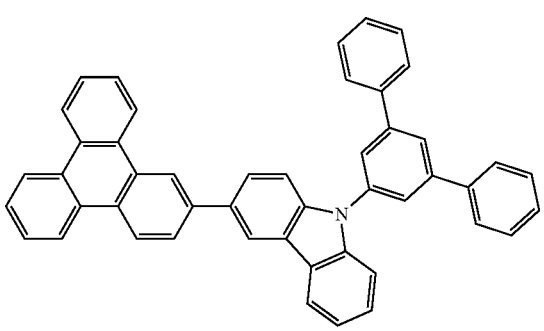
C-24
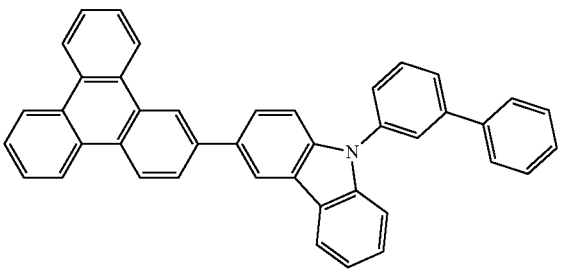
C-25
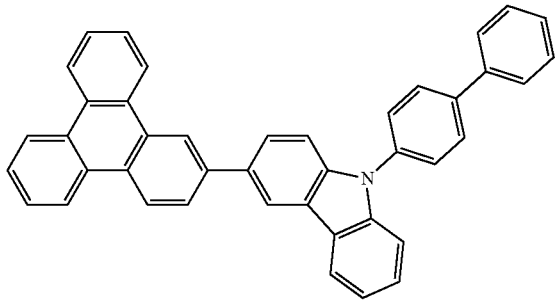
C-26
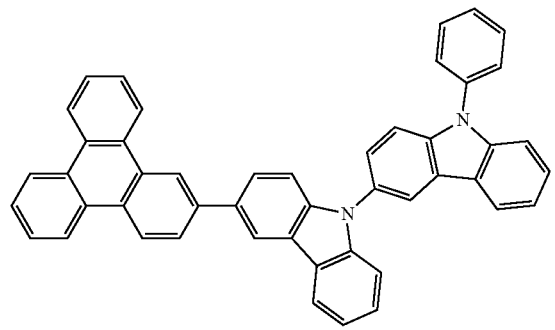
C-27
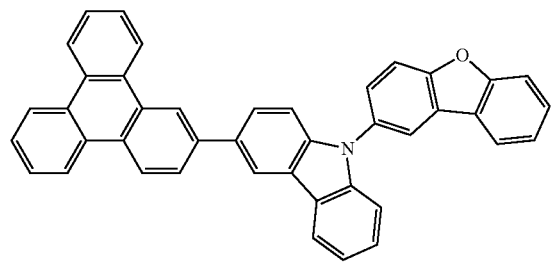

C-28
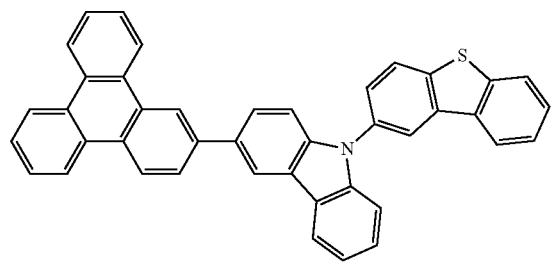
C-33
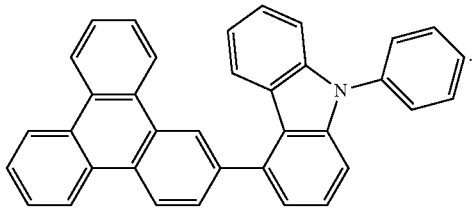
The compound represented by the above Chemical Formula 2-III may be, for example, a compound selected from the following Group 7.
[Group 7]
C-29
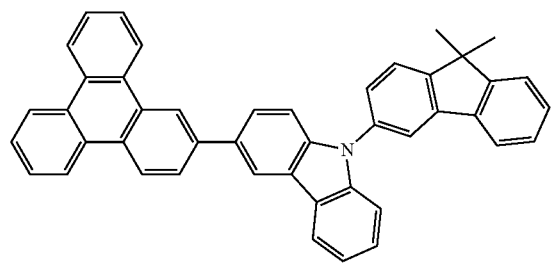
D-10
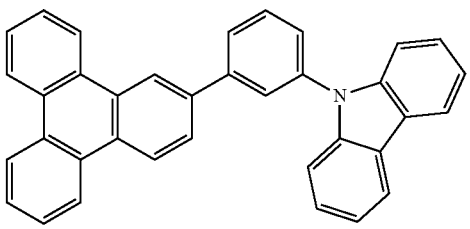
C-30
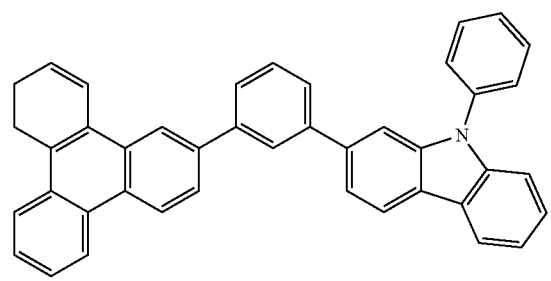
D-11
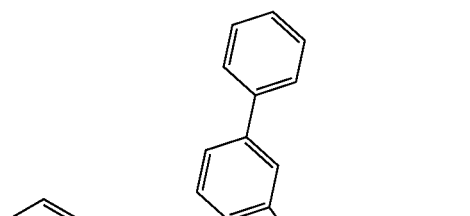
C-31
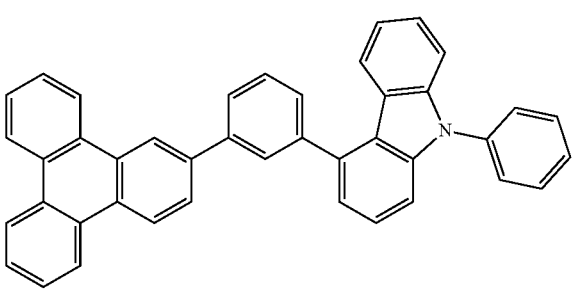
C-32
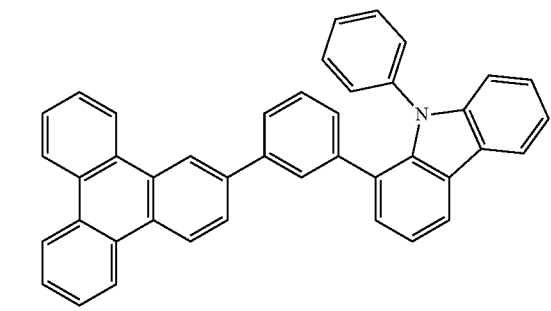
D-15
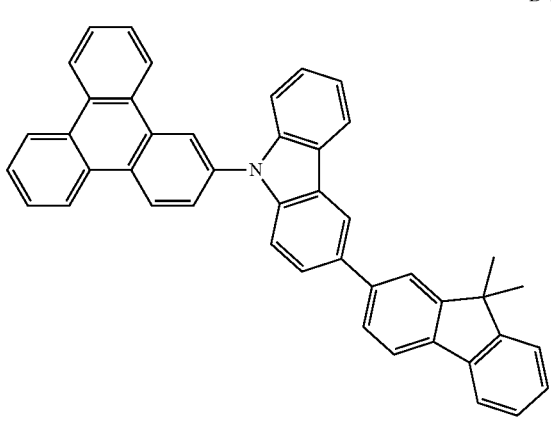

-continued
D-16
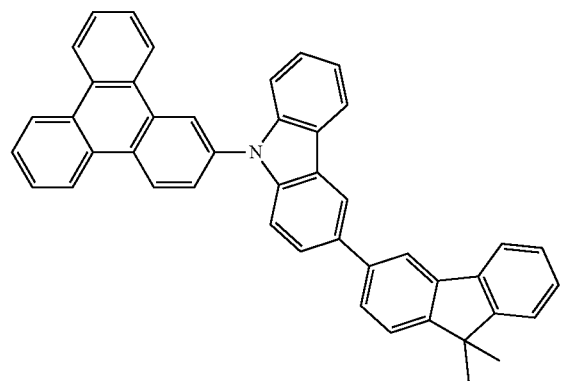
D-17
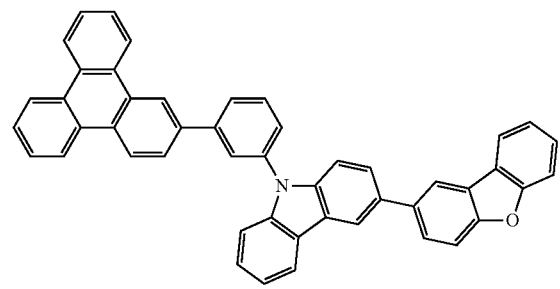
-continued
D-20
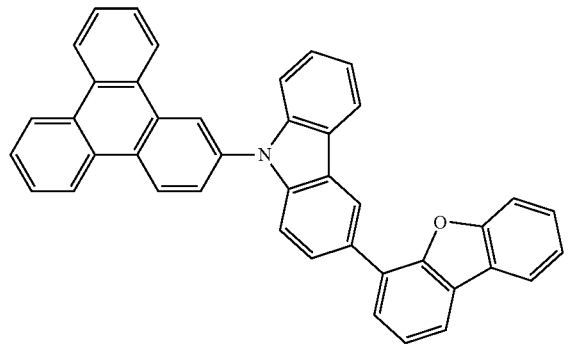
D-21
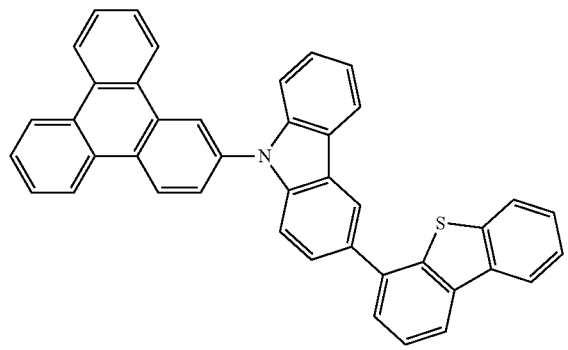
D-18
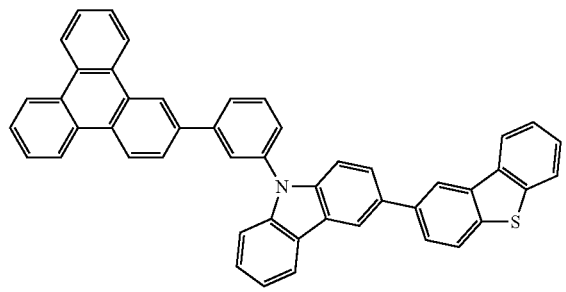
D-19
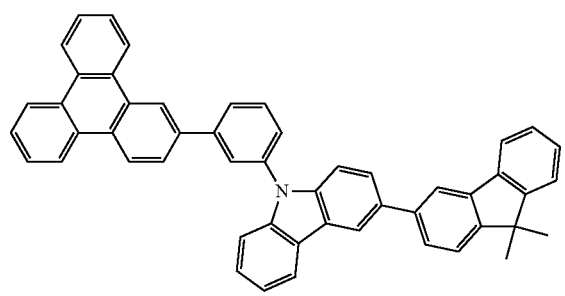
D-22
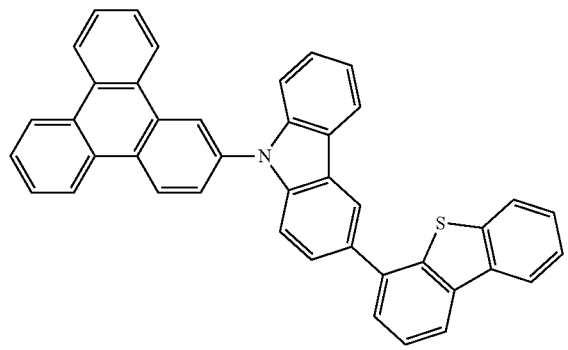
D-23

D-24

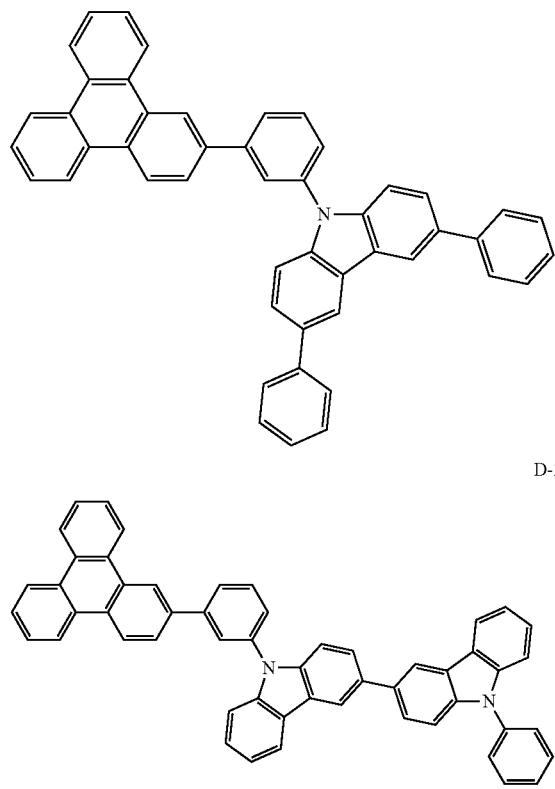

D-25

D-26

D-27

D-28

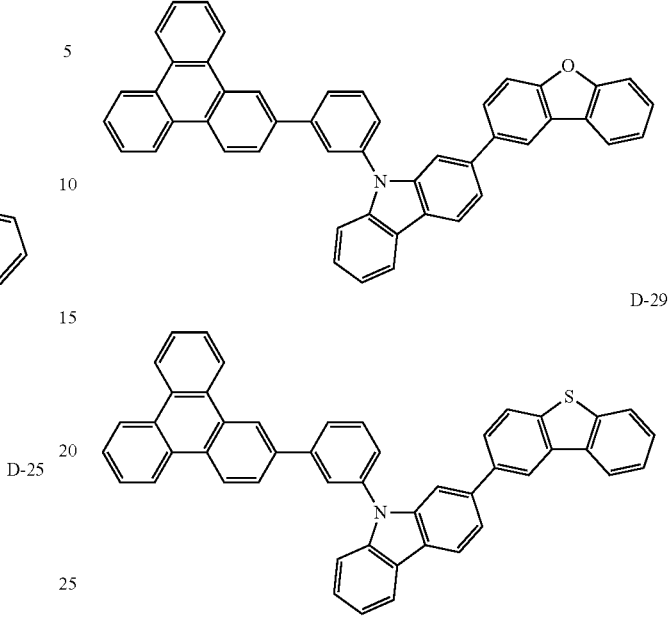

D-29

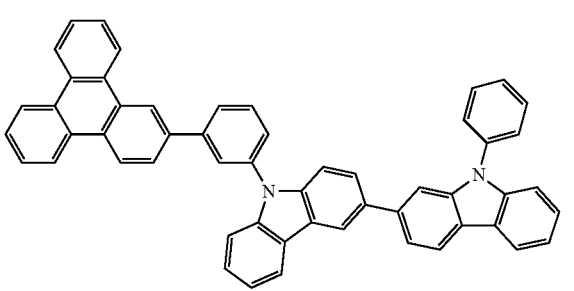

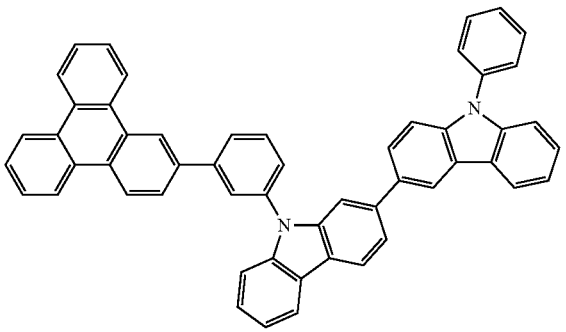

At least one or more of the second compound and/or the third compound may be independently used.

As described above, the emission layer 32 may include the first compound having bipolar characteristics in which electron characteristics are relatively strong, and the second compound may have bipolar characteristics in which hole characteristics are relatively strong, mobility of electrons and holes may be increased, and luminous efficiency may be improved compared with when the first and second compounds are used alone.

A material having biased electron characteristics or biased hole characteristics may be used to form an emission layer, and excitons in a device including the emission layer may be produced more readily due to recombination of carriers at the interface of the emission layer and the electron transport layer (ETL) or hole transport layer (HTL). The excitons in the emission layer may interact with charges at the interface of the emission layer and the electron transport layer (ETL) or hole transport layer (HTL), and a sharply deteriorating efficiency roll-off and/or sharply deteriorating light emitting life-span characteristics may be caused.

The first and second compounds may be simultaneously introduced into the emission layer to manufacture a device balancing carriers in the emission layer, and a light emitting area may not be biased toward either the electron transport layer or hole transport layer. The hole transport auxiliary layer including the third compound hole transport layer and the emission layer may prevent charge from accumulating at an interface of the hole transport layer and the emission layer, and a device capable of adjusting carrier balance in the emission layer may be provided. Roll-off characteristic and life-span characteristics of an organic optoelectric device may be remarkably improved.

In the emission layer 32, the first compound and the second compound may be included as a host, and may be included, for example, in a weight ratio of, for example, about 1:10 to about 10:1. Maintaining a weight ratio within the range may help realize bipolar characteristics more efficiently and efficiency and life-span may be improved.

The emission layer 32 may further include at least one compound as a host besides the above first compound and second compound.

The emission layer 32 may further include a dopant. The dopant may be mixed with the host in a small amount to cause light emission, and may be a material, such as a metal complex, that emits light by multiple excitation into a triplet or more. The dopant may be, for example, an inorganic, organic, or organic/inorganic compound, and one or more dopants may be used.

The dopant may be a red, green, or blue dopant, for example, a phosphorescent dopant. Examples of the phosphorescent dopant may be an organic metal compound including Ir, Pt, Os, Ti, Zr, Hf, Eu, Tb, Tm, Fe, Co, Ni, Ru, Rh, Pd, or a combination thereof. The phosphorescent dopant may be, for example, represented by the following Chemical Formula Z.

$$L_2MX \quad \text{[Chemical Formula Z]}$$

In the above Chemical Formula Z, M is a metal, and L and X are the same or different, and are a ligand to form a complex compound with M.

The M may be, for example, Ir, Pt, Os, Ti, Zr, Hf, Eu, Tb, Tm, Fe, Co, Ni, Ru, Rh, Pd or a combination thereof, and the L and X may be, for example, a bidendate ligand.

The organic layer 30 may further include an electron transport layer (ETL) 34. The electron transport layer (ETL) 34 makes transportation of electrons from the cathode 20 to the emission layer 32 easy, and may be omitted.

The organic layer 30 may further include a hole injection layer (HIL) (not shown) positioned between the anode 10 and the hole transport layer (HTL) 31 and/or an electron injection layer (EIL) (not shown) positioned between the cathode 20 and the electron transport layer (ETL) 34.

The organic light emitting diode may be applied to an organic light emitting diode (OLED) display.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of First Compound

Synthesis Example 1: Synthesis of Intermediate I-1

[Reaction Scheme 1]

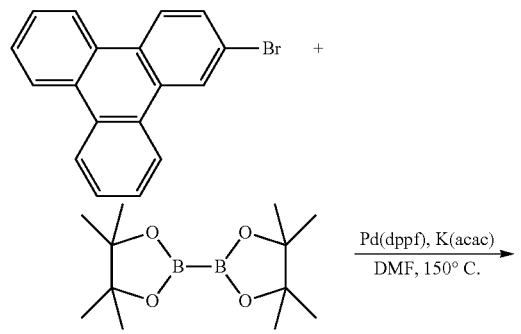

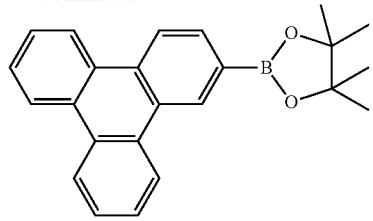

I-1

100 g (326 mmol) of 2-bromotriphenylene was dissolved in 1 L of dimethylformamide (DMF) under a nitrogen environment, 99.2 g (391 mmol) of bis(pinacolato)diboron, 2.66 g (3.26 mmol) of (1,1'-bis(diphenylphosphine)dichloropalladium (II), and 80 g (815 mmol) of potassium acetate were added thereto, and the mixture was heated and refluxed at 150° C. for 5 hours. When the reaction was complete, water was added to the reaction solution, and the mixture was filtered and then, dried in a vacuum oven. The obtained residue was separated and purified through flash column chromatography, obtaining 113 g (98%) of the compound I-1.

HRMS (70 eV, EI+): m/z calcd for C24H23BO2: 354.1791, found: 354.

Elemental Analysis: C, 81%; H, 7%

Synthesis Example 2: Synthesis of Intermediate I-2

[Reaction Scheme 2]

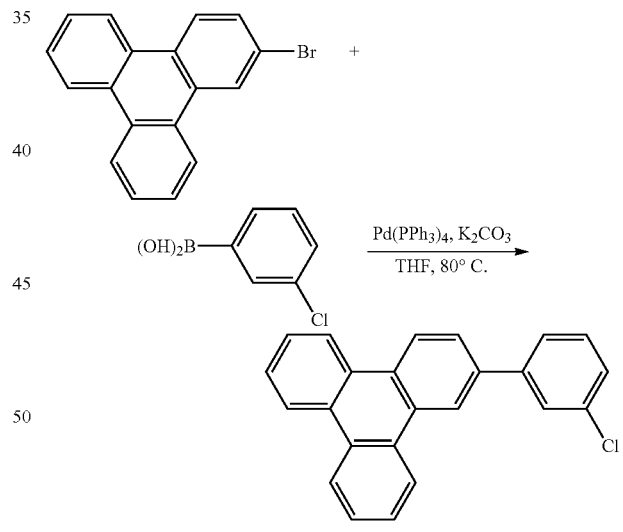

I-2

32.7 g (107 mmol) of 2-bromotriphenylene was dissolved in 0.3 L of tetrahydrofuran (THF) in a nitrogen environment, 20 g (128 mmol) of 3-chlorophenyl boronic acid and 1.23 g (1.07 mmol) of tetrakis(triphenylphosphine)palladium were added thereto, and the mixture was agitated. 36.8 g (267 mmol) of potassium carbonate saturated in water was added to the agitated resultant, and the resulting mixture was heated and refluxed at 80° C. for 24 hours. When the reaction was complete, water was added to the reaction solution, the mixture was extracted with dichloromethane (DCM), and the extract was treated with anhydrous MgSO$_4$ to remove moisture therefrom, filtered, and concentrated under a reduced pressure. The obtained residue was separated and purified through flash column chromatography, obtaining 22.6 g (63%) of the compound I-2.

HRMS (70 eV, EI+): m/z calcd for C24H15Cl: 338.0862, found: 338.

Elemental Analysis: C, 85%; H, 5%

Synthesis Example 3: Synthesis of Intermediate I-3

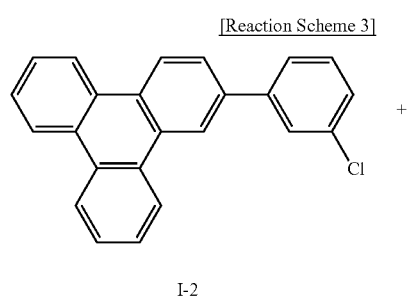

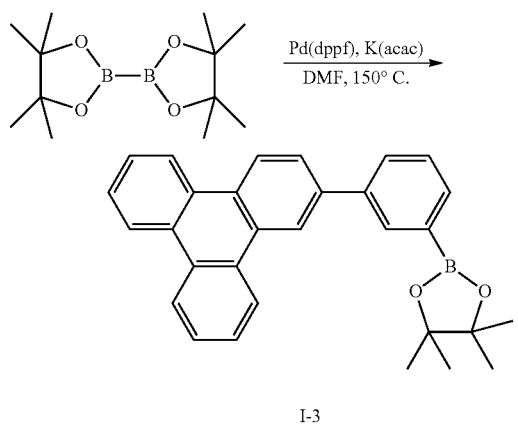

22.6 g (66.7 mmol) of the compound I-2 was dissolved in 0.3 L of dimethylformamide (DMF) under a nitrogen environment, 25.4 g (100 mmol) of bis(pinacolato)diboron, 0.54 g (0.67 mmol) of (1,1'-bis(diphenylphosphine)ferrocene) dichloropalladium (II), and 16.4 g (167 mmol) of potassium acetate were added thereto, and the mixture was heated and refluxed at 150° C. for 48 hours. When the reaction was complete, water was added to the reaction solution, and the mixture was filtered and dried in a vacuum oven. The obtained residue was separated and purified through flash column chromatography, obtaining 18.6 g (65%) of a compound I-3.

HRMS (70 eV, EI+): m/z calcd for C30H27BO2: 430.2104, found: 430.

Elemental Analysis: C, 84%; H, 6%

Synthesis Example 4: Synthesis of Intermediate I-4

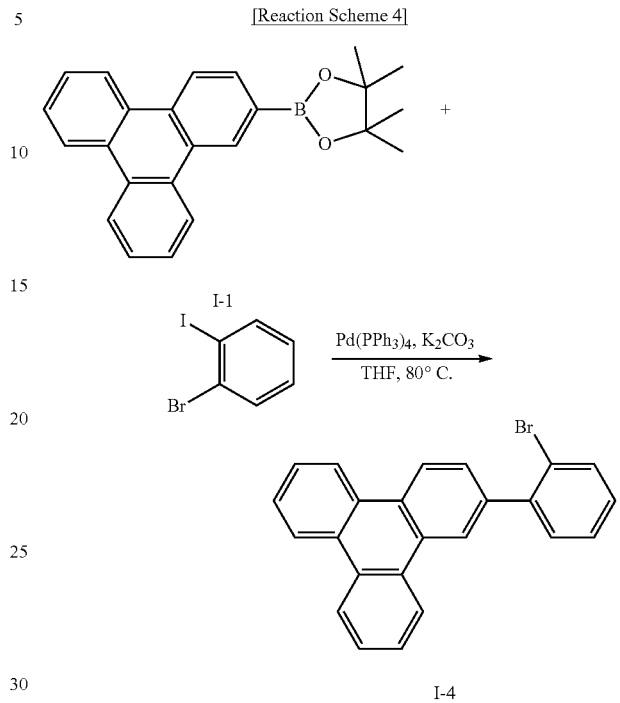

100 g (282 mmol) of the compound I-1 was dissolved in 1 L of tetrahydrofuran (THF) under a nitrogen environment, 95.9 g (339 mmol) of 1-bromo-2-iodobenzene and 3.26 g (2.82 mmol) of tetrakis(triphenylphosphine)palladium were added thereto, and the mixture was agitated. 97.4 g (705 mmol) of potassium carbonate saturated in water was added thereto, and the resulting mixture was heated and refluxed at 80° C. for 53 hours. When the reaction was complete, water was added to the reaction solution, the mixture was extracted with dichloromethane (DCM), and the extract was treated with anhydrous MgSO$_4$ to remove moisture therefrom, filtered, and concentrated under a reduced pressure. The obtained residue was separated and purified through flash column chromatography, obtaining 95.1 g (88%) of the compound I-4.

HRMS (70 eV, EI+): m/z calcd for C24H15Br: 382.0357, found: 382.

Elemental Analysis: C, 75%; H, 4%

Synthesis Example 5: Synthesis of Intermediate I-5

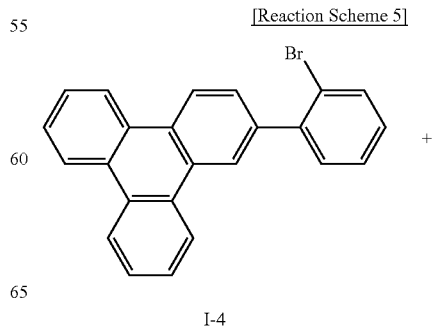

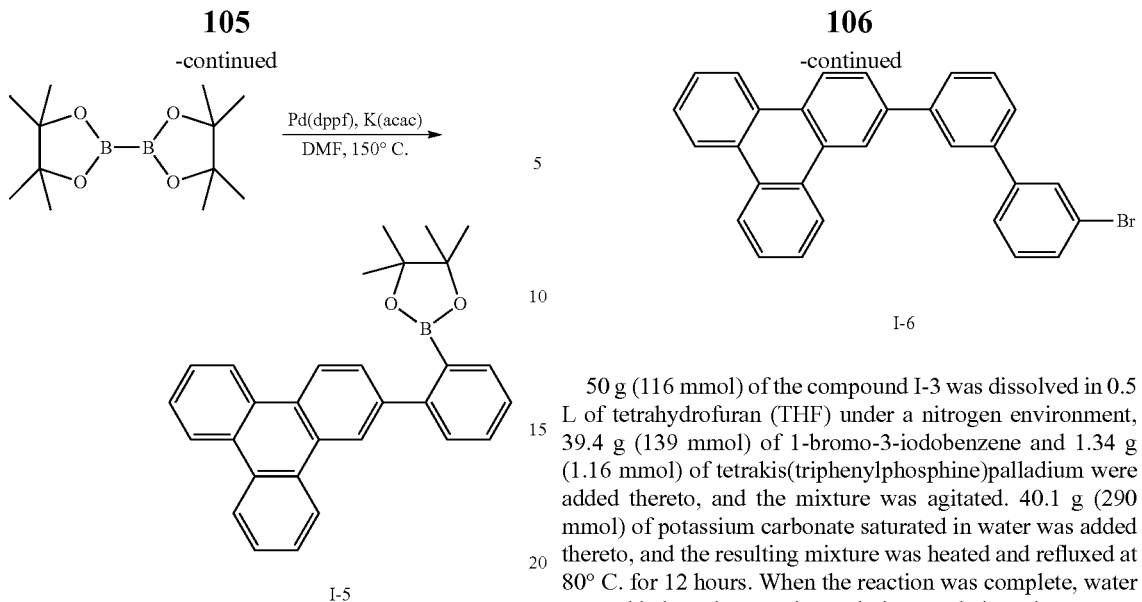

90 g (235 mmol) of the compound I-4 was dissolved in 0.8 L of dimethylformamide (DMF) under a nitrogen environment, 71.6 g (282 mmol) of bis(pinacolato)diboron, 1.92 g (2.35 mmol) of 1,1'-bis(diphenylphosphine)ferrocene)dichloropalladium (II), and 57.7 g (588 mmol) of potassium acetate were added thereto, and the mixture was heated and refluxed at 150° C. for 35 hours. When the reaction was complete, water was added to the reaction solution, and the mixture was filtered and dried in a vacuum oven. The obtained residue was separated and purified through flash column chromatography obtaining 74.8 g (74%) of the compound I-5.

HRMS (70 eV, EI+): m/z calcd for C30H27BO2: 430.2104, found: 430.

Elemental Analysis: C, 84%; H, 6%

Synthesis Example 6: Synthesis of Intermediate I-6

50 g (116 mmol) of the compound I-3 was dissolved in 0.5 L of tetrahydrofuran (THF) under a nitrogen environment, 39.4 g (139 mmol) of 1-bromo-3-iodobenzene and 1.34 g (1.16 mmol) of tetrakis(triphenylphosphine)palladium were added thereto, and the mixture was agitated. 40.1 g (290 mmol) of potassium carbonate saturated in water was added thereto, and the resulting mixture was heated and refluxed at 80° C. for 12 hours. When the reaction was complete, water was added to the reaction solution, and the mixture was extracted with dichloromethane (DCM), and the extract was treated with anhydrous MgSO4 to remove moisture therefrom and then, filtered and concentrated under a reduced pressure. This obtained residue was separated and purified through flash column chromatography, obtaining 42.6 g (80%) of the compound I-6.

HRMS (70 eV, EI+): m/z calcd for C30H19Br: 458.0670, found: 458.

Elemental Analysis: C, 78%; H, 4%

Synthesis Example 7: Synthesis of Intermediate I-7

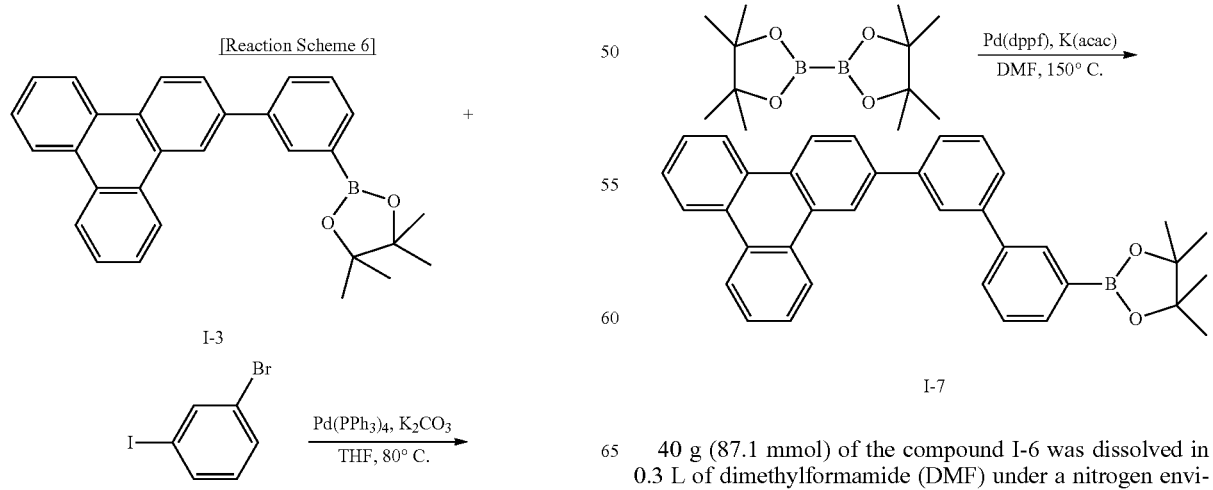

40 g (87.1 mmol) of the compound I-6 was dissolved in 0.3 L of dimethylformamide (DMF) under a nitrogen environment, 26.5 g (104 mmol) of bis(pinacolato)diboron, 0.71 g (0.87 mmol) of 1,1'-bis(diphenylphosphine)ferrocene)dichloropalladium (II), and 21.4 g (218 mmol) of potassium acetate were added thereto, and the mixture was heated and refluxed at 150° C. for 26 hours. When the reaction was complete, water was added to the reaction solution, and the mixture was filtered and dried in a vacuum oven. The obtained residue was separated and purified through flash column chromatography, obtaining 34 g (77%) of the compound I-7.

HRMS (70 eV, EI+): m/z calcd for C36H31BO2: 506.2417, found: 506.

Elemental Analysis: C, 85%; H, 6%

Synthesis Example 8: Synthesis of Intermediate I-8

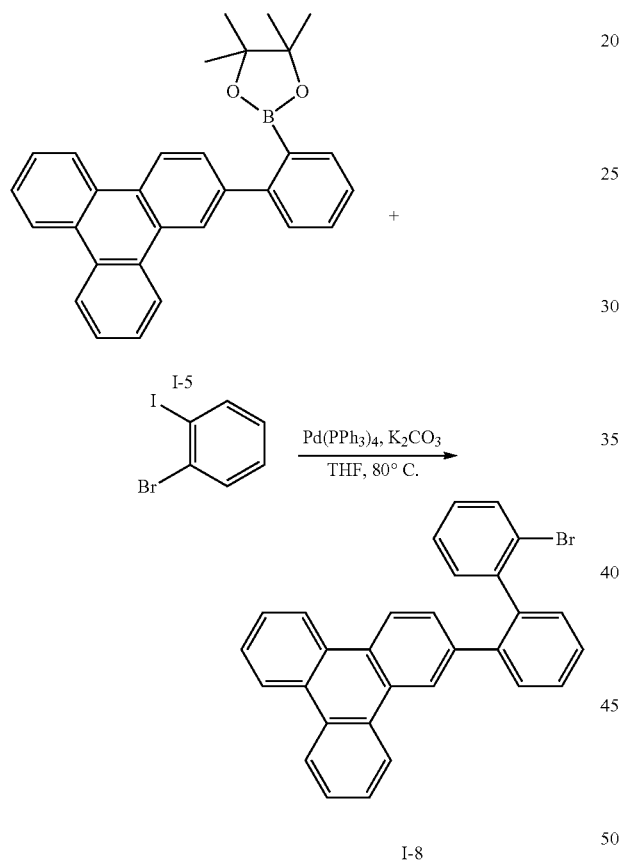

I-8

70 g (163 mmol) of the compound I-5 was dissolved in 0.6 L of tetrahydrofuran (THF) in a nitrogen environment, 55.2 g (195 mmol) of 1-bromo-2-iodobenzene and 1.88 g (1.63 mmol) of tetrakis(triphenylphosphine)palladium were added thereto, and the mixture was agitated. 56.3 g (408 mmol) of potassium carbonate saturated in water was added thereto, and the mixture was heated and refluxed at 80° C. for 12 hours. When the reaction was complete, water was added to the reaction solution, the mixture was extracted with dichloromethane (DCM), and the extract was treated with anhydrous MgSO4 to remove moisture therefrom and then, filtered and concentrated under a reduced pressure. This obtained residue was separated and purified through flash column chromatography, obtaining 68.1 g (91%) of the compound I-8.

HRMS (70 eV, EI+): m/z calcd for C30H19Br: 458.0670, found: 458.

Elemental Analysis: C, 78%; H, 4%

Synthesis Example 9: Synthesis of Intermediate I-9

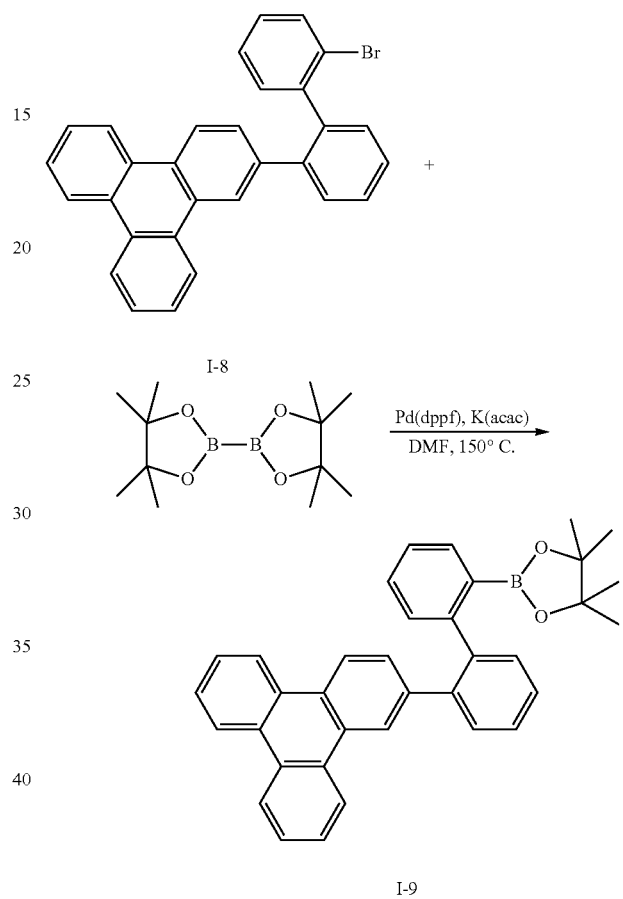

I-9

40 g (87.1 mmol) of the compound I-8 was dissolved in 0.3 L of dimethylformamide (DMF) under a nitrogen environment, 26.5 g (104 mmol) of bis(pinacolato)diboron, 0.71 g (0.87 mmol) of (1,1'-bis(diphenylphosphine)ferrocene) dichloropalladium (II), and 21.4 g (218 mmol) of potassium acetate were added thereto, and the mixture was heated and refluxed at 150° C. for 23 hours. When the reaction was complete, water was added to the reaction solution, and the mixture was filtered and dried in a vacuum oven. This obtained residue was separated and purified through flash column chromatography, obtaining 30.4 g (69%) of the compound I-9.

HRMS (70 eV, EI+): m/z calcd for C36H31BO2: 506.2417, found: 506.

Elemental Analysis: C, 85%; H, 6%

Synthesis Example 10: Synthesis of Intermediate I-10

[Reaction Scheme 10]

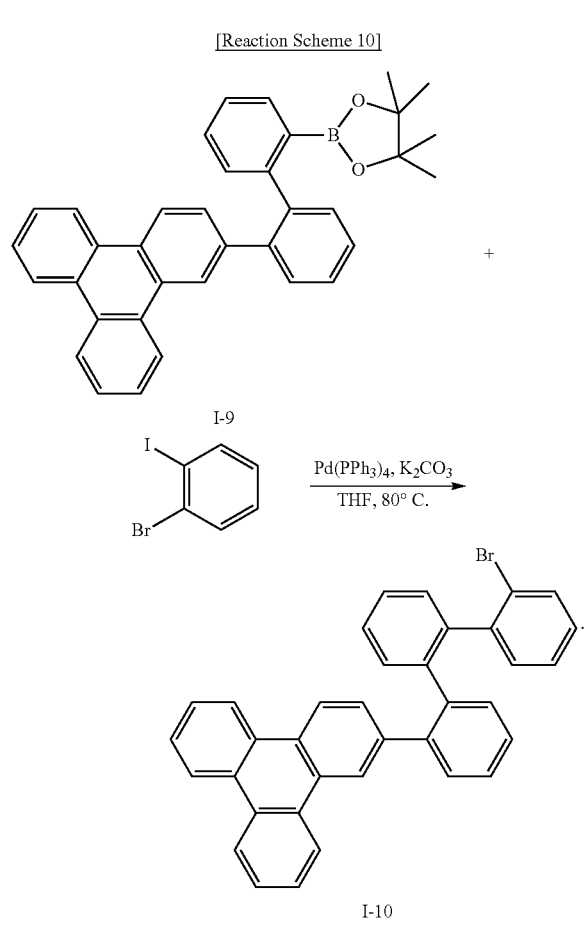

30 g (59.2 mmol) of the compound I-9 was dissolved in 0.3 L of tetrahydrofuran (THF) under a nitrogen environment, 20.1 g (71.1 mmol) of 1-bromo-2-iodobenzene and 0.68 g (0.59 mmol) of tetrakis(triphenylphosphine)palladium were added thereto, and the mixture was agitated. 20.5 g (148 mmol) of potassium carbonate saturated in water was added thereto, and the mixture was heated and refluxed at 80° C. for 16 hours. When the reaction was complete, water was added to the reaction solution, the mixture was extracted with dichloromethane (DCM), and the extract was treated with anhydrous $MgSO_4$ to remove moisture therefrom and then, filtered and concentrated under a reduced pressure. The obtained residue was separated and purified through flash column chromatography, obtaining 32.4 g (85%) of the compound I-10.

HRMS (70 eV, EI+): m/z calcd for $C_{36}H_{23}Br$: 534.0983, found: 534.

Elemental Analysis: C, 81%; H, 4%

Synthesis Example 11: Synthesis of Intermediate I-11

[Reaction Scheme 11]

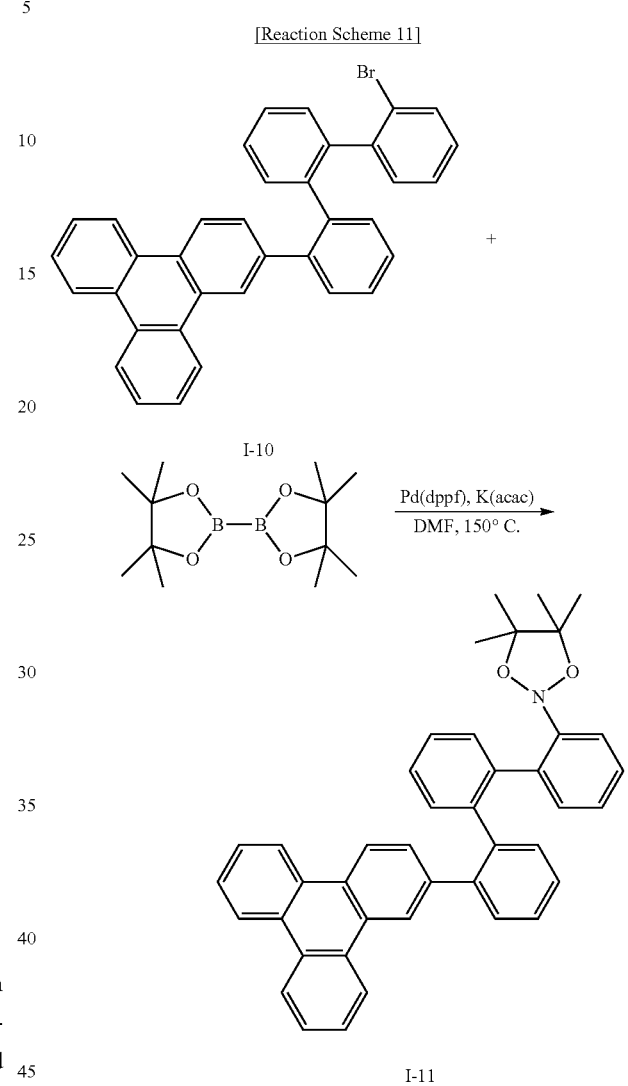

30 g (56 mmol) of the compound I-10 was dissolved in 0.3 L of dimethylformamide (DMF) under a nitrogen environment, 17.1 g (67.2 mmol) of bis(pinacolato)diboron, 0.46 g (0.56 mmol) of (1,1'-bis(diphenylphosphine)ferrocene)dichloropalladium (II), and 13.7 g (140 mmol) of potassium acetate were added thereto, and the mixture was heated and refluxed at 150° C. for 25 hours. When the reaction was complete, water was added to the reaction solution, and the mixture was filtered and dried in a vacuum oven. The obtained residue was separated and purified through flash column chromatography, obtaining 22.8 g (70%) of the compound I-11.

HRMS (70 eV, EI+): m/z calcd for $C_{42}H_{35}BO_2$: 582.2730, found: 582.

Elemental Analysis: C, 87%; H, 6%

Synthesis Example 12: Synthesis of Compound A-1

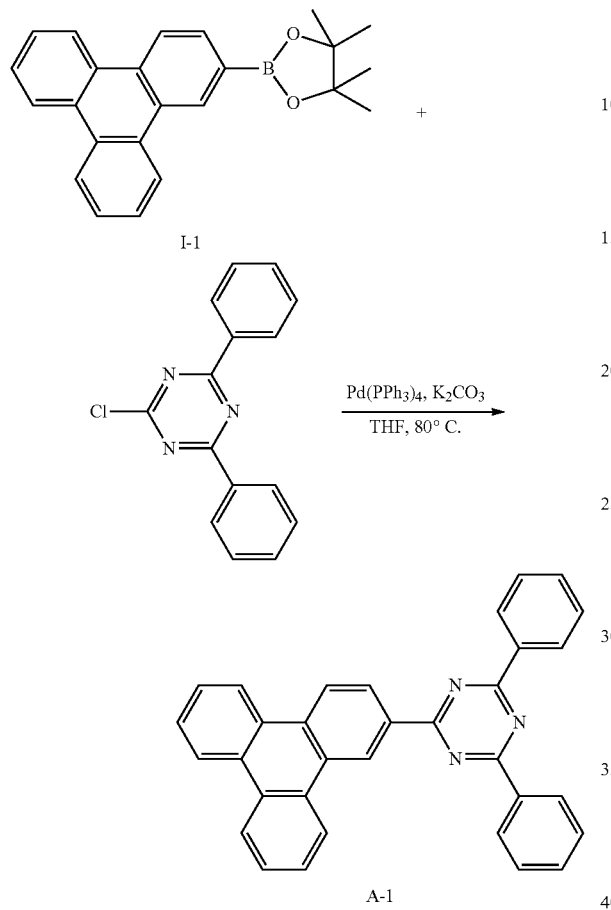

20 g (56.5 mmol) of the compound I-1 was dissolved in 0.2 L of tetrahydrofuran (THF) in a nitrogen environment, 15.1 g (56.5 mmol) of 2-chloro-4,6-diphenyl-1,3,5-triazine and 0.65 g (0.57 mmol) of 2-chloro-4,6-diphenyl-1,3,5-triazine were added thereto, and the mixture was agitated. 19.5 g (141 mmol) of potassium carbonate saturated in water was added thereto, and the mixture was heated and refluxed at 80° C. for 20 hours. When the reaction was complete, water was added to the reaction solution, the mixture was extracted with dichloromethane (DCM), and the extract was treated with anhydrous MgSO$_4$ to remove moisture therefrom and then, filtered and concentrated under a reduced pressure. The obtained residue was separated and purified through flash column chromatography, obtaining 22.1 g (85%) of the compound A-1.

HRMS (70 eV, EI+): m/z calcd for C33H21N3: 459.1735, found: 459.

Elemental Analysis: C, 86%; H, 5%

Synthesis Example 13: Synthesis of Compound A-13

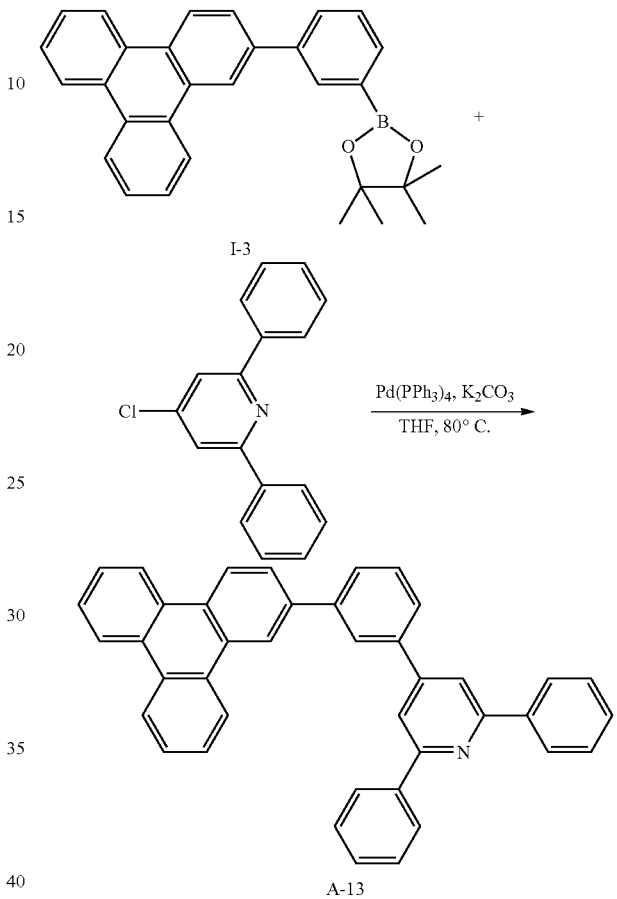

20 g (46.5 mmol) of the compound I-3 was dissolved in 0.2 L of tetrahydrofuran (THF) under a nitrogen environment, 12.4 g (46.5 mmol) of 4-chloro-2,6-diphenylpyridine and 0.54 g (0.47 mmol) of tetrakis(triphenylphosphine) palladium were added thereto, and the mixture was agitated. 16.1 g (116 mmol) of potassium carbonate saturated in water was added thereto, and the mixture was heated and refluxed at 80° C. for 17 hours. When the reaction was complete, water was added to the reaction solution, the mixture was extracted with dichloromethane (DCM), and the extract was treated with anhydrous MgSO$_4$ to remove moisture therefrom and then, filtered and concentrated under a reduced pressure. This obtained residue was separated and purified through flash column chromatography, obtaining 18.9 g (76%) of the compound A-13.

HRMS (70 eV, EI+): m/z calcd for C41H27N, 533.2143, found: 533.

Elemental Analysis: C, 92%; H, 5%

Synthesis Example 14: Synthesis of Compound A-14

Synthesis Example 15: Synthesis of Compound A-15

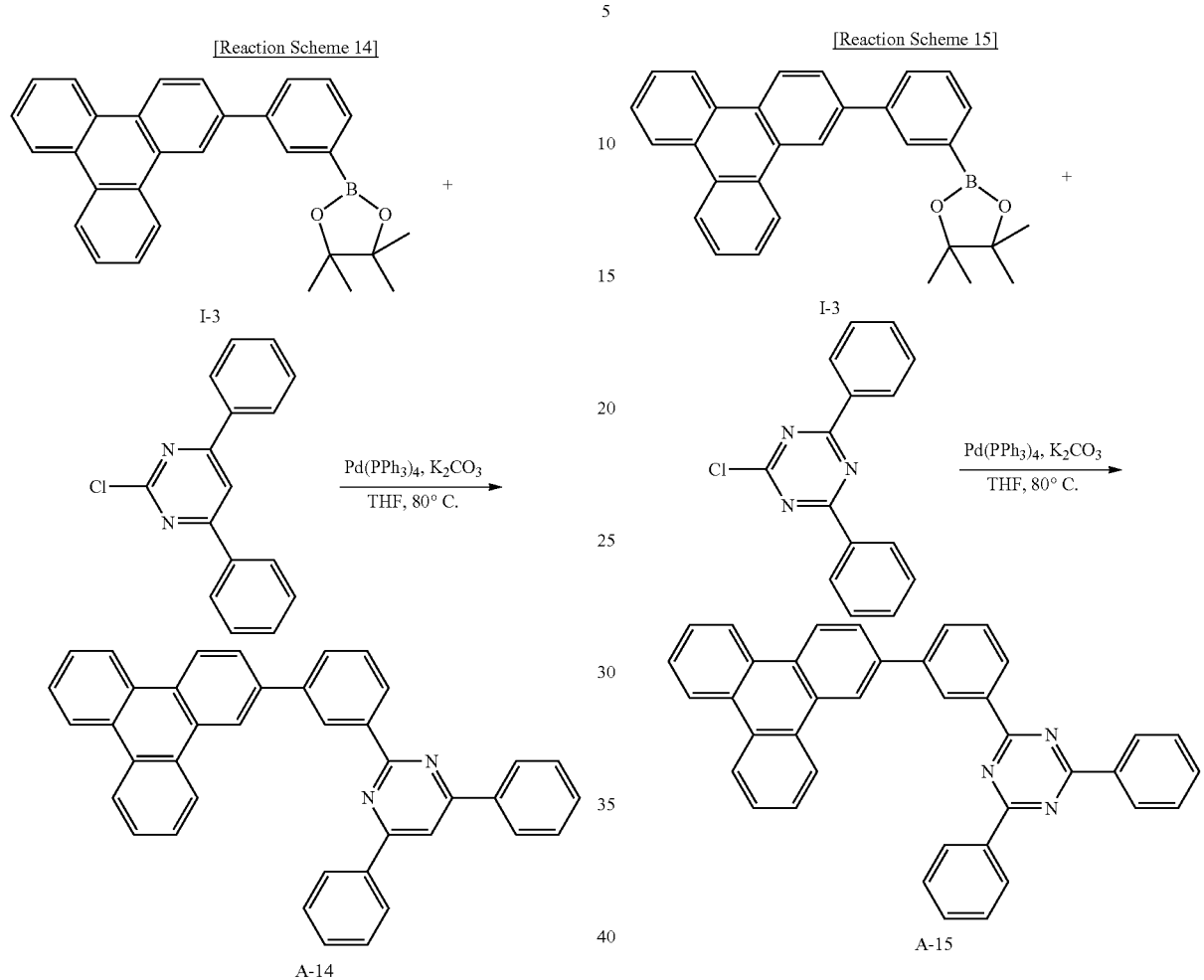

20 g (46.5 mmol) of the compound I-3 was dissolved in 0.2 L of tetrakishydrofuran (THF) under a nitrogen environment, 12.4 g (46.5 mmol) of 2-chloro-4,6-diphenylpyrimidine and 0.54 g (0.47 mmol) of tetrakis(triphenylphosphine)palladium were added thereto, and the mixture was agitated. 16.1 g (116 mmol) of potassium carbonate saturated in water was added thereto, and the mixture was heated and refluxed at 80° C. for 15 hours. When the reaction was complete, water was added to the reaction solution, the mixture was extracted with dichloromethane (DCM), and the extract was treated with anhydrous $MgSO_4$ to remove moisture therefrom and then, filtered and concentrated under a reduced pressure. The obtained residue was separated and purified through flash column chromatography, obtaining 20.4 g (82%) of the compound A-14.

HRMS (70 eV, EI+): m/z calcd for $C_{40}H_{26}N_2$: 534.2096, found: 534.

Elemental Analysis: C, 90%; H, 5%

20 g (46.5 mmol) of the compound I-3 was dissolved in 0.2 L of tetrahydrofuran (THF) under a nitrogen environment, 12.4 g (46.5 mmol) of 2-chloro-4,6-diphenyl-1,3,5-triazine and 0.54 g (0.47 mmol) of tetrakis(triphenylphosphine)palladium were added thereto, and the mixture was agitated. 16.1 g (116 mmol) of potassium carbonate saturated in water was added thereto, and the mixture was heated and refluxed at 80° C. for 20 hours. When the reaction was complete, water was added to the reaction solution, the mixture was extracted with dichloromethane (DCM), and the extract was treated with anhydrous $MgSO_4$ to remove moisture therefrom and filtered and then, concentrated under a reduced pressure. The obtained residue was separated and purified through flash column chromatography, obtaining 21.2 g (85%) of the compound A-15.

HRMS (70 eV, EI+): m/z calcd for $C_{39}H_{25}N_3$: 535.2048, found: 535.

Elemental Analysis: C, 87%; H, 5%

Synthesis Example 16: Synthesis of Compound A-24

Synthesis Example 17: Synthesis of Compound A-33

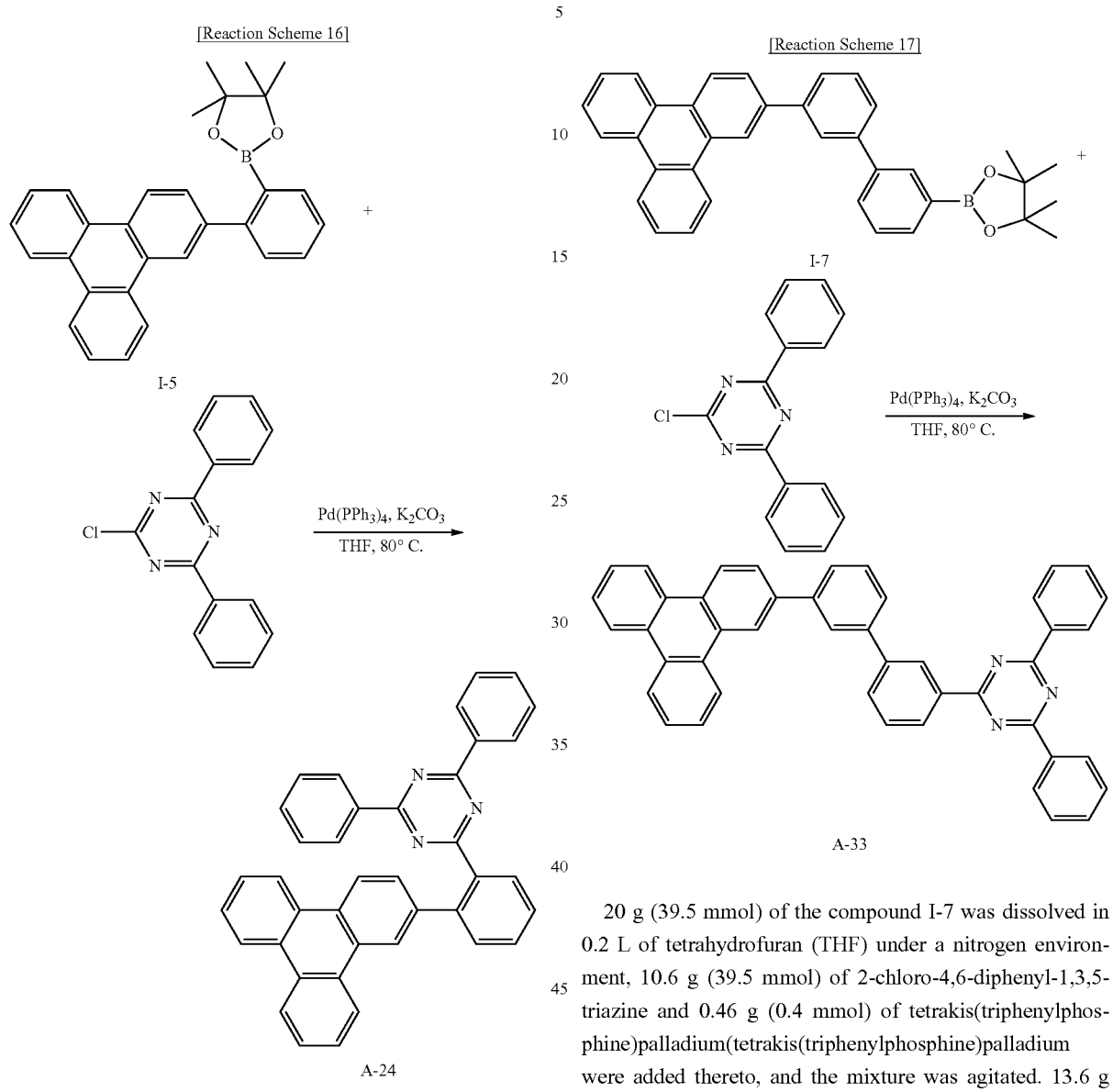

20 g (46.5 mmol) of the compound I-5 was dissolved in 0.2 L of tetrakishydrofuran (THF) under a nitrogen environment, 12.4 g (46.5 mmol) of 2-chloro-4,6-diphenyl-1,3,5-triazine and 0.54 g (0.47 mmol) of tetrakis(triphenylphosphine)palladium were added thereto, and the mixture was agitated. 16.1 g (116 mmol) of potassium carbonate saturated in water was added thereto, and the mixture was heated and refluxed at 80° C. for 27 hours. When the reaction was complete, water was added to the reaction solution, the mixture was extracted with dichloromethane (DCM), and the extract was treated with anhydrous MgSO$_4$ to remove moisture therefrom and then, filtered and concentrated under a reduced pressure. This obtained residue was separated and purified through flash column chromatography, obtaining 19.7 g (79%) of the compound A-24.

HRMS (70 eV, EI+): m/z calcd for C39H25N3: 535.2048, found: 535.

Elemental Analysis: C, 87%; H, 5%

20 g (39.5 mmol) of the compound I-7 was dissolved in 0.2 L of tetrahydrofuran (THF) under a nitrogen environment, 10.6 g (39.5 mmol) of 2-chloro-4,6-diphenyl-1,3,5-triazine and 0.46 g (0.4 mmol) of tetrakis(triphenylphosphine)palladium(tetrakis(triphenylphosphine)palladium were added thereto, and the mixture was agitated. 13.6 g (98.8 mmol) of potassium carbonate saturated in water was added thereto, and the mixture was heated and refluxed at 80° C. for 23 hours. When the reaction was complete, water was added to the reaction solution, the mixture was extracted with dichloromethane (DCM), and the extract was treated with anhydrous MgSO$_4$ to remove moisture therefrom and then, filtered and concentrated under a reduced pressure. The obtained residue was separated and purified through flash column chromatography, obtaining 17.9 g (74%) of the compound A-33.

HRMS (70 eV, EI+): m/z calcd for C45H29N3: 611.2361, found: 611.

Elemental Analysis: C, 88%; H, 5%

Synthesis Example 18: Synthesis of Compound A-69

[Reaction Scheme 18]

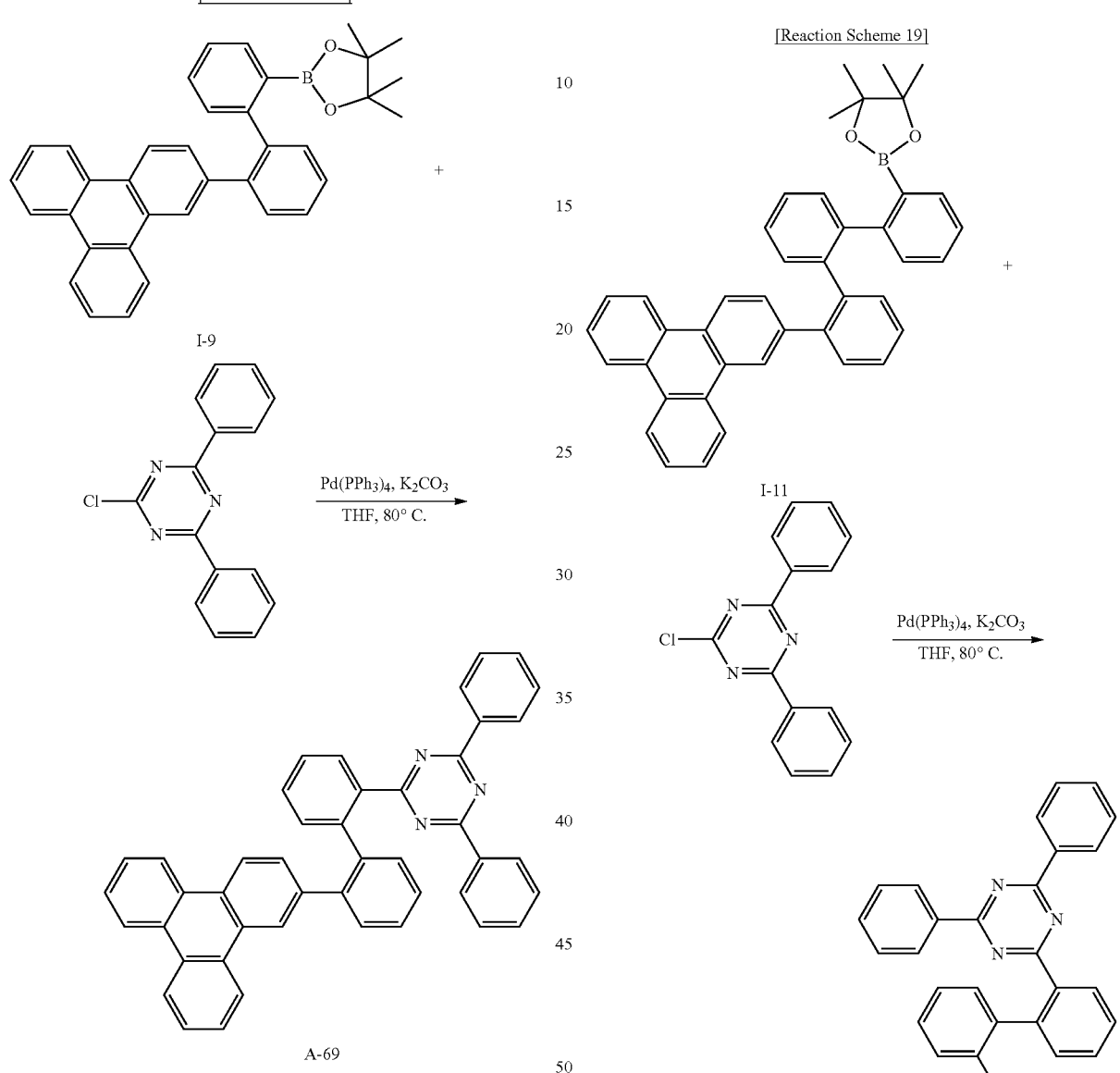

20 g (39.5 mmol) of the compound I-9 was dissolved in 0.2 L of tetrahydrofuran (THF) under a nitrogen environment, 10.6 g (39.5 mmol) of 2-chloro-4,6-diphenyl-1,3,5-triazine and 0.46 g (0.4 mmol) of tetrakis(triphenylphosphine)palladium were added thereto, and the mixture was agitated. 13.6 g (98.8 mmol) of potassium carbonate saturated in water was added thereto, and the resulting mixture was heated and refluxed at 80° C. for 32 hours. When the reaction was complete, water was added to the reaction solution, the mixture was extracted with dichloromethane (DCM), and the extract was treated with anhydrous $MgSO_4$ to remove moisture therefrom and then, filtered and concentrated under a reduced pressure. This obtained residue was separated and purified through flash column chromatography, obtaining 15.2 g (63%) the compound A-69.

HRMS (70 eV, EI+): m/z calcd for C45H29N3: 611.2361, found: 611.
Elemental Analysis: C, 88%; H, 5%

Synthesis Example 19: Synthesis of Compound A-87

[Reaction Scheme 19]

20 g (34.3 mmol) of the compound I-11 was dissolved in 0.15 L of tetrahydrofuran (THF) under a nitrogen environment, 9.19 g (34.3 mmol) of 2-chloro-4,6-diphenyl-1,3,5-triazine and 0.4 g (0.34 mmol) of tetrakis(triphenylphosphine)palladium were added thereto, and the mixture was agitated. 11.9 g (85.8 mmol) of potassium carbonate saturated in water was added thereto, and the resulting mixture was heated and refluxed at 80° C. for 29 hours. When the reaction was complete, water was added to the reaction solution, the mixture was extracted with dichloromethane (DCM), and the extract was treated with anhydrous MgSO$_4$ to remove moisture therefrom and then, filtered and concentrated under a reduced pressure. The obtained residue was separated and purified through flash column chromatography, obtaining 16.3 g (69%) of the compound A-87.

HRMS (70 eV, EI+): m/z calcd for C51H33N3: 687.2674, found: 687.

Elemental Analysis: C, 89%; H, 5%

Synthesis of Second Compound and/or Third Compound 1: Synthesis of Compound C-10

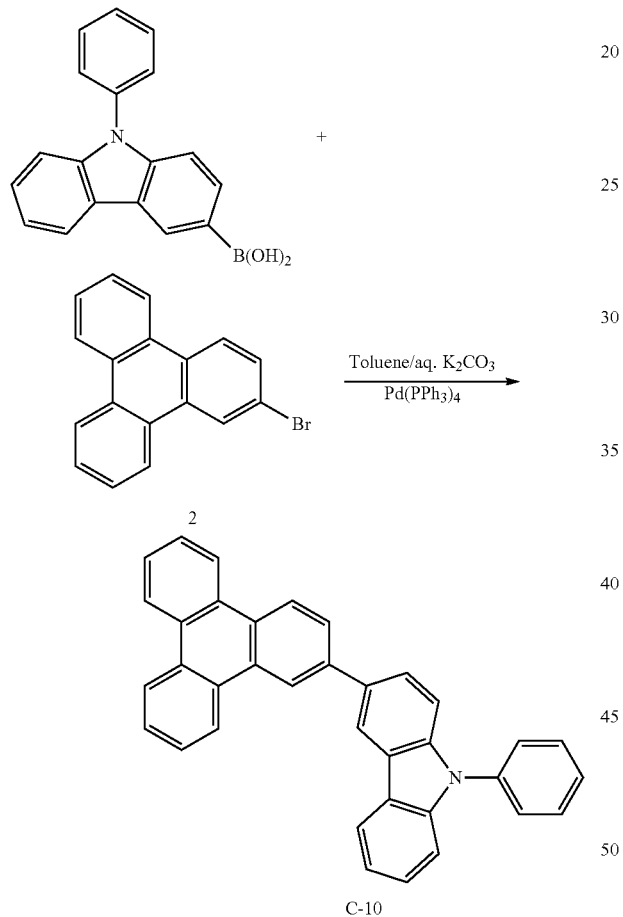

10 g (34.83 mmol) of phenylcarbazolyl boronic acid, 11.77 g (38.31 mmol) of the compound 2, and 14.44 g (104.49 mmol) of potassium carbonate, and 0.80 g (0.7 mmol) of tetrakis-(triphenylphosphine)palladium (0) were suspended in 140 ml of toluene and 50 ml of distilled water, and the suspended solution was refluxed and agitated for 12 hours. Subsequently, the resultant mixture was extracted with dichloromethane and distilled water, and the obtained organic layer was silica gel-filtered. Then, after removing an organic solution therefrom, a solid product was obtained through a silica gel column with hexane:dichloromethane=7:3 (v/v) and then, recrystallized with dichloromethane and n-hexane, obtaining 14.4 g (a yield: 88%) of a compound C-10.

HRMS (70 eV, EI+): m/z calcd for C36H23N: 469.18, found: 469.

Elemental Analysis: C, 92%; H, 5%

Synthesis of Second Compound and/or Third Compound 2: Synthesis of Compound B-10

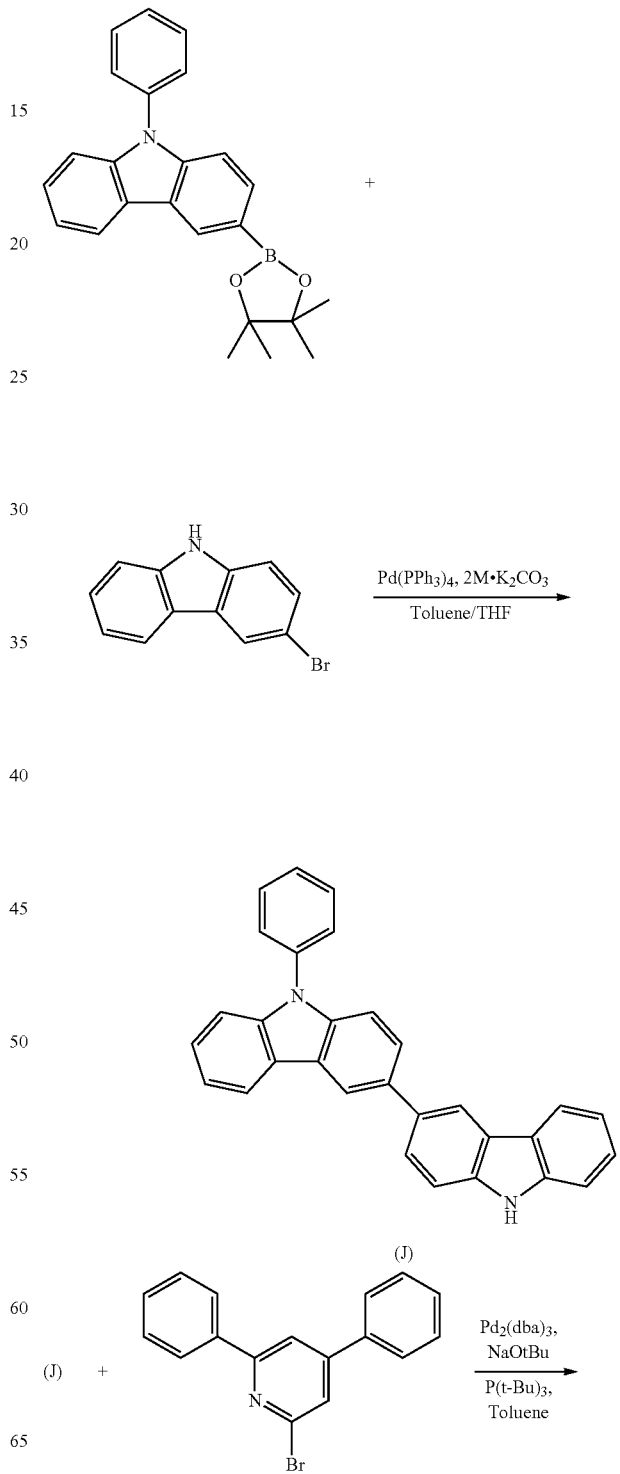

-continued

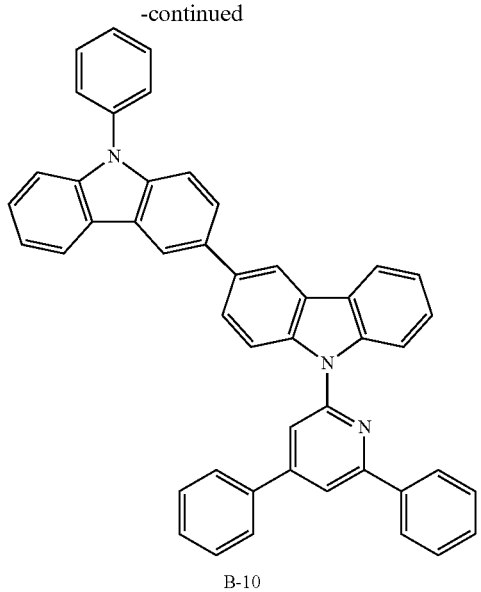

B-10

First Step: Synthesis of Compound J 26.96 g (81.4 mmol) of N-phenyl carbazole-3-boronic acid pinacolate and 23.96 g (97.36 mmol) of 3-bromo carbazole were mixed with 230 mL of tetrahydrofuran and 100 ml of a 2 M-potassium carbonate aqueous solution, and the mixture was heated and refluxed under a nitrogen stream for 12 hours. When the reaction was complete, a solid produced by pouring the reactant into methanol was filtered and then, dissolved in chlorobenzene, activated carbon and anhydrous magnesium sulfate were added thereto, and the mixture was agitated. The solution was filtered and recrystallized by using chlorobenzene and methanol, obtaining 22.6 g of a compound J (a yield: 68%).

HRMS (70 eV, EI+): m/z calcd for C30H20N2: 408.16, found: 408.

Elemental Analysis: C, 88%; H, 5%

Second Step: Synthesis of Compound B-10

22.42 g (54.88 mmol) of the compound J, 20.43 g (65.85 mmol) of 2-bromo-4,6-diphenylpyridine, and 7.92 g (82.32 mmol) of tertiarybutoxy sodium were dissolved in 400 ml of toluene, and 1.65 g (1.65 mmol) of palladium dibenzylideneamine and 1.78 g (4.39 mmol) of tertiarybutyl phosphorus were added in a dropwise fashion. The reaction solution was heated and refluxed at 110° C. under a nitrogen stream for 12 hours. When the reaction was complete, a solid produced by pouring methanol into the reactant mixture was filtered and then, dissolved in chlorobenzene, activated carbon and anhydrous magnesium sulfate were added thereto, and the mixture was agitated. The solution was filtered and recrystallized with chlorobenzene and methanol, obtaining 28.10 g of a compound B-10 (a yield: 80%).

HRMS (70 eV, EI+): m/z calcd for C47H31N3: 637.25, found: 637.

Elemental Analysis: C, 89%; H, 5%

Synthesis of Second Compound and/or Third Compound 3: Synthesis of Compound B-31

[Reaction Scheme 22]

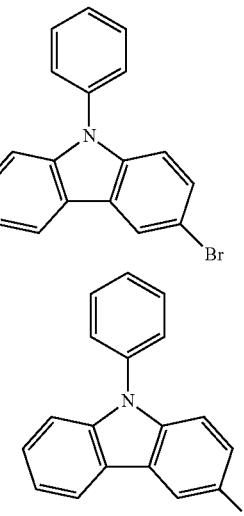

+

Toluene/aq. K₂CO₃
Pd(PPh₃)₄

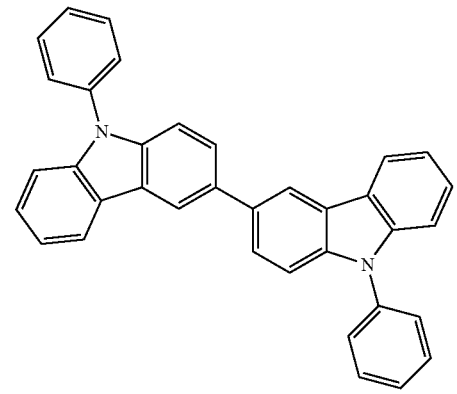

B-31

9.97 g (30.95 mmol) of phenylcarbazolyl bromide, 9.78 g (34.05 mmol) of phenylcarbazolyl boronic acid, 12.83 g (92.86 mmol) of potassium carbonate, and 1.07 g (0.93 mmol) of tetrakis-(triphenylphosphine)palladium (0) were suspended in 120 ml of toluene and 50 ml of distilled water, and the suspended solution was refluxed and agitated for 12 hours. Subsequently, the resultant mixture was extracted with dichloromethane and distilled water, and an organic layer was silica gel-filtered therefrom. Then, after removing an organic solution therefrom, a solid product obtained therefrom was recrystallized with dichloromethane and n-hexane, obtaining 13.8 g of a compound B-31 (a yield: 92%).

HRMS (70 eV, EI+): m/z calcd for C36H24N2: 484.19, found: 484.

Elemental Analysis: C, 89%; H, 5%

Synthesis of Second Compound and/or Third Compound 4: Synthesis of Compound B-34

[Reaction Scheme 23]

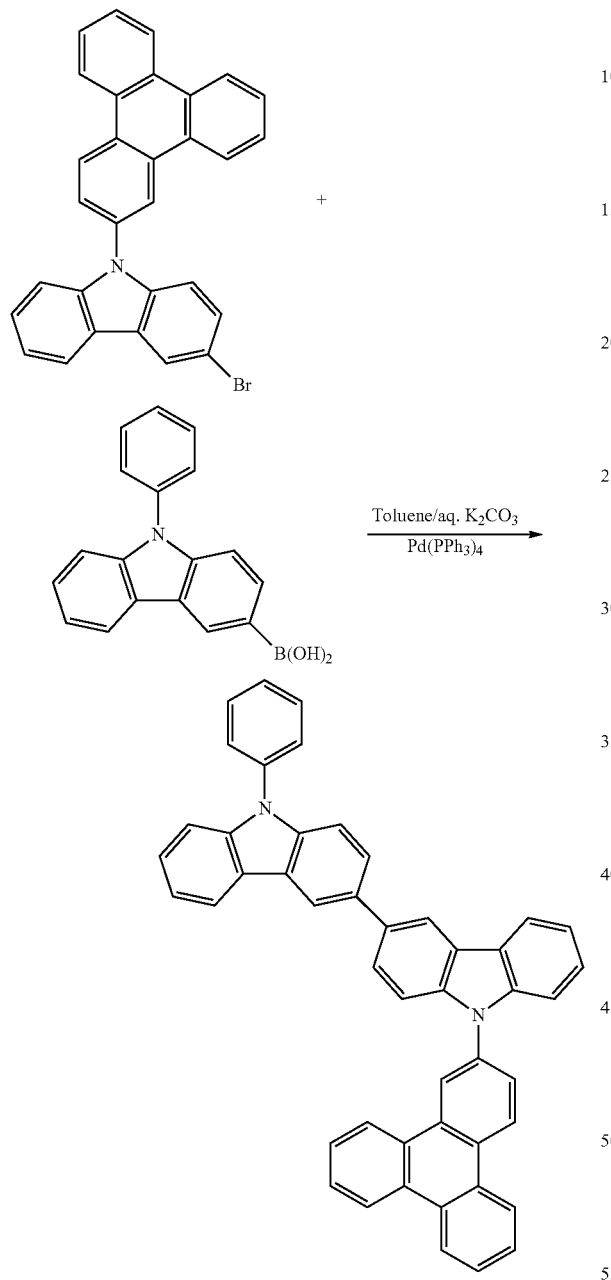

14.62 g (30.95 mmol) of triphenyl carbazolyl bromide, 9.78 g (34.05 mmol) of phenylcarbazolyl boronic acid, 12.83 g (92.86 mmol) of potassium carbonate, and 1.07 g (0.93 mmol) of tetrakis-(triphenylphosphine)palladium (0) were suspended in 120 ml of toluene and 50 ml of distilled water, and the suspended solution was refluxed and agitated for 12 hours. Subsequently, the resultant mixture was extracted with dichloromethane and distilled water, and an organic layer produced therein was silica gel-filtered. Then, a solid product obtained after removing an organic solution therefrom was recrystallized with dichloromethane and n-hexane, obtaining 16.7 g of a compound B-34 (a yield: 85%).

HRMS (70 eV, EI+): m/z calcd for C47H29N2: 621.23, found: 621.

Elemental Analysis: C, 91%; H, 5%

Synthesis of Second Compound and/or Third Compound 5: Synthesis of Compound B-43

[Reaction Scheme 24]

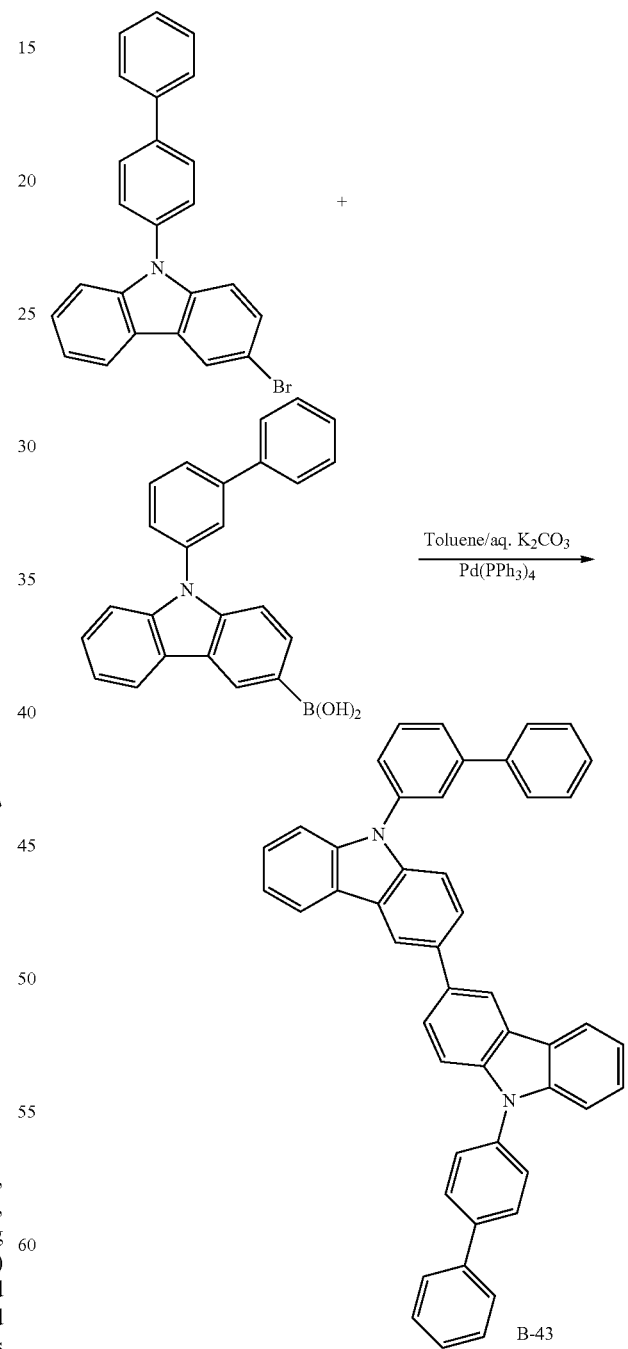

12.33 g (30.95 mmol) of biphenylcarbazolyl bromide, 12.37 g (34.05 mmol) of biphenylcarbazolyl boronic acid, 12.83 g (92.86 mmol) of potassium carbonate, and 1.07 g (0.93 mmol) of tetrakis-(triphenylphosphine)palladium (0) were suspended in 120 ml of toluene and 50 ml of distilled water, and the suspended solution was refluxed and agitated for 12 hours. Subsequently, the resultant mixture was extracted with dichloromethane and distilled water, and an organic layer produced therein was silica gel-filtered. Then, a solid product obtained after removing an organic solution therefrom was recrystallized with dichloromethane and n-hexane, obtaining 18.7 g of a compound B-43 (a yield: 92%).

HRMS (70 eV, EI+): m/z calcd for C48H32N2: 636.26, found: 636.

Elemental Analysis: C, 91%; H, 5%

Synthesis of Second Compound and/or Third Compound 6: Synthesis of Compound B-23

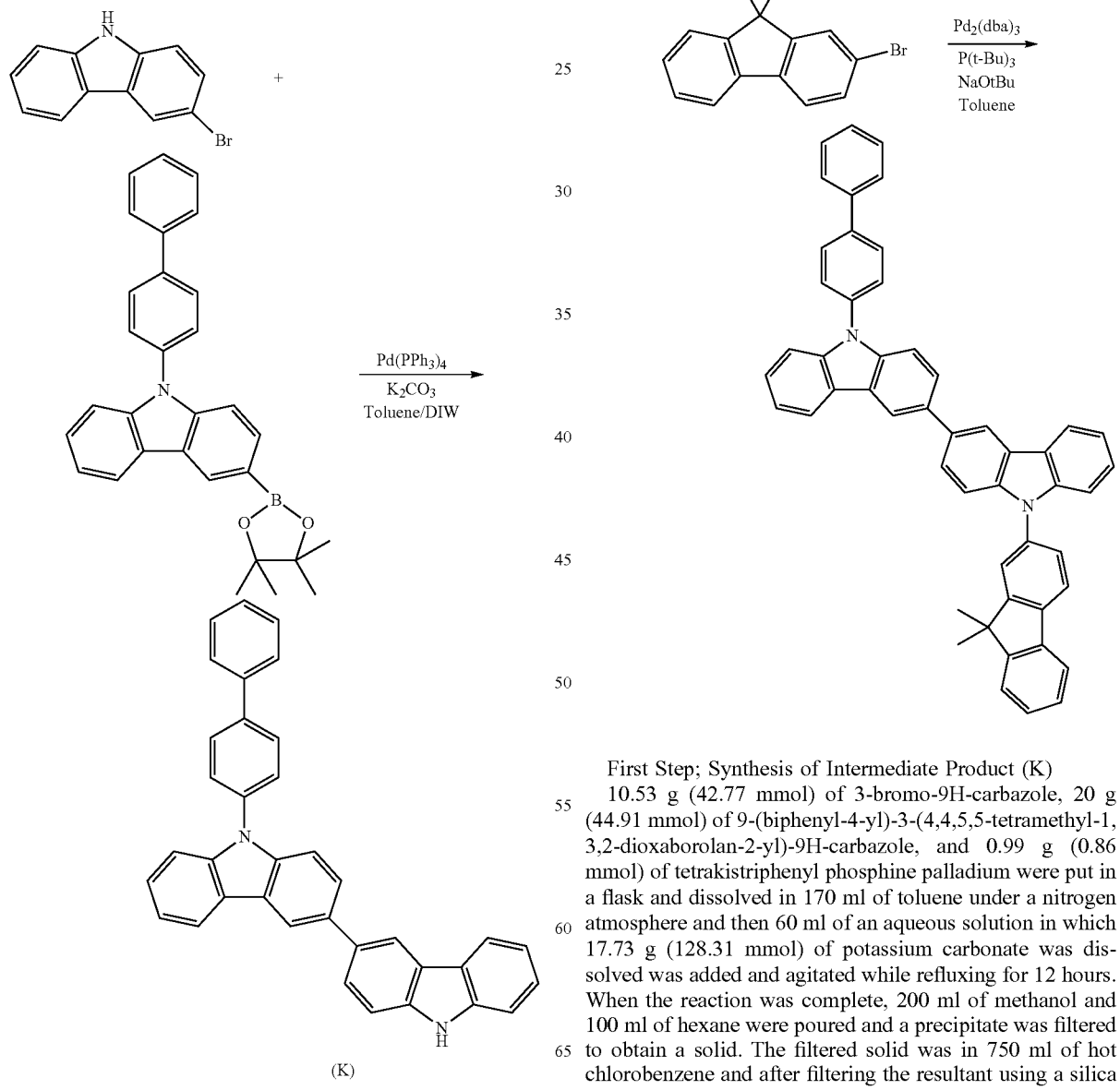

First Step; Synthesis of Intermediate Product (K)

10.53 g (42.77 mmol) of 3-bromo-9H-carbazole, 20 g (44.91 mmol) of 9-(biphenyl-4-yl)-3-(4,4,5,5-tetramethyl-1,3,2-dioxaborolan-2-yl)-9H-carbazole, and 0.99 g (0.86 mmol) of tetrakistriphenyl phosphine palladium were put in a flask and dissolved in 170 ml of toluene under a nitrogen atmosphere and then 60 ml of an aqueous solution in which 17.73 g (128.31 mmol) of potassium carbonate was dissolved was added and agitated while refluxing for 12 hours. When the reaction was complete, 200 ml of methanol and 100 ml of hexane were poured and a precipitate was filtered to obtain a solid. The filtered solid was in 750 ml of hot chlorobenzene and after filtering the resultant using a silica gel filter, the filtered solution was cooled to obtain a white crystal. The cooled filtered solution was filtered to obtain 8.92 g (yield 43%) of a desirable compound, an intermediate (K) as a white solid.

Second Step; Synthesis of Compound B-23

8.92 g (18.41 mmol) of the intermediate (K) and 5.53 g (20.23 mmol) of 2-bromo-9,9-dimethyl-9H-fluorene, 2.65 g (27.61 mmol) of NaOt-Bu, 0.51 g (0.55 mmol) of $Pd_2(dba)_3$ were suspended in 100 ml of toluene and 0.45 ml (1.84 mmol) of $P(t-Bu)_3$ was added and then agitated while refluxing for 12 hours. The resultant mixture was extracted with dichloromethane and distilled water, and an organic layer was filtered using a silica gel filter. After removing an organic solution, the generated solid was recrystallized with dichloromethane and ethyl acetate to 11.07 g (yield: 89%) of a synthesized product HT-545.

Manufacture of Organic Light Emitting Diode

Example 1

A glass substrate coated with ITO (Indium tin oxide) to be 1500 Å thick was ultrasonic wave-washed with a distilled water. Subsequently, the glass substrate was ultrasonic wave-washed with a solvent, such as, isopropyl alcohol, acetone, methanol, and the like, moved to a plasma cleaner, cleaned by using oxygen plasma for 10 minutes, and then, moved to a vacuum depositor. This obtained ITO transparent electrode was used as a anode, N4,N4'-diphenyl-N4,N4'-bis (9-phenyl-9H-carbazol-3-yl)biphenyl-4,4'-diamine) (a compound A) was vacuum-deposited on the ITO substrate upper to form a 700 Å-thick hole injection layer (HIL), 1,4,5,8,9, 11-hexaazatriphenylene-hexacarbonitrile (HAT-CN) (a compound B) was deposited to be 50 Å-thick on the hole injection layer, and N-(biphenyl-4-yl)-9,9-dimethyl-N-(4-(9-phenyl-9H-carbazol-3-yl)phenyl)-9H-fluoren-2-amine (a compound C) was deposited to be 700 Å-thick to form a hole transport layer (HTL). The synthesized compound B-23 was vacuum-deposited on the hole transport layer (HTL) to form a 320 Å-thick hole transport auxiliary layer. Subsequently, the synthesized compound A-33 and compound B-10 were used as a host and doped with 10 wt % of tris (4-methyl-2,5-diphenylpyridine)iridium(III) (compound D) as a dopant using vacuum deposition on the hole transport auxiliary layer to form a 400 Å-thick emission layer. Herein, the compound A-33 and the compound B-10 were used in a weight ratio of 1:1.

Subsequently, 8-(4-(4-(naphthalen-2-yl)-6-(naphthalen-3-yl)-1,3,5-triazin-2-yl)phenyl)quinoline) (a compound E) and Liq were simultaneously vacuum-deposited in a ratio of 1:1 on the emission layer upper to form a 300 Å-thick electron transport layer (ETL), and 15 Å-thick Liq and 1200 Å-thick Al were sequentially vacuum-deposited to from a cathode on the electron transport layer (ETL), manufacturing an organic light emitting diode.

The organic light emitting diode had a six-layered organic thin film structure, specifically, ITO/A 700 Å/B 50 Å/C 720 Å/hole transport auxiliary layer [B-23 320 Å]/EML[A-33:B-10:D=X:X:10%] 400 Å/E:Liq 300 Å/Liq 15 Å/Al 1200 Å.

(X=weight ratio)

Example 2

An organic light emitting diode was manufactured according to the same method as Example 1 except for using the compound A-33 and the compound B-10 in a weight ratio of 4:1 in the emission layer.

Example 3

An organic light emitting diode was manufactured according to the same method as Example 1 except for using the compound B-31 instead of the compound B-23 in the hole transport auxiliary layer.

Example 4

An organic light emitting diode was manufactured according to the same method as Example 1 except for using the compound A-33 and the compound B-10 in a weight ratio of 4:1 in the emission layer and using the compound B-31 instead of the compound B-23 in the hole transport auxiliary layer.

Example 5

An organic light emitting diode was manufactured according to the same method as Example 1 except for using the compound B-43 in a weight ratio of 4:1 in the emission layer and using the compound B-10 instead of the compound B-23 in the hole transport auxiliary layer.

Example 6

An organic light emitting diode was manufactured according to the same method as Example 1 except for using the compound B-43 in the emission layer instead of the compound B-10 and using the compound B-43 instead of the compound B-23 in the hole transport auxiliary layer.

Example 7

An organic light emitting diode was manufactured according to the same method as Example 1 except for using the compound C-10 in the emission layer instead of the compound B-10 and using the compound B-10 instead of the compound B-23 in the hole transport auxiliary layer.

Example 8

An organic light emitting diode was manufactured according to the same method as Example 1 except for using the compound C-10 in the emission layer instead of the compound B-10.

Example 9

An organic light emitting diode was manufactured according to the same method as Example 1 except for using the compound B-10 instead of the compound B-23 in the hole transport auxiliary layer.

Comparative Example 1

An organic light emitting diode was manufactured according to the same method as Example 1 except that a hole transport auxiliary layer was not used.

Comparative Example 2

An organic light emitting diode was manufactured according to the same method as Example 1 except that a hole transport auxiliary layer was not used and the compound B-43 was used instead of compound B-10 in the emission layer.

Comparative Example 3

An organic light emitting diode was manufactured according to the same method as Example 1 except that a hole transport auxiliary layer was not used and the compound C-10 was used instead of compound B-10 in the emission layer.

Evaluation

Luminous efficiency and roll-off characteristics of each organic light emitting diode according to Examples 1 to 9 and Comparative Examples 1 to 3 were measured.

The measurements were performed in the following method, and the results are provided in the following Table 1.

(1) Measurement of Current Density Change Depending on Voltage Change

Current values flowing in the unit device of the manufactured organic light emitting diodes were measured for, while increasing the voltage from 0V to 10V using a current-voltage meter (Keithley 2400), and the measured current values were divided by an area to provide the results.

(2) Measurement of Luminance Change Depending on Voltage Change

Luminance of the manufactured organic light emitting diodes was measured for luminance, while increasing the voltage from 0V to 10V using a luminance meter (Minolta Cs-1000A).

(3) Measurement of Luminous Efficiency

Current efficiency (cd/A) at the same current density (10 mA/cm2) were calculated by using the luminance, current density, and voltages obtained from items (1) and (2).

(4) Measurement of Roll-Off

An efficiency roll-off was calculated as a percentage by using the measurements in the (3) (Max measurement−Measurement at 6000 cd/m$^2$/Max measurement).

By way of summation and review, an organic optoelectric device may be classified in accordance with its driving principles. For example, in a photoelectric device, excitons generated by photoenergy may be separated into electrons and holes and the electrons and holes may be transferred to different electrodes, respectively, and electrical energy may be generated. In a light emitting device, photoenergy may be generated from electrical energy by supplying a voltage or a current to electrodes.

Examples of organic optoelectric devices include an organic photoelectric device, an organic light emitting diode, an organic solar cell, and an organic photo-conductor drum.

The organic light emitting diode (OLED) has recently drawn attention due to an increase in demand for flat panel displays. The organic light emitting diode converts electrical energy into light by applying current to an organic light emitting material, and has a structure in which an organic layer is interposed between an anode and a cathode. The organic layer may include an emission layer and optionally an auxiliary layer, and the auxiliary layer may include at least one layer selected from, for example, a hole injection layer, a hole transport layer, an electron blocking layer, an electron transport layer, an electron injection layer, and a hole blocking layer in order to improve efficiency and stability of an organic light emitting diode.

One embodiment provides an organic optoelectric device having high efficiency characteristics. Another embodiment provides a display device including the organic optoelectric device. In an embodiment, an organic optoelectric device having high efficiency may be realized.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment

TABLE 1

|  | Hole transport auxiliary layer | Emission layer ||| Luminous efficiency (cd/A) | Roll-off (%) |
|  |  | First compound | Second compound | First compound: Second compound (wt/wt) |  |  |
| --- | --- | --- | --- | --- | --- | --- |
| Example 1 | B-23 | A-33 | B-10 | 1:1 | 57.7 | 10.8 |
| Example 2 | B-23 | A-33 | B-10 | 4:1 | 60.9 | 9.2 |
| Example 3 | B-31 | A-33 | B-10 | 1:1 | 51.9 | 16.5 |
| Example 4 | B-31 | A-33 | B-10 | 4:1 | 53.4 | 15.1 |
| Example 5 | B-10 | A-33 | B-43 | 1:1 | 63.5 | 7.1 |
| Example 6 | B-43 | A-33 | B-43 | 1:1 | 58.0 | 7.4 |
| Example 7 | B-10 | A-33 | C-10 | 1:1 | 55.1 | 11.6 |
| Example 8 | B-23 | A-33 | C-10 | 1:1 | 58.6 | 11.1 |
| Example 9 | C-10 | A-33 | B-10 | 1:1 | 55.9 | 16.8 |
| Comparative Example 1 |  | A-33 | B-10 | 1:1 | 45.1 | 17.3 |
| Comparative Example 2 |  | A-33 | B-43 | 1:1 | 44 | 20.7 |
| Comparative Example 3 |  | A-33 | C-10 | 1:1 | 42.3 | 24.8 |

*Impossible to measure life-span of a device having luminance of less than or equal to 6000 cd/m$^2$ Referring to Table 1, the organic light emitting diodes according to Examples 1 to 9 showed remarkably improved luminous efficiency, roll-off, and life-span characteristics compared with the organic light emitting diodes according to Comparative Examples 1 to 3.

may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An organic optoelectric device, comprising:
an anode and a cathode facing each other,
an emission layer interposed between the anode and the cathode,
a hole transport layer interposed between the anode and the emission layer, and
a hole transport auxiliary layer interposed between the hole transport layer and the emission layer,
the emission layer including at least one first compound represented by Chemical Formula 1:

[Chemical Formula 1]

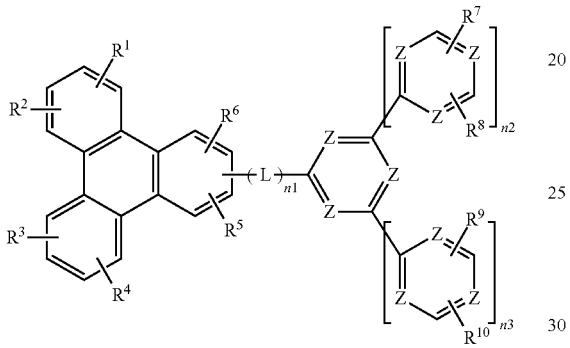

wherein, in Chemical Formula 1,
Z is independently N or $CR^a$,
at least one of Z is N,
$R^1$ to $R^{10}$ and $R^a$ are independently hydrogen, deuterium, a substituted or unsubstituted C1 to C10 alkyl group, a substituted or unsubstituted phenyl group, a substituted or unsubstituted naphthyl group, a substituted or unsubstituted biphenyl group, or a combination thereof,
the total number of 6-membered rings substituted on the triphenylenyl group is less than or equal to 6,
L is a substituted or unsubstituted phenylene group, a substituted or unsubstituted biphenylene group or a substituted or unsubstituted terphenylene group, wherein a substituent of the substituted phenylene group, the substituted biphenylene group, and the substituted terphenylene group is a C1 to C30 alkyl group, a C6 to C30 aryl group, or a cyano group,
n1 to n3 are independently 0 or 1, and
n1+n2+n3≥1;
the emission layer further including at least one second compound represented by Chemical Formula 2:

[Chemcial Formula 2]

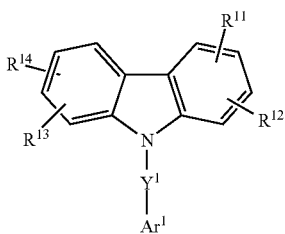

wherein, in Chemical Formula 2,
$Y^1$ is a single bond, a substituted or unsubstituted C1 to C20 alkylene group, a substituted or unsubstituted C2 to C20 alkenylene group, a substituted or unsubstituted C6 to C30 arylene group, a substituted or unsubstituted C2 to C30 heterocyclic group, or a combination thereof,
$Ar^1$ is a substituted or unsubstituted C6 to C30 aryl group, a substituted or unsubstituted C2 to C30 heterocyclic group, or a combination thereof,
$R^{11}$ to $R^{14}$ are independently hydrogen, deuterium, a substituted or unsubstituted C1 to C20 alkyl group, a substituted or unsubstituted C6 to C50 aryl group, a substituted or unsubstituted C2 to C50 heterocyclic group, or a combination thereof, and
at least one of $R^{11}$ to $R^{14}$ and $Ar^1$ includes a substituted or unsubstituted triphenylenyl group or a substituted or unsubstituted carbazolyl group; and
the hole transport auxiliary layer including a third compound represented by Chemical Formula 2, the third compound being the same as or different from the second compound.

2. The organic optoelectric device as claimed in claim 1, wherein the first compound is represented by Chemical Formula 1-I or Chemical Formula 1-II:

[Chemical Formula 1-I]

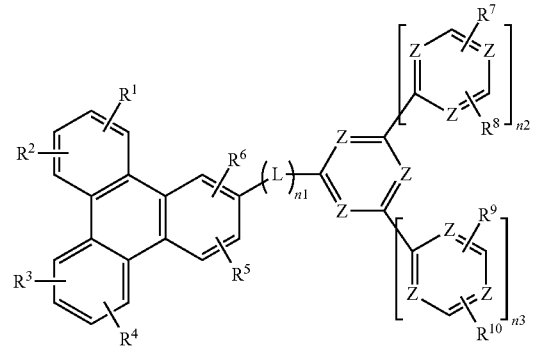

[Chemical Formula 1-II]

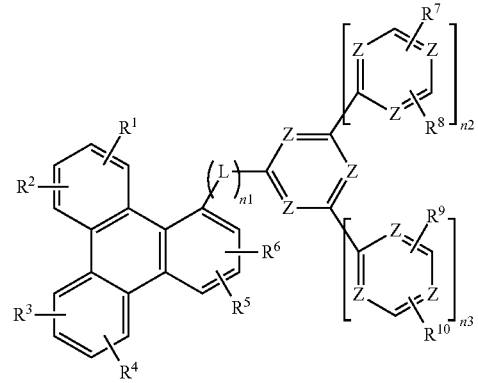

wherein, in Chemical Formula 1-I or 1-II,
Z is independently N or $CR^a$,
at least one of Z is N,
$R^1$ to $R^{10}$ and $R^a$ are independently hydrogen, deuterium, a substituted or unsubstituted C1 to C10 alkyl group, a substituted or unsubstituted phenyl group, a substituted or unsubstituted naphthyl group, a substituted or unsubstituted biphenyl group, or a combination thereof, the total number of 6-membered rings substituted on the triphenylenyl group is less than or equal to 6, L is a substituted or unsubstituted phenylene group, a substituted or unsubstituted biphenylene group or a substituted or unsubstituted terphenylene group, a substituent of the substituted phenylene group, the substituted biphenylene group, and the substituted terphenylene group is a C1 to C30 alkyl group, a C6 to C30 aryl group, or a cyano group, n1 to n3 are independently 0 or 1, and n1+n2+n3≥1.

3. The organic optoelectric device as claimed in claim 1, wherein L of Chemical Formula 1 is a single bond, a substituted or unsubstituted phenylene having a kink structure, a substituted or unsubstituted biphenylene group having a kink structure, or a substituted or unsubstituted terphenylene group having a kink structure, and a substituent of the substituted phenylene group, the substituted biphenylene group, and the substituted terphenylene group is a C1 to C30 alkyl group, a C6 to C30 aryl group or a cyano group.

4. The organic optoelectric device as claimed in claim 3, wherein L of Chemical Formula 1 is a single bond or a substituted or unsubstituted group selected from Group 1:

[Group 1]

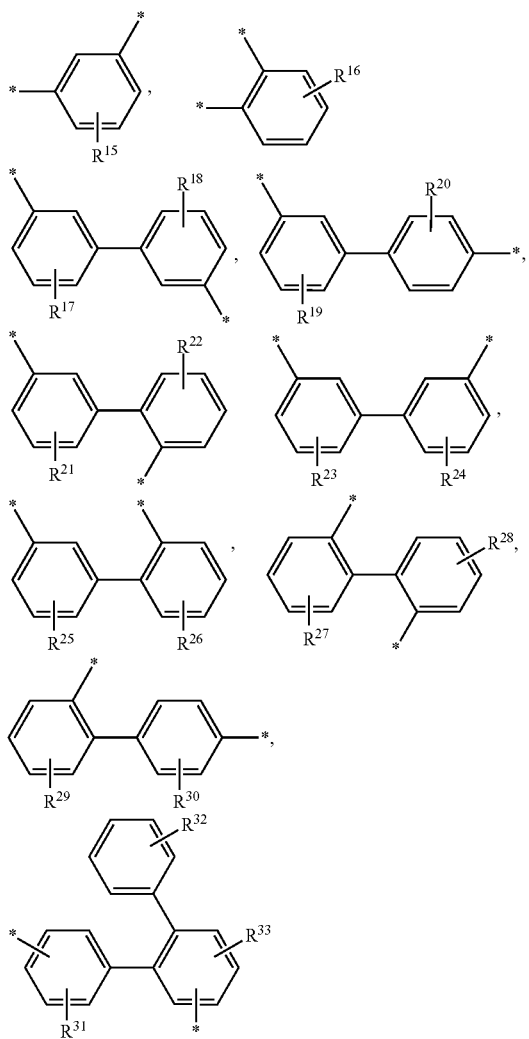

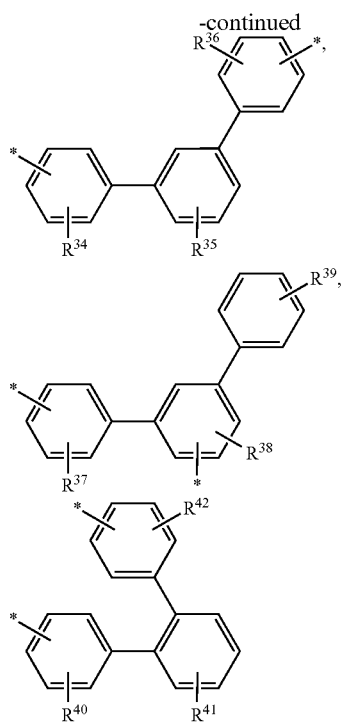

wherein, in the Group 1, $R^{15}$ to $R^{42}$ are independently hydrogen, C1 to C10 alkyl group, C6 to C30 aryl group, a cyano group.

5. The organic optoelectric device as claimed in claim 1, wherein the first compound has at least two kink structures.

6. The organic optoelectric device as claimed in claim 1, wherein the first compound is a compound selected from Group 2:

[Group 2]

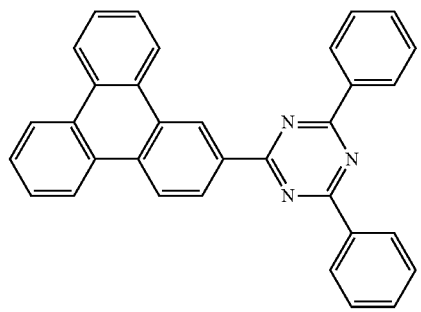

A-1

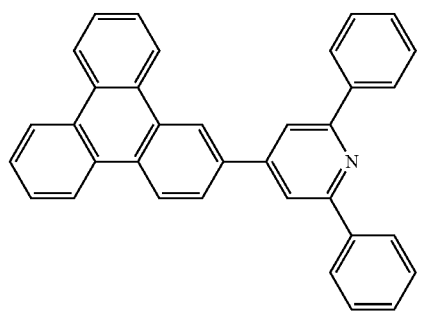

A-2

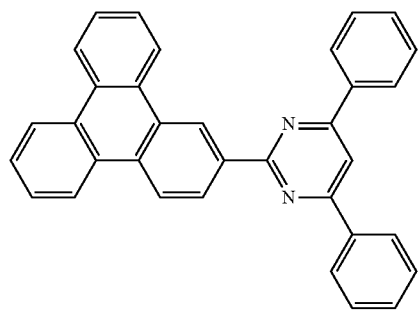
A-3
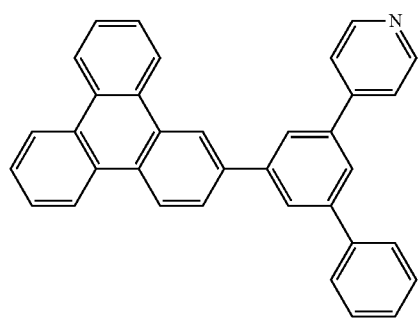
A-4
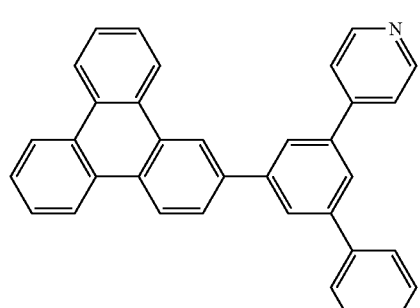
A-5
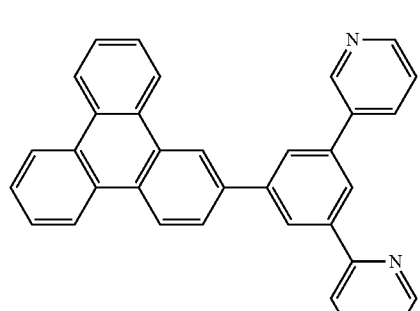
A-6
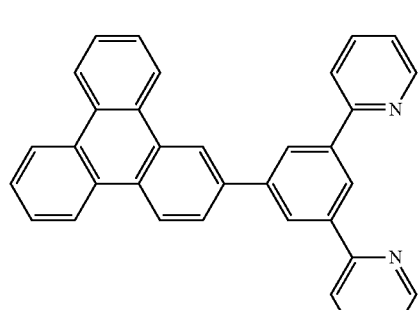
A-7
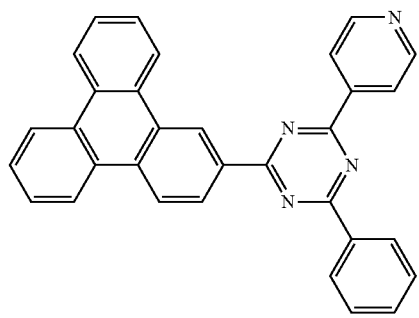
A-8
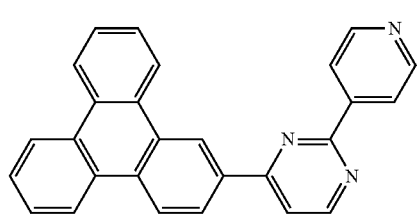
A-9
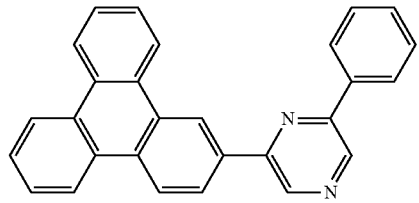
A-10
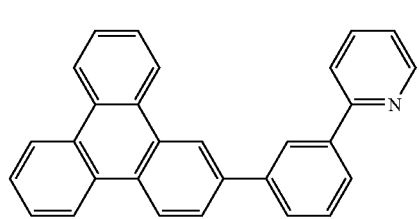
A-11
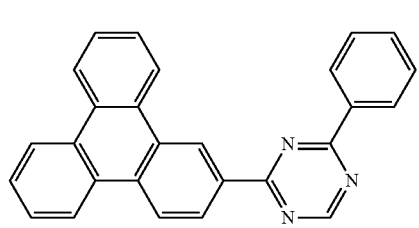
A-12
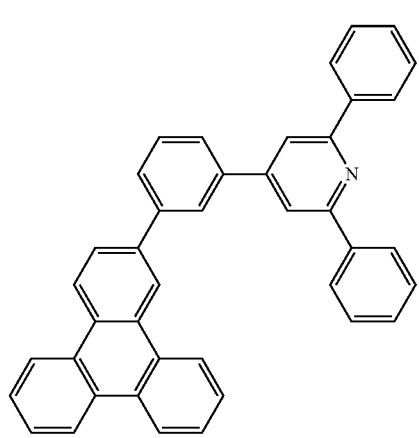
A-13

A-14
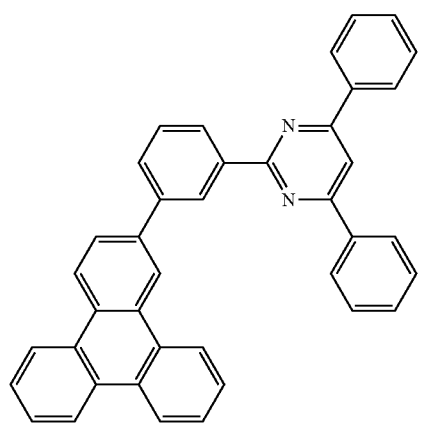
A-17
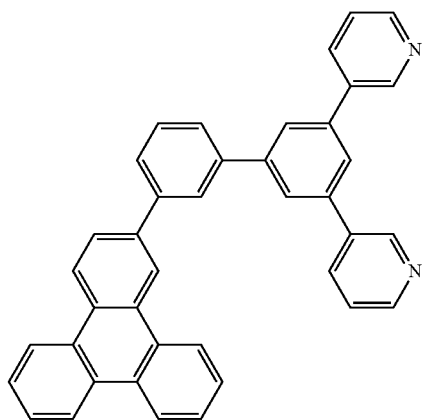
A-15
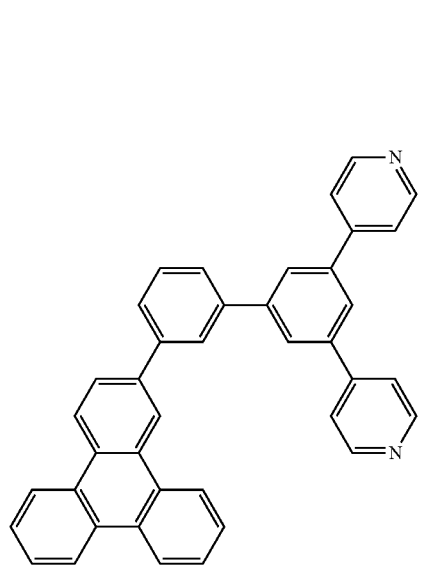
A-18
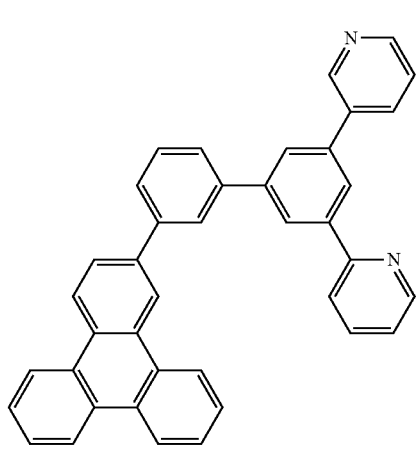
A-16
A-19
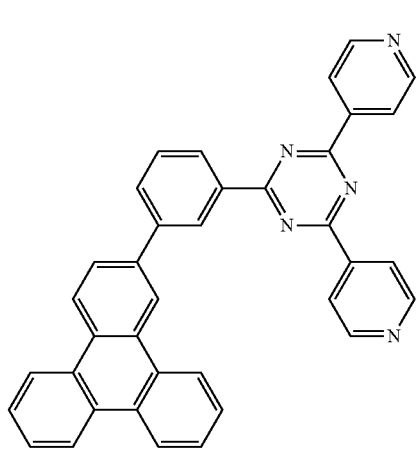

A-20
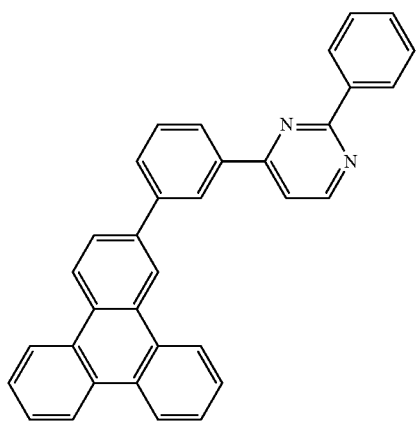
A-21
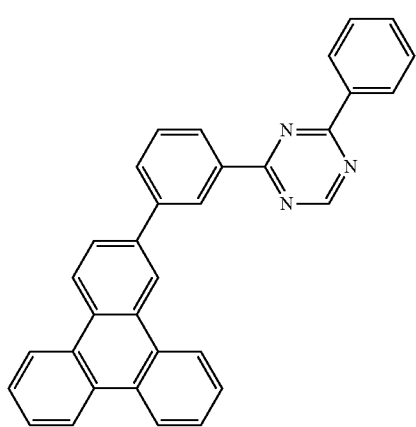
A-22
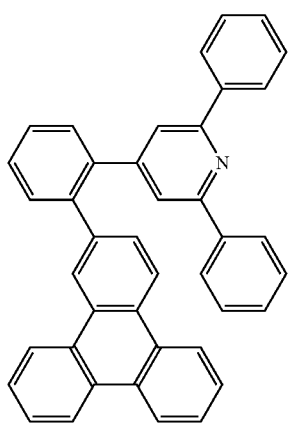
A-23
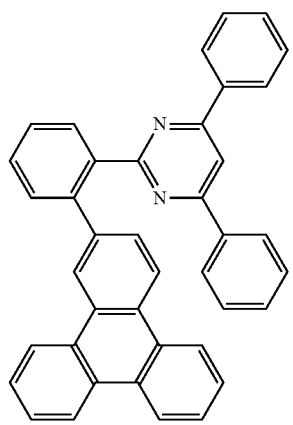
A-24
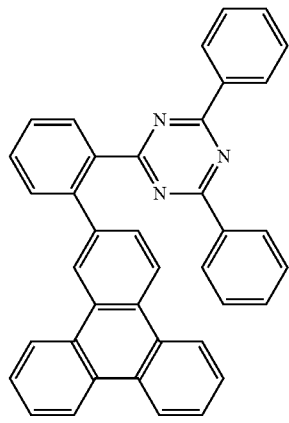
A-25
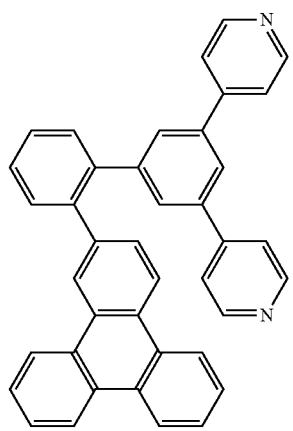

A-26 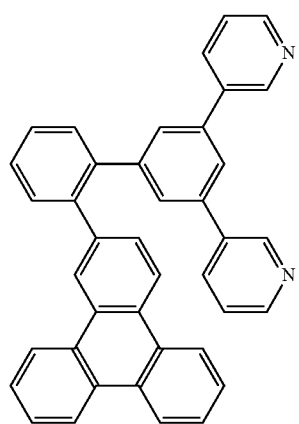
A-27 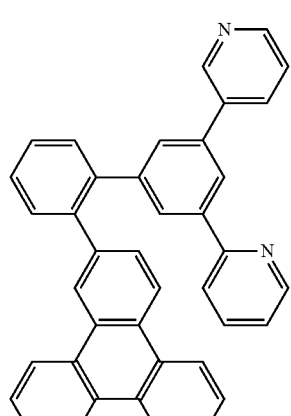
A-28 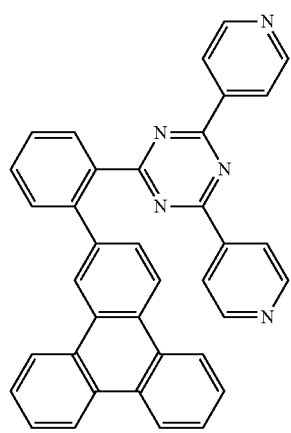
A-29 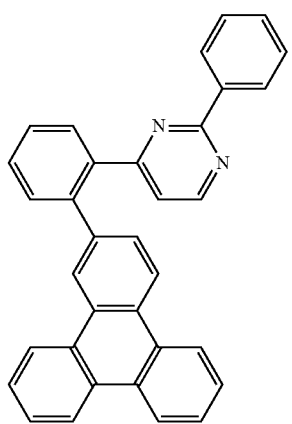
A-30 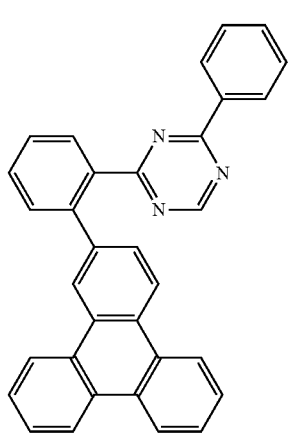
A-31 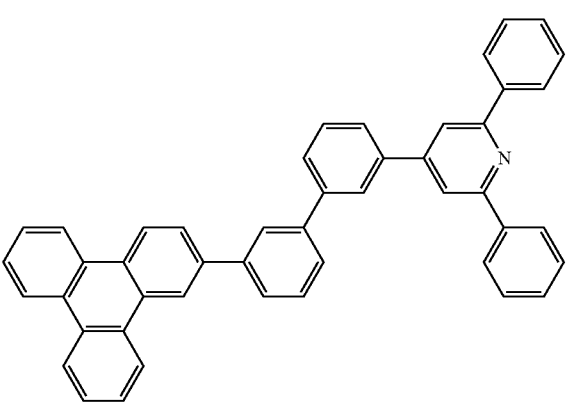

A-32
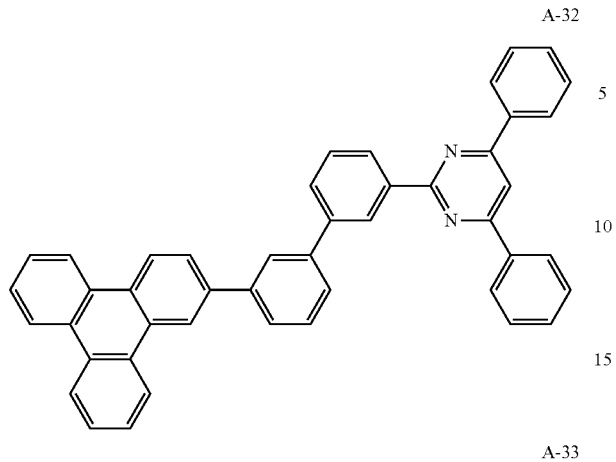
A-33
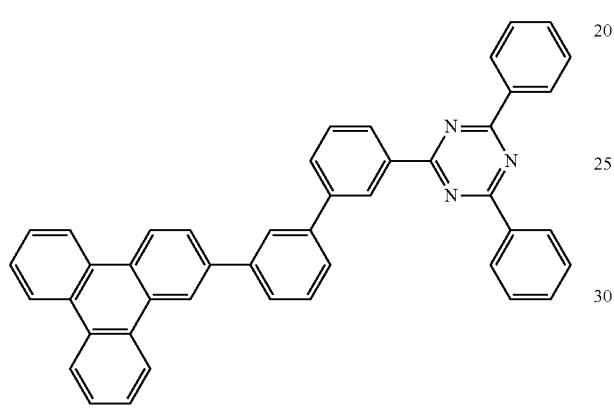
A-34
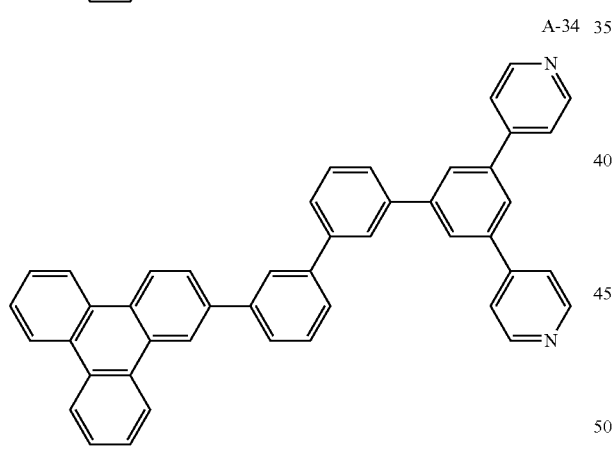
A-35
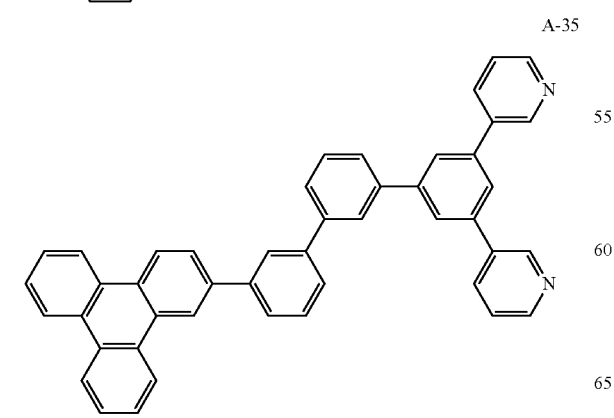
A-36
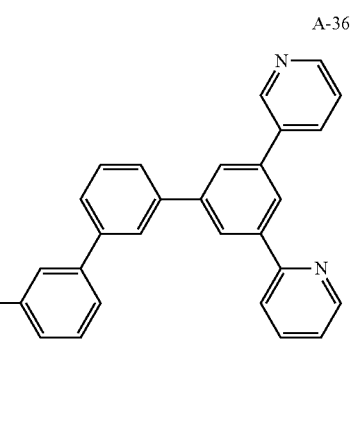
A-37
A-38

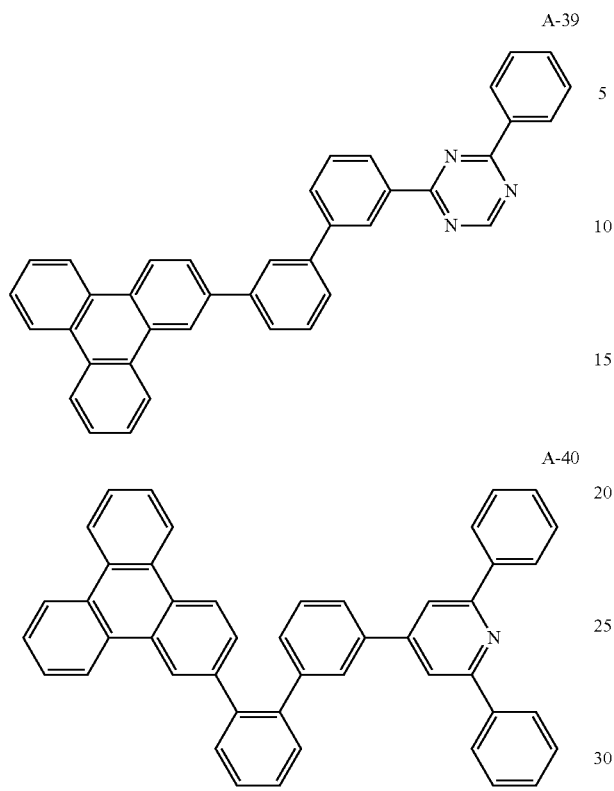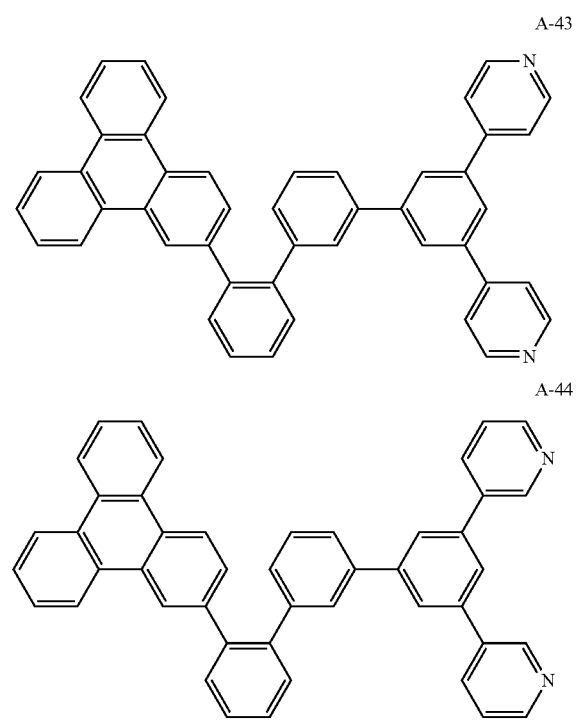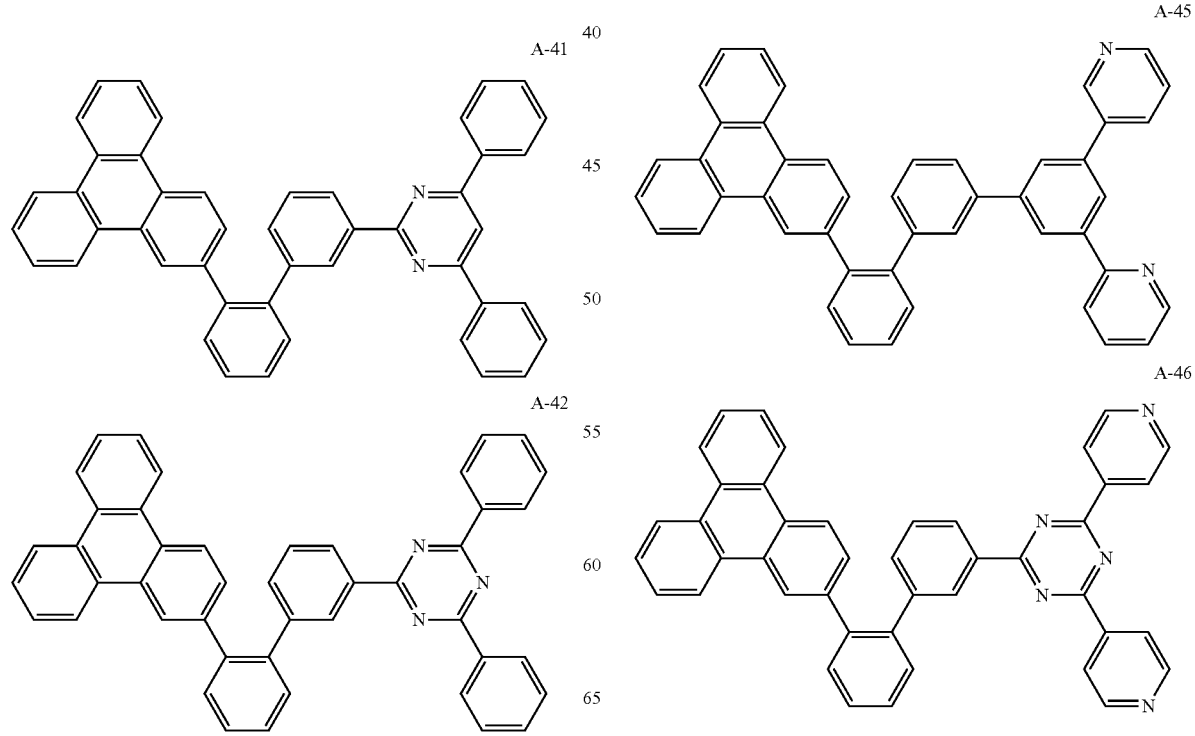

A-47
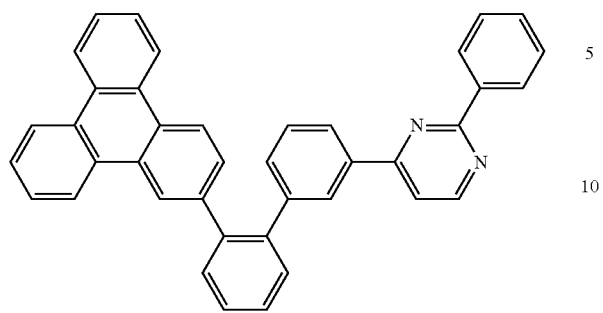
A-50
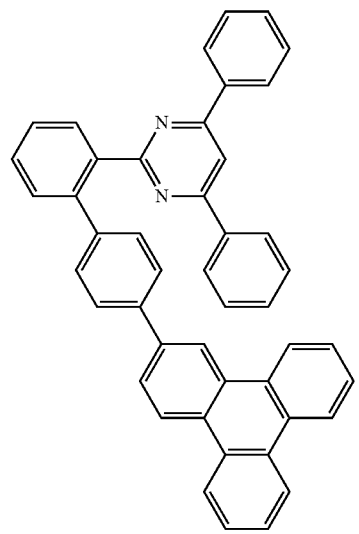
A-48
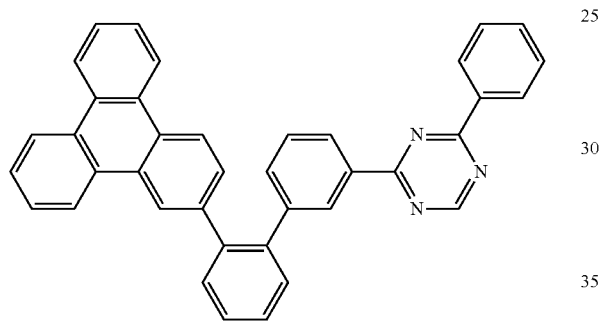
A-51
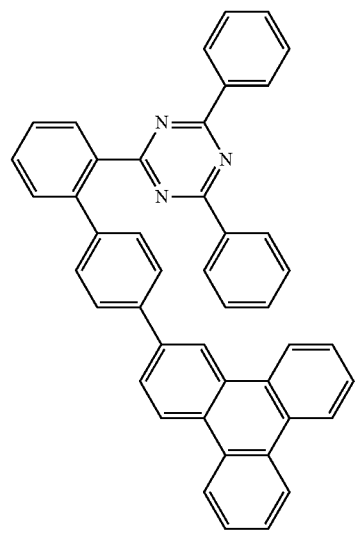
A-49
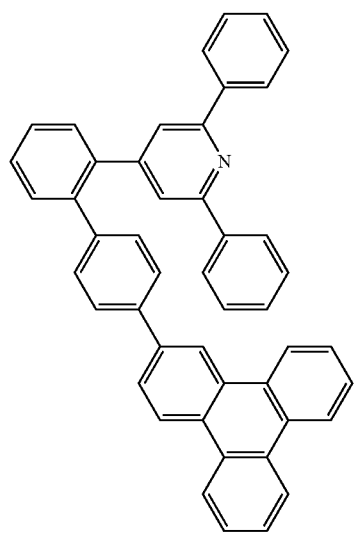
A-52
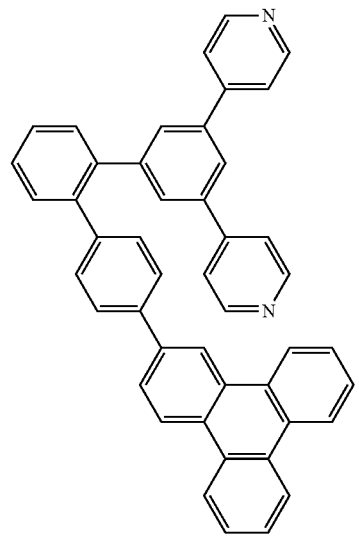

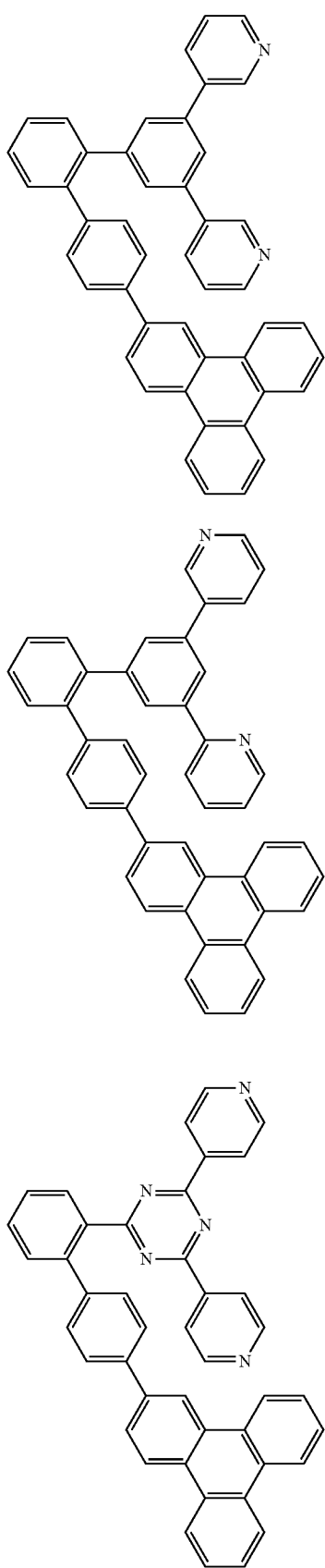
A-53
A-54
A-55
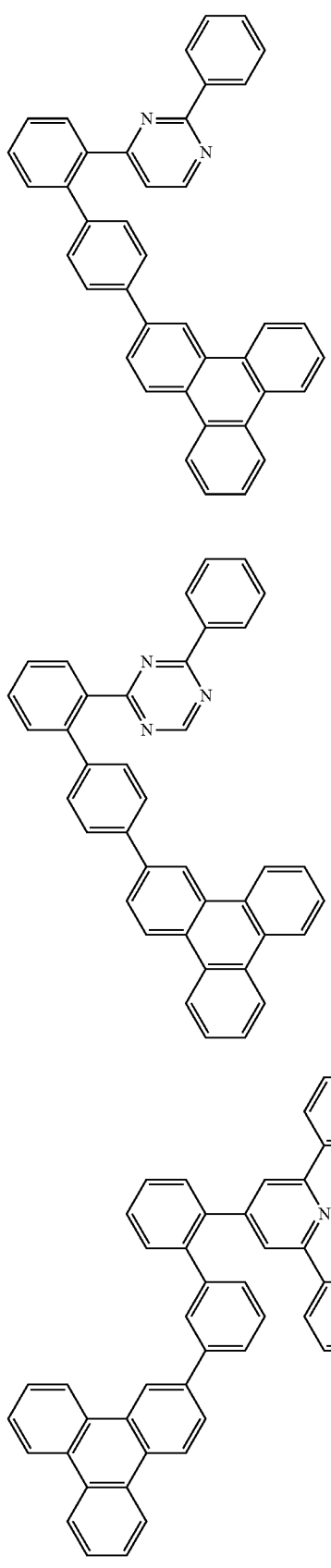
A-56
A-57
A-58

A-59
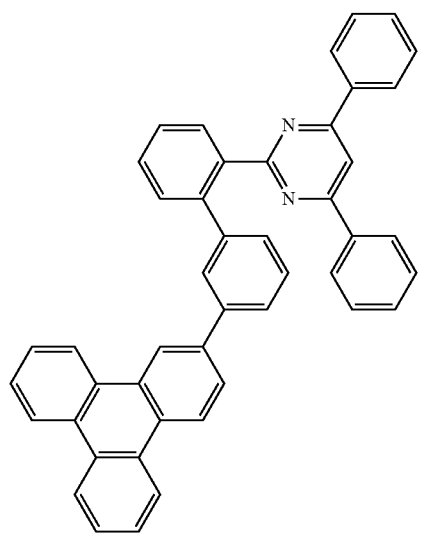
A-60
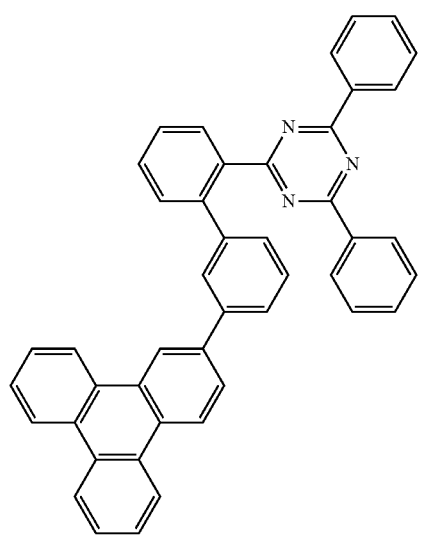
A-61
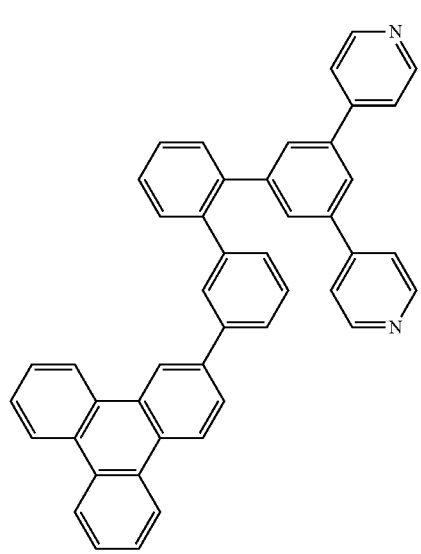
A-62
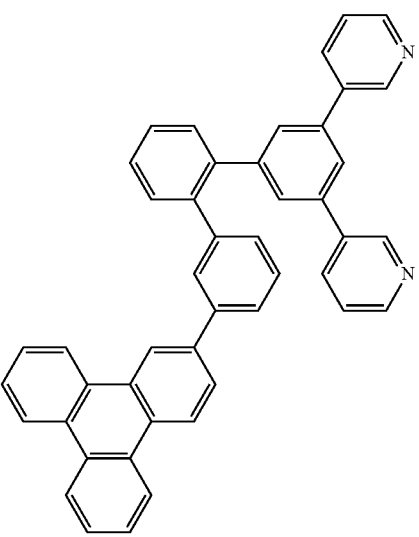
A-63
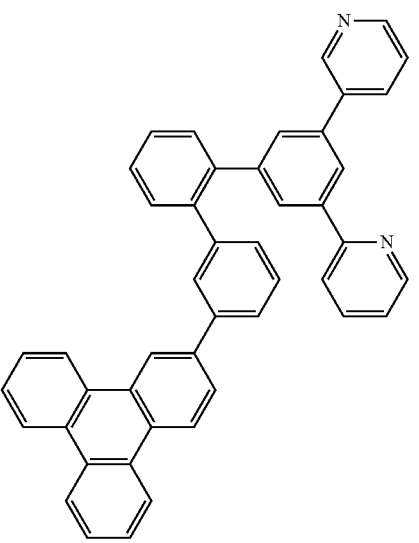
A-64
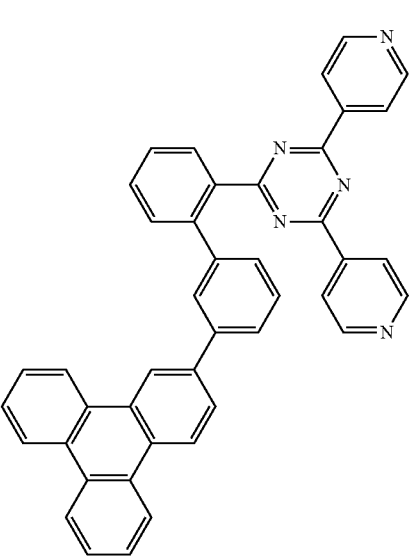

A-65
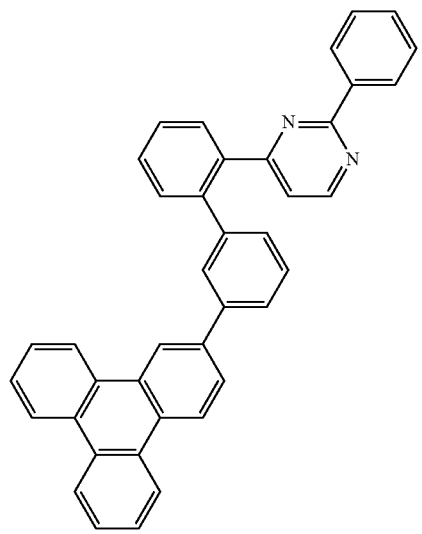
A-66
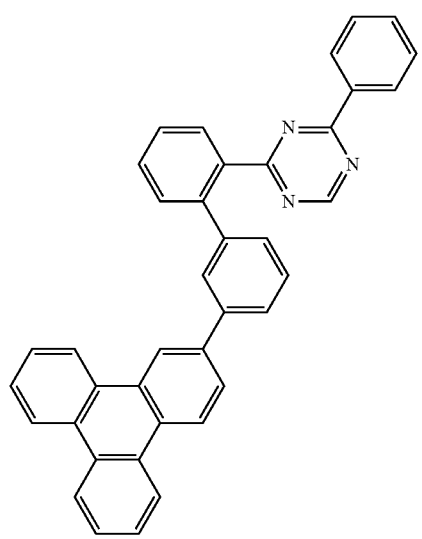
A-67
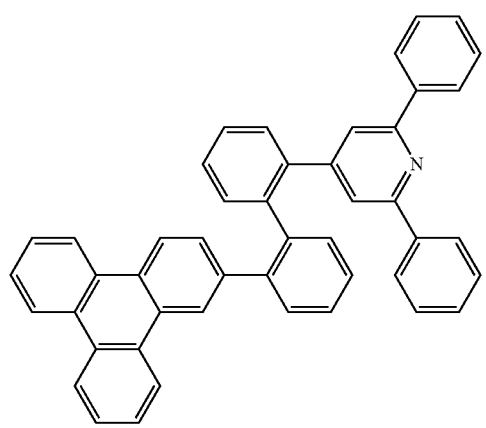
A-68
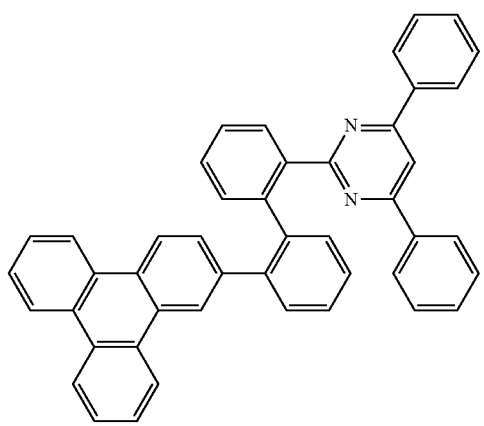
A-69
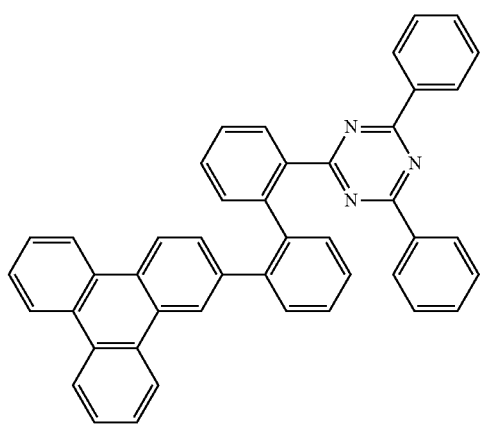
A-70
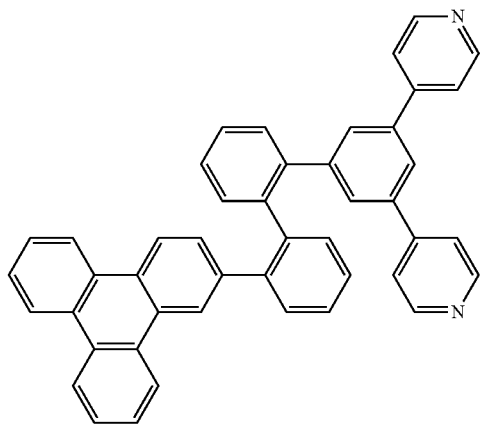

A-71
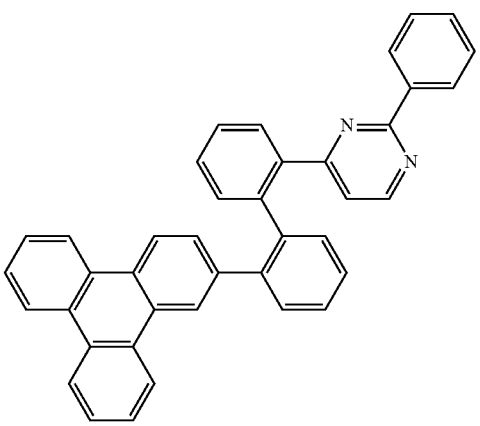
A-74
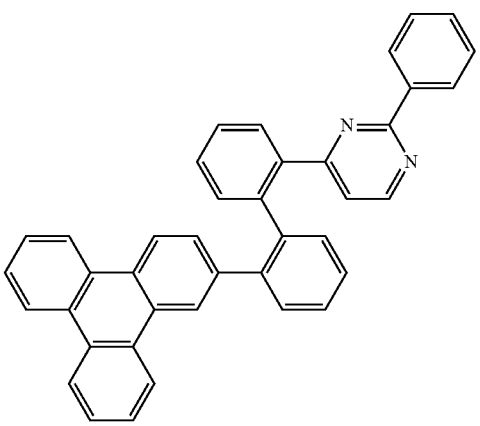
A-75
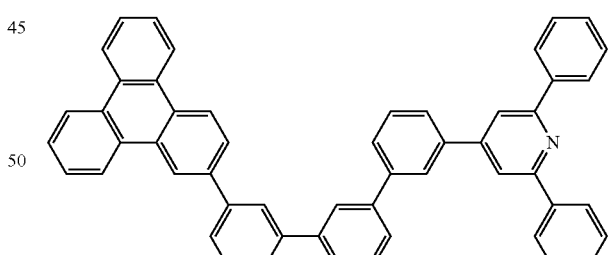
A-72
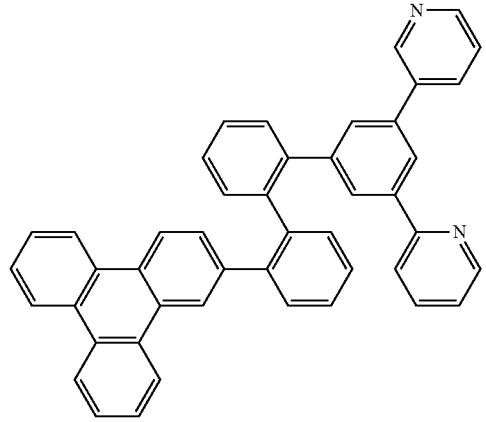
A-73
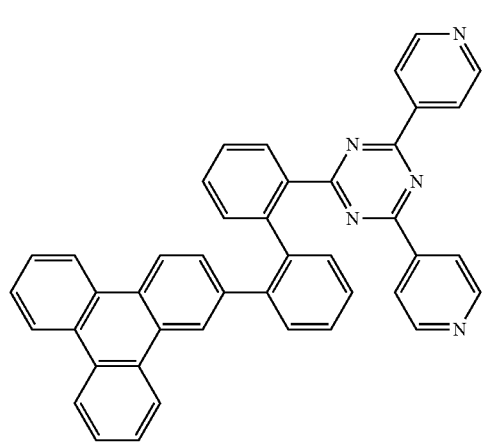
A-76
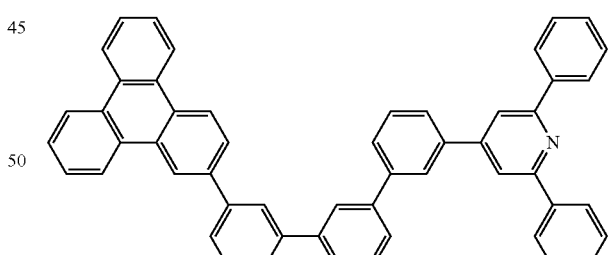
A-77
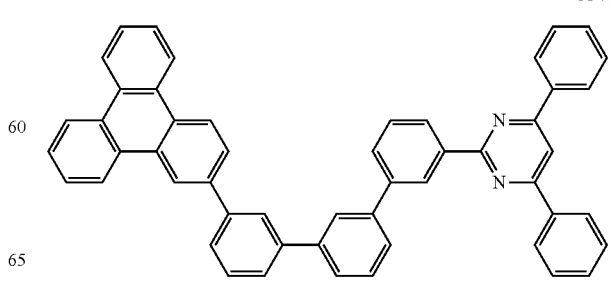

A-78
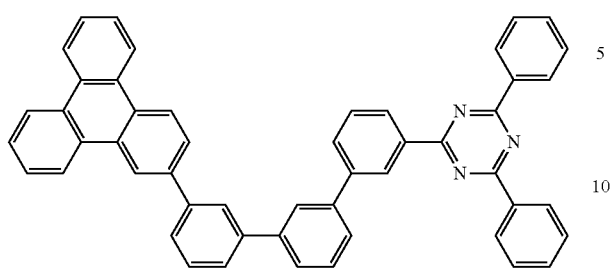
A-79
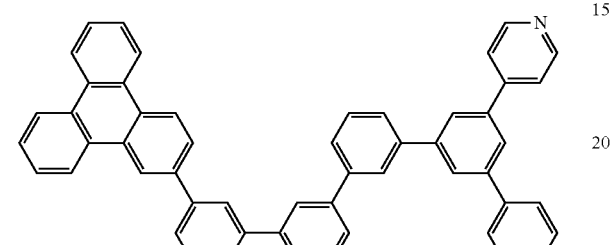
A-80
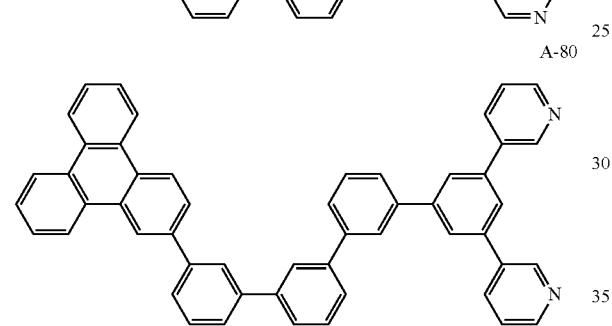
A-81
A-82
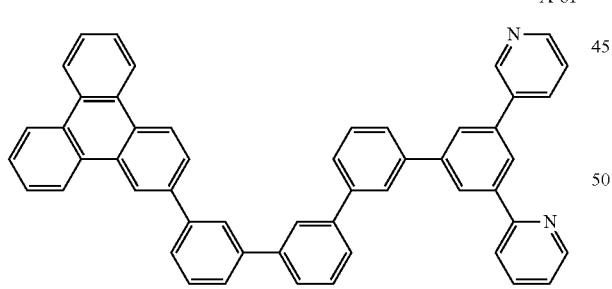
A-83
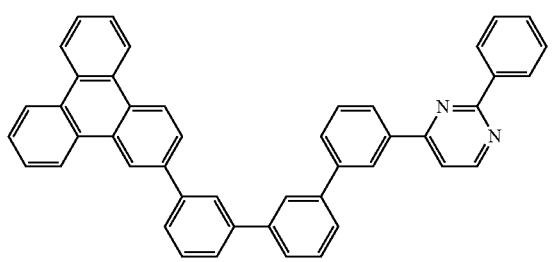
A-84
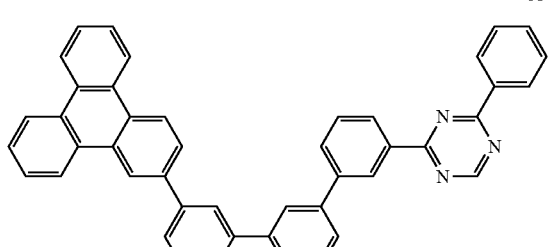
A-85
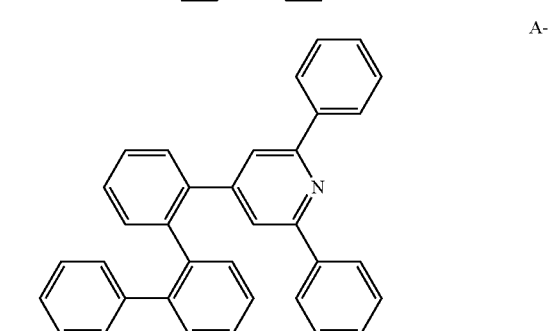
A-86
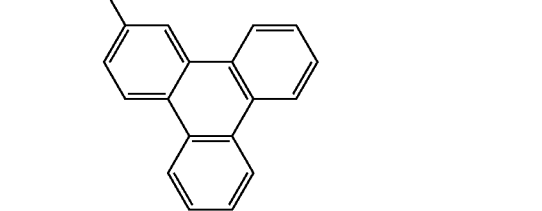

A-87
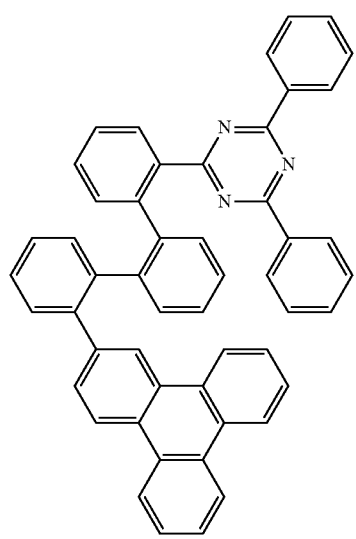
A-88
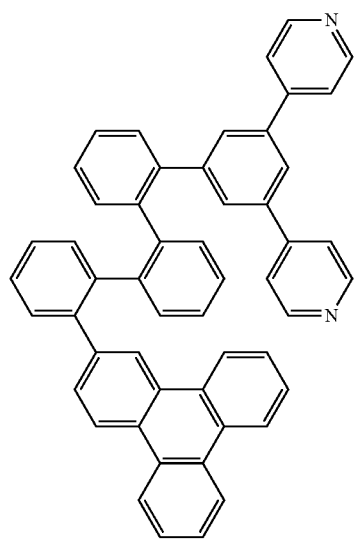
A-89
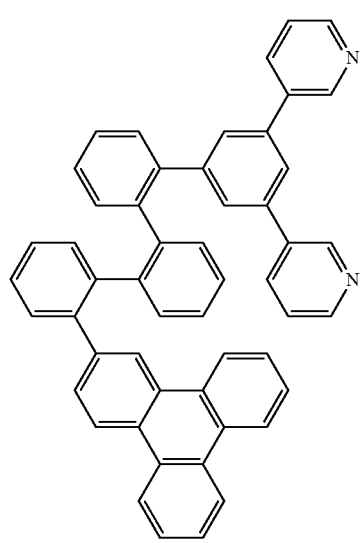
A-90
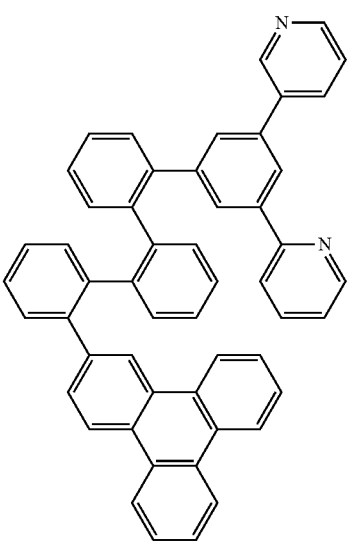
A-91
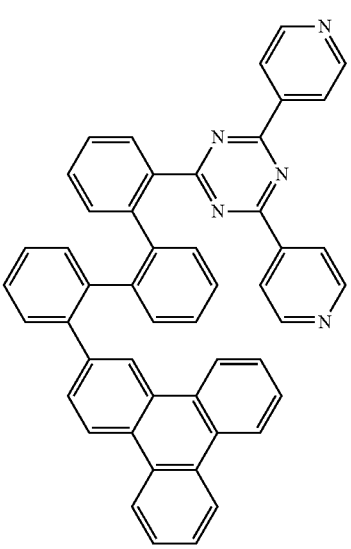
A-92
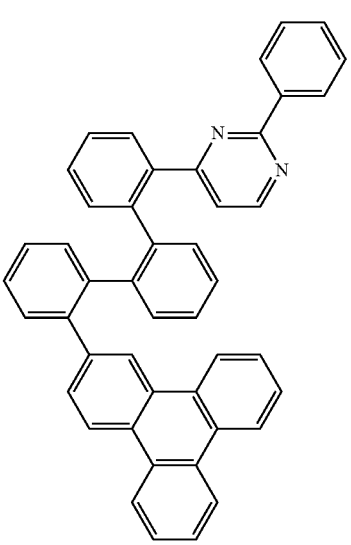

A-93
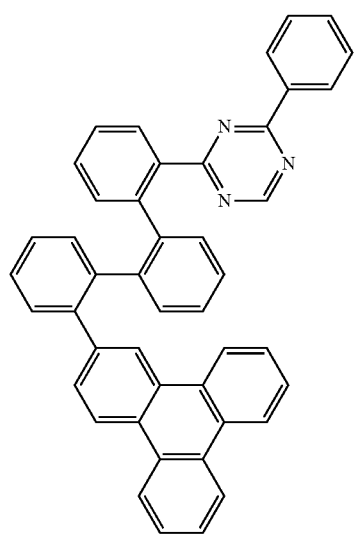
A-96
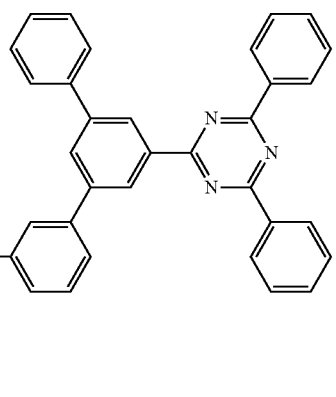
A-94
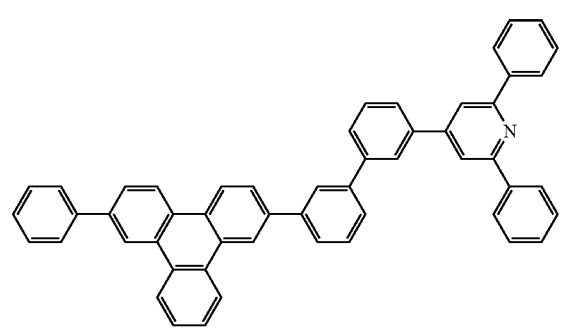
A-97
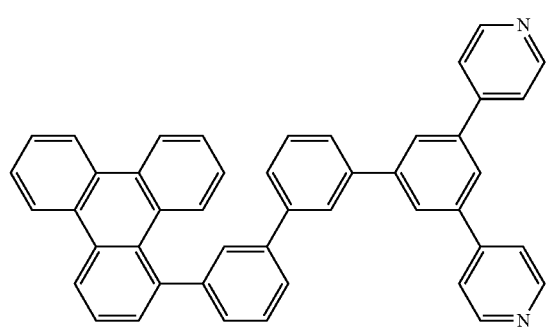
A-98
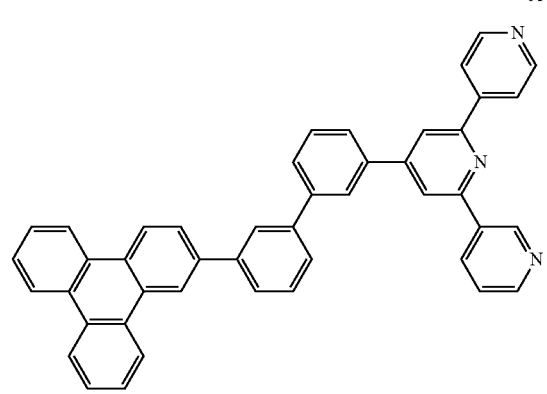
A-95
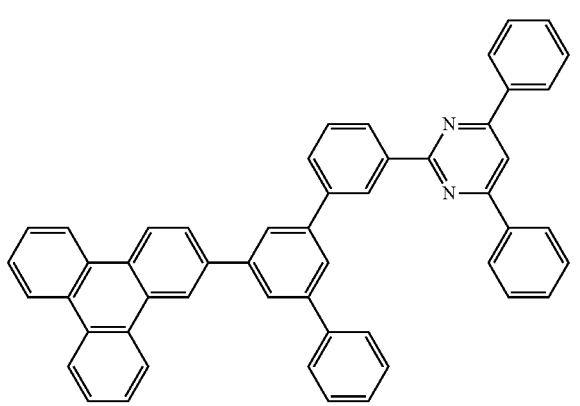
A-99
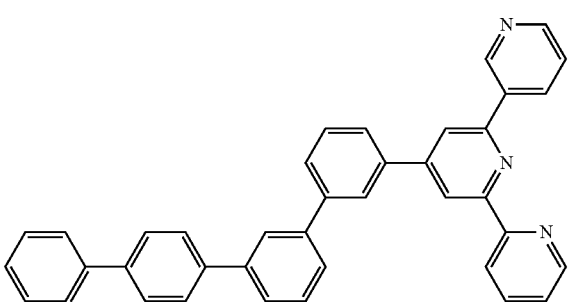

A-100
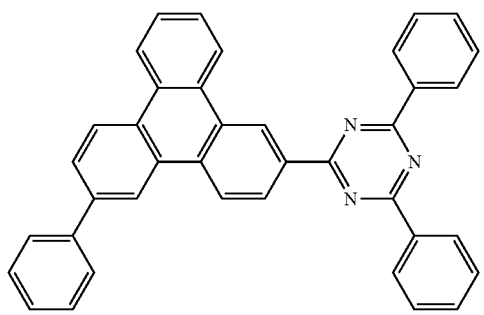
A-101
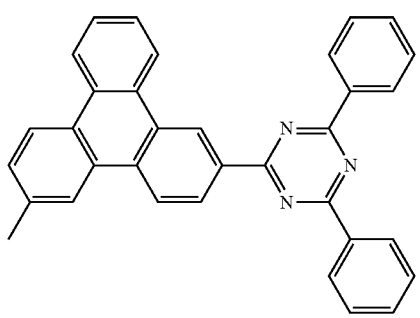
A-102
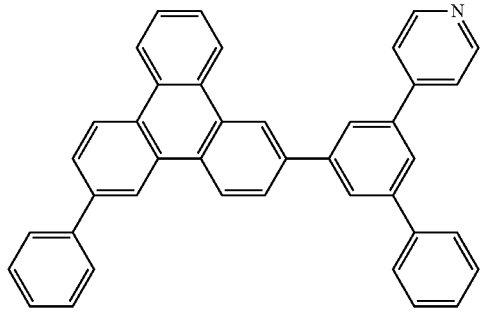
A-103
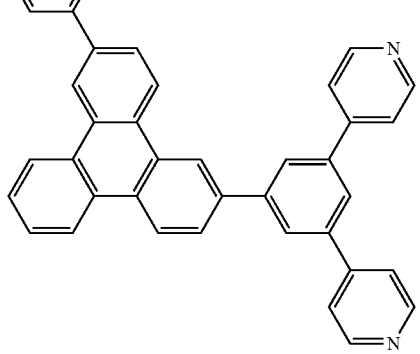
A-104
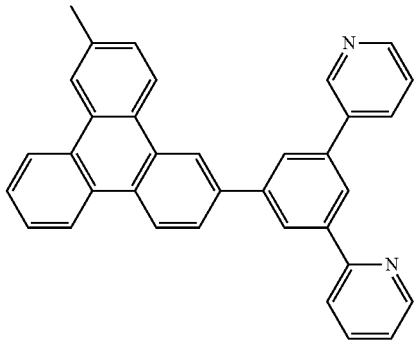
A-105
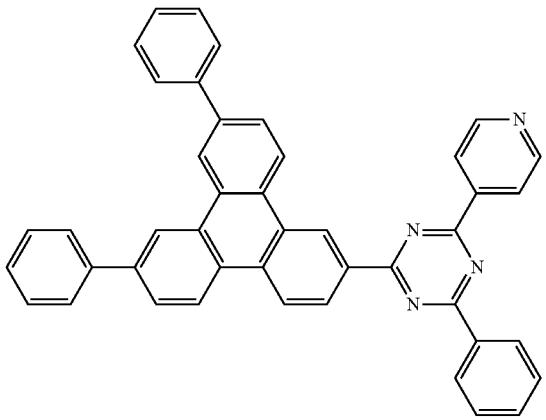
A-106
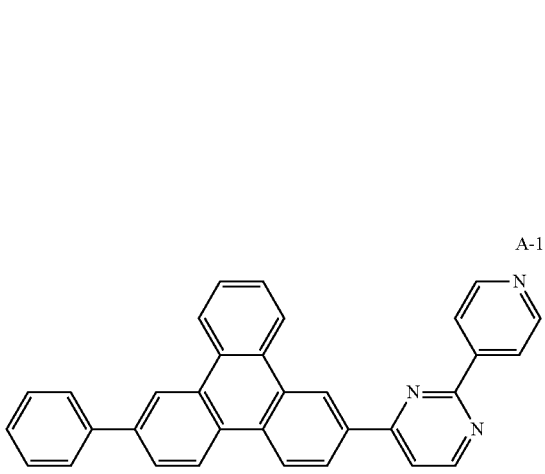
A-107
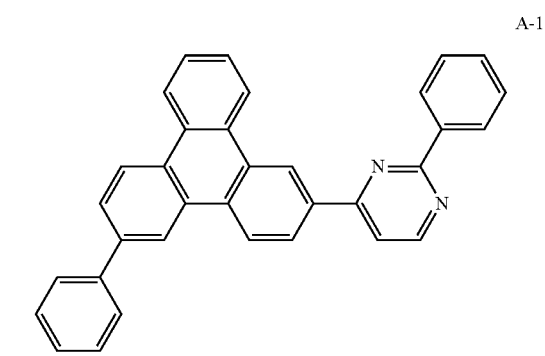

A-108
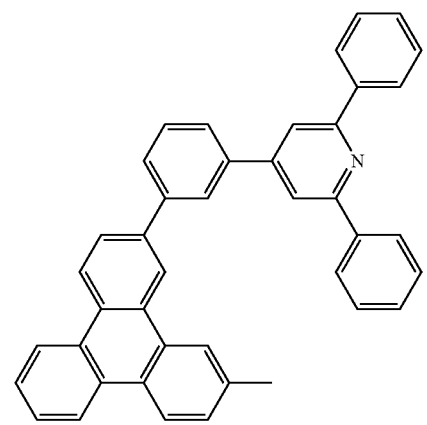
A-109
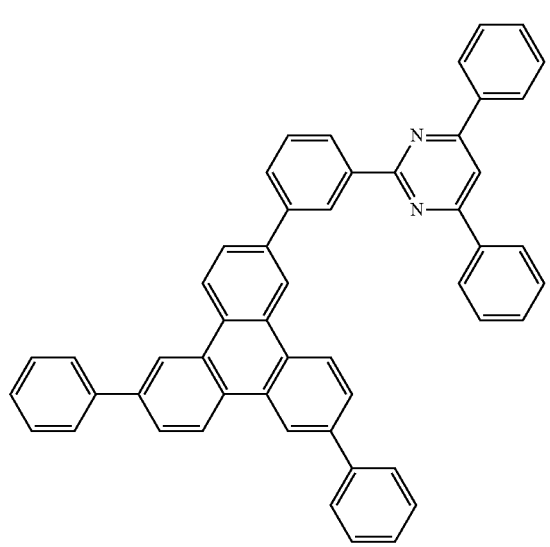
A-110
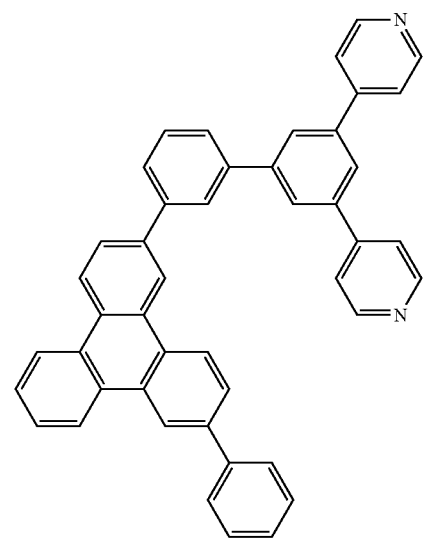
A-111
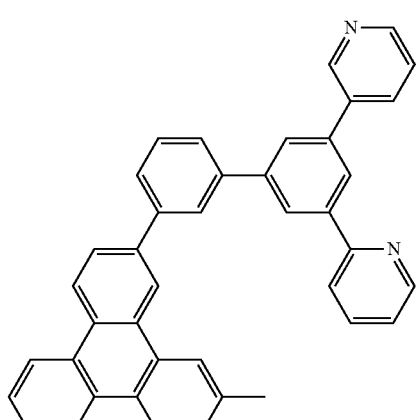
A-112
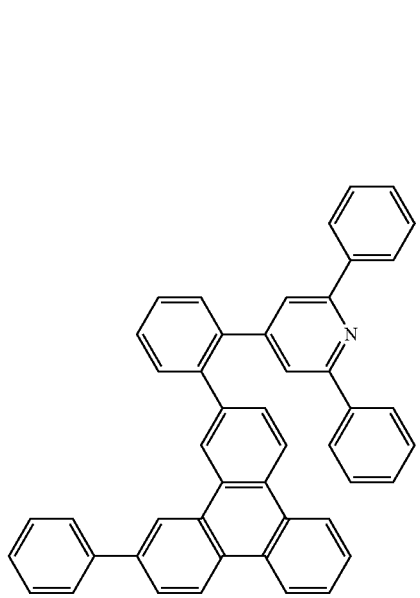
A-113
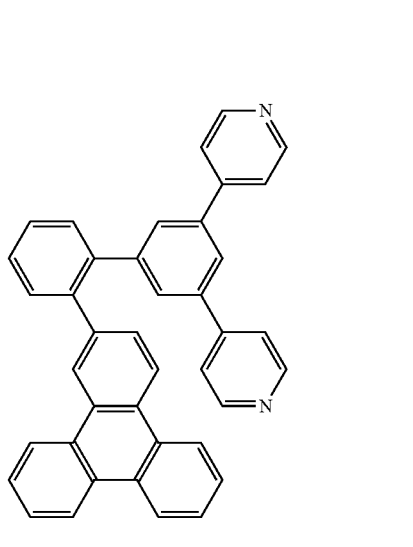

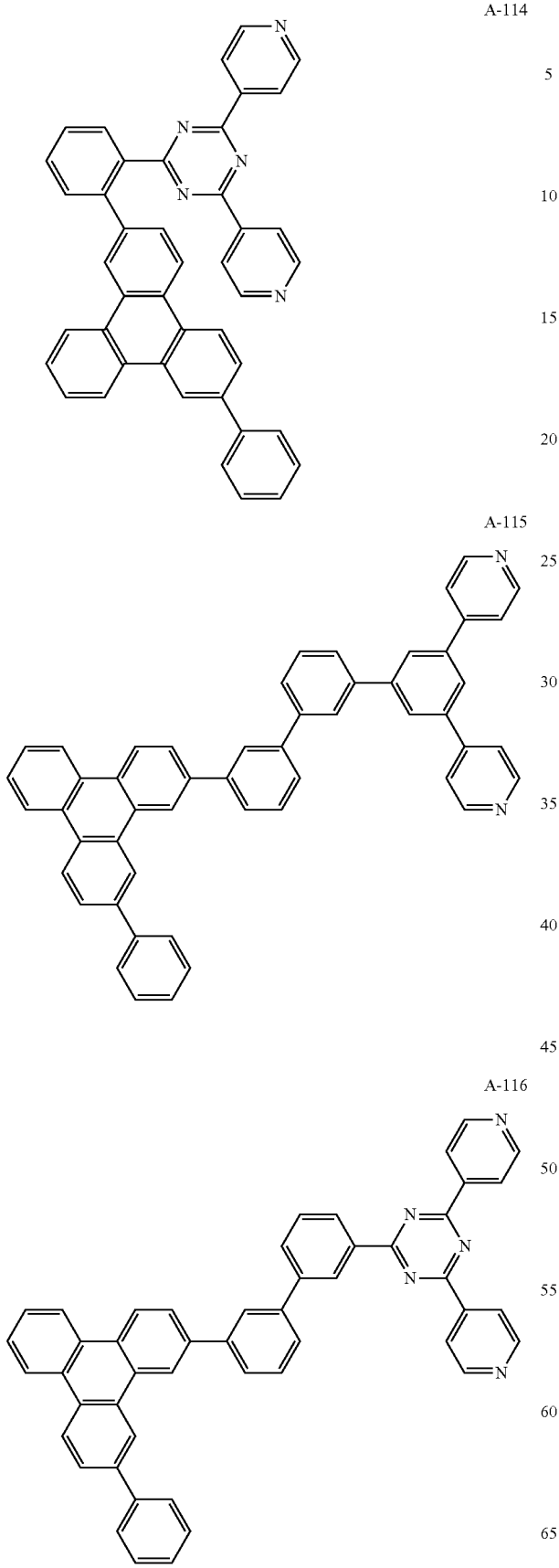
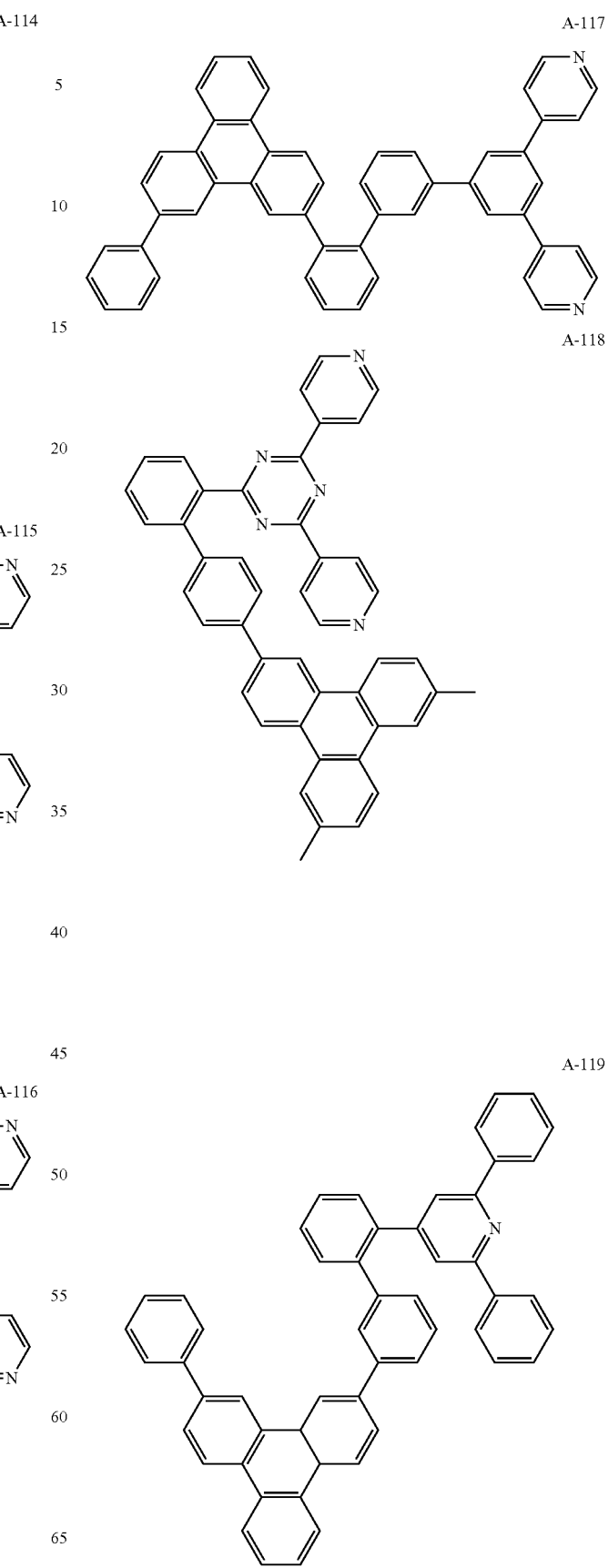

-continued
A-120
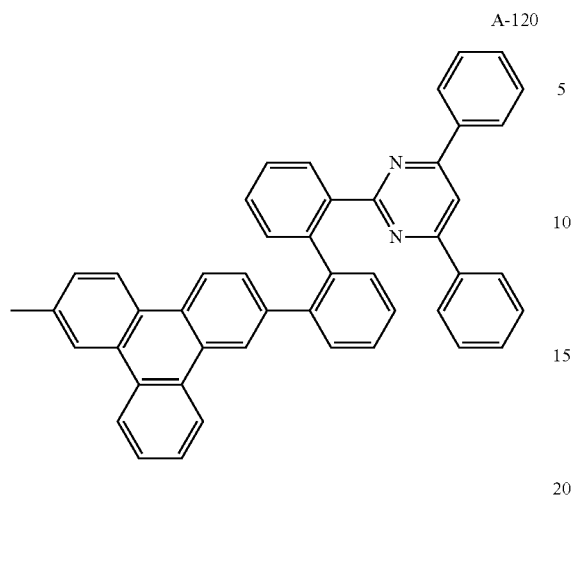
A-121
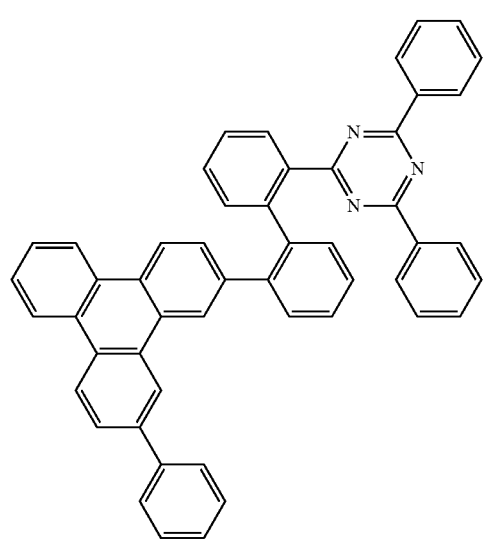
A-122
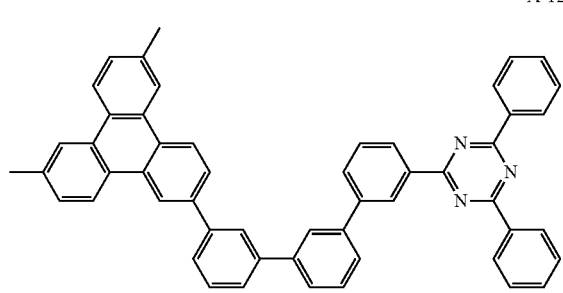
-continued
A-123
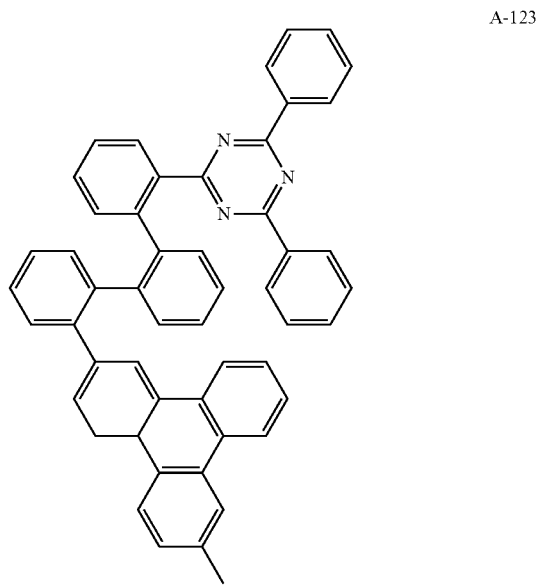
A-124
A-125
A-126
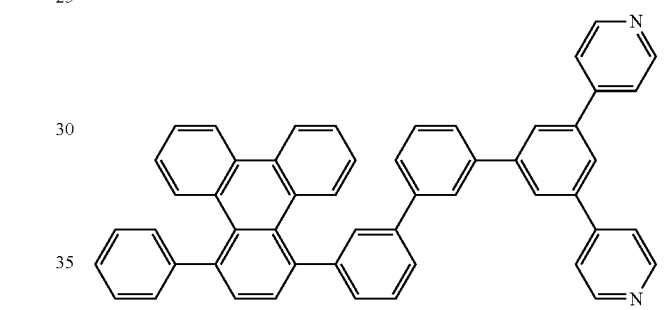
7. The organic optoelectric device as claimed in claim 1, wherein the second compound and the third compound are independently represented by at least one of Chemical Formula 2-I to Chemical Formula 2-III:

[Chemical Formula 2-I]

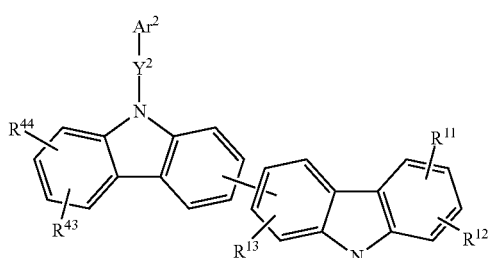

[Chemical Formula 2-II]

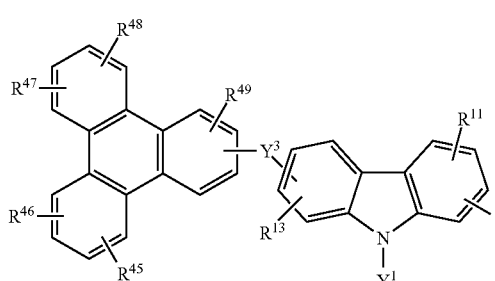

[Chemical Formula 2-III]

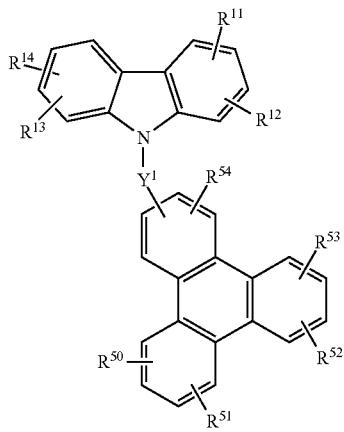

wherein, in Chemical Formulae 2-I to 2-III,
$Y^1$ to $Y^3$ are independently a single bond, a substituted or unsubstituted C1 to C20 alkylene group, a substituted or unsubstituted C2 to C20 alkenylene group, a substituted or unsubstituted C6 to C30 arylene group, a substituted or unsubstituted C2 to C30 heterocyclic group, or a combination thereof,
$Ar^1$ and $Ar^2$ are independently a substituted or unsubstituted C6 to C30 aryl group, a substituted or unsubstituted C2 to C30 heterocyclic group, or a combination thereof, and
$R^{11}$ to $R^{14}$ and $R^{43}$ to $R^{54}$ are independently hydrogen, deuterium, a substituted or unsubstituted C1 to C20 alkyl group, a substituted or unsubstituted C6 to C50 aryl group, a substituted or unsubstituted C2 to C50 heterocyclic group, or a combination thereof.

8. The organic optoelectric device as claimed in claim 7, wherein $Ar^1$ and $Ar^2$ of Chemical Formula 2-I are independently a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted carbazolyl group, a substituted or unsubstituted benzofuranyl group, a substituted or unsubstituted benzothiophenyl group, a substituted or unsubstituted fluorenyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted triphenylene group, a substituted or unsubstituted dibenzofuranyl group, a substituted or unsubstituted dibenzothiophenyl group, or a combination thereof.

9. The organic optoelectric device as claimed in claim 7, wherein the compound represented by Chemical Formula 2-I is selected from Group 4:

[Group 4]

B-10

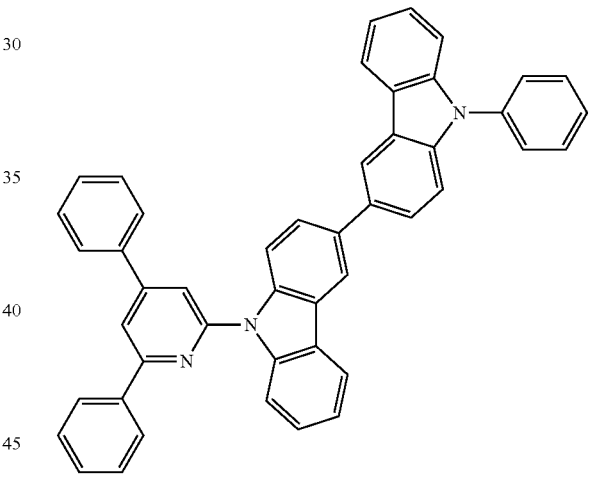

B-11

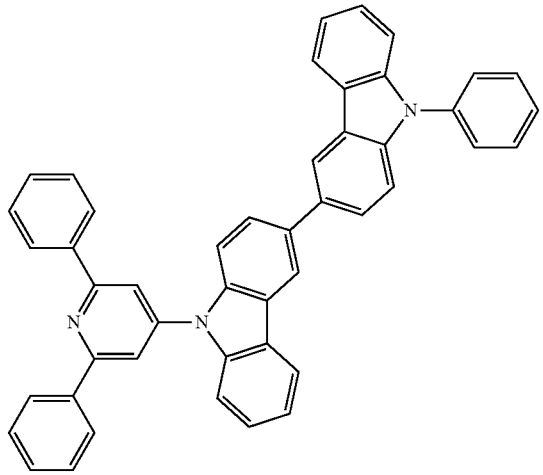

B-12
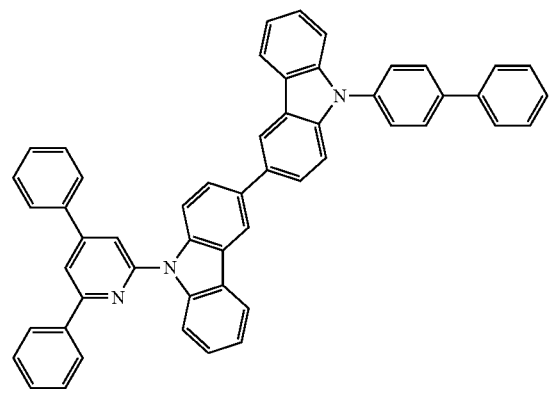
B-13
B-14
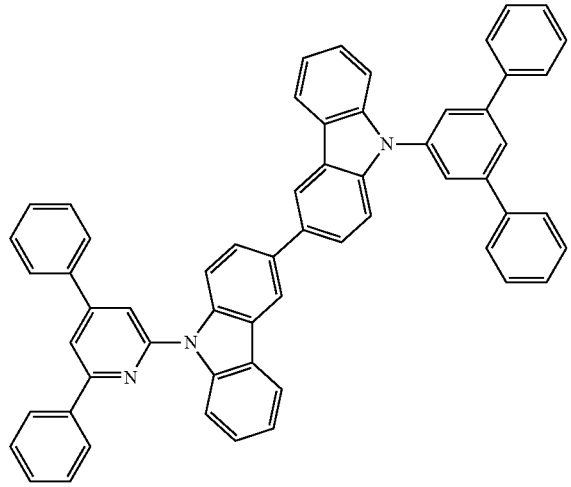
B-15
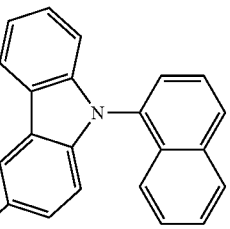
B-16
B-17
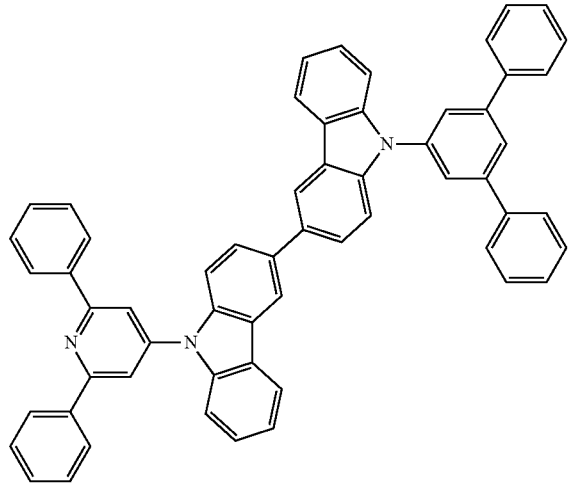

B-18
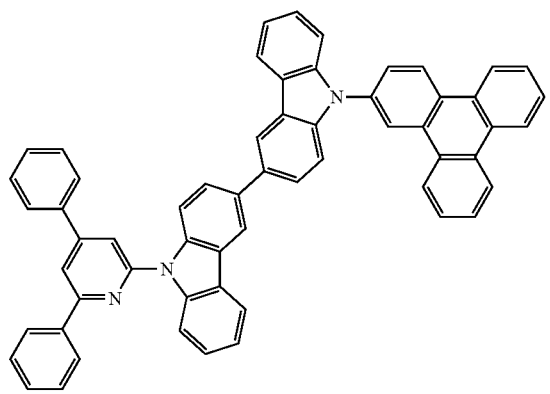
B-19
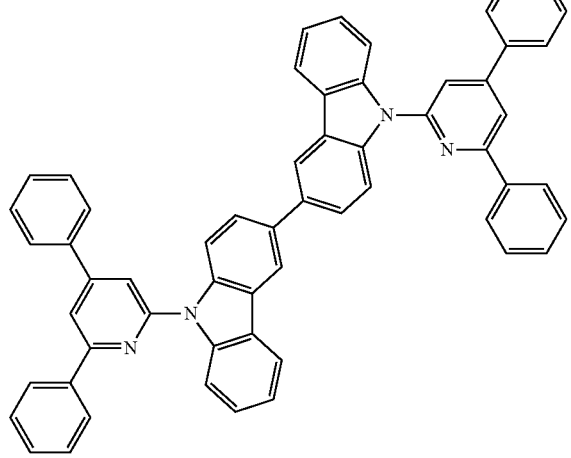
B-20
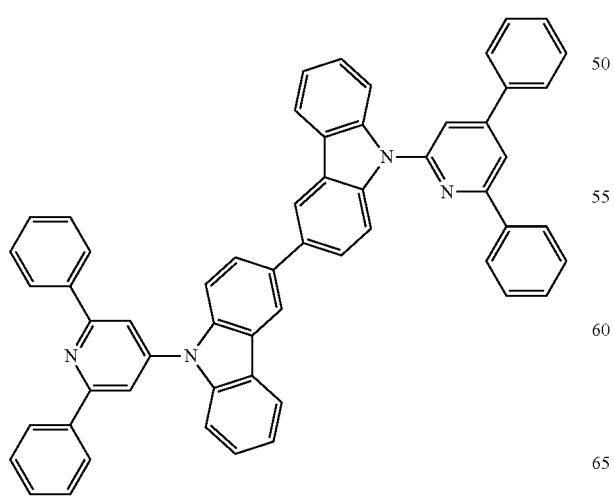
B-21
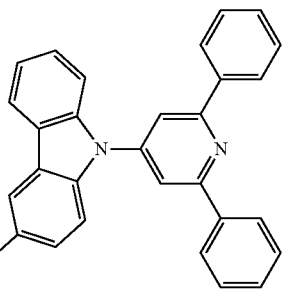
B-22
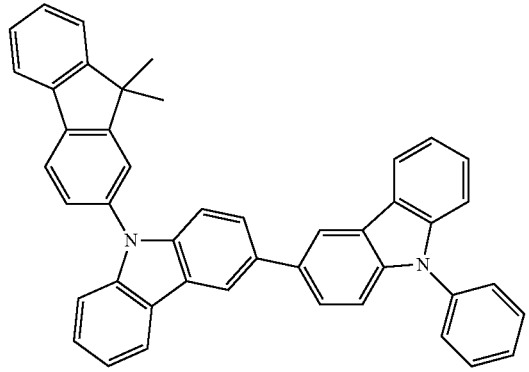
B-23
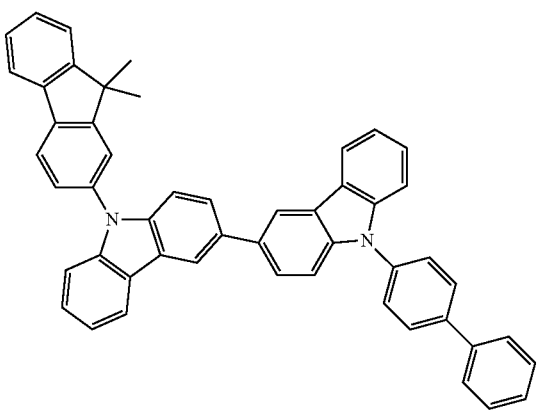

B-24
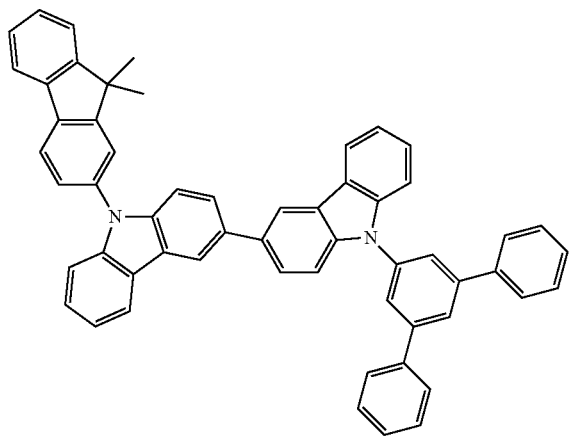
B-25
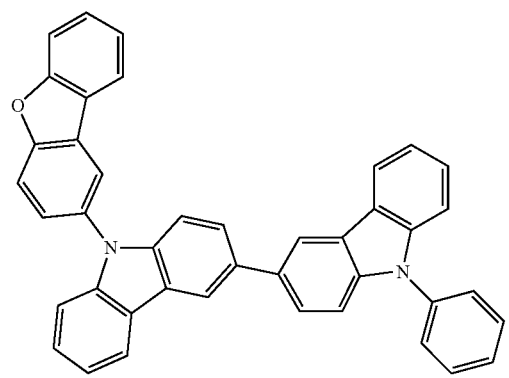
B-26
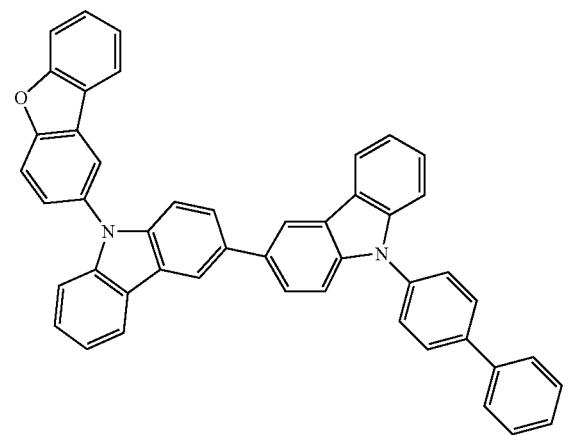
B-27
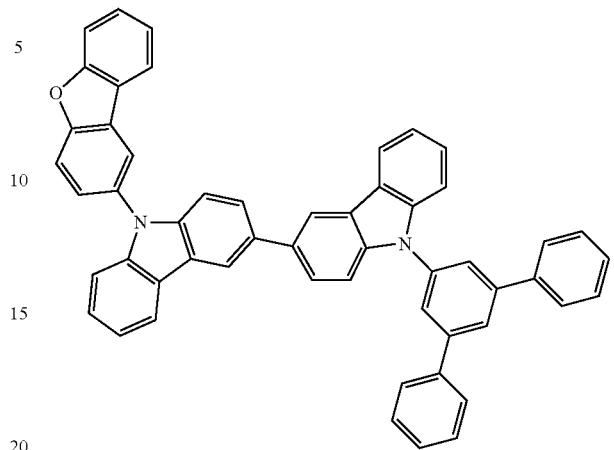
B-28
B-29
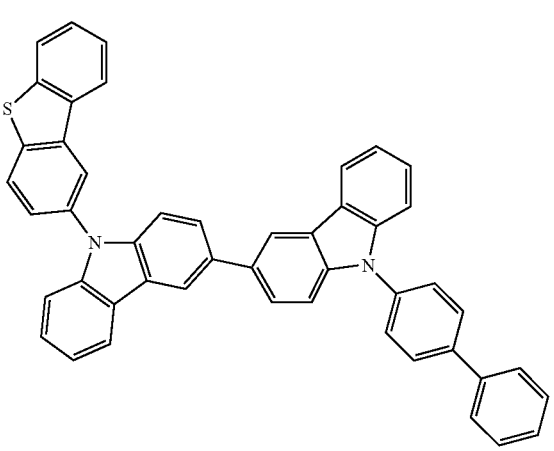

-continued
B-30
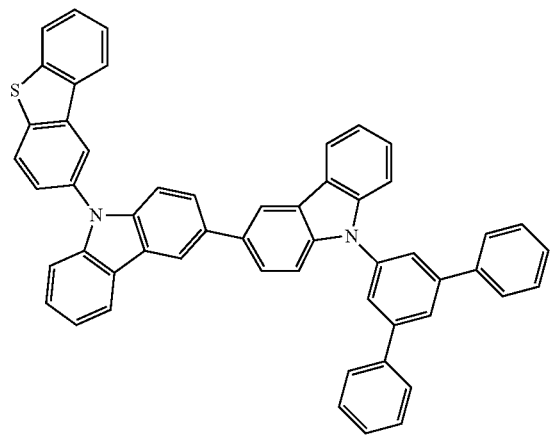
B-31
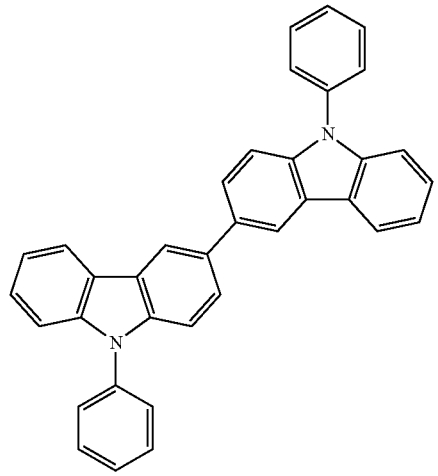
B-32
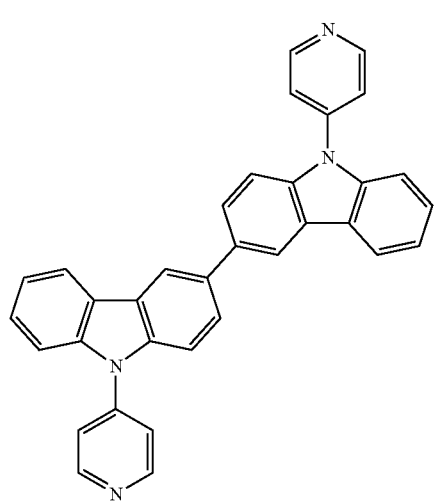
-continued
B-33
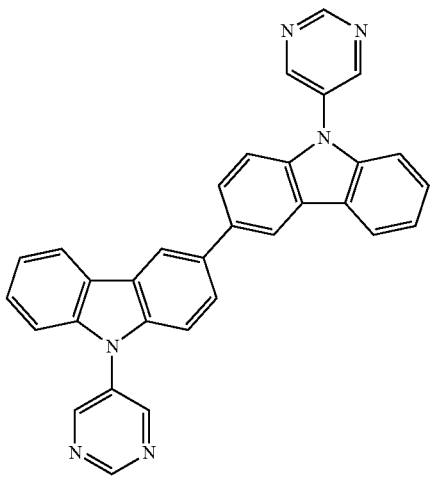
B-34
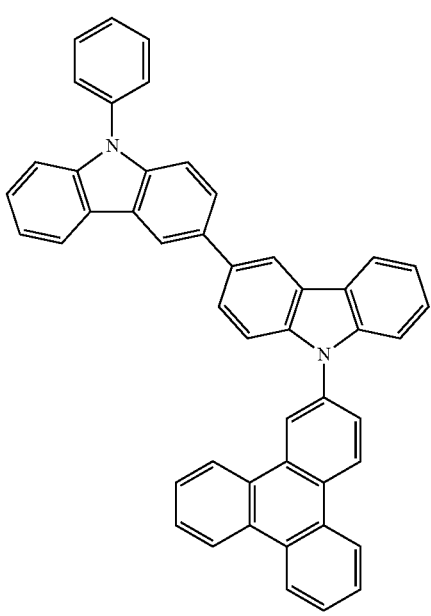

B-35
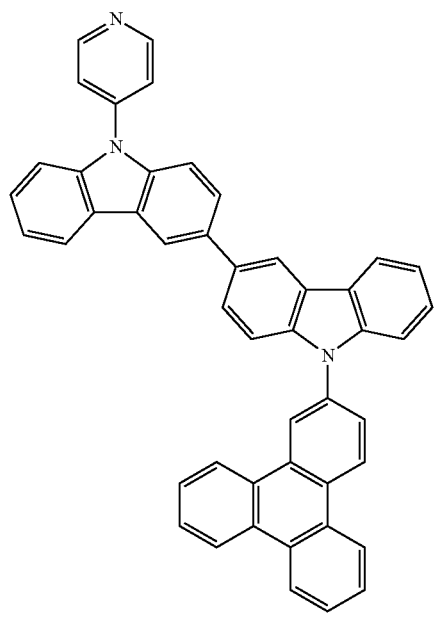
B-37
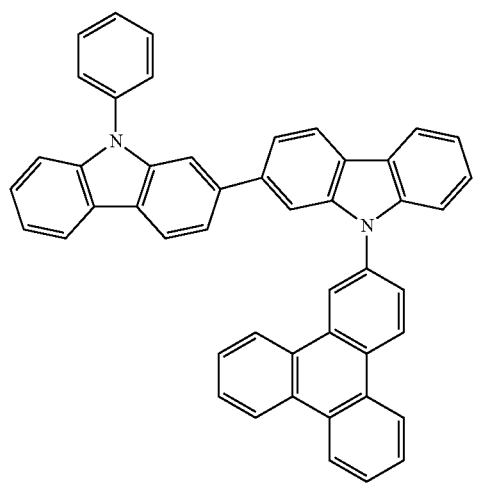
B-38
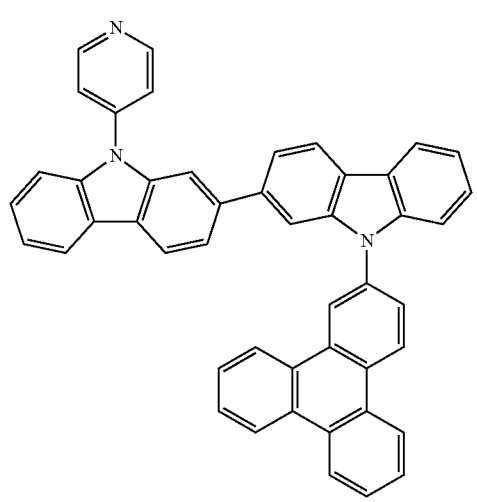
B-40
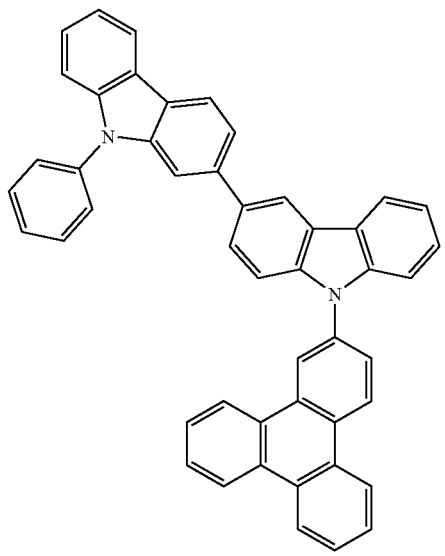
B-41
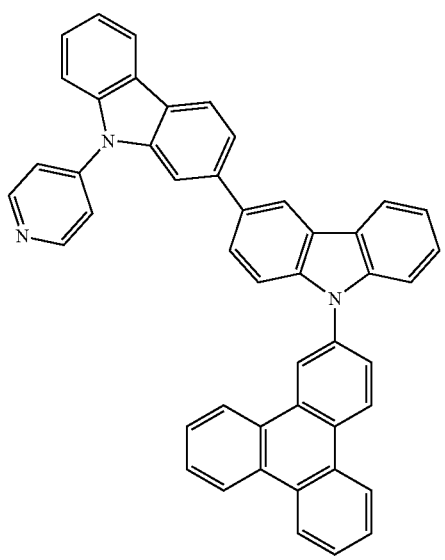

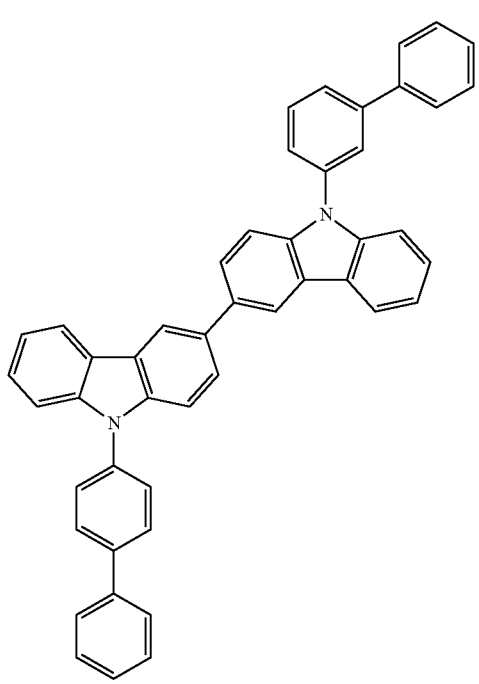
B-43
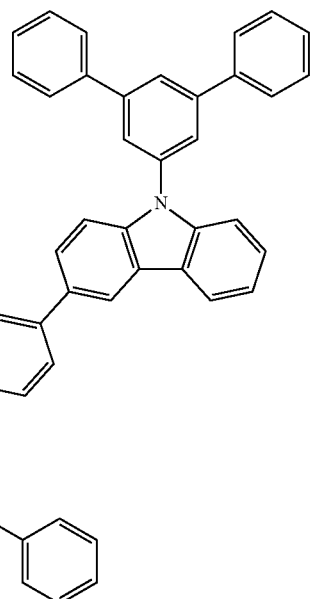
B-45
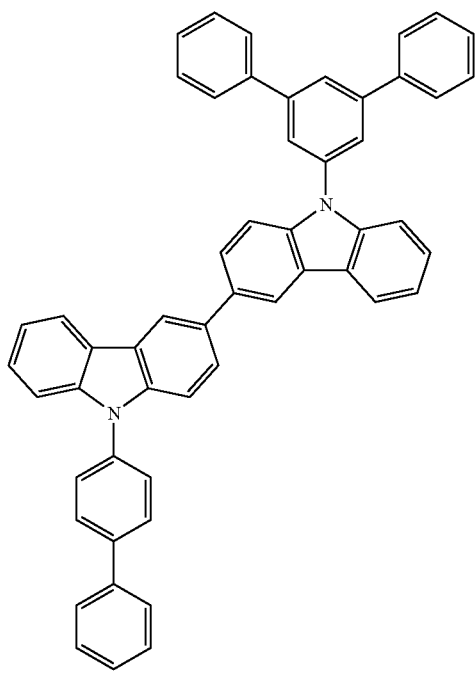
B-44
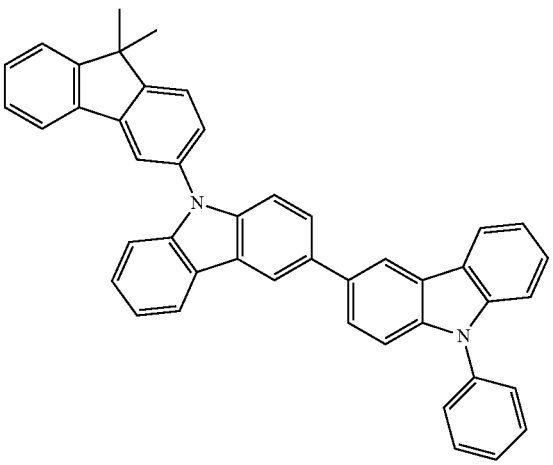
B-46

B-47
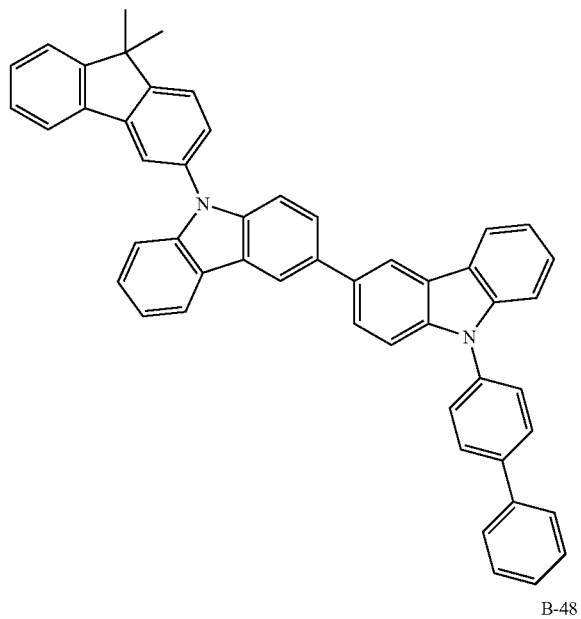
B-50
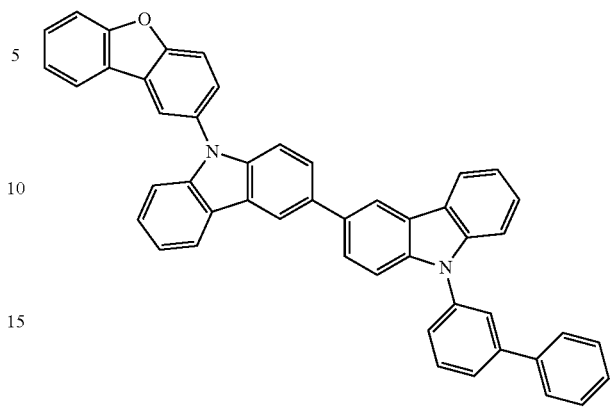
B-48
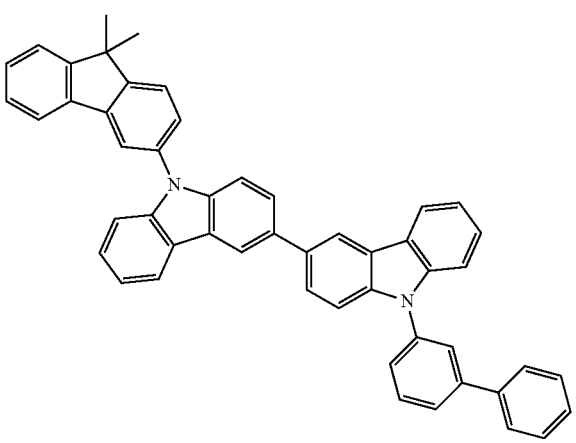
B-51
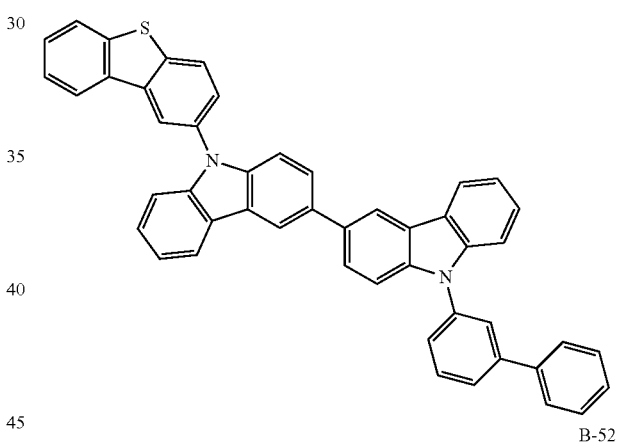
B-49
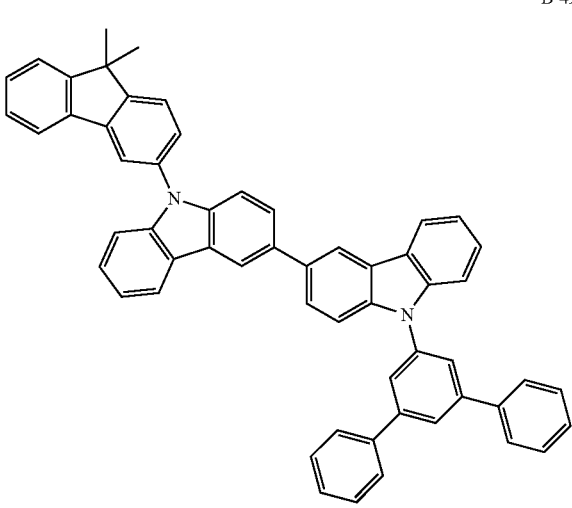
B-52
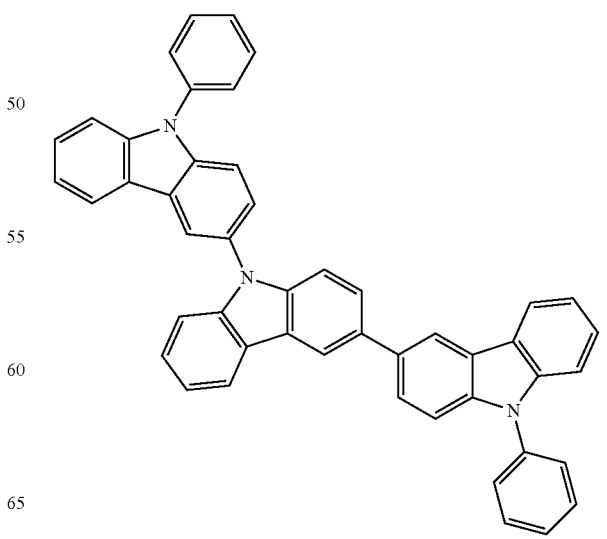

B-53
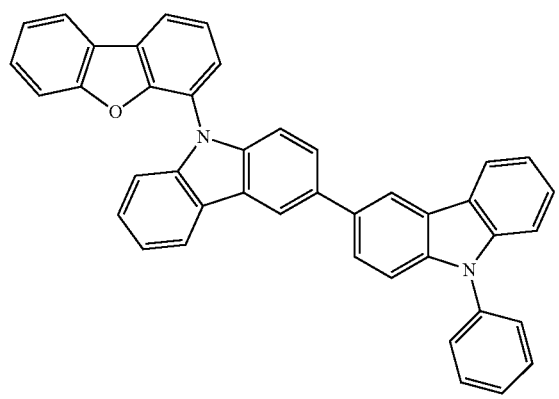
B-54
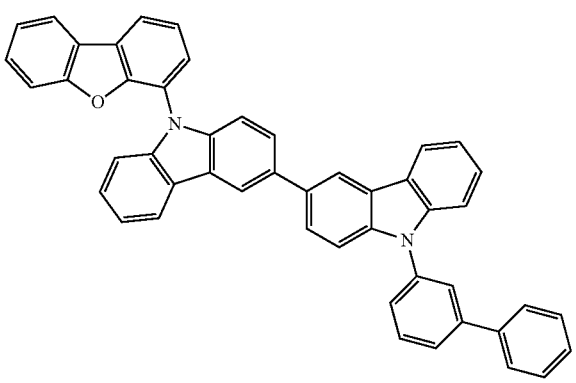
B-55
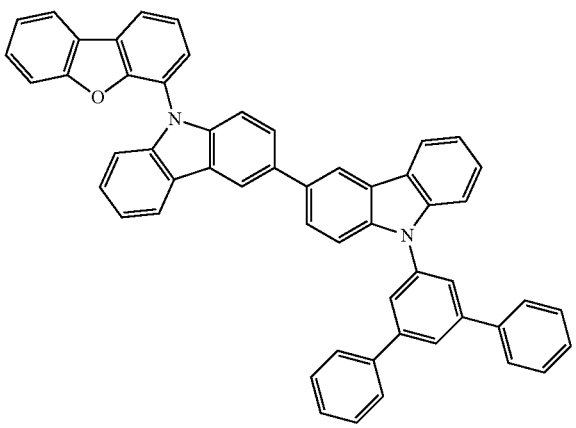
B-56
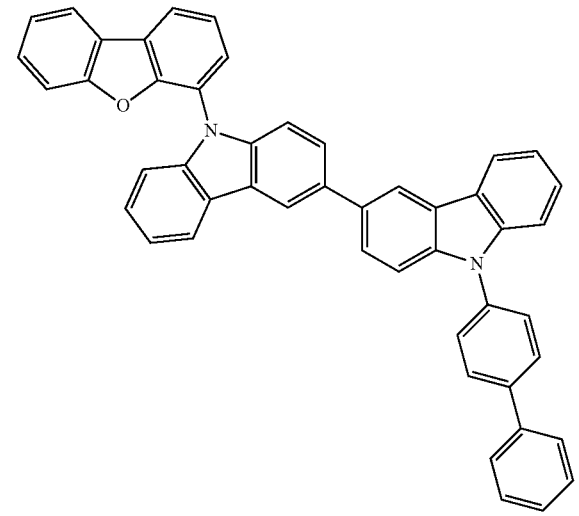
B-57
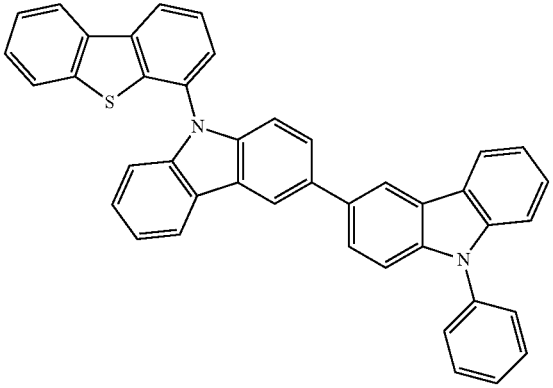
B-58
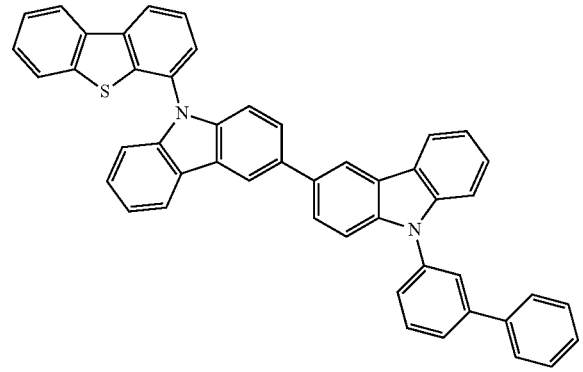

B-59
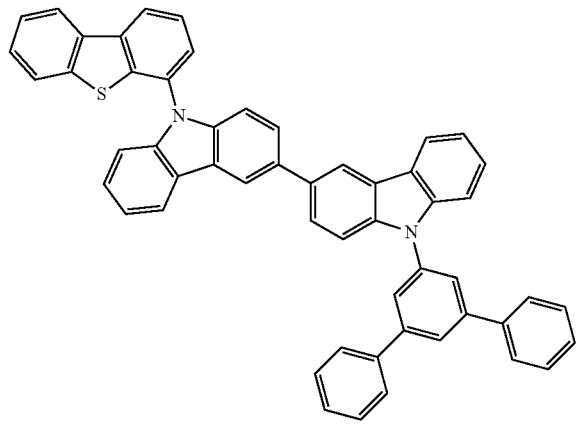
B-60
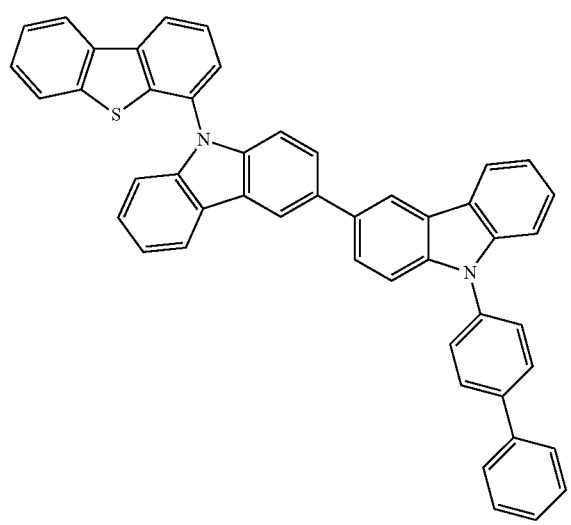
B-61
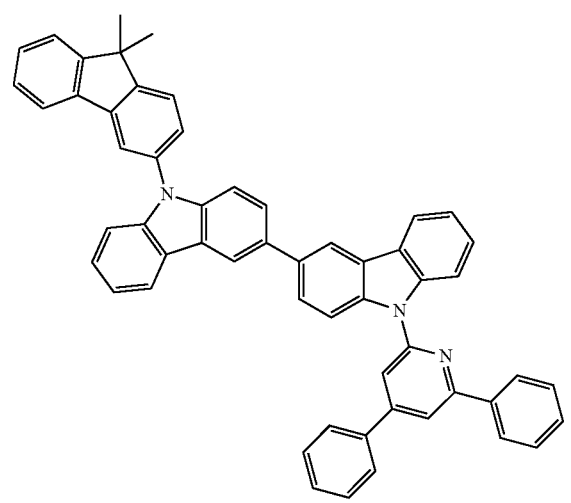
B-62
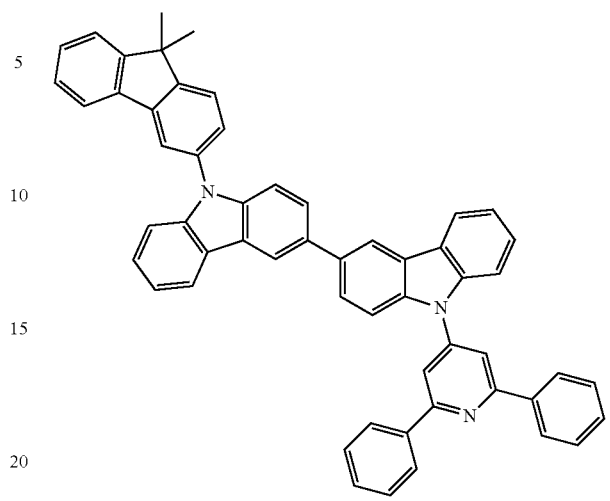
B-63
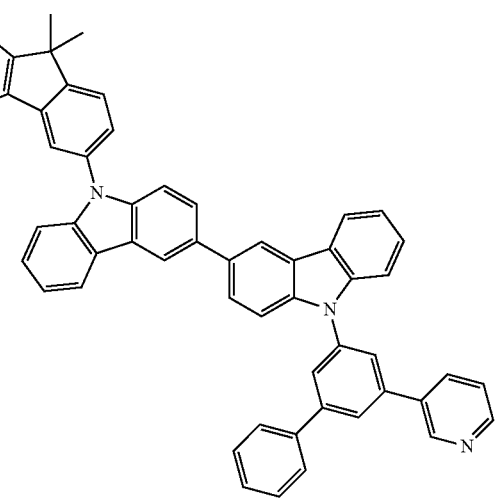
B-64

B-65
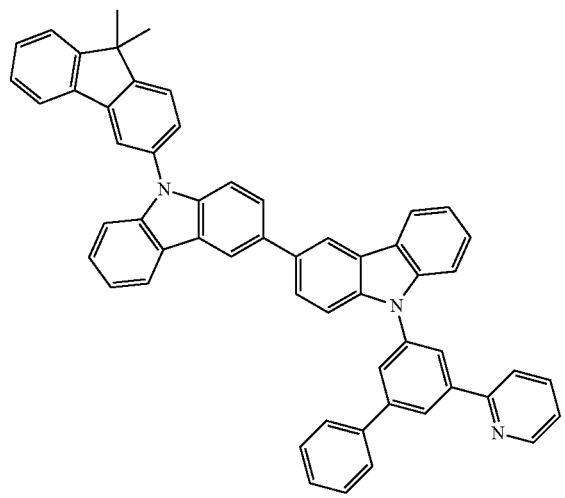
B-66
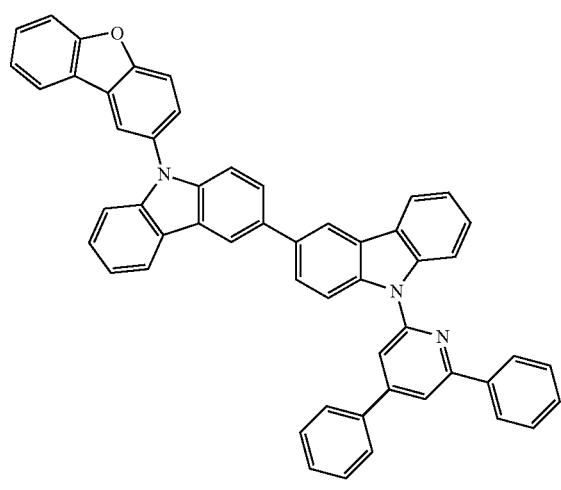
B-67
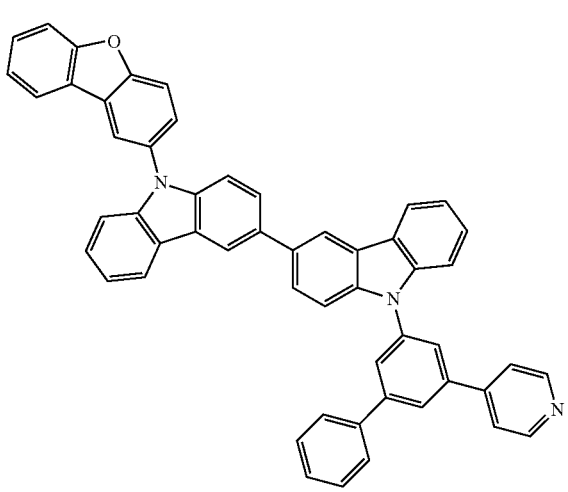
B-68
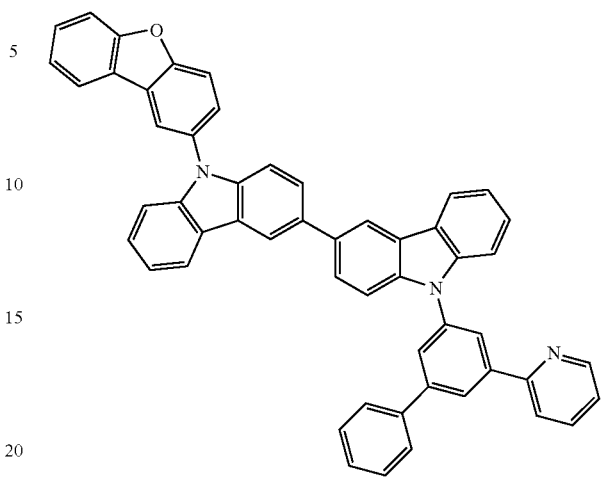
B-69
B-70
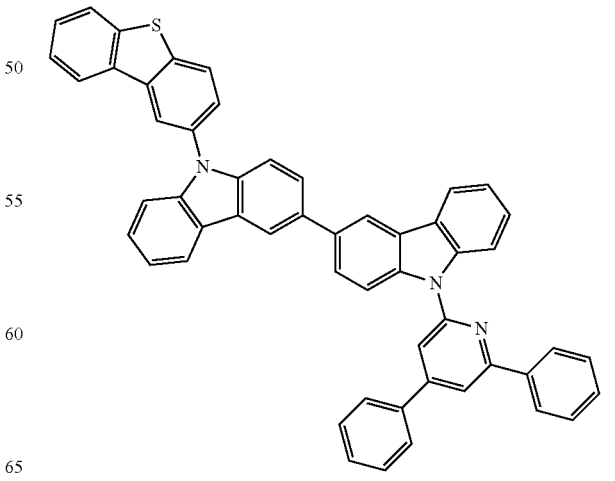

B-71
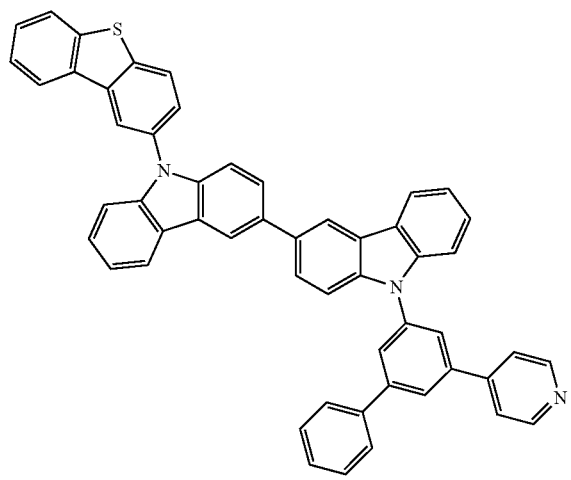
B-74
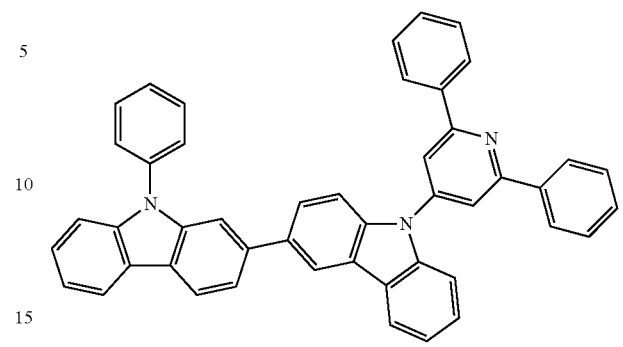
B-72
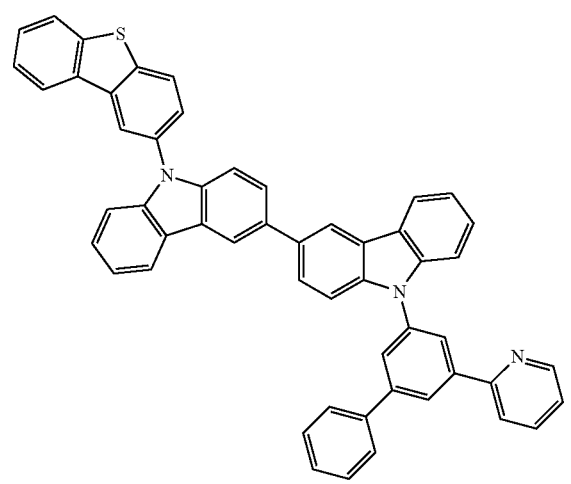
B-75
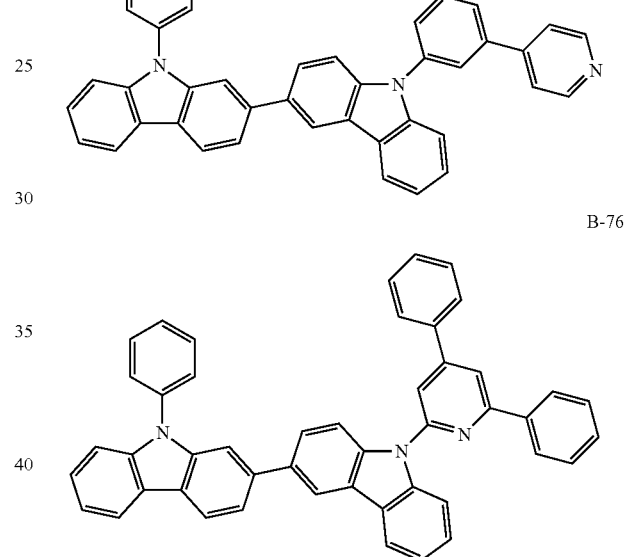
B-76
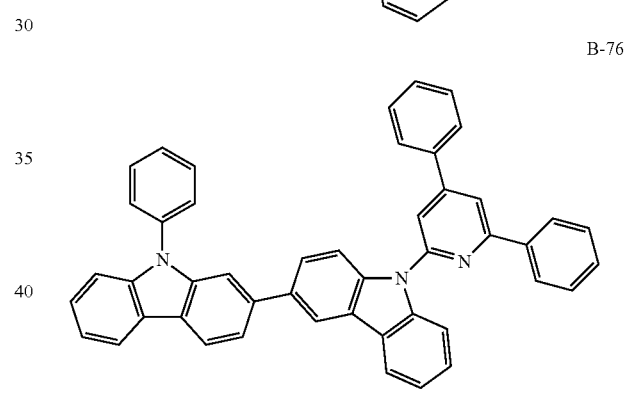
B-73
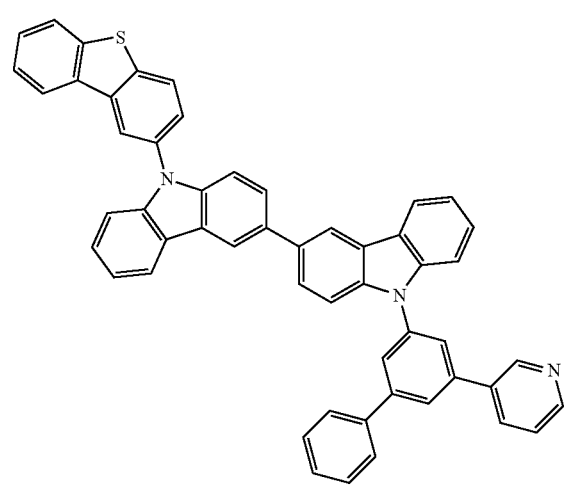
B-77
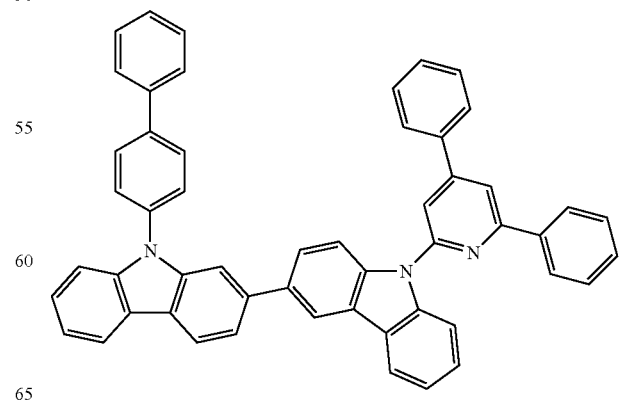

B-78
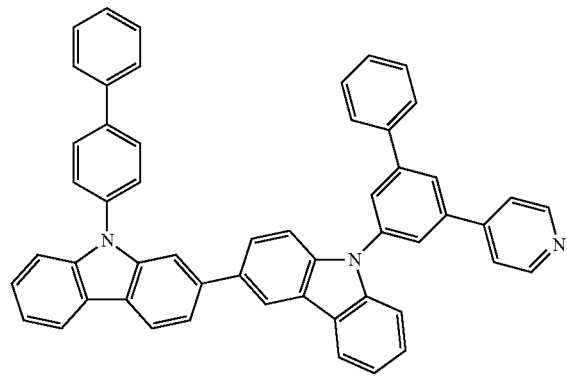
B-79
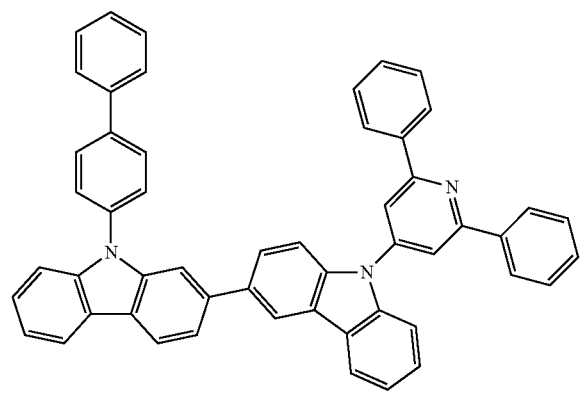
B-80
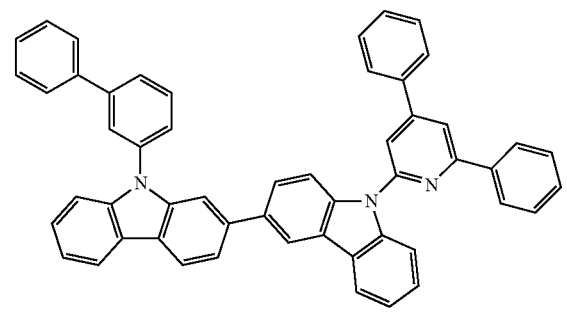
B-81
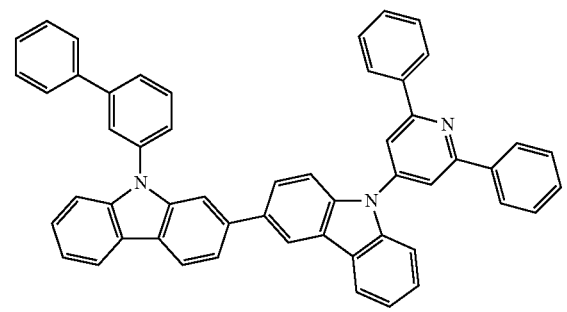
B-82
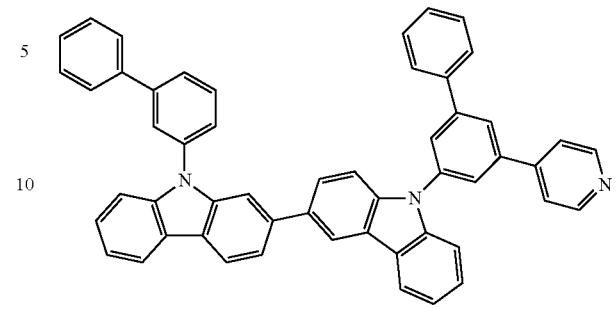
B-83
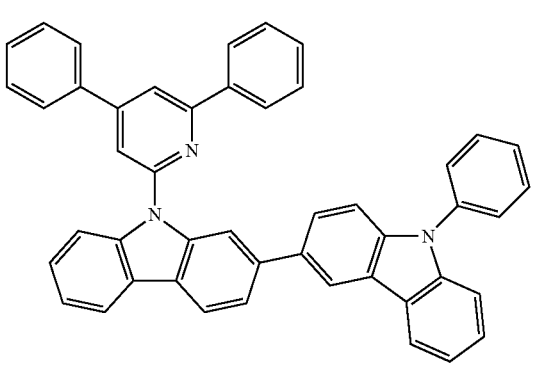
B-84
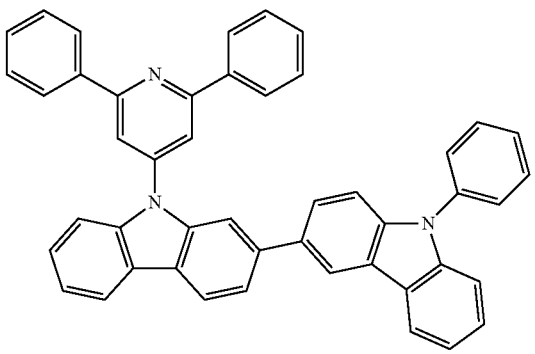
B-85
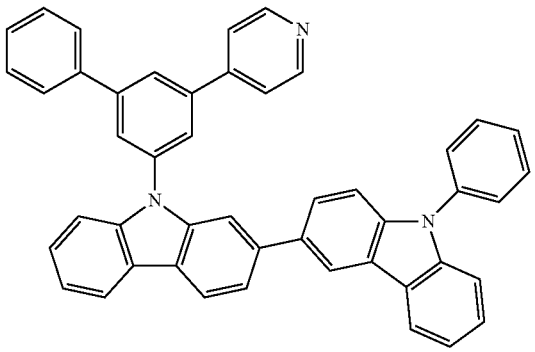

B-86
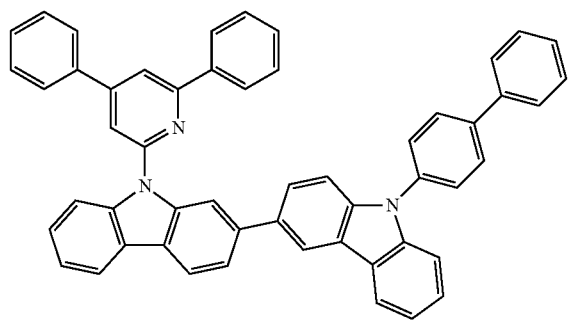
B-87
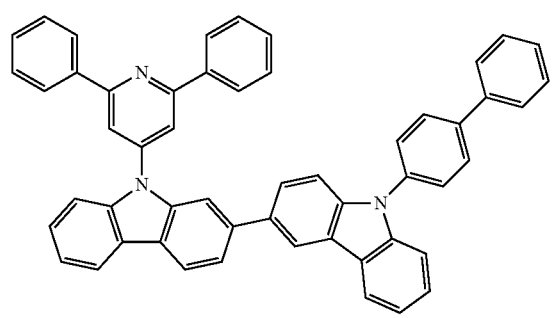
B-88
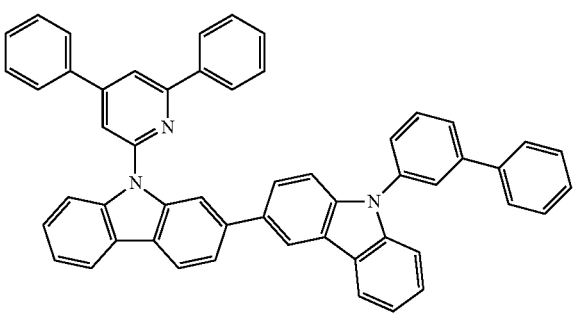
B-89
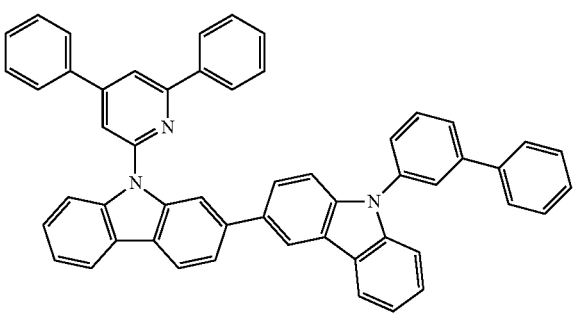
B-90
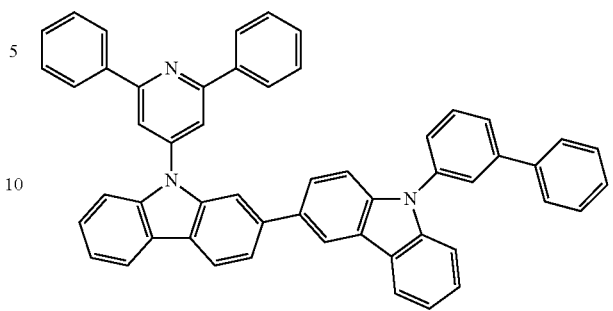
B-91
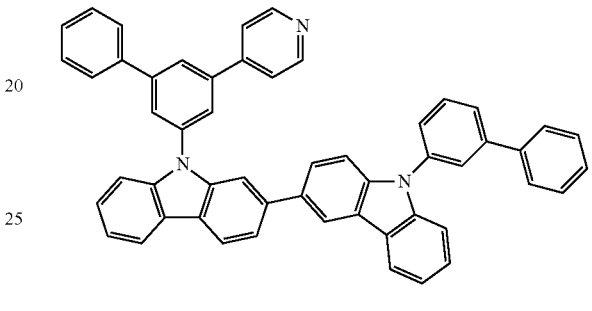
B-92
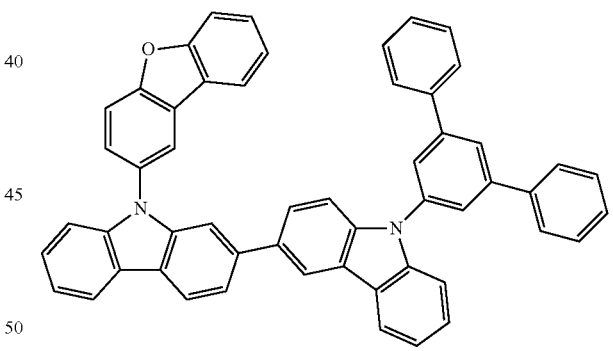
B-93
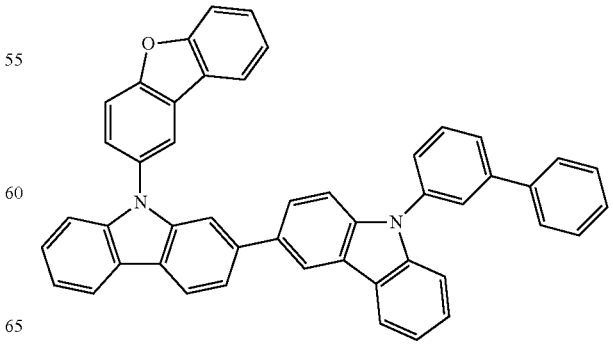

B-94
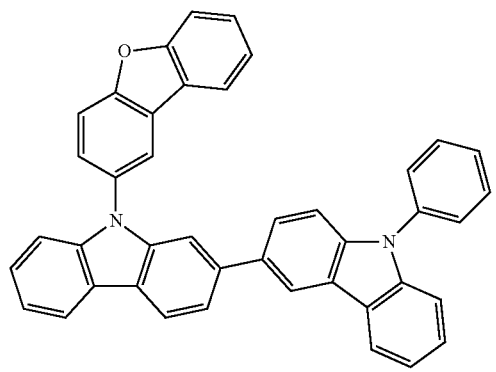
B-95
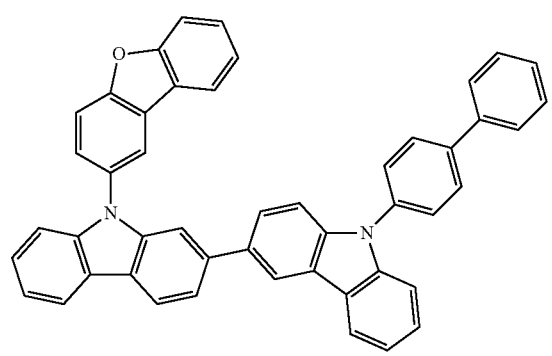
B-96
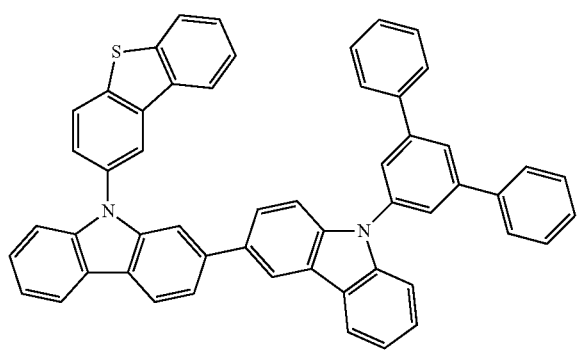
B-97
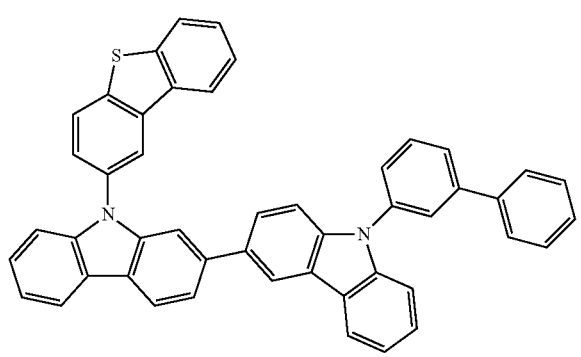
B-98
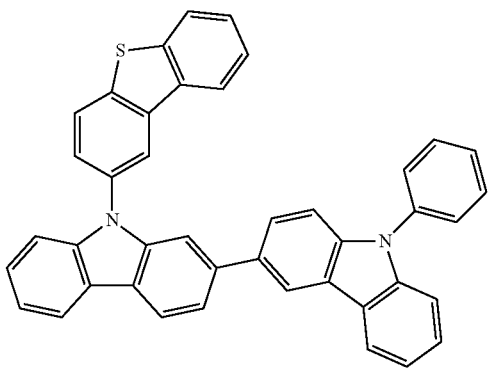
B-99
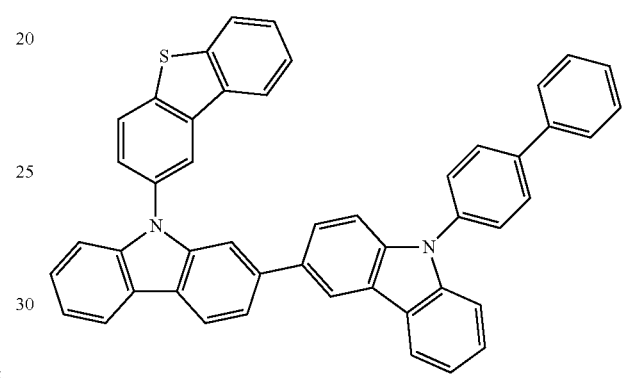
B-100
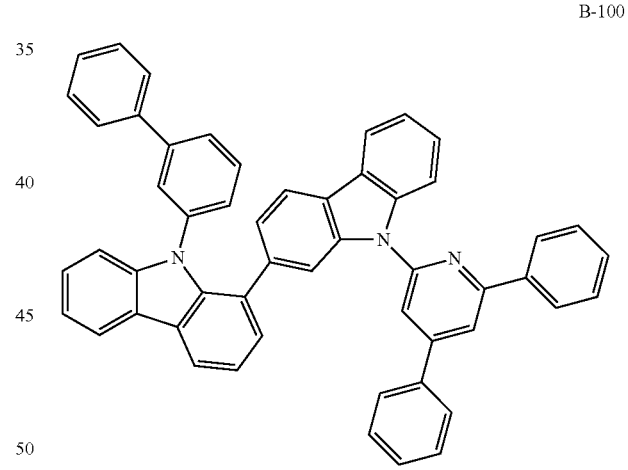
B-101
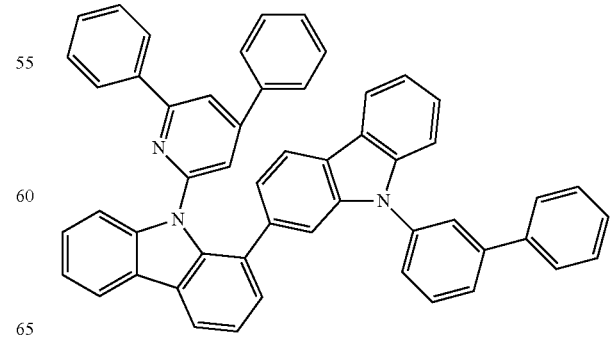

B-102
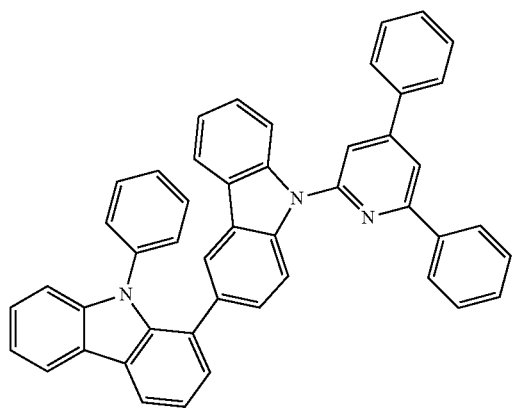
B-103
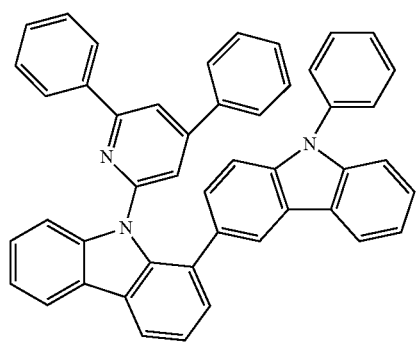
B-104
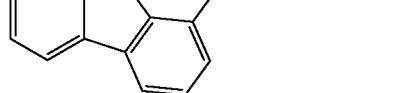
B-105
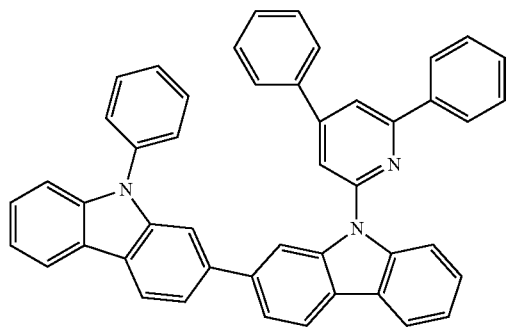
B-106
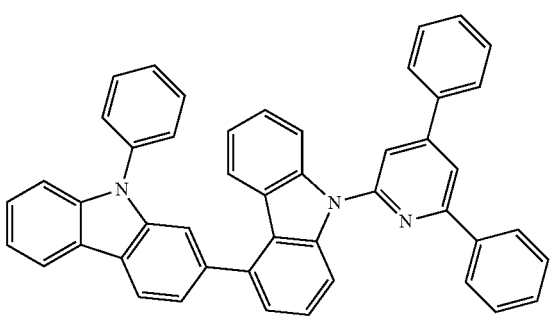
B-107
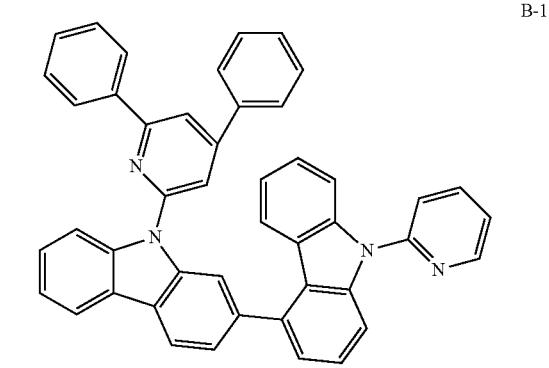
B-108
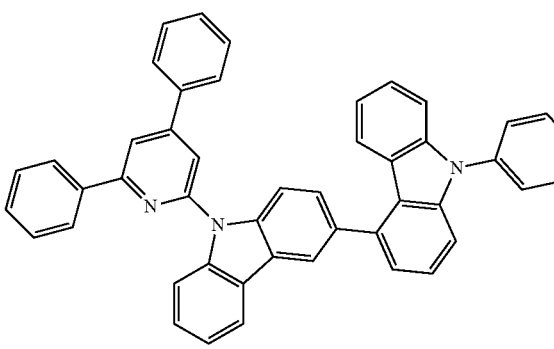
B-109
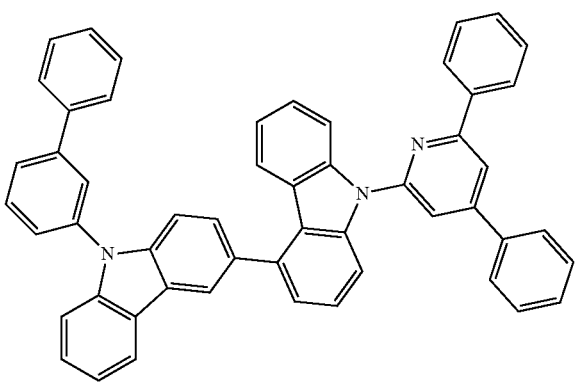

-continued
B-110
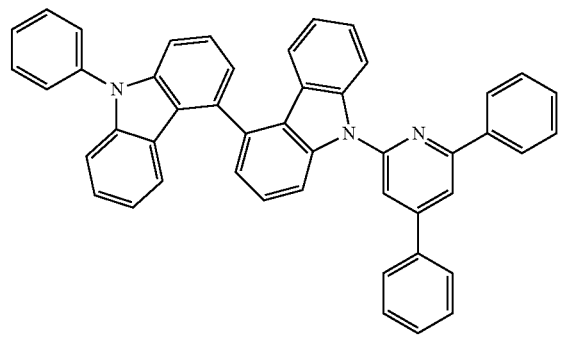
B-112
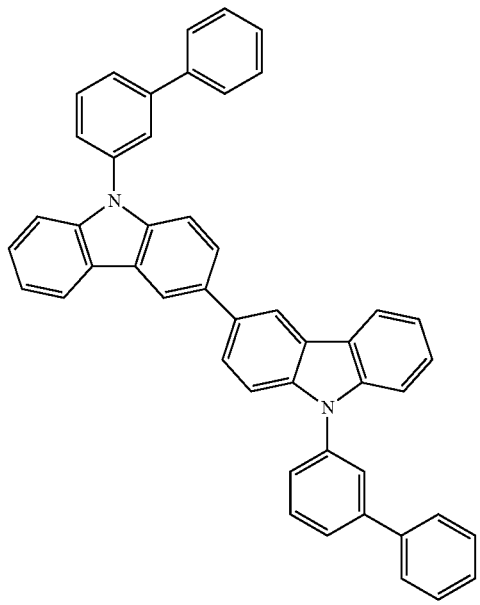
B-111
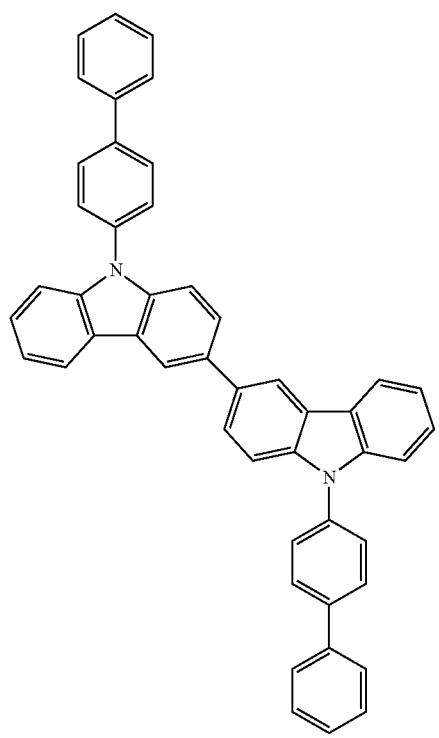
B-113
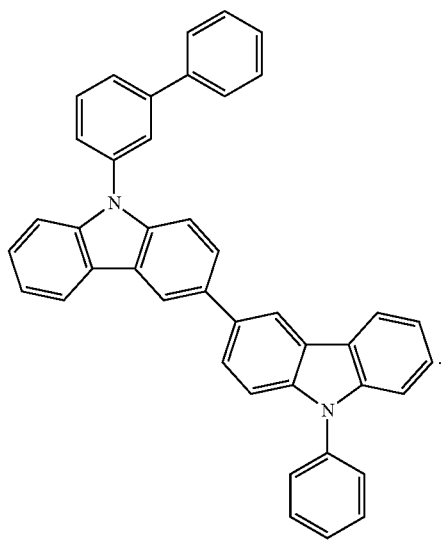
10. The organic optoelectric device as claimed in claim 7, wherein the compound represented by Chemical Formula 2-II is selected from Group 5:

[Group 5]
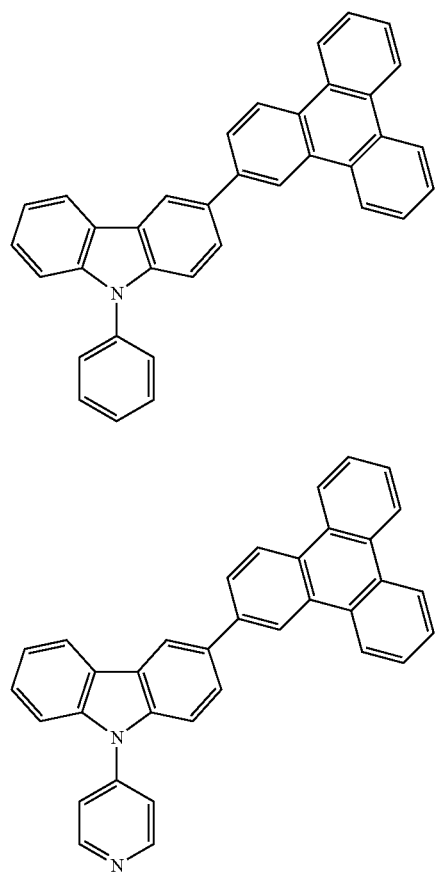
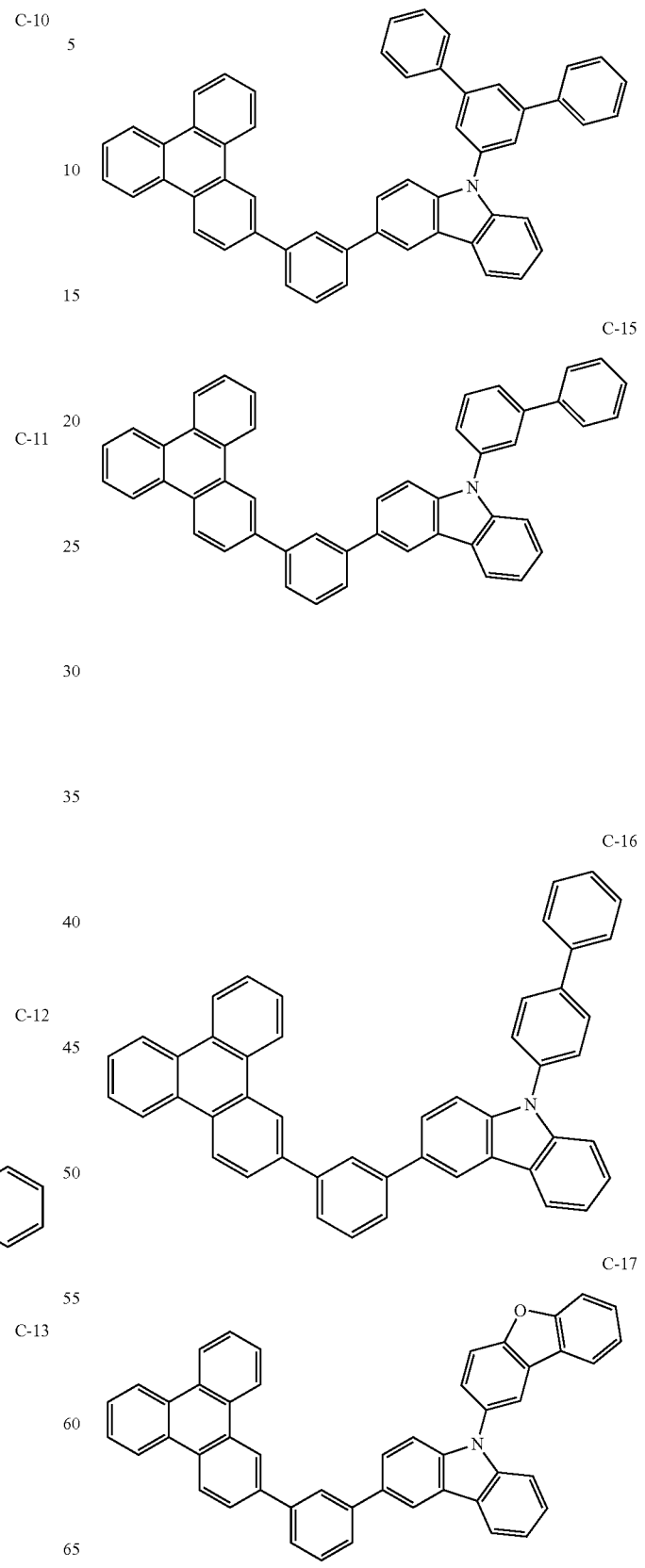

C-18
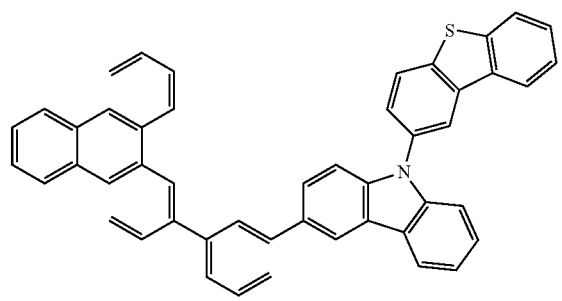
C-19
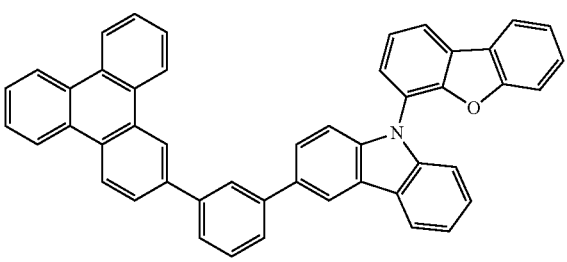
C-20
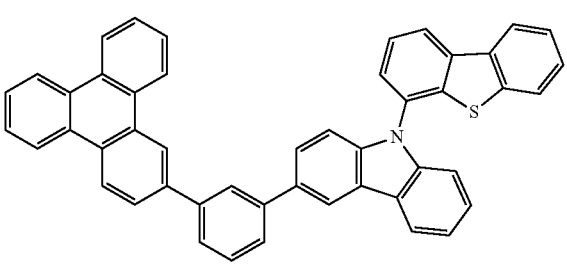
C-21
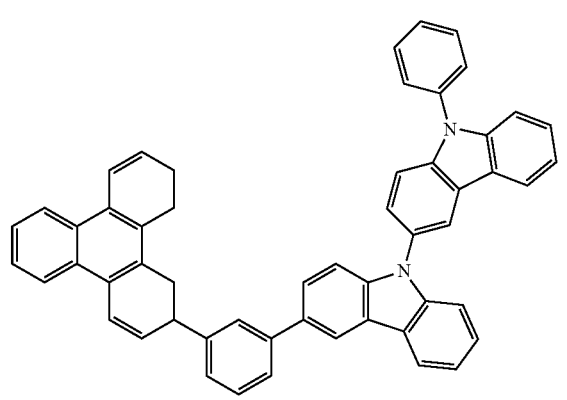
C-22
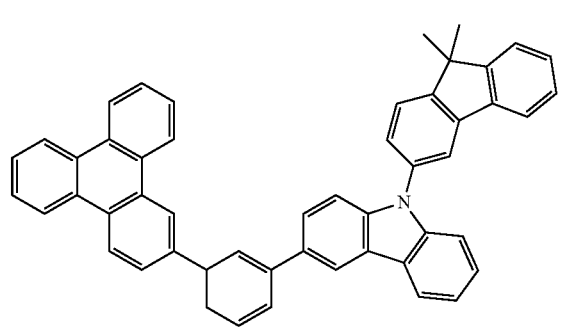
C-23
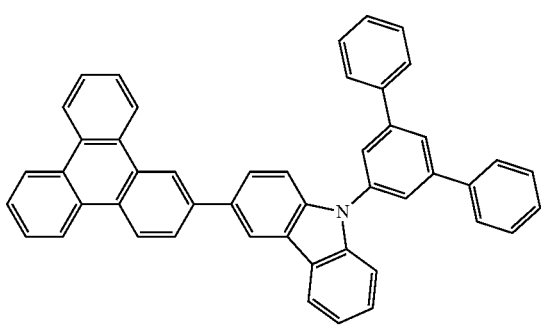
C-24
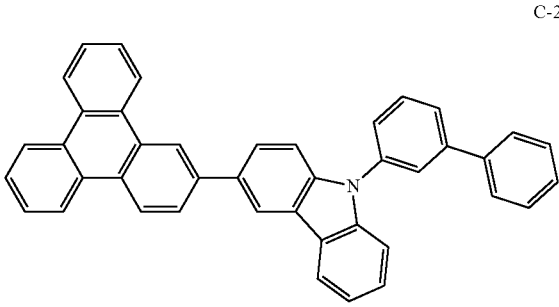
C-25
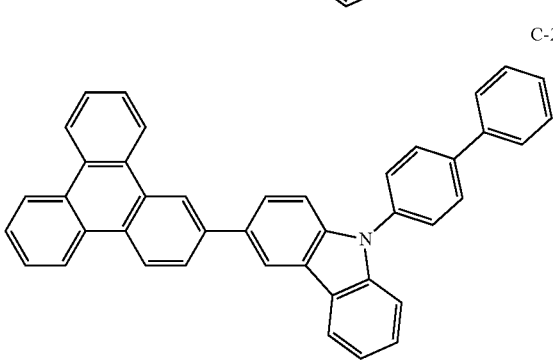
C-26
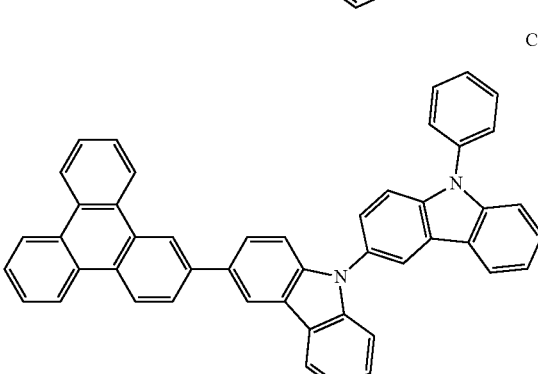
C-27
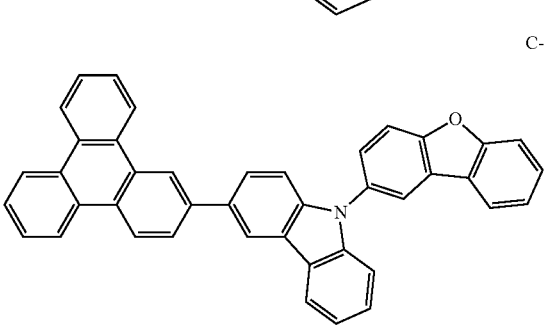

C-28
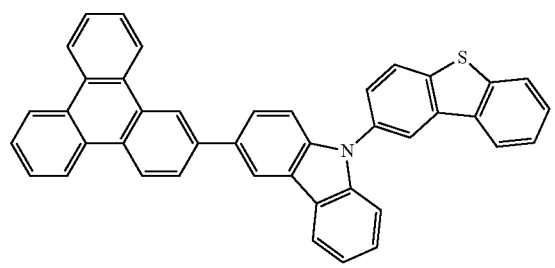
C-29
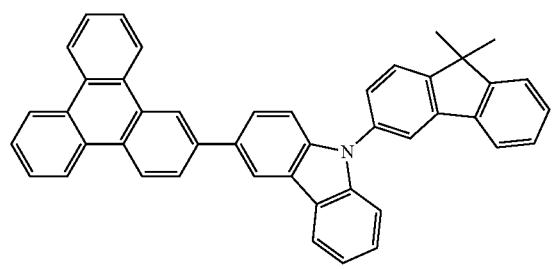
C-30
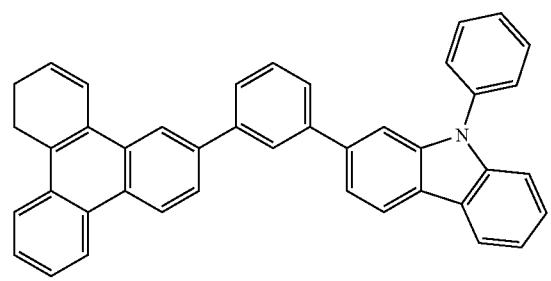
C-31
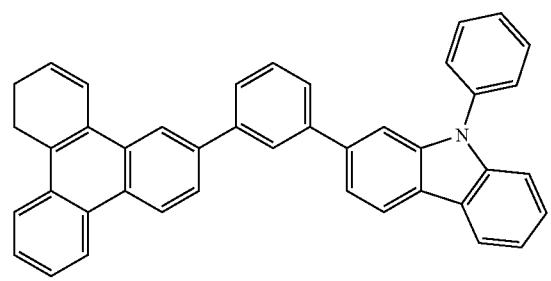
C-32
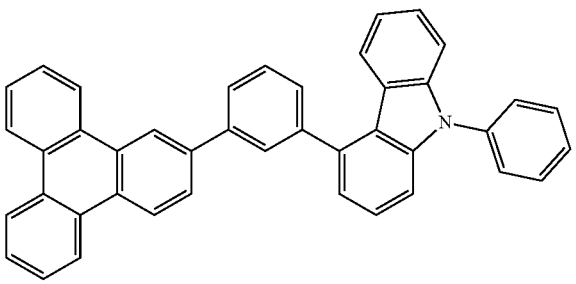
C-33
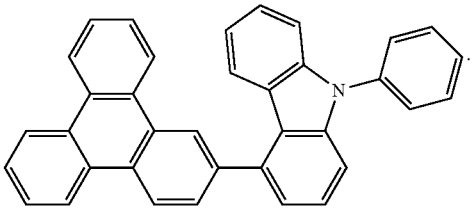
11. The organic optoelectric device as claimed in claim 7, wherein the compound represented by Chemical Formula 2-III is selected from Group 6:
[Group 6]
D-10
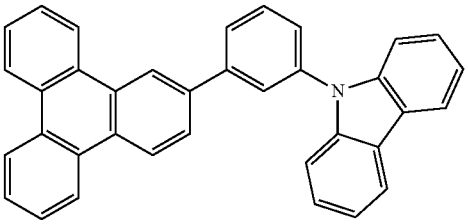
D-11
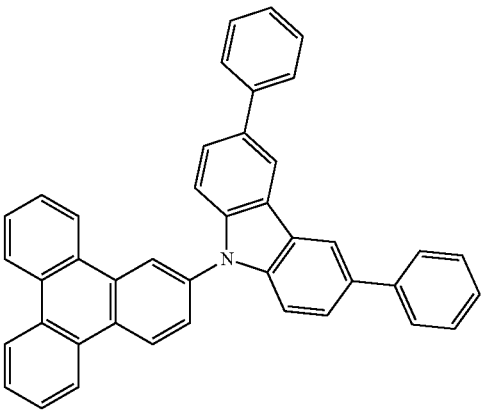
D-12
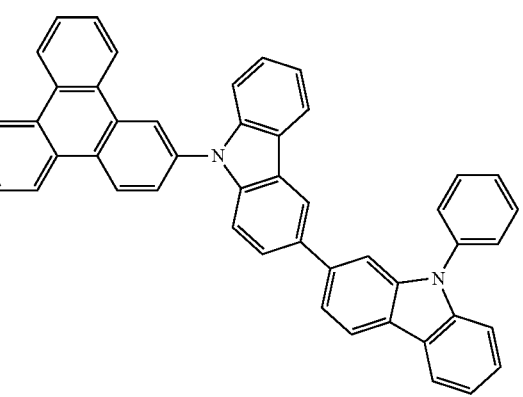

D-13
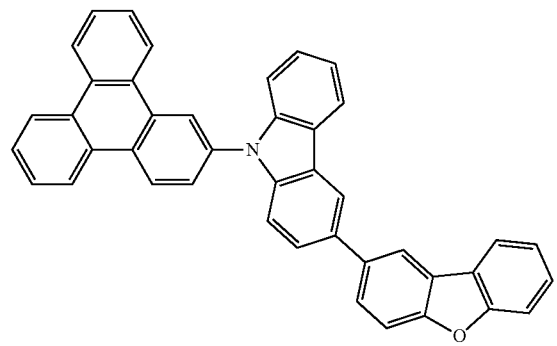
D-17
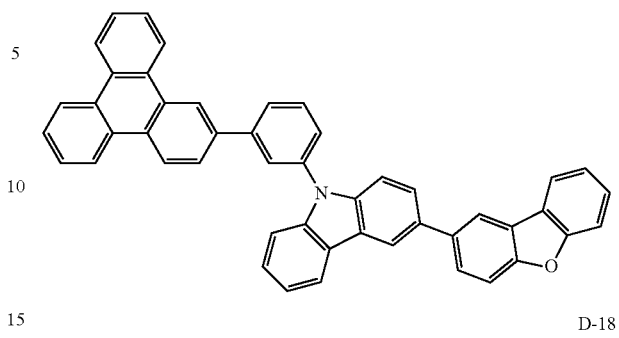
D-14
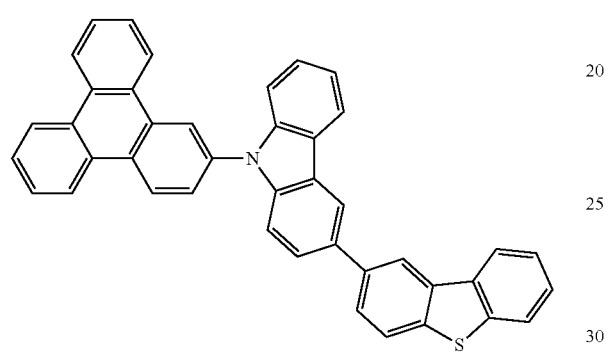
D-18
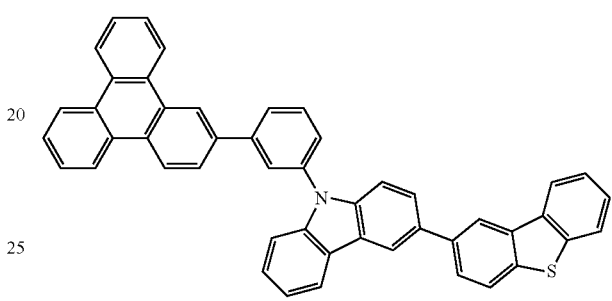
D-15
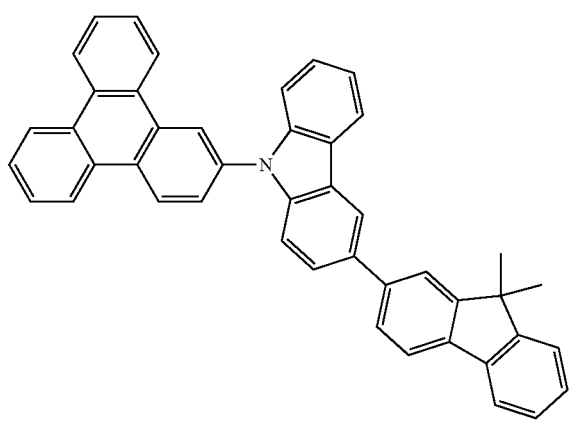
D-19
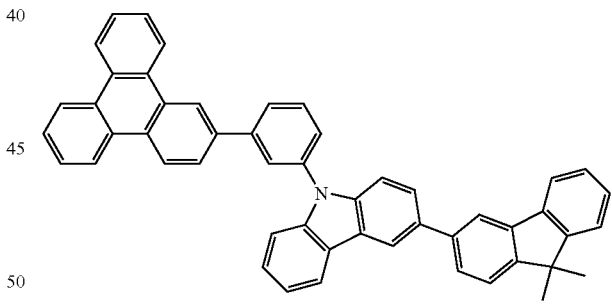
D-16
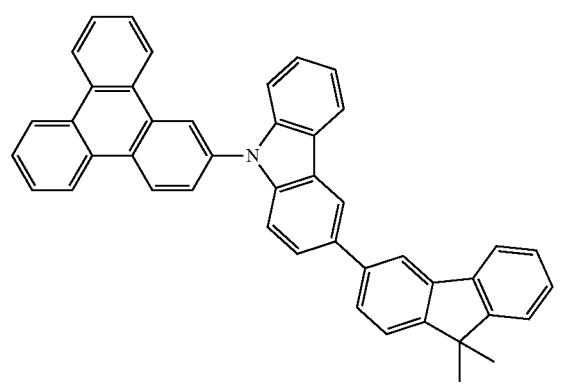
D-20
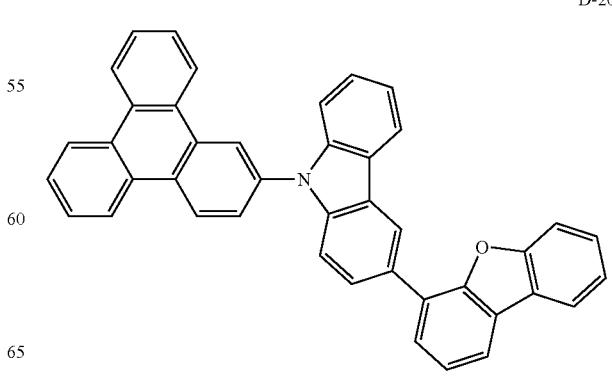

D-21
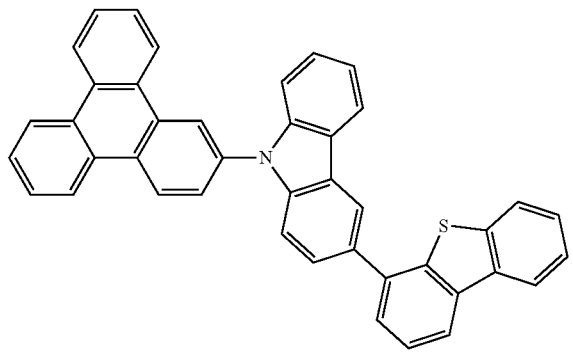
D-22
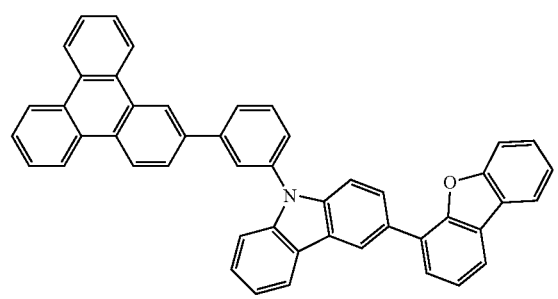
D-23
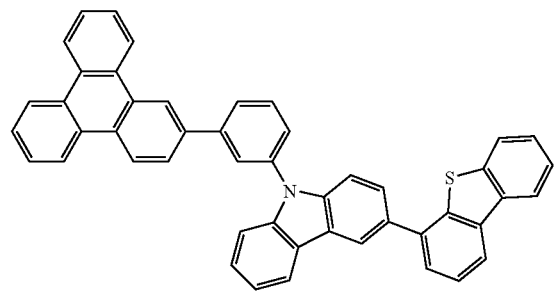
D-24
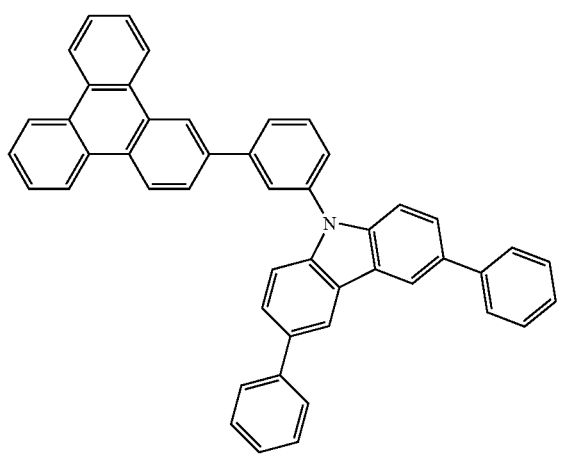
D-25
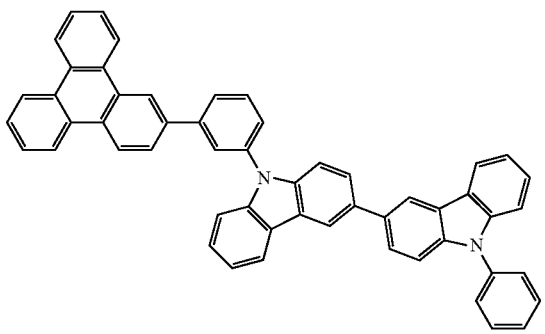
D-26
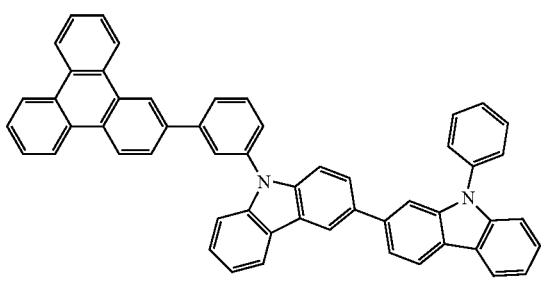
D-27
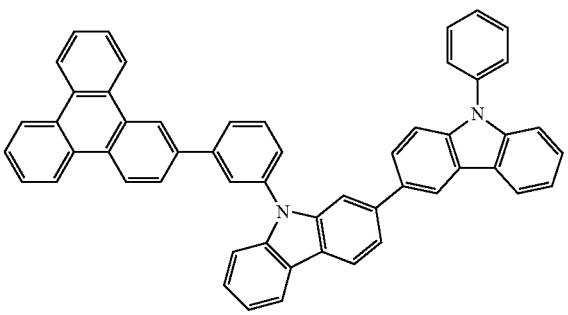
D-28
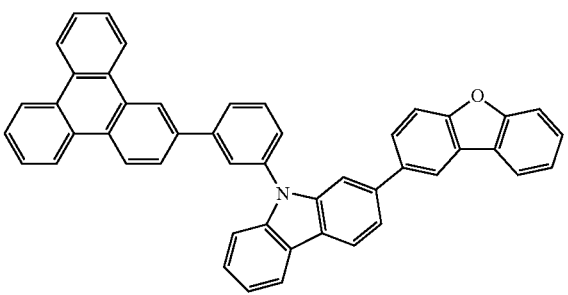
D-29

12. The organic optoelectric device as claimed in claim 1, wherein the hole transport auxiliary layer is in contact with the hole transport layer and the emission layer.

13. The organic optoelectric device as claimed in claim 1, wherein the emission layer includes the first compound and the second compound in a weight ratio of about 1:10 to about 10:1.

14. The organic optoelectric device as claimed in claim 1, wherein the emission layer further includes a phosphorescent dopant.

15. A display device including the organic optoelectric device as claimed in claim 1.

* * * * *